(12) United States Patent
Iwato et al.

(10) Patent No.: US 10,126,653 B2
(45) Date of Patent: Nov. 13, 2018

(54) PATTERN FORMING METHOD AND RESIST COMPOSITION

(75) Inventors: Kaoru Iwato, Shizuoka (JP); Shohei Kataoka, Shizuoka (JP); Shinji Tarutani, Shizuoka (JP); Sou Kamimura, Shizuoka (JP); Keita Kato, Shizuoka (JP); Yuichiro Enomoto, Shizuoka (JP); Kazuyoshi Mizutani, Shizuoka (JP); Toru Tsuchihashi, Shizuoka (JP); Kana Fujii, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/580,921

(22) PCT Filed: Feb. 24, 2011

(86) PCT No.: PCT/JP2011/054840
§ 371 (c)(1),
(2), (4) Date: Aug. 23, 2012

(87) PCT Pub. No.: WO2011/105626
PCT Pub. Date: Sep. 1, 2011

(65) Prior Publication Data
US 2012/0321855 A1 Dec. 20, 2012

Related U.S. Application Data

(60) Provisional application No. 61/308,665, filed on Feb. 26, 2010.

(30) Foreign Application Priority Data

Feb. 26, 2010 (JP) .................................. 2010-043281
Jun. 23, 2010 (JP) .................................. 2010-143185
Feb. 15, 2011 (JP) .................................. 2011-029622

(51) Int. Cl.
*G03F 7/30* (2006.01)
*G03F 7/004* (2006.01)
*G03F 7/38* (2006.01)
*G03F 7/075* (2006.01)
*G03F 7/038* (2006.01)
*G03F 7/039* (2006.01)
*G03F 7/11* (2006.01)
*G03F 7/20* (2006.01)
*G03F 7/32* (2006.01)

(52) U.S. Cl.
CPC ............. *G03F 7/30* (2013.01); *G03F 7/0045* (2013.01); *G03F 7/0046* (2013.01); *G03F 7/0382* (2013.01); *G03F 7/0392* (2013.01); *G03F 7/0395* (2013.01); *G03F 7/0397* (2013.01); *G03F 7/0757* (2013.01); *G03F 7/0758* (2013.01); *G03F 7/11* (2013.01); *G03F 7/2041* (2013.01); *G03F 7/325* (2013.01); *G03F 7/38* (2013.01); *Y10T 428/24479* (2015.01)

(58) Field of Classification Search
CPC .......... G03F 7/2041; G03F 7/30; G03F 7/325; G03F 7/38; G03F 7/0382; G03F 7/0758
USPC ...... 430/325, 326, 330, 270.1, 905, 909, 910
See application file for complete search history.

(56) References Cited

U.S. PATENT DOCUMENTS

| | | | |
|---|---|---|---|
| 4,743,529 A * | 5/1988 | Farid et al. ................. | 430/281.1 |
| 6,146,811 A * | 11/2000 | Kim ........................ | G03F 7/038 |
| | | | 430/270.1 |
| 6,391,520 B1 | 5/2002 | Nakano et al. | |
| 2002/0051933 A1 * | 5/2002 | Kodama et al. ............ | 430/270.1 |
| 2003/0008233 A1 | 1/2003 | Hada et al. | |
| 2004/0202966 A1 | 10/2004 | Hada et al. | |
| 2004/0241579 A1 * | 12/2004 | Hamada et al. ............ | 430/270.1 |
| 2004/0248032 A1 * | 12/2004 | Zampini et al. ............ | 430/270.1 |
| 2005/0065312 A1 | 3/2005 | Hada et al. | |
| 2008/0187860 A1 | 8/2008 | Tsubaki et al. | |
| 2008/0248423 A1 | 10/2008 | Yamaguchi et al. | |
| 2008/0261150 A1 * | 10/2008 | Tsubaki et al. ............ | 430/270.1 |
| 2008/0318171 A1 | 12/2008 | Tsubaki | |
| 2009/0011366 A1 * | 1/2009 | Tsubaki ................... | G03F 7/325 |
| | | | 430/285.1 |

(Continued)

FOREIGN PATENT DOCUMENTS

EP 1 939 691 A2 7/2008
EP 2 003 504 A2 12/2008

(Continued)

OTHER PUBLICATIONS

Chinese Office Action issued in Application No. 201180010800.6 dated Jan. 6, 2014.

(Continued)

*Primary Examiner* — John S Chu
(74) *Attorney, Agent, or Firm* — Sughrue Mion, PLLC

(57) ABSTRACT

Provided is a method of forming a pattern, ensuring excellent sensitivity, limiting resolving power, roughness characteristic, exposure latitude (EL), dependence on post-exposure bake (PEB) temperature and focus latitude (depth of focus DOF), and a resist composition for use in the method. The method comprises (A) forming a film from a resist composition comprising a resin containing a repeating unit containing a group that is decomposed when acted on by an acid to thereby produce an alcoholic hydroxyl group, which resin thus when acted on by an acid decreases its solubility in a developer containing an organic solvent, (B) exposing the film to light, and (C) developing the exposed film using a developer containing an organic solvent.

20 Claims, No Drawings

(56) References Cited

U.S. PATENT DOCUMENTS

| | | | |
|---|---|---|---|
| 2009/0130592 A1* | 5/2009 | Wang | G03F 7/0046 430/270.1 |
| 2009/0142693 A1 | 6/2009 | Iwashita | |
| 2009/0142696 A1 | 6/2009 | Furuya et al. | |
| 2009/0186298 A1 | 7/2009 | Ohsawa et al. | |
| 2009/0263741 A1* | 10/2009 | Hayashi | C08F 220/28 430/270.1 |
| 2010/0047710 A1 | 2/2010 | Yamagishi et al. | |
| 2010/0330507 A1 | 12/2010 | Tsubaki et al. | |
| 2011/0076625 A1 | 3/2011 | Tsubaki | |
| 2011/0177462 A1 | 7/2011 | Hatakeyama et al. | |
| 2011/0236826 A1 | 9/2011 | Hatakeyama et al. | |
| 2011/0236831 A1 | 9/2011 | Hasegawa et al. | |
| 2011/0262864 A1 | 10/2011 | Hirano et al. | |
| 2012/0058436 A1 | 3/2012 | Tsubaki et al. | |

FOREIGN PATENT DOCUMENTS

| | | |
|---|---|---|
| EP | 2 157 479 A1 | 2/2010 |
| JP | 09-050126 A | 2/1997 |
| JP | 2000-122295 A | 4/2000 |
| JP | 2000-206694 A | 7/2000 |
| JP | 2000199953 A | 7/2000 |
| JP | 2006-131739 A | 5/2006 |
| JP | 2006-195050 A | 7/2006 |
| JP | 2006-259582 A | 9/2006 |
| JP | 2006-317803 A | 11/2006 |
| JP | 2007-114613 A | 5/2007 |
| JP | 2008-138176 A | 6/2008 |
| JP | 2008-203639 A | 9/2008 |
| JP | 2008-233613 A | 10/2008 |
| JP | 2008-281974 A | 11/2008 |
| JP | 2008-281975 A | 11/2008 |
| JP | 2008-290980 A | 12/2008 |
| JP | 2008-292975 A | 12/2008 |
| JP | 2008-309879 A | 12/2008 |
| JP | 2009-25707 A | 2/2009 |
| JP | 2009-169205 A | 7/2009 |
| JP | 2009-237167 A | 10/2009 |
| JP | 2009-251392 A | 10/2009 |
| JP | 4355011 B2 | 10/2009 |
| JP | 2009-258586 A | 11/2009 |
| JP | 2010-39145 A | 2/2010 |
| JP | 2011-170316 A | 9/2011 |
| JP | 2012-073565 A | 4/2012 |
| KR | 10-2007-0088571 A | 8/2007 |
| TW | 200910024 A | 3/2009 |
| WO | 2011/083872 A1 | 7/2011 |
| WO | 2012/026622 A1 | 3/2012 |

OTHER PUBLICATIONS

International Search Report of PCT/JP2011/054840 dated Mar. 29, 2011.
European Search Report dated Oct. 22, 2013 issued in Application No. 11747578.0-1564.
Chinese Office Action dated Mar. 13, 2015 issued in application No. 201180010800.6.
Communication from the Taiwanese Patent Office dated May 29, 2015 in a counterpart Taiwanese Application No. 100106490.
Japanese Office Action dated May 27, 2014 issued in Application No. 2011-029622.
Japanese Office Action dated Nov. 11, 2014, issued in application No. 2011-029622.
Communication dated Jan. 8, 2016, issued by the Korean Intellectual Property Office in corresponding Korean Application No. 10-2012-7022027.
Communication dated Aug. 9, 2016 from the Korean Intellectual Property Office in counterpart application No. 10-2012-7022027.
Communication dated Nov. 23, 2016, issued by the Korean Intellectual Property Office in corresponding Korean Application No. 10-2012-7022027.
Communication dated Nov. 24, 2016, issued by the Korean Intellectual Property Office in corresponding Korean Application No. 10-2015-7022027.
Communication dated Sep. 28, 2015 from the Intellectual Property Office of Singapore issued in corresponding application No. 2012091492.

* cited by examiner

PATTERN FORMING METHOD AND RESIST COMPOSITION

CROSS REFERENCE TO RELATED APPLICATIONS

This is a U.S. national phase application under 35 USC 371 of International Application PCT/JP2011/054840, published in English, filed Feb. 24, 2011 claiming the benefit of U.S. Provisional Application No. 61/308,665, filed Feb. 26, 2010.

This application is based upon and claims the benefit of priority from prior Japanese Patent Application No. 2010-043281, filed Feb. 26, 2010; No. 2010-143185, filed Jun. 23, 2010; and No. 2011-029622, filed Feb. 15, 2011; the entire contents of all of which are incorporated herein by reference.

TECHNICAL FIELD

The present invention relates to a method of forming a pattern and a resist composition. More specifically, the present invention relates to a method of forming a negative pattern that is suitable for use in lithography operations employed in a semiconductor production process for an IC or the like, the production of a circuit board for a liquid crystal, a thermal head or the like and other photofabrication, and relates to a composition for use in the method. Further more specifically, the present invention relates to a method of forming a negative pattern that is suitable for exposure using an ArF exposure apparatus, ArF liquid-immersion projection exposure apparatus or EUV exposure apparatus in which a far-ultraviolet light of wavelength 300 nm or shorter is employed as a light source, and relates to a composition for use in the method.

In the present invention, the terms "actinic rays" and "radiation" mean, for example, a mercury lamp bright line spectrum, far ultraviolet rays represented by an excimer laser, extreme ultraviolet rays, X-rays, electSron beams and the like. In the present invention, the term "light" means actinic rays or radiation.

The expression "exposure" used herein, unless otherwise noted, means not only light irradiation using a mercury lamp, far ultraviolet, X-rays, EUV light, etc. but also lithography using particle beams, such as an electron beam and an ion beam.

BACKGROUND ART

Since the emergence of the resist for a KrF excimer laser (248 nm), it has been of common practice to employ a pattern forming method in which chemical amplification is utilized in order to compensate for any sensitivity decrease caused by light absorption. For example in a positive chemical amplification method, first, a photoacid generator contained in exposed areas is decomposed by light irradiation to thereby generate an acid. Then, in the stage of, for example, the bake after the exposure (Post-Exposure Bake: PEB), the generated acid exerts a catalytic action so that the alkali-insoluble group contained in the photosensitive composition is converted to an alkali-soluble group. Thereafter, development is carried out using, for example, an alkali solution. Thus, the exposed areas are removed to obtain a desired pattern.

For use in the above method, various alkali developers have been proposed. For example, an aqueous alkali developer containing 2.38 mass % TMAH (aqueous solution of tetramethylammonium hydroxide) is generally used.

The wavelength shortening of the exposure light source and the realization of high numerical apertures (high NA) for projector lenses have been advanced in order to cope with the miniaturization of semiconductor elements. To now, an exposure unit using an ArF excimer laser of 193 nm wavelength as a light source has been developed. Further, a method in which the space between a projector lens and a sample is filled with a liquid of high refractive index (hereinafter also referred to as an "immersion liquid"), namely liquid-immersion method has been proposed as a technology for enhancing the resolving power. Still further, an EUV lithography in which exposure is carried out using an ultraviolet of further shorter wavelength (13.5 nm) has been proposed.

However, the current situation is that it is extremely difficult to discover an appropriate combination of resist composition, developer, rinse liquid, etc., required for the formation of a pattern realizing comprehensively excellent performance. In particular, in accordance with the decrease of the resolved line width of resists, there is a demand for an enhancement of line pattern roughness performance and an enhancement of pattern dimension in-plane uniformity.

In this current situation, in recent years, various formulations have been proposed as a positive resist composition (see, for example, patent references 1 to 4). Moreover, the development of negative resist compositions for use in the pattern formation by alkali development is progressing (see, for example, patent references 5 to 8). These reflect the situation in which in the production of semiconductor elements and the like, while there is a demand for the formation of a pattern with various configurations, such as a line, a trench and a hole, there exist patterns whose formation is difficult with the use of current positive resists.

In recent years, also, a pattern forming method using a negative developer, namely, a developer containing an organic solvent is being exploited (see, for example, patent references 9 to 11). For example, patent reference 11 discloses a pattern forming method comprising the operations of applying onto a substrate a positive resist composition that when exposed to actinic rays or radiation, increases its solubility in a positive developer and decreases its solubility in a negative developer, exposing the applied resist composition and developing the exposed resist composition using a negative developer. This method realizes the stable formation of a high-precision fine pattern.

However, as for development performed using a developer containing an organic solvent, there is still a demand for further enhancements of the sensitivity, limiting resolving power, roughness characteristic, exposure latitude (EL), dependence on post-exposure bake (PEB) temperature, and focus latitude (depth of focus DOF).

PRIOR ART REFERENCE

Patent Reference

Patent reference 1: Jpn. Pat. Appln. KOKAI Publication No. (hereinafter referred to as JP-A-) 2008-203639,
Patent reference 2: JP-A-2007-114613,
Patent reference 3: JP-A-2006-131739,
Patent reference 4: JP-A-2000-122295,
Patent reference 5: JP-A-2006-317803,
Patent reference 6: JP-A-2006-259582,
Patent reference 7: JP-A-2006-195050,
Patent reference 8: JP-A-2000-206694,
Patent reference 9: JP-A-2008-281974,
Patent reference 10: JP-A-2008-281975, and
Patent reference 11: JP-A-2008-292975.

DISCLOSURE OF INVENTION

It is an object of the present invention to provide a method of forming a pattern and a resist composition, ensuring excellent sensitivity, limiting resolving power, roughness characteristic, exposure latitude (EL), dependence on post-exposure bake (PEB) temperature, and focus latitude (depth of focus DOF).

Some aspects of the present invention are as follows.

[1] A method of forming a pattern, comprising: (A) forming a film from a resist composition comprising a resin containing a repeating unit containing a group that is decomposed when acted on by an acid to thereby produce an alcoholic hydroxyl group, which resin when acted on by an acid decreases its solubility in a developer containing an organic solvent, (B) exposing the film to light, and (C) developing the exposed film using a developer containing an organic solvent.

[2] The method of forming a pattern according to [1], wherein the repeating unit is represented by at least one selected from the group consisting of general formulae (I-1) to (I-10) below:

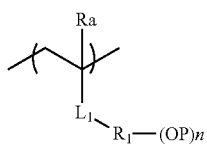
(I-1)

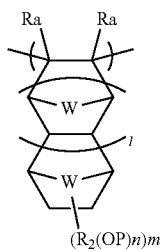
(I-2)

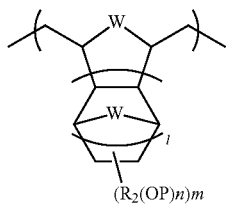
(I-3)

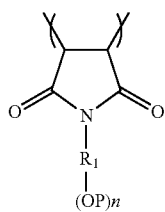
(I-4)

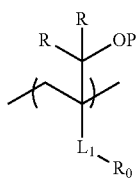
(I-5)

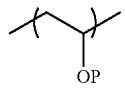
(I-6)

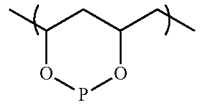
(I-7)

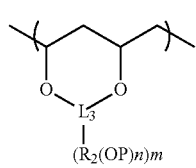
(I-8)

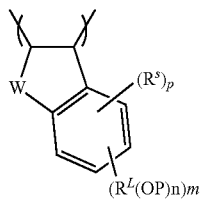
(I-9)

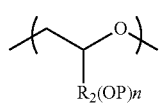
(I-10)

in which

Ra, or each of Ra's independently, represents a hydrogen atom, an alkyl group or any of groups of the formula —CH$_2$—O—Ra2 in which Ra2 represents a hydrogen atom, an alkyl group or an acyl group, R$_1$ represents a (n+1)-valent organic group, R$_2$, when m≥2 each of R$_2$s independently, represents a single bond or a (n+1)-valent organic group, OP, or each of OPs independently, represents the group that is decomposed when acted on by an acid to thereby produce an alcoholic hydroxyl group, provided that when n≥2 and/or m≥2, two or more OPs may be bonded to each other to thereby form a ring, W represents a methylene group, an oxygen atom or a sulfur atom, each of n and m is an integer of 1 or greater, l is an integer of 0 or greater, L$_1$ represents a connecting group of the formula —COO—, —OCO—, —CONH—, —O—, —Ar—, —SO$_3$— or —SO$_2$NH—, the Ar representing a bivalent aromatic ring group, each of R's independently represents a hydrogen atom or an alkyl group, R$_0$ represents a hydrogen atom or an organic group, L$_3$ represents a (m+2)-valent connecting group, R$^L$, when m≥2 each of R$^L$s independently, represents a (n+1)-valent connecting group, R$^S$, when p≥2 each of R$^S$s independently, represents a substituent, provided that when p≥2, two or more R$^S$s may be bonded to each other to thereby form a ring, and p is an integer of 0 to 3.

[3] The method of forming a pattern according to [1] or [2], wherein the group that is decomposed when acted on by an acid to thereby produce an alcoholic hydroxyl group is represented by at least one selected from the group consisting of general formulae (II-1) to (II-9) below:

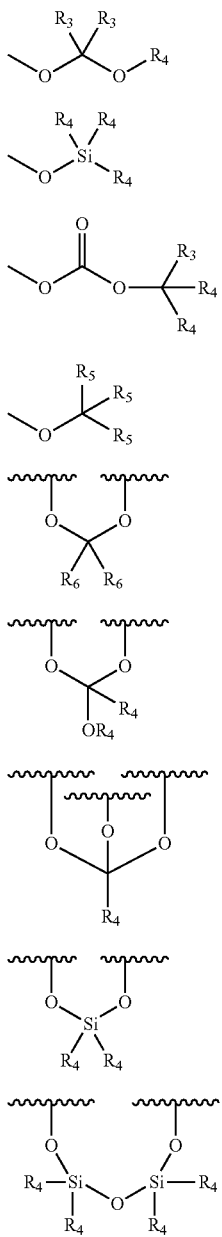

(II-1)
(II-2)
(II-3)
(II-4)
(II-5)
(II-6)
(II-7)
(II-8)
(II-9)

in which $R_3$, or each of $R_3$s independently, represents a hydrogen atom or a monovalent organic group, provided that two $R^3$s may be bonded to each other to thereby form a ring, $R_4$, or each of $R_4$s independently, represents a monovalent organic group, provided that at least two $R_4$s may be bonded to each other to thereby form a ring and that $R_3$ and $R_4$ may be bonded to each other to thereby form a ring, each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group, and each of $R_6$s independently represents a hydrogen atom or a monovalent organic group, provided that $R_6$s may be bonded to each other to thereby form a ring.

[4] The method of forming a pattern according to any of [1] to [3], wherein the repeating unit is any of those represented by general formula (III) below,

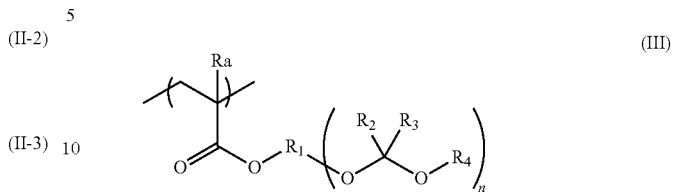

(III)

in which $R_1$ represents a (n+1)-valent organic group,

Ra represents a hydrogen atom, an alkyl group or any of groups of the formula —$CH_2$—O—Ra2 in which Rat represents a hydrogen atom, an alkyl group or an acyl group, each of $R_3$s independently represents a hydrogen atom or a monovalent organic group, provided that $R_3$s may be bonded to each other to thereby form a ring, $R_4$, when n≥2 each of $R_4$s independently, represents a monovalent organic group, provided that $R_4$s may be bonded to each other to thereby form a ring and that $R_3$ and $R_4$ may be bonded to each other to thereby form a ring, and n is an integer of 1 or greater.

[5] The method of forming a pattern according to [4], wherein $R_1$ represents a nonaromatic hydrocarbon group.

[6] The method of forming a pattern according to [5], wherein $R_1$ represents an alicyclic hydrocarbon group.

[7] The method of forming a pattern according to any of [3] to [6], wherein the group that is decomposed when acted on by an acid to thereby produce an alcoholic hydroxyl group is any of those of general formula (II-1) above, and wherein at least one of $R_3$s represents a monovalent organic group.

[8] The method of forming a pattern according to any of [1] to [7], wherein the repeating unit contains two or more groups, each of which is decomposed when acted on by an acid to thereby produce an alcoholic hydroxyl group.

[9] The method of forming a pattern according to any of [1] to [8], wherein the resin further contains a repeating unit containing an alcoholic hydroxyl group.

[10] The method of forming a pattern according to any of [1] to [9], wherein the resin further contains a repeating unit containing a cyano group.

[11] The method of forming a pattern according to any of [1] to [10], wherein the resin further contains a repeating unit containing a group that is decomposed when acted on by an acid to thereby produce a carboxyl group.

[12] The method of forming a pattern according to [1], the resin comprising a repeating unit containing a partial structure represented by the formula (D-1) below.

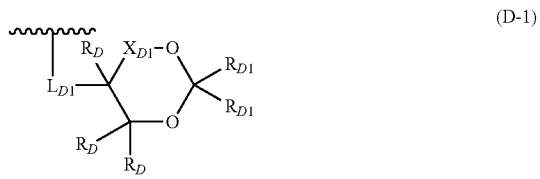

(D-1)

In the formula, $L_{D1}$ represents a single bond or a bivalent connecting group.

Each of $R_D$s independently represents a hydrogen atom, an alkyl group or a cycloalkyl group. At least two of three $R_D$s may be bonded to each other to thereby form a ring.

$X_{D1}$ represents a single bond or a connecting group having 1 or more carbon atoms.

$L_{D1}$, $R_D$ and $X_{D1}$ may be bonded to each other to thereby form a ring. Further, at least one of $L_{D1}$, $R_D$ and $X_{D1}$ may be bonded to a carbon atom as a constituent of the principal chain of a polymer to thereby form a ring.

Each of $R_{D1}$s independently represents a hydrogen atom, an alkyl group or a cycloalkyl group. Two $R_{D1}$s may be bonded to each other to thereby form a ring.

[13] The method of forming a pattern according to any of [1] to [12], wherein the organic solvent contained in the developer is any of ester, ketone, alcohol, amide, ether and hydrocarbon solvents.

[14] The method of forming a pattern according to any of [1] to [13], wherein an amount of the organic solvent used in the developer is in the range of 80 to 100 mass % based on a whole amount of the developer.

[15] A resist composition for use in the method of forming a pattern according to any of [1] to [14], the resist composition comprising a resin containing a group that is decomposed when acted on by an acid to thereby produce an alcoholic hydroxyl group, which resin thus when acted on by an acid decreases its solubility in a developer containing an organic solvent.

[16] A resist pattern formed from the composition of [15].

The present invention has made it feasible to provide a method of forming a pattern and a resist composition, ensuring excellent sensitivity, limiting resolving power, roughness characteristic, exposure latitude (EL), dependence on post-exposure bake (PEB) temperature, and focus latitude (depth of focus DOF).

BEST MODE FOR CARRYING OUT THE INVENTION

The present invention will be described below.

Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

<Resist Composition>

First, the resist composition of the present invention will be described. This resist composition may be used in negative development and also positive development. Namely, this resist composition may be used in development using a developer containing an organic solvent and also in development using an alkali developer. The resist composition of the present invention is typically used in negative development, namely, development using a developer containing an organic solvent. That is, the composition of the present invention is typically a negative resist composition.

The resist composition of the present invention comprises a resin (a) that decreases its solubility in a developer containing an organic solvent when acted on by an acid (hereinafter also referred to as an acid-decomposable resin). The resist composition may further comprise a compound (b) that generates an acid when exposed to actinic rays or radiation (hereinafter also referred to as an acid generator). Furthermore, the resist composition may contain at least any of a basic compound (c), a solvent (d), a hydrophobic resin (e), a surfactant (f) and other additives (g). Each of these components will be sequentially described below.

(a) Acid-Decomposable Resin

The resist composition of the present invention comprises an acid-decomposable resin. The acid-decomposable resin contains a repeating unit (P) containing a group that is decomposed when acted on by an acid to thereby produce an alcoholic hydroxyl group as an acid-decomposable group.

The inventors have found that, for example, the sensitivity, limiting resolving power, roughness characteristic, exposure latitude (EL), dependence on post-exposure bake (PEB) temperature and focus latitude (depth of focus DOF) are superior when at least a part of the acid-decomposable group is a group that is decomposed when acted on by an acid to thereby produce an alcoholic hydroxyl group compared to, for example, those exhibited when the acid-decomposable group consists only of a group that is decomposed when acted on by an acid to thereby produce a carboxyl group. The reason therefor is not necessarily apparent. However, the inventors presume that the reason would be that when a group that is decomposed when acted on by an acid to thereby produce an alcoholic hydroxyl group is used as at least a part of the acid-decomposable group, the reactivity of the acid-decomposable resin is increased and accordingly the resin exhibits an increased polarity change by the decomposition of the acid-decomposable group, thereby enhancing a dissolution contrast to a developer containing an organic solvent.

The inventors have further found that, for example, the decrease of the film thickness by post-exposure bake (PEB) can be suppressed more effectively when at least part of the acid-decomposable group is a group that is decomposed when acted on by an acid to thereby produce an alcoholic hydroxyl group than when the acid-decomposable group consists only of a group that is decomposed when acted on by an acid to thereby produce a carboxyl group. The inventors presume that the reason would be that the change of the polarity of the resin occurring after the decomposition by the action of an acid is greater in the former instance than in the latter instance. The difference in the magnitude of the polarity change is especially conspicuous when the protective group cleaved by the action of an acid has a small molecular weight.

The pKa value of the alcoholic hydroxyl group produced by the decomposition of the above group under the action of an acid is, for example, 12 or greater, and typically in the range of 12 to 20. When the pKa value is extremely small, the stability of the composition containing the acid-decomposable resin tends to decrease and the change over time of the resist performance tends to be large. Herein, the term "pKa" means the value calculated using "ACD/pKa DB" available from Fujitsu Limited under noncustomized initial setting.

It is preferred for the repeating unit (P) to contain two or more groups that are decomposed to thereby produce an alcoholic hydroxyl group when acted on by an acid. Namely, it is preferred for the repeating unit (P) to have a structure that is decomposed when acted on by an acid to thereby produce two or more alcoholic hydroxyl groups. The limiting resolving power and roughness characteristic of the composition comprising the acid-decomposable resin can be enhanced by having this structure.

It is preferred for the repeating unit (P) to be any of those of at least one selected from the group consisting of general formulae (I-1) to (I-10) below. This repeating unit is more preferably any of those of at least one selected from the group consisting of general formulae (I-1) to (I-3) below, further more preferably any of those of general formula (I-1) below.

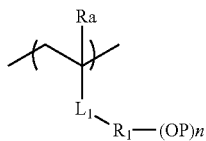
(I-1)

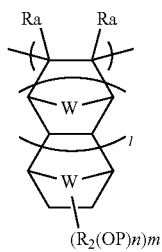
(I-2)

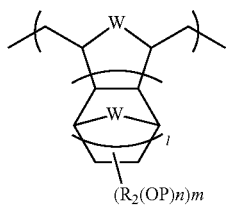
(I-3)

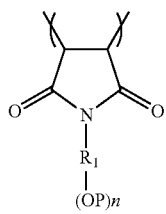
(I-4)

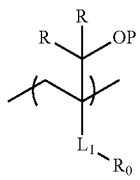
(I-5)

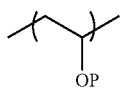
(I-6)

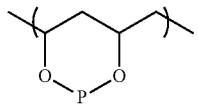
(I-7)

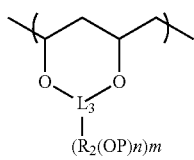
(I-8)

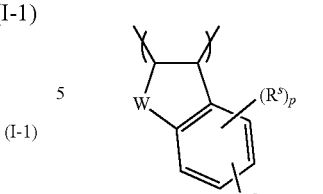
(I-9)

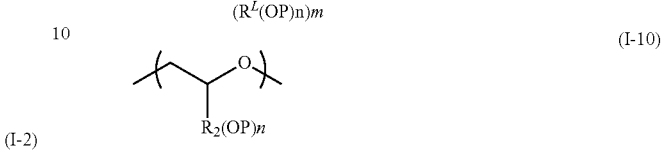
(I-10)

In the formulae,

Ra, or each of Ra's independently, represents a hydrogen atom, an alkyl group or any of groups of the formula —$CH_2$—O—Ra2 in which Ra2 represents a hydrogen atom, an alkyl group or an acyl group.

$R_1$ represents a (n+1)-valent organic group.

$R_2$, when m≥2 each of $R_2$s independently, represents a single bond or a (n+1)-valent organic group.

OP, or each of OPs independently, represents the group that is decomposed when acted on by an acid to thereby produce an alcoholic hydroxyl group, provided that when n≥2 and/or m≥2, two or more OPs may be bonded to each other to thereby form a ring.

W represents a methylene group, an oxygen atom or a sulfur atom.

Each of n and m is an integer of 1 or greater, provided that in general formulae (I-2), (I-3) and (I-8), n is 1 when $R_2$ represents a single bond.

l is an integer of 0 or greater.

$L_1$ represents a connecting group of the formula —COO—, —OCO—, —CONH—, —O—, —Ar—, —$SO_3$— or —$SO_2NH$—, the Ar representing a bivalent aromatic ring group.

Each of R's independently represents a hydrogen atom or an alkyl group.

$R_0$ represents a hydrogen atom or an organic group, $L_3$ represents a (m+2)-valent connecting group.

$R^L$, when m≥2 each of $R^L$s independently, represents a (n+1)-valent connecting group.

$R^S$, when p≥2 each of $R^S$s independently, represents a substituent, provided that when p≥2, two or more $R^S$s may be bonded to each other to thereby form a ring, and p is an integer of 0 to 3.

Ra represents a hydrogen atom, an alkyl group or any of groups of the formula —$CH_2$—O—Ra2. Ra is preferably a hydrogen atom or an alkyl group having 1 to 10 carbon atoms, more preferably a hydrogen atom or a methyl group.

W represents a methylene group, an oxygen atom or a sulfur atom. W is preferably a methylene group or an oxygen atom.

$R_1$ represents a (n+1)-valent organic group. $R_1$ is preferably a nonaromatic hydrocarbon group. In particular, $R_1$ may be a chain hydrocarbon group or an alicyclic hydrocarbon group. $R_1$ is more preferably an alicyclic hydrocarbon group. The alicyclic hydrocarbon group may be monocyclic or polycyclic. It is preferred for the alicyclic hydrocarbon group to be polycyclic.

$R_2$ is a single bond or a (n+1)-valent organic group. $R_2$ is preferably a single bond or a nonaromatic hydrocarbon group. In particular, $R_2$ may be a chain hydrocarbon group or an alicyclic hydrocarbon group.

When $R_1$ and/or $R_2$ are/is a chain hydrocarbon group, the chain hydrocarbon group may be in the form of a linear chain or a branched chain. The chain hydrocarbon group preferably has 1 to 8 carbon atoms. When $R_1$ and/or $R_2$ are/is, for example, an alkylene group, it is preferred for $R_1$ and/or $R_2$ to be a methylene group, an ethylene group, an n-propylene group, an isopropylene group, an n-butylene group, an isobutylene group or a sec-butylene group.

When $R_1$ and/or $R_2$ are/is an alicyclic hydrocarbon group, the alicyclic hydrocarbon group may be monocyclic or polycyclic. The alicyclic hydrocarbon group has, for example, a monocyclo, bicyclo, tricyclo or tetracyclo structure. The alicyclic hydrocarbon group has generally 5 or more carbon atoms, preferably 6 to 30 carbon atoms and more preferably 7 to 25 carbon atoms.

As the alicyclic hydrocarbon groups, there can be mentioned, for example, those having a series of partial structures shown below. A substituent may be introduced in each of these partial structures. In each of these partial structures, the methylene group (—$CH_2$—) may be replaced by an oxygen atom (—O—), a sulfur atom (—S—), a carbonyl group [—(=O)—], a sulfonyl group [—S(=O)$_2$—], a sulfinyl group [—S(=O)—] or an imino group [—N(R)—] (R is a hydrogen atom or an alkyl group).

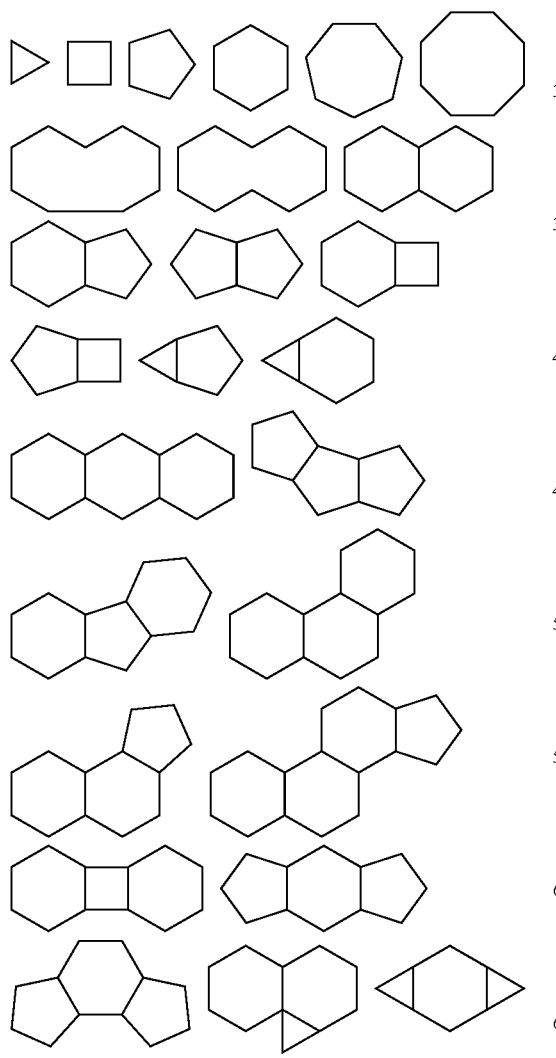

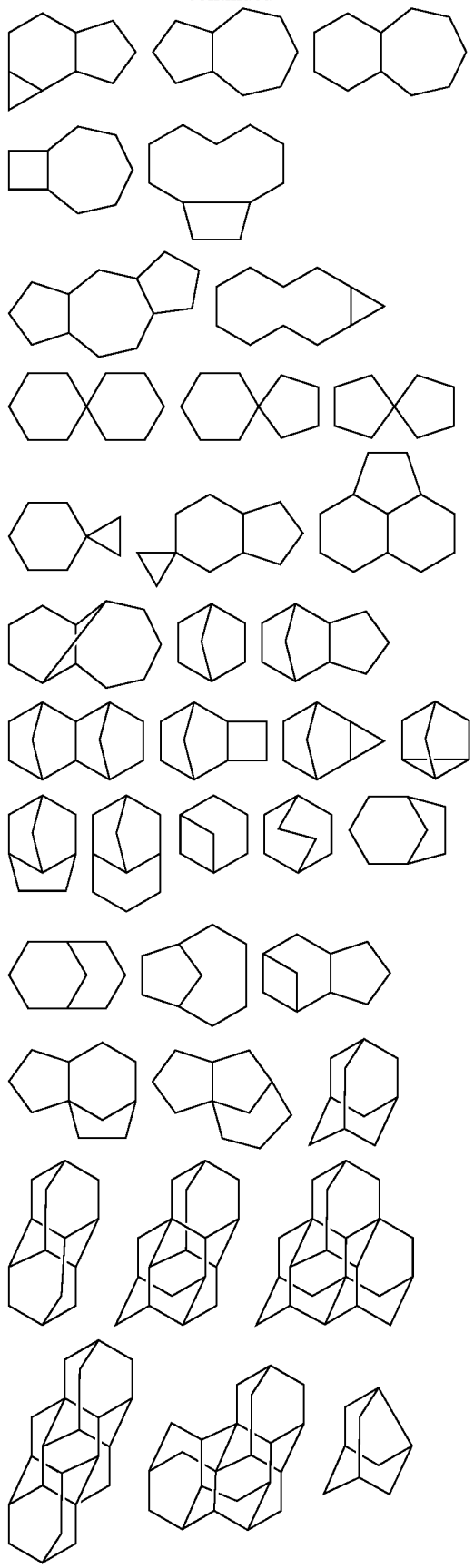

-continued

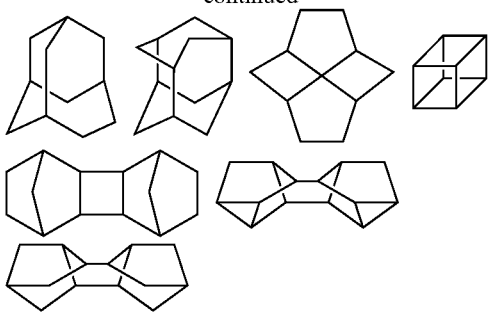

When $R_1$ and/or $R_2$ are/is, for example, a cycloalkylene group, it is preferred for $R_1$ and/or $R_2$ to be an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group. Of these, an adamantylene group, a norbornylene group, a cyclohexylene group, a cyclopentylene group, a tetracyclododecanylene group and a tricyclodecanylene group are more preferred.

One or more substituents may be introduced in the nonaromatic hydrocarbon group represented by $R_1$ and/or $R_2$. As the substituent, there can be mentioned, for example, an alkyl group having 1 to 4 carbon atoms, a halogen atom, a hydroxyl group, an alkoxy group having 1 to 4 carbon atoms, a carboxyl group or an alkoxycarbonyl group having 2 to 6 carbon atoms. A substituent may further be introduced in the alkyl group, alkoxy group and alkoxycarbonyl group. As such a substituent, there can be mentioned, for example, a hydroxyl group, a halogen atom or an alkoxy group.

$L_1$ represents a connecting group of the formula —COO—, —OCO—, —CONH—, —O—, —Ar—, —SO$_3$— or —SO$_2$NH—. Herein, Ar represents a bivalent aromatic ring group. $L_1$ is preferably a connecting group of the formula —COO—, —CONH— or —Ar—, more preferably a connecting group of the formula —COO— or —CONH—.

R represents a hydrogen atom or an alkyl group. The alkyl group may be in the form of a linear chain or a branched chain. The alkyl group preferably has 1 to 6 carbon atoms, more preferably 1 to 3 carbon atoms. It is preferred for R to be a hydrogen atom or a methyl group, especially a hydrogen atom.

$R_0$ represents a hydrogen atom or an organic group. As the organic group, there can be mentioned, for example, an alkyl group, a cycloalkyl group, an aryl group, an alkynyl group or an alkenyl group. It is preferred for Ro to be a hydrogen atom or an alkyl group, especially a hydrogen atom or a methyl group.

$L_3$ represents a (m+2)-valent connecting group. Namely, $L_3$ represents a tri- or higher valent connecting group. As such a connecting group, there can be mentioned, for example, a corresponding group contained in each of particular examples shown below.

$R^L$ represents a (n+1)-valent connecting group. Namely, $R^L$ represents a bi- or higher valent connecting group. As such a connecting group, there can be mentioned, for example, an alkylene group, a cycloalkylene group or a corresponding group contained in each of particular examples shown below. $R^L$s, or $R^L$ and $R^S$, may be bonded to each other to thereby form a ring structure.

$R^S$ represents a substituent. As the substituent, there can be mentioned, for example, an alkyl group, an alkenyl group, an alkynyl group, an aryl group, an alkoxy group, an acyloxy group, an alkoxycarbonyl group or a halogen atom.

In the formula, n is an integer of 1 or greater, preferably an integer of 1 to 3, and more preferably 1 or 2. When n is 2 or greater, the dissolution contrast to a developer containing an organic solvent can be enhanced. Accordingly, if so, the limiting resolving power and roughness characteristic can be enhanced.

In the formula, m is an integer of 1 or greater, preferably an integer of 1 to 3, and more preferably 1 or 2, l is an integer of 0 or greater, preferably 0 or 1, and p is an integer of 0 to 3.

Specific examples of the repeating units each containing a group that is decomposed when acted on by an acid to thereby produce an alcoholic hydroxyl group will be shown below. In the particular examples, Ra and OP are as defined in general formulae (I-1) to (I-3). When a plurality of OPs are bonded to each other to thereby form a ring, the corresponding ring structure is expressed as "O—P—O" for the sake of convenience.

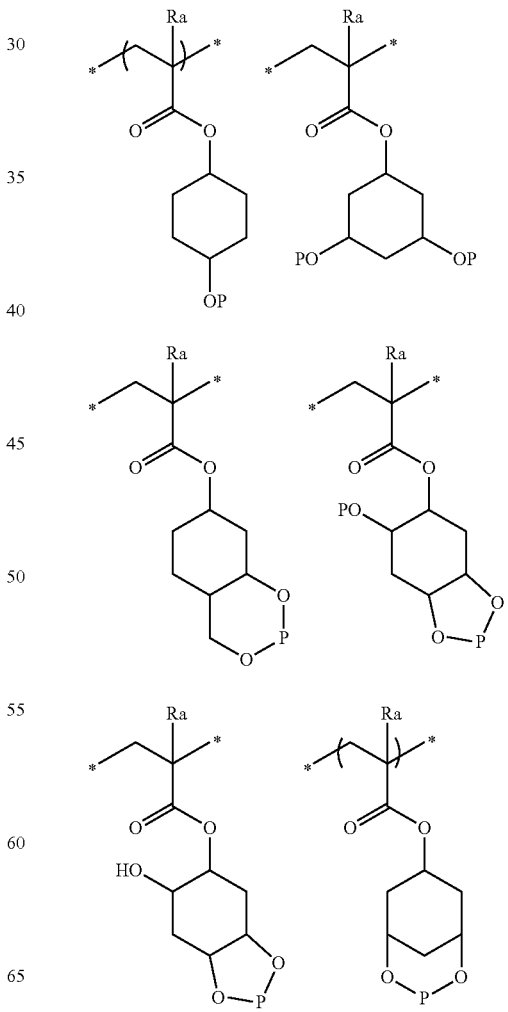

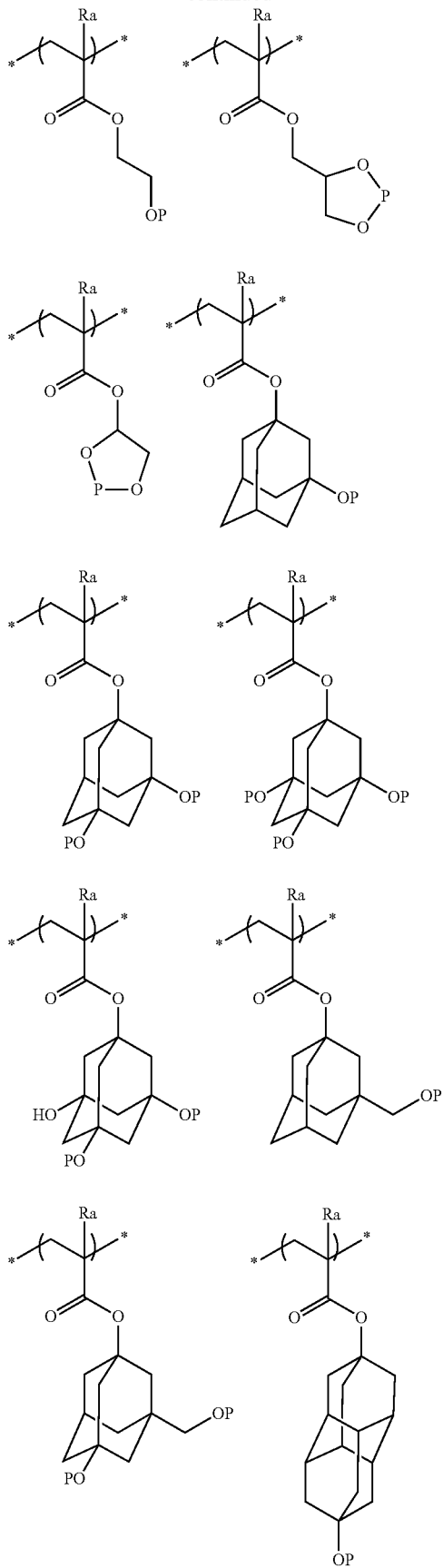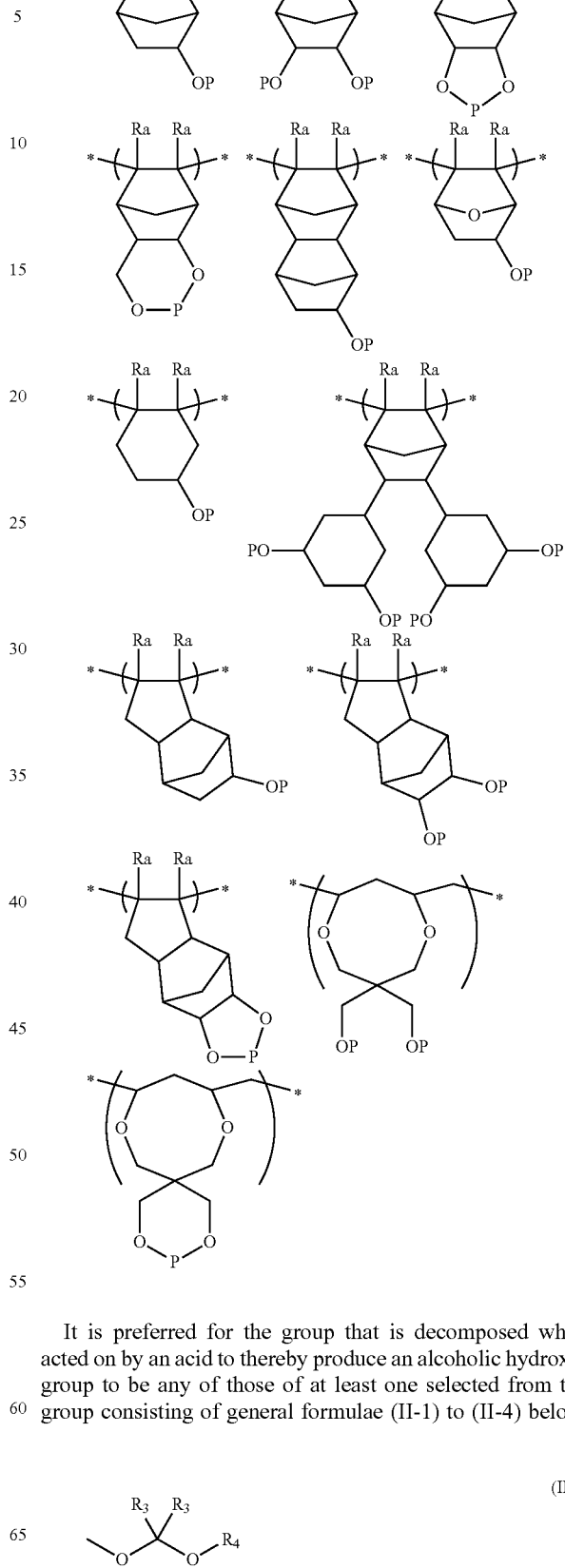
It is preferred for the group that is decomposed when acted on by an acid to thereby produce an alcoholic hydroxyl group to be any of those of at least one selected from the group consisting of general formulae (II-1) to (II-4) below.
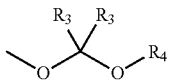
(II-1)

(II-2)
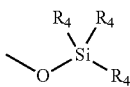

(II-3)
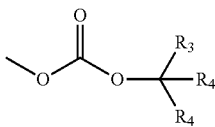

(II-4)
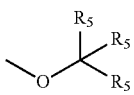

In the formulae,

R₃, or each of R₃s independently, represents a hydrogen atom or a monovalent organic group, provided that R₃s may be bonded to each other to thereby form a ring.

R₄, or each of R₄s independently, represents a monovalent organic group, provided that R₄s may be bonded to each other to thereby form a ring and that R₃ and R₄ may be bonded to each other to thereby form a ring.

Each of R₅s independently represents a hydrogen atom, an alkyl group, a cycloalkyl group, an aryl group, an alkenyl group or an alkynyl group, provided that at least two R₅s may be bonded to each other to thereby form a ring and that when one or two of three R₅s are a hydrogen atom, at least one of the rest of R₅s represents an aryl group, an alkenyl group or an alkynyl group.

It is preferred for the group that is decomposed when acted on by an acid to thereby produce an alcoholic hydroxyl group to be any of those of at least one selected from the group consisting of general formulae (II-5) to (II-9) below.

(II-5)
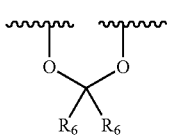

(II-6)
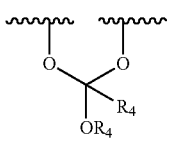

(II-7)
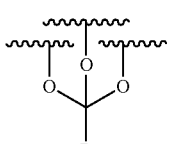

(II-8)
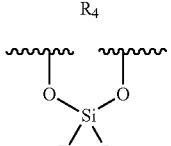

(II-9)
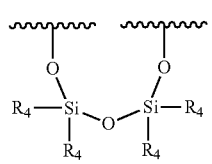

In the formulae,

R₄ is as defined above in general formulae (II-1) to (II-3).

Each of R₆s independently represents a hydrogen atom or a monovalent organic group, provided that R₆s may be bonded to each other to thereby form a ring.

The group that is decomposed when acted on by an acid to thereby produce an alcoholic hydroxyl group is more preferably any of those of at least one selected from among general formulae (II-1) to (II-3), further more preferably any of those of general formula (II-1) or (II-3) and most preferably any of those of general formula (II-1).

As mentioned above, R₃ represents a hydrogen atom or a monovalent organic group. R₃ is preferably a hydrogen atom, an alkyl group or a cycloalkyl group, more preferably a hydrogen atom or an alkyl group.

The alkyl group represented by R₃ may be in the form of a linear chain or a branched chain. The alkyl group represented by R₃ preferably has 1 to 10 carbon atoms, more preferably 1 to 3 carbon atoms. As the alkyl group represented by R₃, there can be mentioned, for example, a methyl group, an ethyl group, an n-propyl group, an isopropyl group or an n-butyl group.

The cycloalkyl group represented by R₃ may be monocyclic or polycyclic. The cycloalkyl group represented by R₃ preferably has 3 to 10 carbon atoms, more preferably 4 to 8 carbon atoms. As the cycloalkyl group represented by R₃, there can be mentioned, for example, a cyclopropyl group, a cyclobutyl group, a cyclopentyl group, a cyclohexyl group, a norbornyl group or an adamantyl group.

In general formula (II-1), it is preferred for at least one of R₃s to be a monovalent organic group. If so, an especially high sensitivity can be attained.

R₄ represents a monovalent organic group. R₄ is preferably an alkyl group or a cycloalkyl group, more preferably an alkyl group. One or more substituents may be introduced in the alkyl group and cycloalkyl group.

Preferably, the alkyl group represented by R₄ is unsubstituted, or one or more aryl groups and/or one or more silyl groups are introduced therein as substituents. The unsubstituted alkyl group preferably has 1 to 20 carbon atoms. The alkyl group moiety of the alkyl group substituted with one or more aryl groups preferably has 1 to 25 carbon atoms. The alkyl group moiety of the alkyl group substituted with one or more silyl groups preferably has 1 to 30 carbon atoms. When the cycloalkyl group represented by R₄ is unsubstituted, the number of carbon atoms thereof is preferably in the range of 3 to 20.

R₅ represents a hydrogen atom, an alkyl group, a cycloalkyl group, an aryl group, an alkenyl group or an alkynyl group, provided that when one or two of three R₅s are hydrogen atoms, at least one of the rest of R₅s represents an aryl group, an alkenyl group or an alkynyl group. R₅ is preferably a hydrogen atom or an alkyl group. The alkyl group may be substituted or unsubstituted. When the alkyl group is unsubstituted, it preferably has 1 to 6 carbon atoms, more preferably 1 to 3 carbon atoms.

As mentioned above, R₆ represents a hydrogen atom or a monovalent organic group. R₆ is preferably a hydrogen atom, an alkyl group or a cycloalkyl group, more preferably a hydrogen atom or an alkyl group and further more preferably a hydrogen atom or an unsubstituted alkyl group. In particular, $R_6$ is preferably a hydrogen atom or an alkyl group having 1 to 10 carbon atoms, more preferably a hydrogen atom or an unsubstituted alkyl group having 1 to 10 carbon atoms.

As the alkyl groups and cycloalkyl groups represented by $R_4$, $R_5$ and $R_6$, there can be mentioned, for example, those set forth above with respect to $R_3$.

Specific examples of the groups that are decomposed to thereby produce an alcoholic hydroxyl group when acted on by an acid will be shown below.

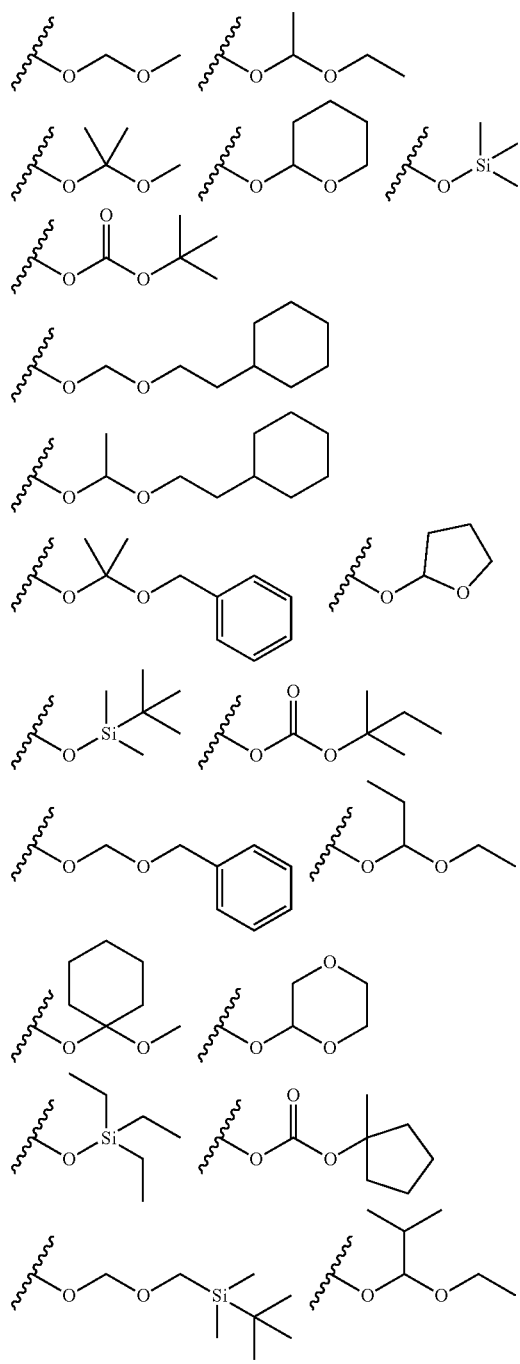

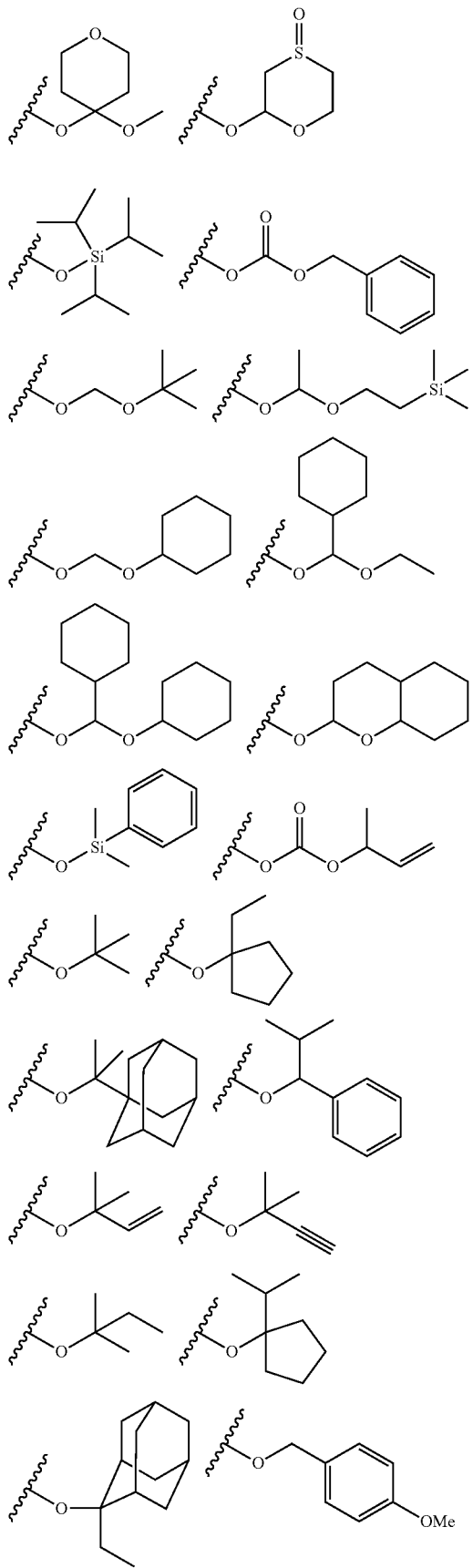

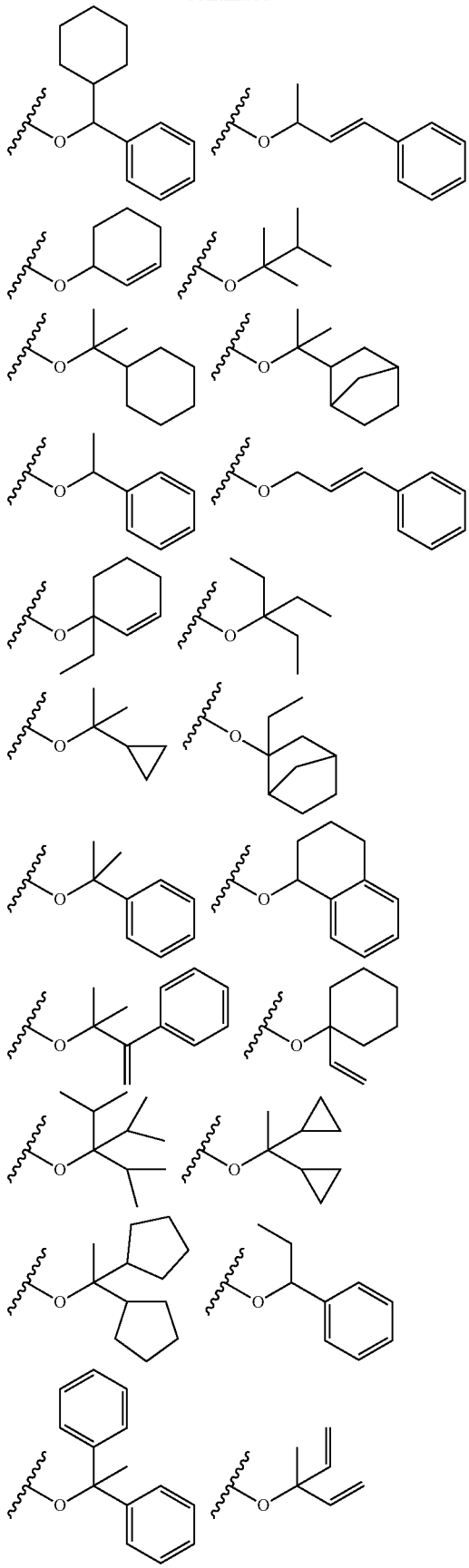

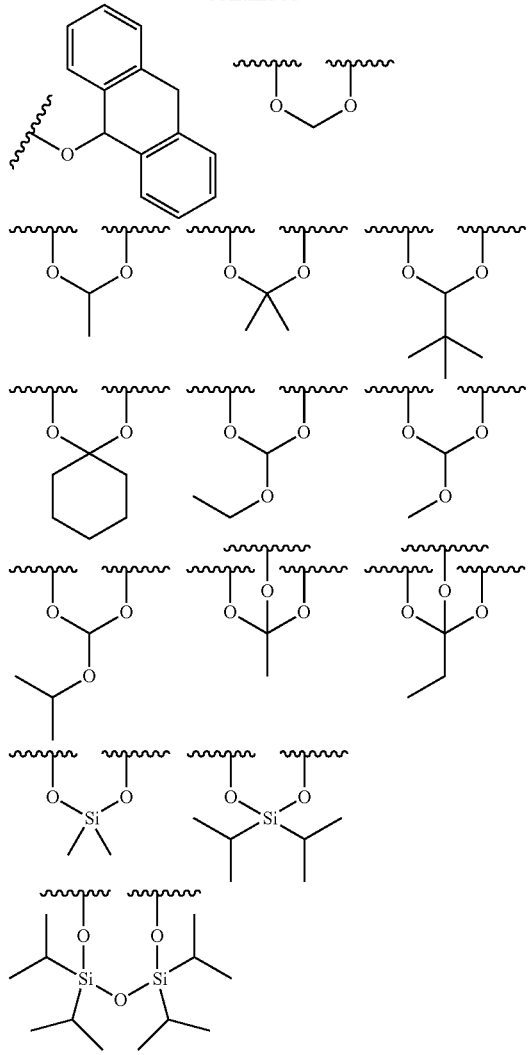

As mentioned above, it is especially preferred for the repeating unit (P) to be any of those of general formula (I-1) above. Further, it is especially preferred for the group that is decomposed when acted on by an acid to thereby produce an alcoholic hydroxyl group to be any of those of general formula (II-1) above. Therefore, it is especially preferred for the repeating unit (P) to be any of those of general formula (III) below.

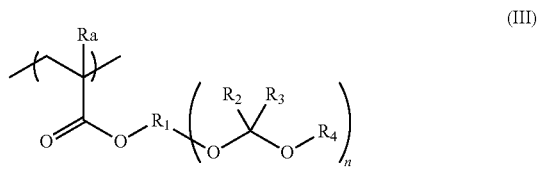

(III)

In the formula, $R_1$, Ra, $R_3$, $R_4$ and n are as defined above in connection with general formulae (I-1) and (II-1).

Moreover, as mentioned above, it is preferred for the repeating unit (P) to have a structure that is decomposed when acted on by an acid to thereby produce two or more alcoholic hydroxyl groups. As this repeating unit (P), there can be mentioned, for example, any of those having partial structures of general formula (D-1) below.

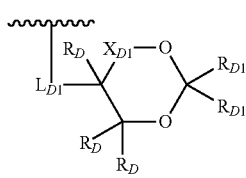

(D-1)

In the formula, $L_{D1}$ represents a single bond or a bivalent connecting group.

Each of $R_D$s independently represents a hydrogen atom, an alkyl group or a cycloalkyl group. At least two of three $R_D$s may be bonded to each other to thereby form a ring.

$X_{D1}$ represents a single bond or a connecting group having 1 or more carbon atoms.

$L_{D1}$, $R_D$ and $X_{D1}$ may be bonded to each other to thereby form a ring. Further, at least one of $L_{D1}$, $R_D$ and $X_{D1}$ may be bonded to a carbon atom as a constituent of the principal chain of a polymer to thereby form a ring.

Each of $R_{D1}$s independently represents a hydrogen atom, an alkyl group or a cycloalkyl group. Two $R_{D1}$s may be bonded to each other to thereby form a ring.

As the bi- or higher valent connecting group represented by $L_{D1}$, there can be mentioned, for example, —COO—, —OCO—, —CONH—, —O—, —Ar—, —SO$_3$—, —SO$_2$NH—, an alkylene group, a cycloalkylene group or a connecting group resulting from a combination of two or more of these. Herein, Ar represents a bivalent aromatic ring group.

When $L_{D1}$ contains an alkylene group, the alkylene group may be in the form of a linear chain or a branched chain. The alkylene group preferably has 1 to 6 carbon atoms, more preferably 1 to 3 carbon atoms and most preferably one carbon atom. As the alkylene group, there can be mentioned, for example, a methylene group, an ethylene group or a propylene group.

When $L_{D1}$ contains a cycloalkylene group, the cycloalkylene group preferably has 3 to 10 carbon atoms, more preferably 5 to 7 carbon atoms. As the cycloalkylene group, there can be mentioned, for example, a cyclopropylene group, a cyclobutylene group, a cyclopentylene group or a cyclohexylene group.

One or more substituents may be introduced in these alkylene and cycloalkylene groups. As such substituents, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; and an aryl group.

It is preferred for $L_{D1}$ to contain —COO—. $L_{D1}$ is more preferably a connecting group resulting from a combination of —COO— and an alkylene group, further more preferably any of connecting groups of the formula —COO—(CH$_2$)$_n$—, in which n is a natural number, preferably 1 to 6, more preferably 1 to 3 and most preferably 1.

When $L_{D1}$ is a connecting group resulting from a combination of —COO— and an alkylene group, a form in which the alkylene group and $R_D$ are bonded to each other to thereby form a ring is also preferred.

The alkyl group represented by $R_D$ may be in the form of a linear chain or a branched chain. The alkyl group preferably has 1 to 6 carbon atoms, more preferably 1 to 3 carbon atoms.

The cycloalkyl group represented by $R_D$ may be monocyclic or polycyclic. As the cycloalkyl group, there can be mentioned, for example, a cyclopentyl group, a cyclohexyl group, a cycloheptyl group, a norbornyl group or an adamantyl group.

The ring formed by the mutual bonding of at least two of three $R_D$s is preferably a 5- to 7-membered ring, more preferably a 6-membered ring.

As the connecting group having one or more carbon atoms represented by $X_{D1}$, there can be mentioned, for example, an alkylene group. The alkylene group may be in the form of a linear chain or a branched chain. The alkylene group preferably has 1 to 6 carbon atoms, more preferably 1 to 3 carbon atoms and most preferably one carbon atom. As the alkylene group, there can be mentioned, for example, a methylene group, an ethylene group or a propylene group.

The alkyl group represented by $R_{D1}$ may be in the form of a linear chain or a branched chain. The alkyl group preferably has 1 to 6 carbon atoms, more preferably 1 to 3 carbon atoms.

The cycloalkyl group represented by $R_{D1}$ may be monocyclic or polycyclic. As the cycloalkyl group, there can be mentioned, for example, any of those set forth above as the cycloalkyl groups represented by $R_D$.

The ring formed by the mutual bonding of two $R_{D1}$s may be monocyclic or polycyclic. However, the monocyclic ring is preferred from the viewpoint of solubility in solvents. The ring is preferably a 5- to 7-membered ring, more preferably a 6-membered ring.

The repeating units (P) of general formula (D-1) above typically have the structures of general formula (D-2) below.

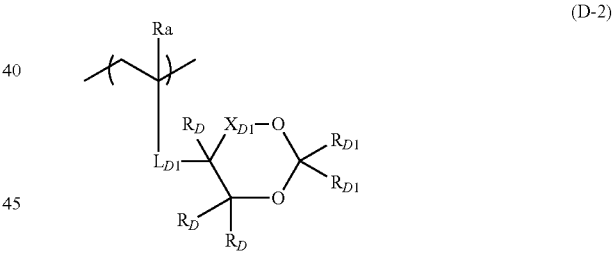

(D-2)

In the formula,

Ra is as defined in general formula (I-1) above. Ra is most preferably a methyl group.

$L_{D1}$, $R_D$, $X_{D1}$ and $R_{D1}$ are as defined in general formula (D-1) above.

Specific examples of the repeating units (P) of general formula (D-1) will be shown below.

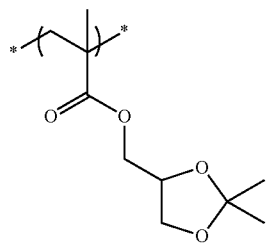

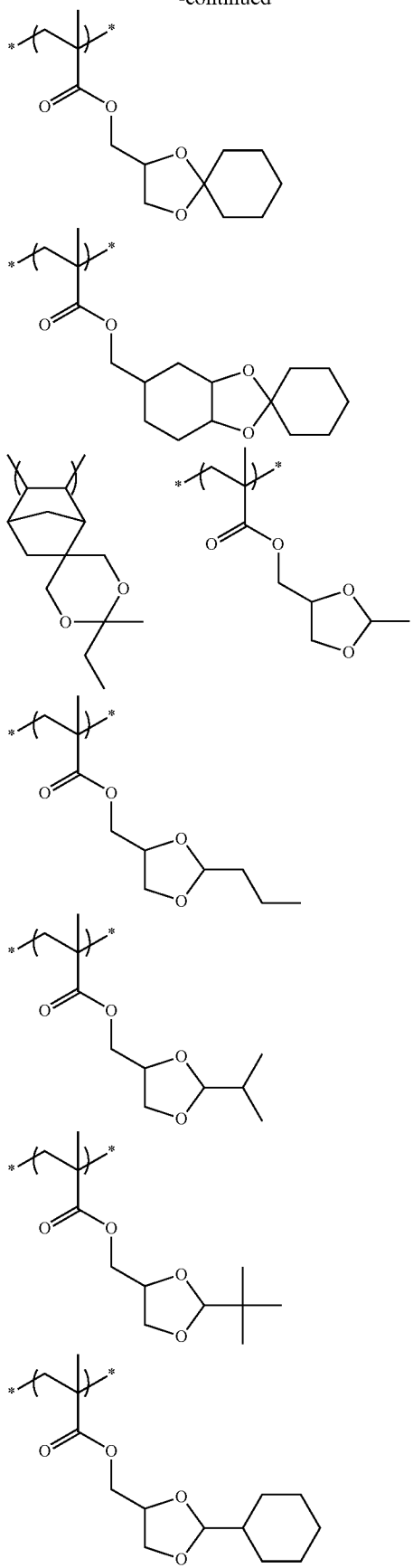
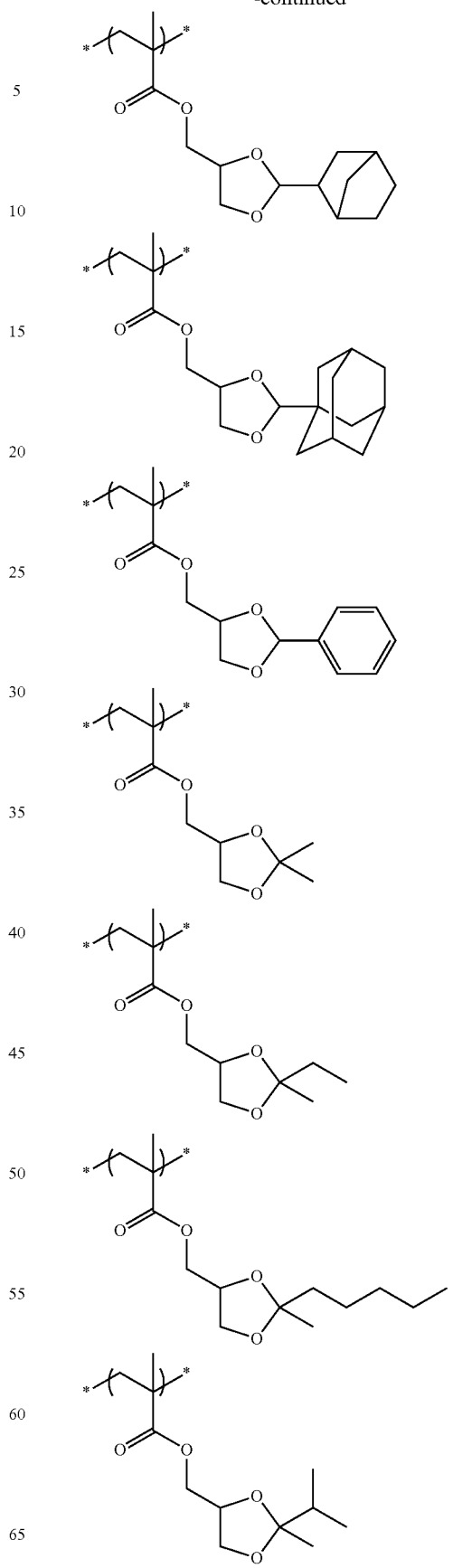

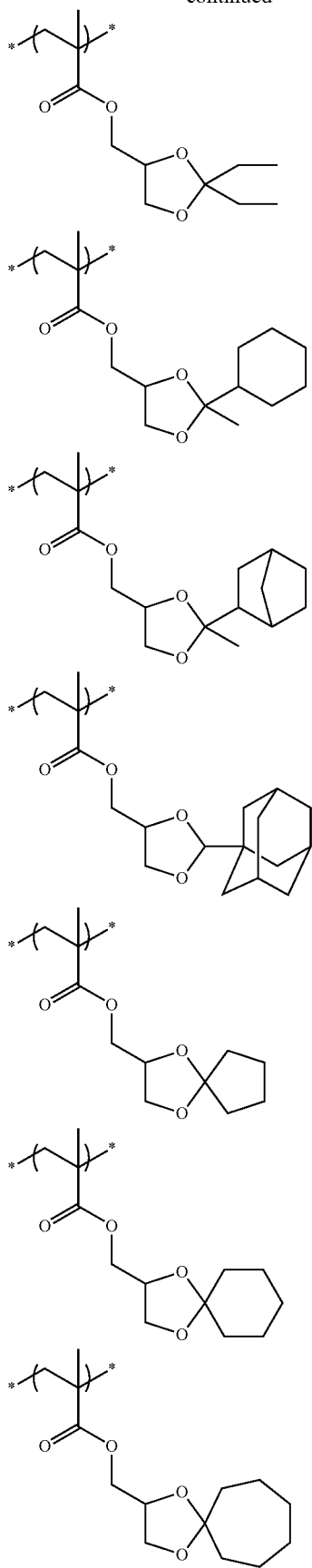
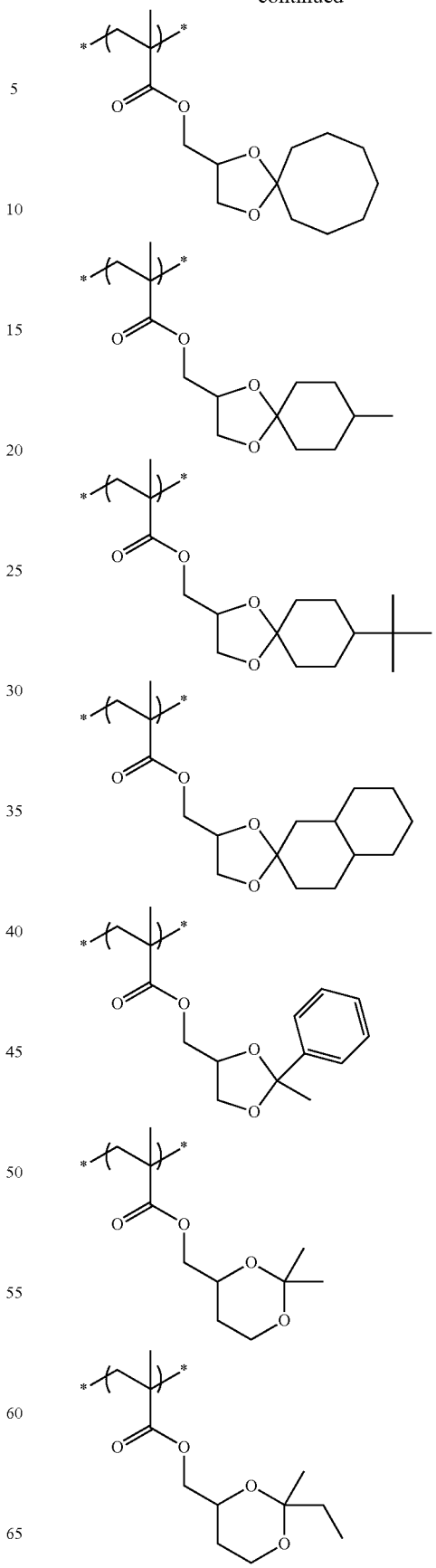

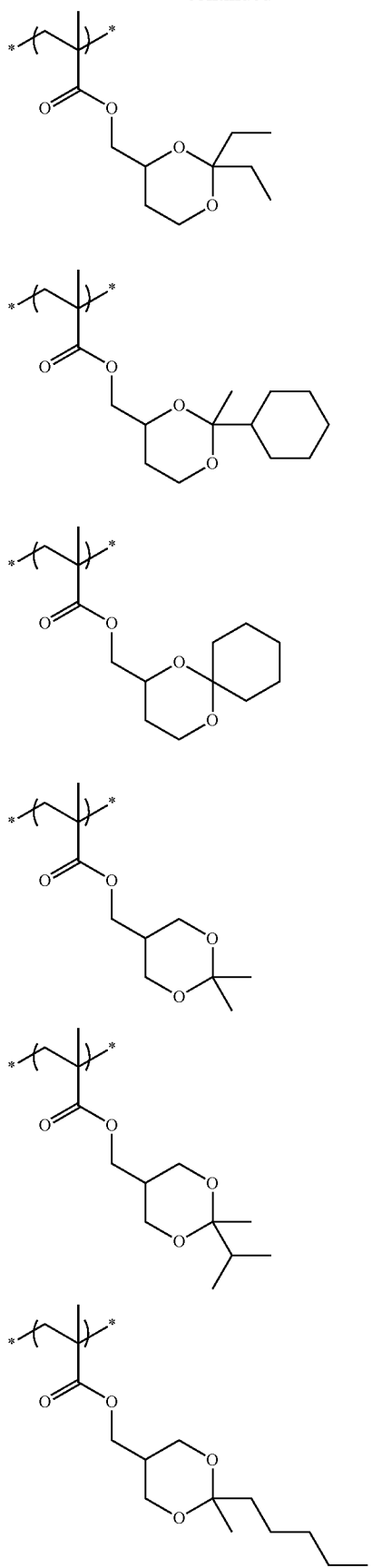
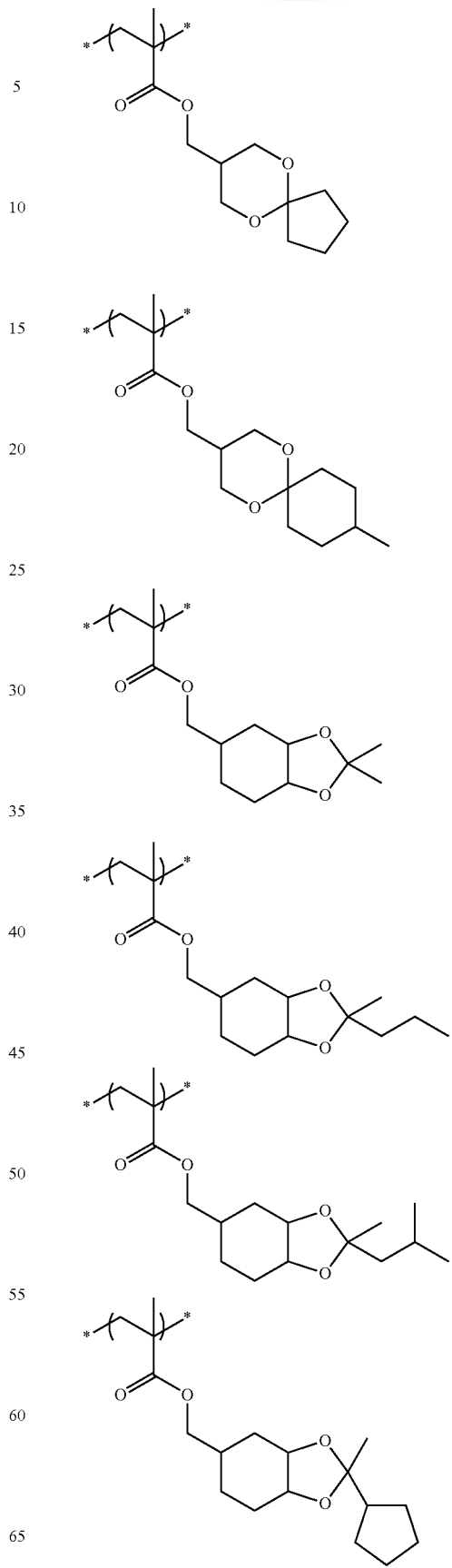

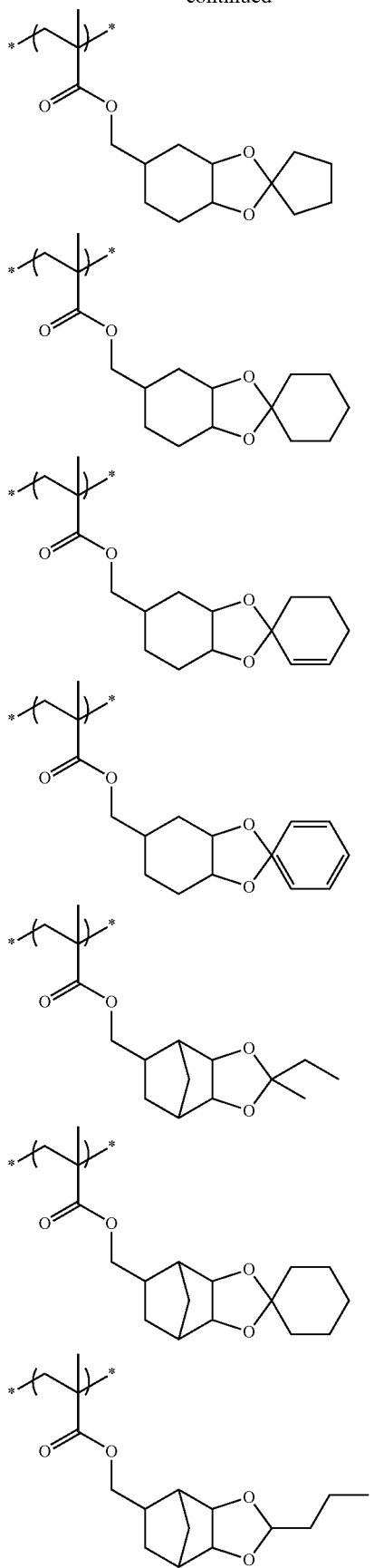
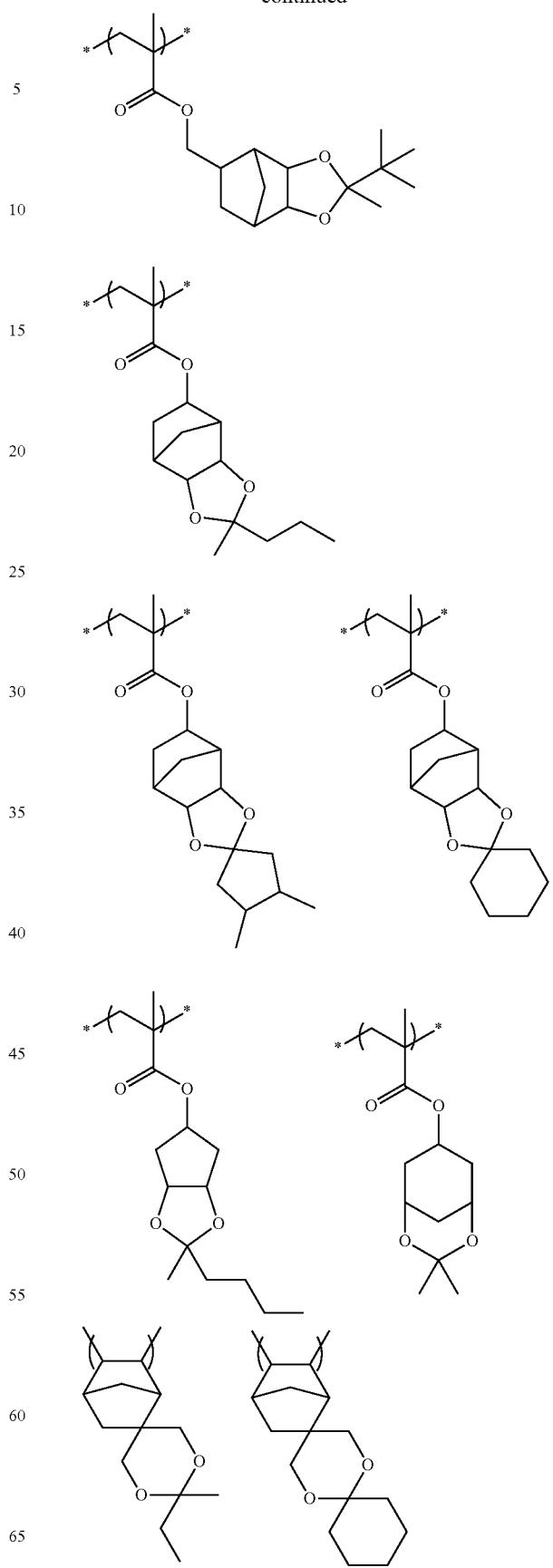

33
-continued
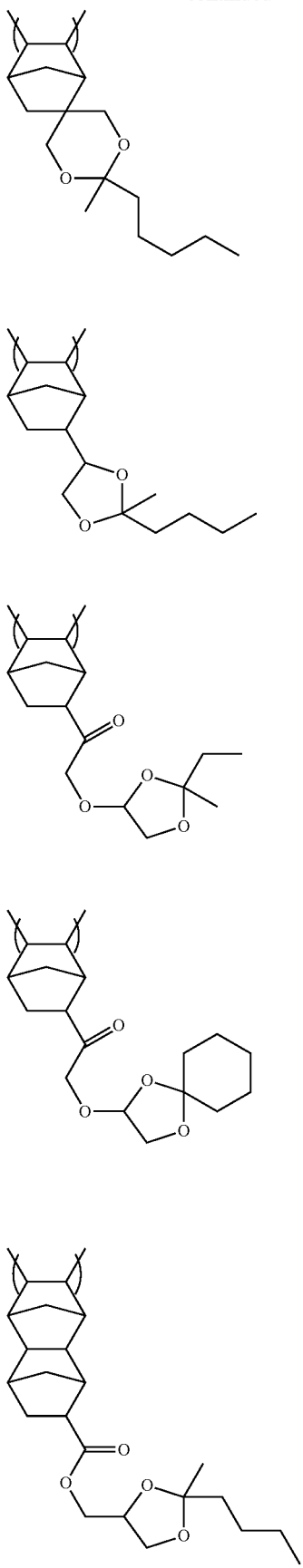
34
-continued
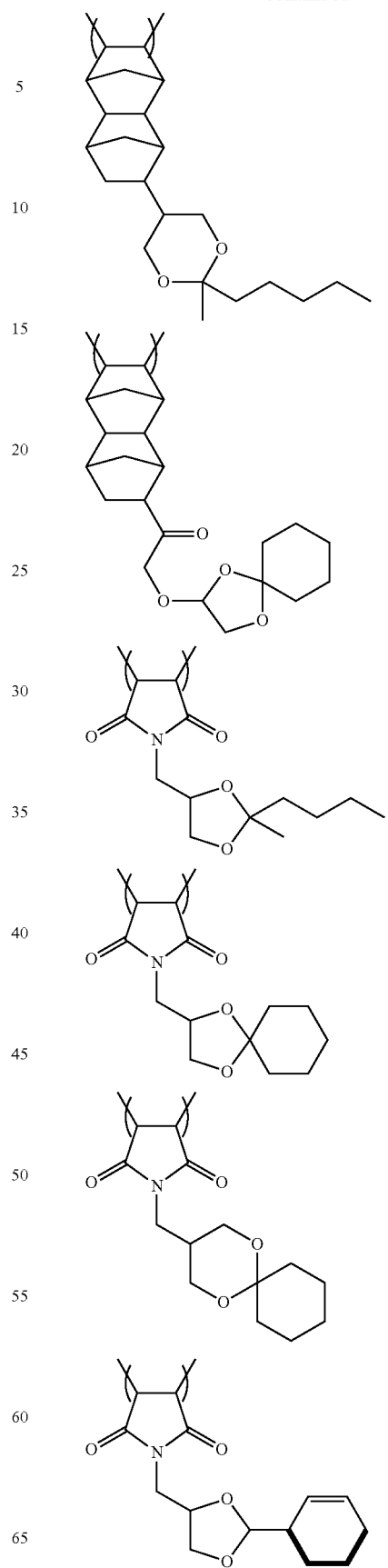

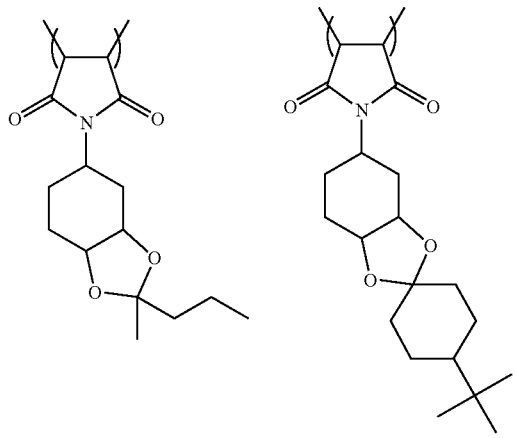

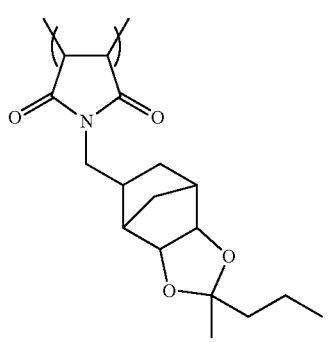

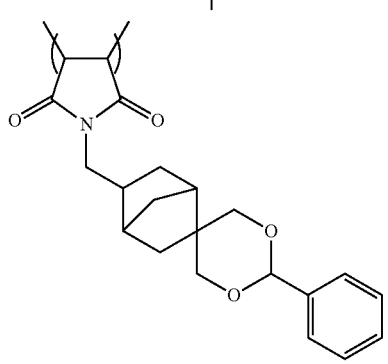

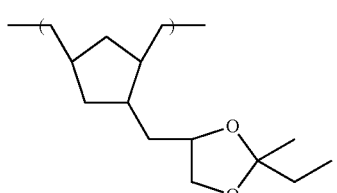

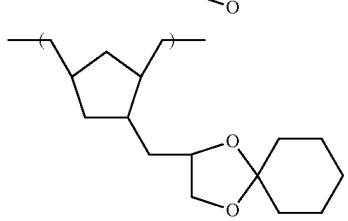

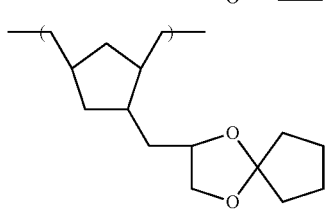

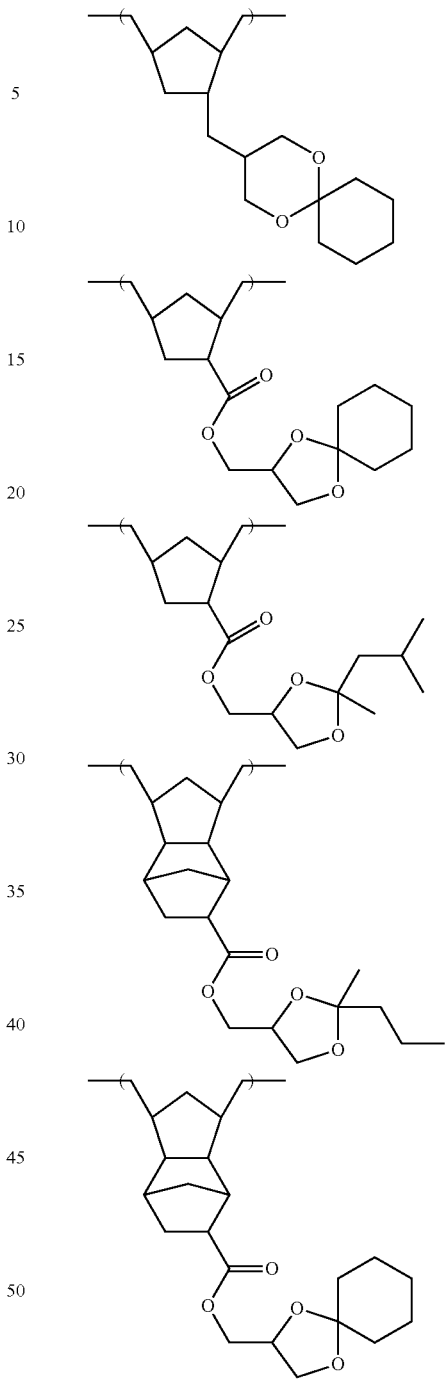

The acid-decomposable resin may contain two or more types of repeating units (P) each containing a group that is decomposed when acted on by an acid to thereby produce an alcoholic hydroxyl group. If so, fine regulation of reactivity and/or developability can be effected, thereby facilitating the optimization of various performances.

The content of repeating unit containing a group that is decomposed when acted on by an acid to thereby produce an alcoholic hydroxyl group, based on all the repeating units of the acid-decomposable resin, is preferably in the range of 10 to 100 mol %, more preferably 30 to 90 mol % and further more preferably 50 to 80 mol %.

The acid-decomposable resin may further contain repeating units other than the above repeating units (P). Examples of the other repeating units include the following.

(A) Repeating Unit Containing a Polar Group

It is preferred for the acid-decomposable resin to further contain a repeating unit (A) containing a polar group. If so, for example, the sensitivity of the composition comprising the acid-decomposable resin can be enhanced.

As the "polar group" that can be contained in the repeating unit (A), there can be mentioned, for example, functional groups (1) to (4) below. In the following, "electronegativity" means a value according to Pauling.

(1) Functional Group Containing a Structure in which an Oxygen Atom is Bonded Through a Single Bond to an Atom Whose Electronegativity Exhibits a Difference of 1.1 or Greater from that of the Oxygen Atom As this polar group, there can be mentioned, for example, a group containing the structure of O—H, such as a hydroxyl group.

(2) Functional Group Containing a Structure in which a Nitrogen Atom is Bonded Through a Single Bond to an Atom Whose Electronegativity Exhibits a Difference of 0.6 or Greater from that of the Nitrogen Atom As this polar group, there can be mentioned, for example, a group containing the structure of N—H, such as an amino group.

(3) Functional Group Containing a Structure in which Two Atoms Whose Electronegativity Values Exhibit a Difference of 0.5 or Greater are Bonded to Each Other Through a Double Bond or Triple Bond As this polar group, there can be mentioned, for example, a group containing the structure of C≡N, C=O, N=O, S=O or C=N.

(4) Functional Group Containing an Ionic Moiety

As this polar group, there can be mentioned, for example, a group containing the moiety of $N^+$ or $S^+$.

The "polar group" that can be contained in the repeating unit (A) is, for example, at least one selected from the group consisting of (I) a hydroxyl group, (II) a cyano group, (III) a lactone group, (IV) a carboxylate group or a sulfonate group, (V) an amido group, a sulfonamido group or a group corresponding to a derivative thereof, (VI) an ammonium group or a sulfonium group, and a group formed of a combination of two or more thereof.

It is especially preferred for the polar group to be an alcoholic hydroxyl group, a cyano group, a lactone group or a group containing a cyanolactone structure.

The exposure latitude (EL) of the composition comprising the acid-decomposable resin can be enhanced by causing the acid-decomposable resin to further contain a repeating unit containing an alcoholic hydroxyl group.

The sensitivity of the composition comprising the acid-decomposable resin can be enhanced by causing the acid-decomposable resin to further contain a repeating unit containing a cyano group.

The dissolution contrast to a developer containing an organic solvent of the composition can be enhanced by causing the acid-decomposable resin to further contain a repeating unit containing a lactone group. Also, if so, the dry etching resistance, applicability and adhesion to substrates of the composition comprising the acid-decomposable resin can also be enhanced.

The dissolution contrast to a developer containing an organic solvent of the composition can be enhanced by causing the acid-decomposable resin to further contain a repeating unit containing a group having a lactone structure containing a cyano group. Also, if so, the sensitivity, dry etching resistance, applicability and adhesion to substrates of the composition comprising the acid-decomposable resin can also be enhanced. In addition, if so, the functions respectively attributed to the cyano group and the lactone group can be introduced in a single repeating unit, so that the freedom of the design of the acid-decomposable resin can be increased.

Specific examples of the structures that can be contained in the "polar group" will be shown below.

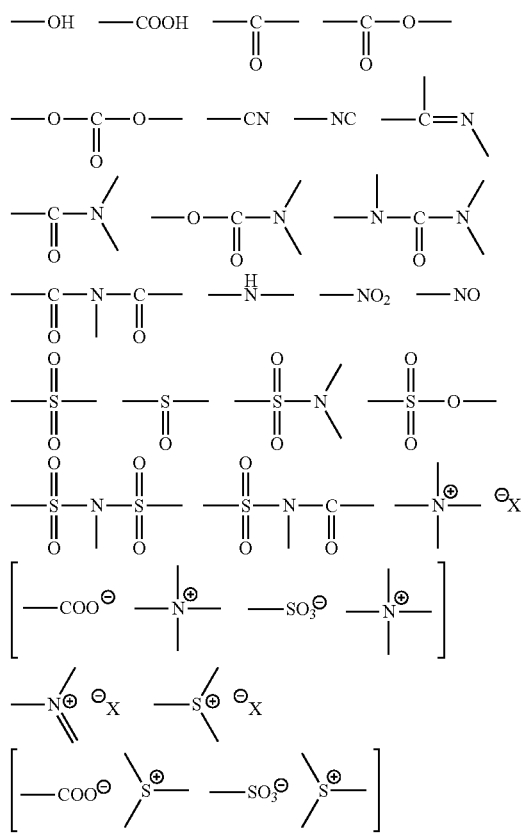

As preferred repeating units (A), there can be mentioned, for example, repeating units (P) as mentioned above wherein the "group capable of producing the group that is decomposed when acted on by an acid to thereby produce an alcoholic hydroxyl group" is replaced by an "alcoholic hydroxyl group."

It is preferred for the repeating unit (A) to have any of the structures of general formulae (I-1) to (I-10) above wherein "OP" is replaced by "OH." Namely, it is preferred for the repeating unit (A) to be any of those of at least one selected from the group consisting of general formulae (I-1H) to (I-10H) below. It is especially preferred for the repeating unit (A) to be any of those of at least one selected from the group consisting of general formulae (I-1H) to (I-3H) below. The repeating units of general formula (I-1H) below are further more preferred.

(I-1H)

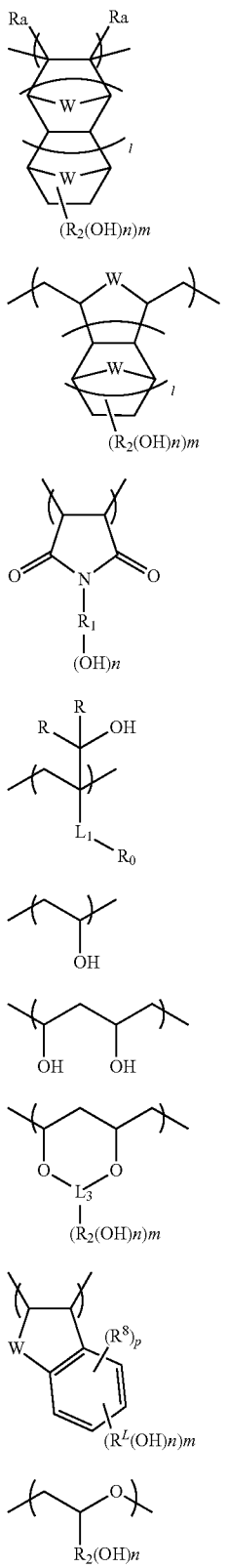

In the formulae, Ra, $R_1$, $R_2$, OP, W, n, m, l, $L_1$, R, $R_0$, $L_3$, $R^L$, $R^S$ and p are as defined above in general formulae (I-1) to (I-10).

When the repeating unit containing a group that is decomposed when acted on by an acid to thereby produce an alcoholic hydroxyl group is used in combination with any of the repeating units of at least one selected from the group consisting of general formulae (I-1H) to (I-10H) above, for example, the inhibition of acid diffusion by the alcoholic hydroxyl group cooperates with the sensitivity increase by the group that is decomposed when acted on by an acid to thereby produce an alcoholic hydroxyl group, thereby realizing an enhancement of exposure latitude (EL) without deterioration of other performance.

As the repeating units (A) resulting from replacement of the "group capable of producing the group that is decomposed when acted on by an acid to thereby produce an alcoholic hydroxyl group" by an "alcoholic hydroxyl group" in the above repeating units (P), use may be made of those containing the partial structures of general formula (D-1H) below or those of general formula (D-2H) below. Namely, the repeating units (A) may be those of general formula (D-1) or (D-2) above wherein the "group capable of producing the group that is decomposed when acted on by an acid to thereby produce an alcoholic hydroxyl group" is replaced by an "alcoholic hydroxyl group."

(D-1H)

(D-2H)

In the formulae, $L_{D1}$, $R_D$, $X_{D1}$ and Ra are as defined in general formulae (D-1) and (D-2) above.

The content of repeating unit (A) resulting from replacement of the "group capable of producing the group that is decomposed when acted on by an acid to thereby produce an alcoholic hydroxyl group" by an "alcoholic hydroxyl group" in the above repeating units (P), based on all the repeating units of the acid-decomposable resin, is preferably in the range of 5 to 100 mol %, more preferably 10 to 90 mol % and further more preferably 20 to 80 mol %.

Specific examples of the repeating units (A) resulting from replacement of the "group capable of producing the group that is decomposed when acted on by an acid to thereby produce an alcoholic hydroxyl group" by an "alcoholic hydroxyl group" in the above repeating units (P) will be shown below. In the specific examples, Ra is as defined in general formulae (I-1H) to (I-10H) above.

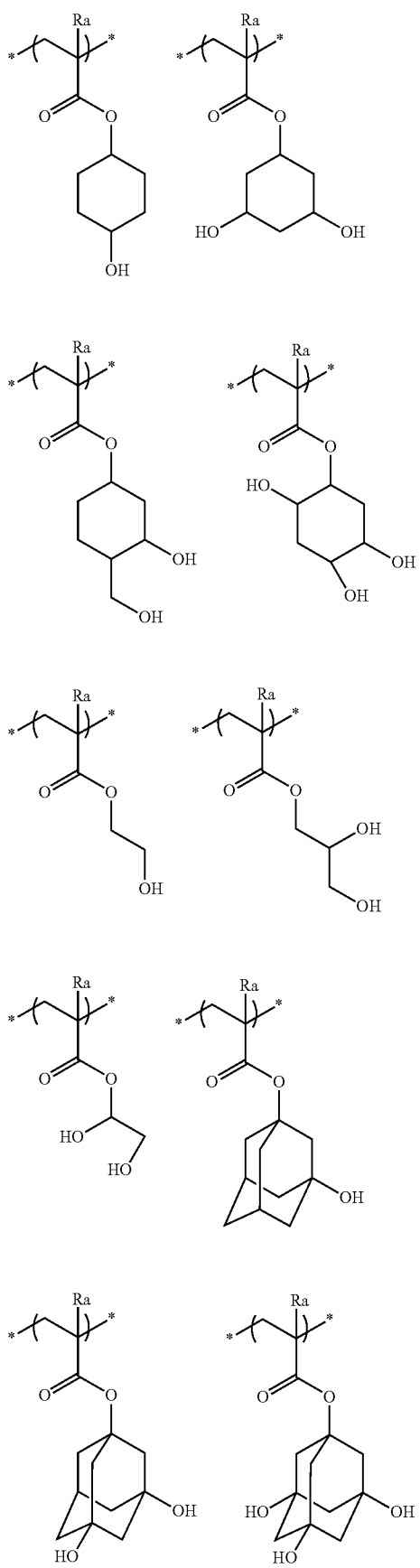
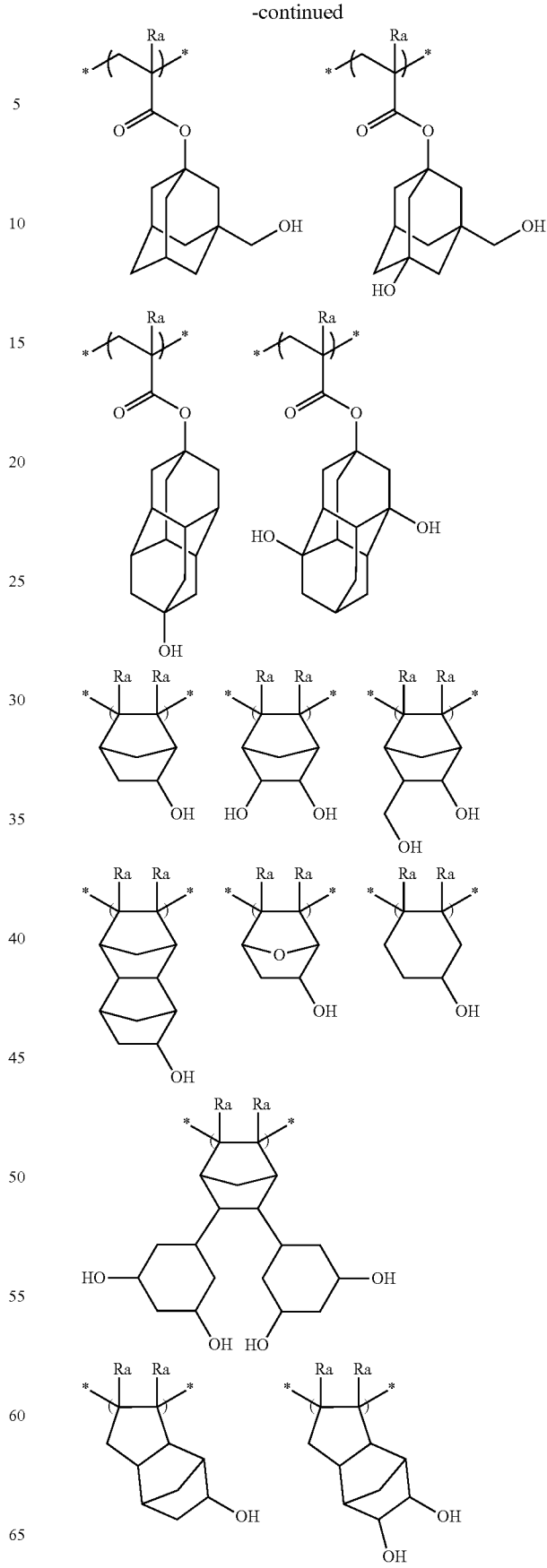
-continued

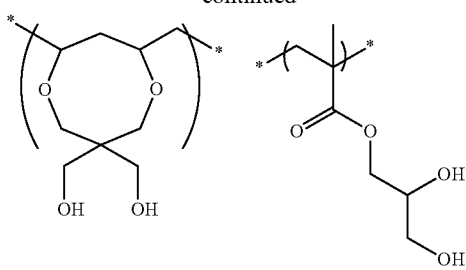

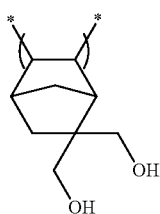

As other preferred repeating units (A), there can be mentioned, for example, a repeating unit containing a hydroxyl group or a cyano group. Introducing this repeating unit enhances the adherence to substrates and the affinity to developer.

A repeating unit containing a hydroxyl group or a cyano group is preferably a repeating unit having an alicyclic hydrocarbon structure substituted with a hydroxy group or a cyano group. Further, the repeating unit is preferably free from the acid-decomposable group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

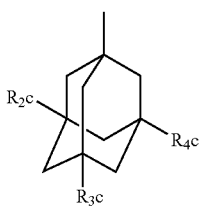
(VIIa)

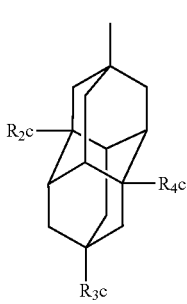
(VIIb)

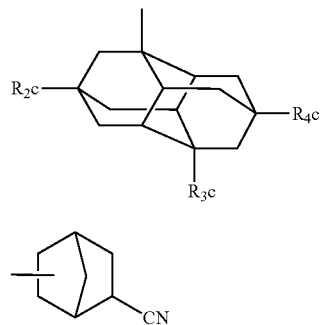
(VIIc)

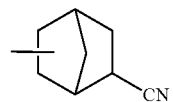
(VIId)

In the general formulae (VIIa) to (VIIc), each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. In the general formula (VIIa), more preferably, two of the $R_2c$ to $R_4c$ are hydroxy groups and the remainder is a hydrogen atom.

As the repeating units having any of the partial structures represented by the general formulae (VIIa) to (VIId), those of the following general formulae (AIIa) to (AIId) can be exemplified.

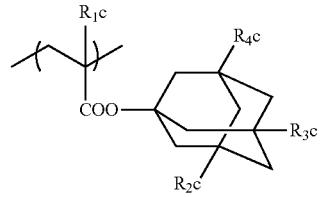
(AIIa)

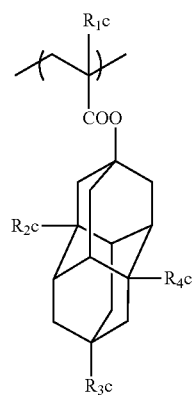
(AIIb)

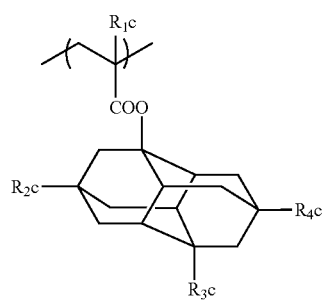
(AIIc)

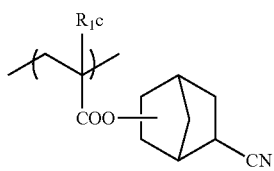

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIII).

The content of the repeating unit containing a hydroxyl group or a cyano group based on all the repeating units of the acid-composable resin is preferably in the range of 5 to 70 mol %, more preferably 5 to 60 mol % and further more preferably 10 to 50 mol %.

Specific examples of the repeating units containing a hydroxyl group or a cyano group will be shown below, which however in no way limit the scope of the present invention.

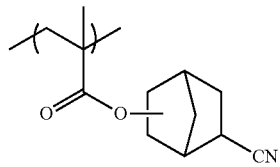

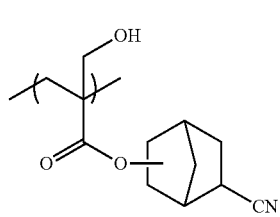

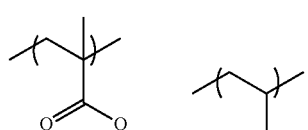

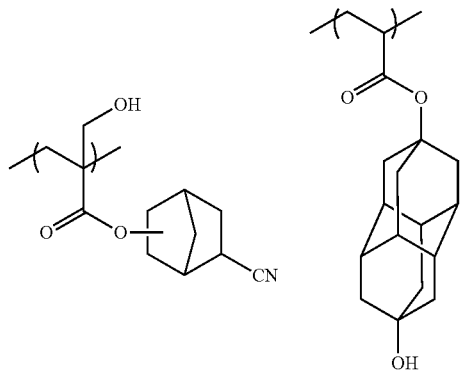

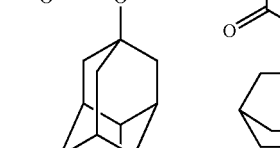

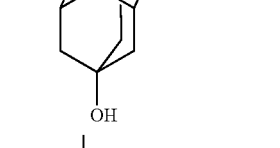

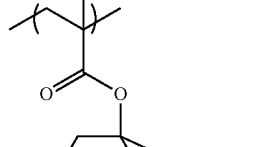

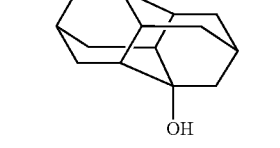

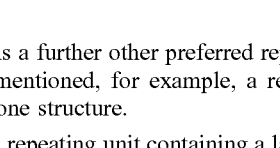

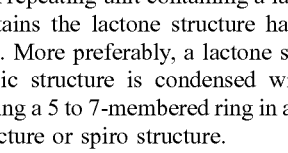

As a further other preferred repeating unit (A), there can be mentioned, for example, a repeating unit containing a lactone structure.

A repeating unit containing a lactone structure preferably contains the lactone structure having a 5 to 7-membered ring. More preferably, a lactone structure in which another cyclic structure is condensed with this lactone structure having a 5 to 7-membered ring in a fashion to form a bicyclo structure or spiro structure.

More specifically, lactone structures represented by any of general formulae (LC1-1) to (LC1-17) below can be exemplified. Of these, more preferred are those of formulae (LC1-1), (LC1-4), (LC1-5), (LC1-6), (LC1-13), (LC1-14), and (LC1-17). The use of these specified lactone structures would realize improvement in the line edge roughness and development defect.

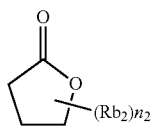 LC1-1
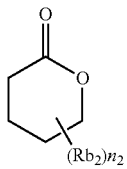 LC1-2
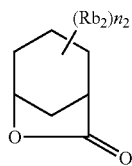 LC1-3
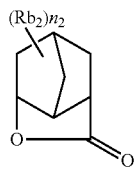 LC1-4
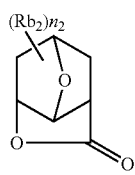 LC1-5
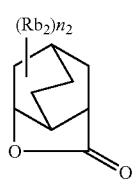 LC1-6
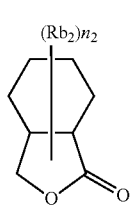 LC1-7
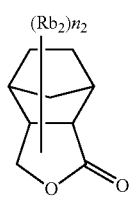 LC1-8
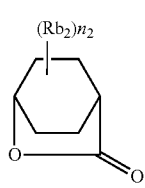 LC1-9
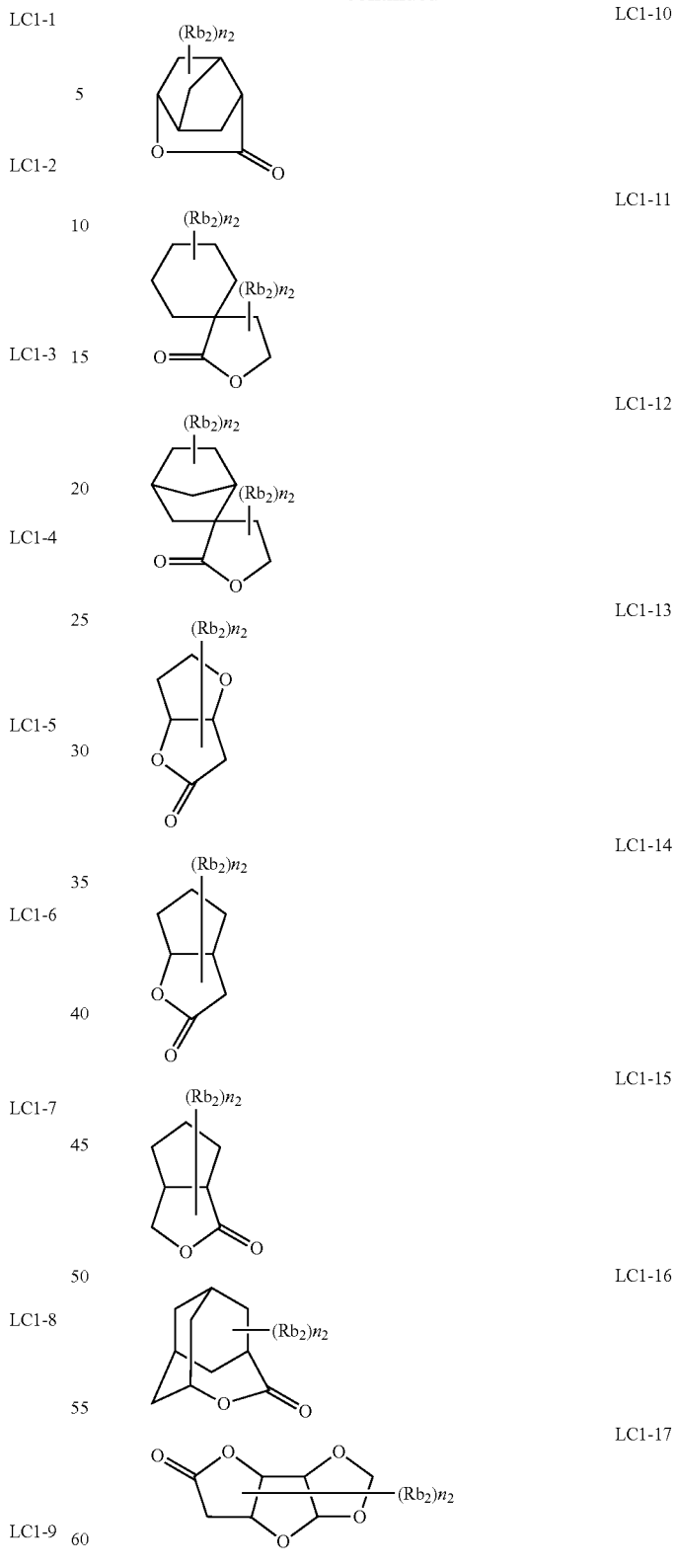
In the formulae, $Rb_2$ represents a substituent, and $n_2$ represents an integer of 0 to 4. Preferably, $n_2$ is an integer of 0 to 2.
As preferred $Rb_2$, there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group which will be described below, and the like. Of these, an alkyl group having 1 to 4 carbon atoms, a cyano group or an acid-decomposable group is particularly preferable.

When $n_2 \geq 2$, the plurality of $Rb_2$ may be identical to or different from each other. Further, the plurality of $Rb_2$ may be bonded to each other to thereby form a ring.

As the repeating unit containing a lactone structure, for example, a repeating unit represented by the general formula (AII') below can be exemplified.

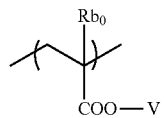

(AII')

In general formula (AII'), $Rb_0$ represents a hydrogen atom, a halogen atom or an alkyl group having 1 to 4 carbon atoms. As preferred substituents that may be introduced in the alkyl group represented by $Rb_0$, there can be mentioned a hydroxyl group and a halogen atom. As the halogen atom, there can be mentioned a fluorine atom, a chlorine atom, a bromine atom or an iodine atom. Preferably, $Rb_0$ represents a hydrogen atom, a methyl group, a hydroxymethyl group, or a trifluoromethyl group, and more preferably a hydrogen atom or a methyl group.

V represents any of the groups of the general formulae (LC1-1) to (LC1-17).

Specific examples of repeating unit containing a lactone structure will be shown below, which in no way limit the scope of the present invention.

In the formulae, Rx represents H, $CH_3$, $CH_2OH$, or $CF_3$.

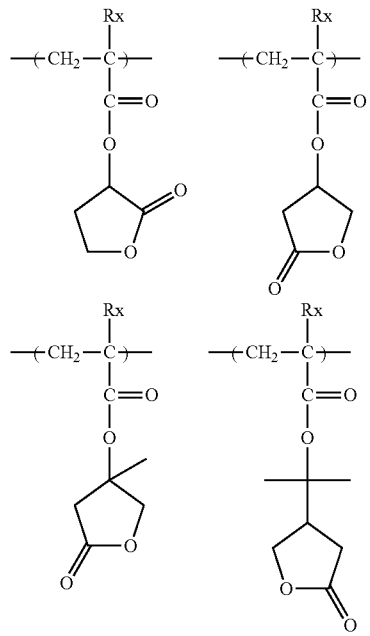

-continued

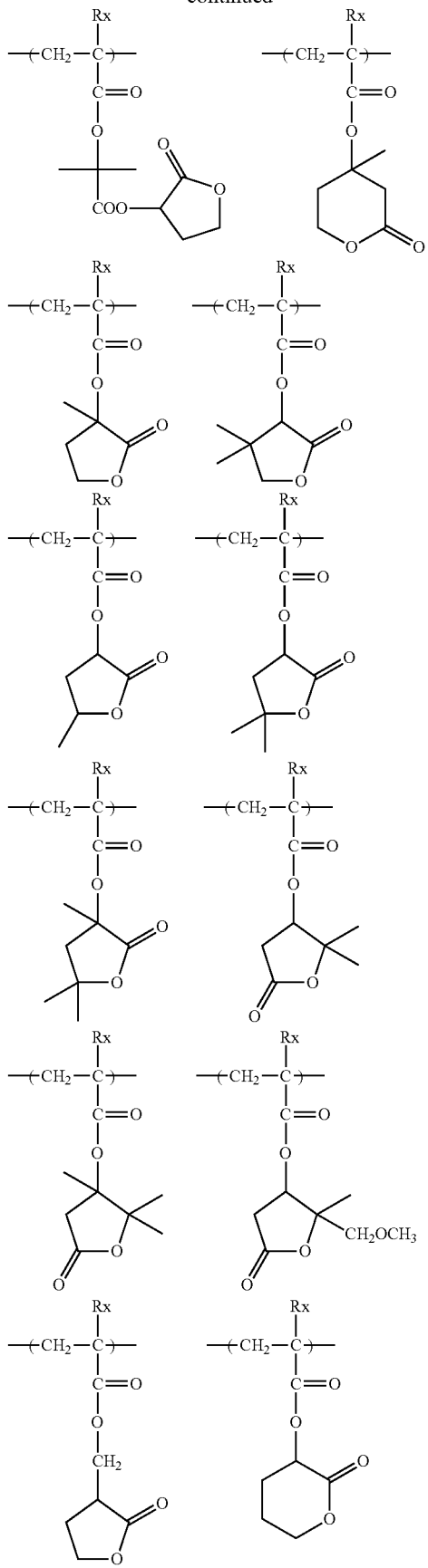

-continued
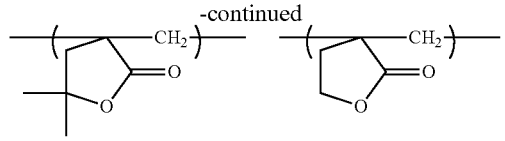
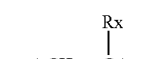 
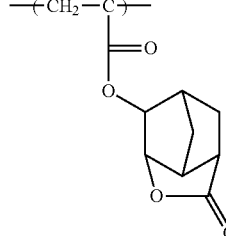
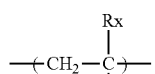 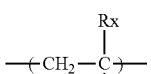
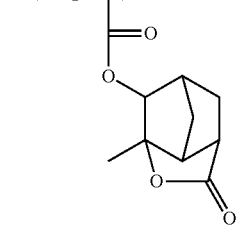
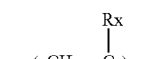 
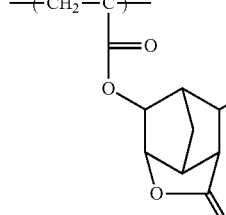
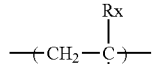 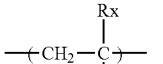
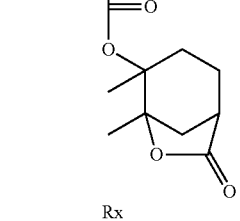
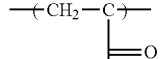 
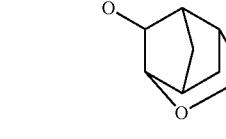
-continued
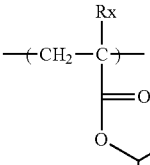 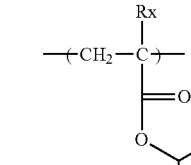
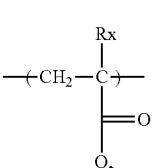
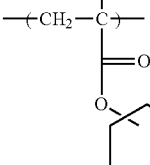
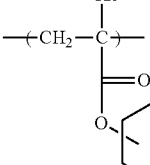
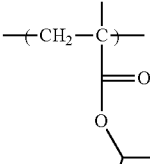
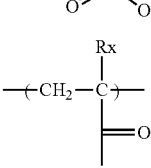
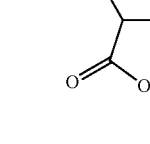

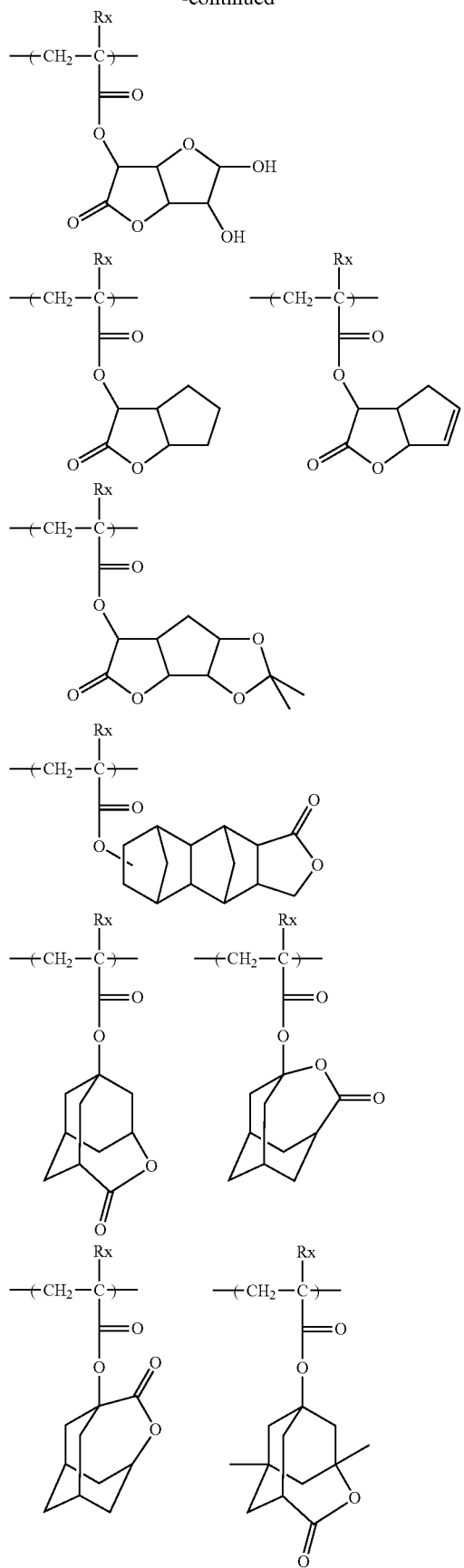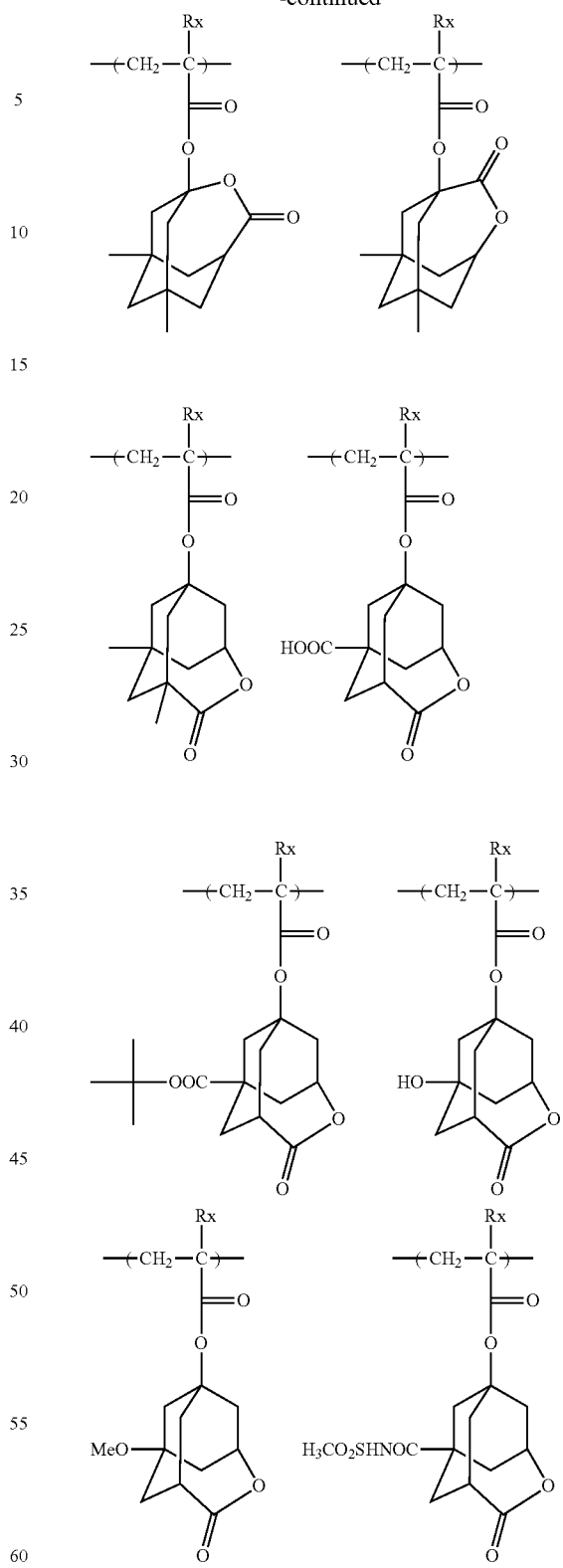
Preferred examples of the repeating units having a lactone structure are those shown below. For example, the pattern profile and/or iso/dense bias can be optimized by selecting the most appropriate lactone group. In the formulae, Rx represents H, $CH_3$, $CH_2OH$, Or $CF_3$.

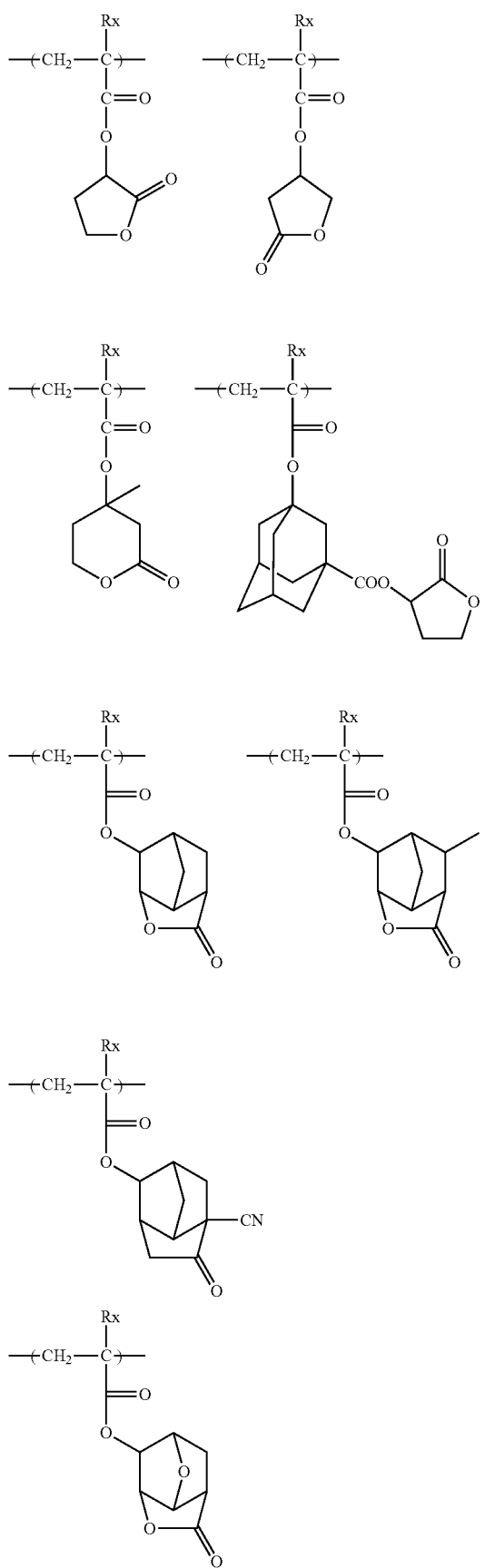

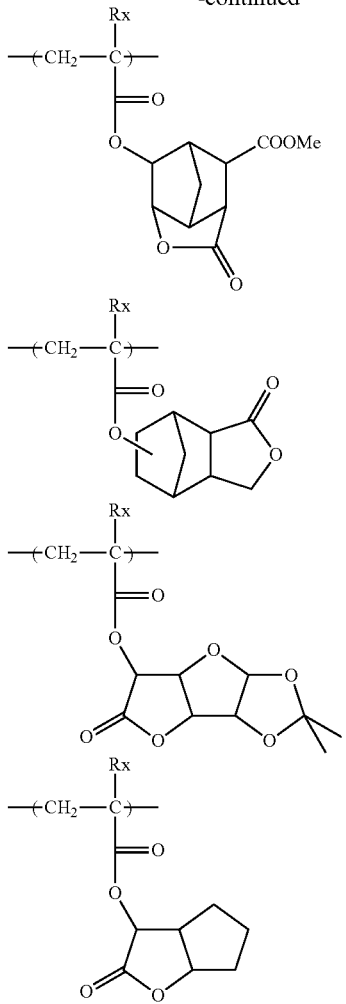

The repeating unit containing a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

The repeating unit containing a lactone group may be any of those of general formula (1) below.

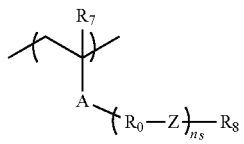

(1)

In general formula (1),

A represents an ester bond or an amido bond.

$R_0$, when $n_s \geq 2$ each of $R_0$s independently, represents an alkylene group, a cycloalkylene group or a combination thereof.

Z, when $n_s \geq 2$ each of Zs independently, represents an ether bond, an ester bond, an amido bond, any of urethane bonds of the formula:

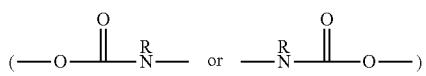

or any of urea bonds of the formula:

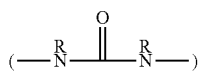

in which R represents, for example, a hydrogen atom, an alkyl group, a cycloalkyl group or an aryl group.

$R_8$ represents a monovalent organic group with a lactone structure.

In the general formula, $n_s$ is an integer of 1 to 5, preferably 1.

$R_7$ represents a hydrogen atom, an alkyl group or a halogen atom. One or more substituents may be introduced in the alkyl group. $R_7$ is preferably a hydrogen atom, a methyl group, a hydroxymethyl group or an acetoxymethyl group.

As mentioned above, $R_0$ represents an alkylene group, a cycloalkylene group or a combination thereof.

The alkylene group represented by $R_0$ may be in the form of a linear chain or a branched chain. The alkylene group preferably has 1 to 6 carbon atoms, more preferably 1 to 3 carbon atoms. As the alkylene group, there can be mentioned, for example, a methylene group, an ethylene group or a propylene group.

The cycloalkylene group represented by $R_0$ preferably has 3 to 10 carbon atoms, more preferably 5 to 7 carbon atoms. As the cycloalkylene group, there can be mentioned, for example, a cyclopropylene group, a cyclobutylene group, a cyclopentylene group or a cyclohexylene group.

One or more substituents may be introduced in these alkylene and cycloalkylene groups. As such substituents, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; and an aryl group.

As mentioned above, Z represents an ether bond, an ester bond, an amido bond, a urethane bond or a urea bond. Z is preferably an ether bond or an ester bond. An ester bond is especially preferred.

As mentioned above, $R_8$ is a monovalent organic group with a lactone structure. This organic group has, for example, any of the lactone structures of general formulae (LC1-1) to (LC1-17) above. Of these, the structures of general formulae (LC1-4), (LC1-5) and (LC1-17) are preferred. The structure of general formula (LC1-4) is especially preferred.

It is preferred for $R_8$ to have an unsubstituted lactone structure or a lactone structure in which a methyl group, a cyano group or an alkoxycarbonyl group is introduced as a substituent. Most preferably, $R_8$ is a monovalent organic group with a lactone structure in which one or more cyano groups are introduced as substituents (namely, a cyanolactone structure).

Specific examples of the repeating units of general formula (1) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

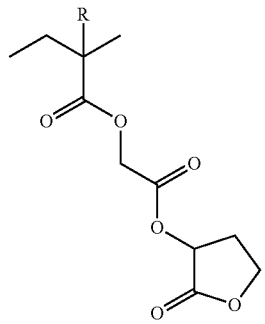

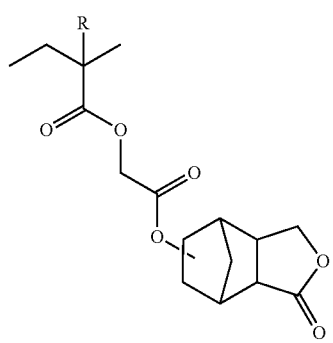

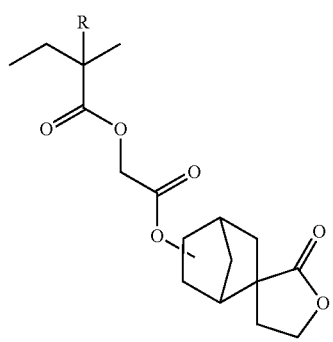

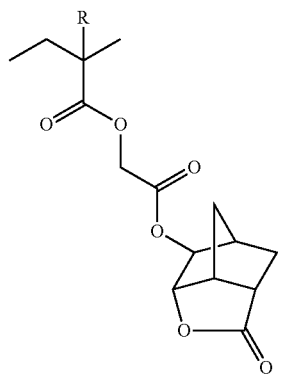

The repeating units of general formula (1) are preferably those of general formula (2) below.

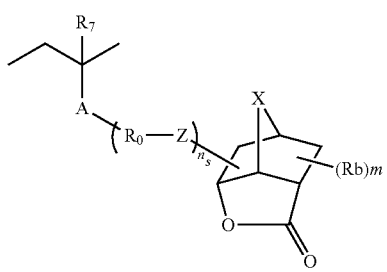
(2)

In general formula (2), $R_7$, A, $R_0$, Z and $n_s$ are as defined in general formula (1) above.

Rb, when m≥2 each of Rb's independently, represents an alkyl group, a cycloalkyl group, an alkoxycarbonyl group, a cyano group, a hydroxyl group or an alkoxy group. When m≥2, two or more Rb's may be bonded to each other to thereby form a ring.

X represents an alkylene group, an oxygen atom or a sulfur atom, and m is an integer of 0 to 5. Preferably, m is 0 or 1.

The alkyl group represented by Rb is preferably an alkyl group having 1 to 4 carbon atoms, more preferably a methyl group or an ethyl group, and most preferably a methyl group. As the cycloalkyl group, there can be mentioned, for example, a cyclopropyl group, a cyclobutyl group, a cyclopentyl group or a cyclohexyl group. As the alkoxycarbonyl group, there can be mentioned, for example, a methoxycarbonyl group, an ethoxycarbonyl group, an n-butoxycarbonyl group or a t-butoxycarbonyl group. As the alkoxy group, there can be mentioned, for example, a methoxy group, an ethoxy group, an n-butoxy group or a t-butoxy group. One or more substituents may be introduced in the alkyl group, cycloalkyl group, alkoxycarbonyl group and alkoxy group represented by Rb. As such substituents, there can be mentioned, for example, a hydroxyl group; an alkoxy group such as a methoxy group or an ethoxy group; a cyano group; and a halogen atom such as a fluorine atom. More preferably, Rb is a methyl group, a cyano group or an alkoxycarbonyl group, further more preferably a cyano group.

When m≥1, it is preferred for the substitution with at least one Rb to take place at the α- or β-position of the carbonyl group of the lactone. The substitution with. Rb at the α-position of the carbonyl group of the lactone is especially preferred.

As the alkylene group represented by X, there can be mentioned, for example, a methylene group or an ethylene group. X is preferably an oxygen atom or a methylene group, more preferably a methylene group.

Specific examples of the repeating units of general formula (2) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

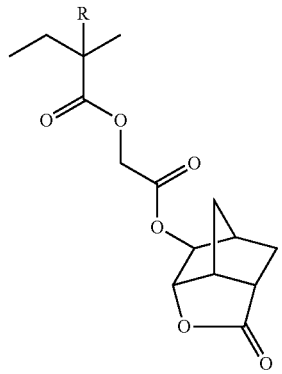

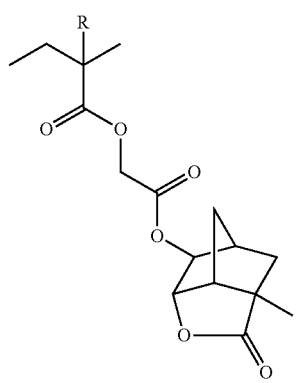

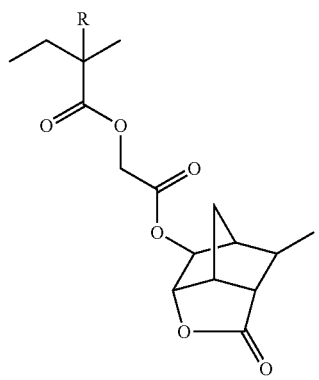

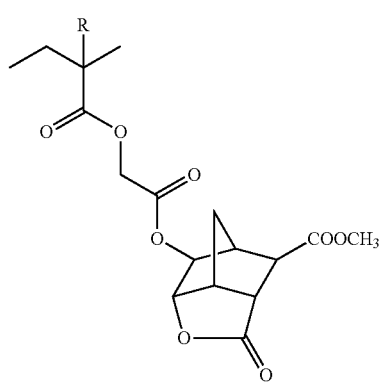

61
-continued
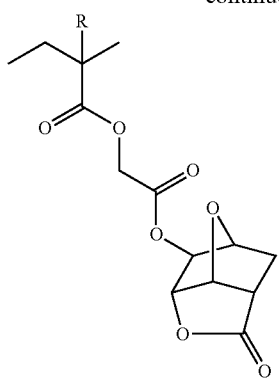
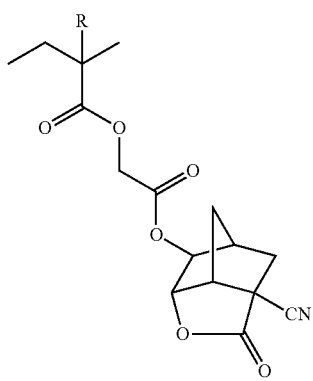
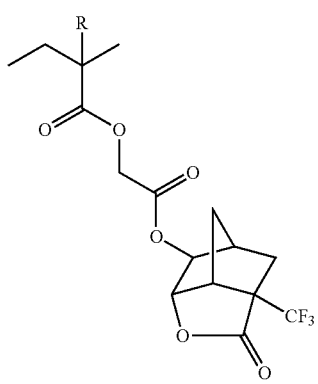
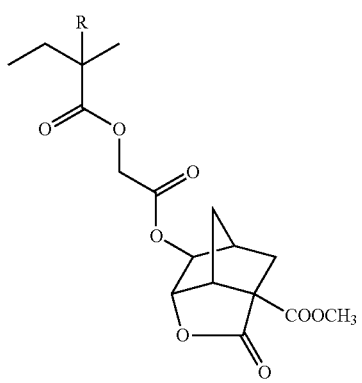
62
-continued
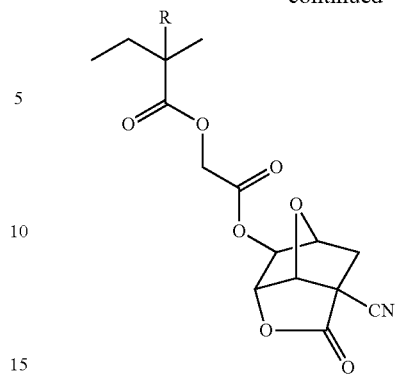
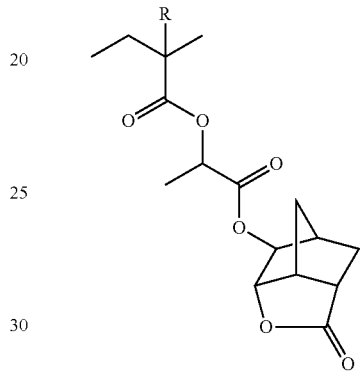
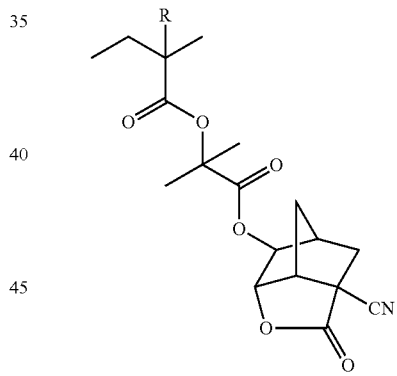
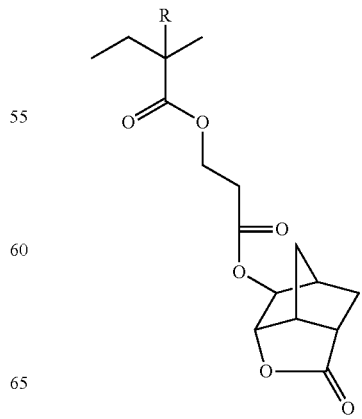

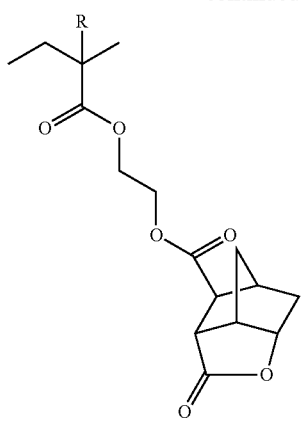
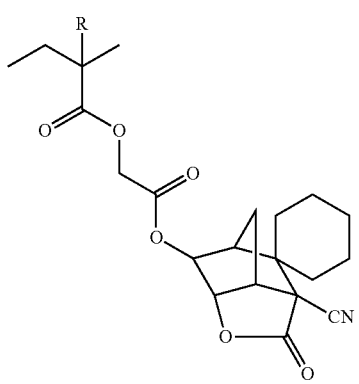
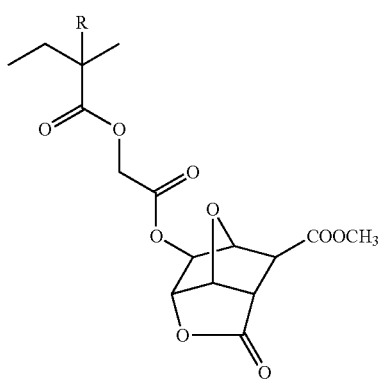
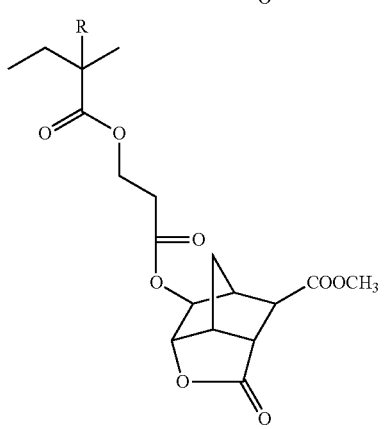
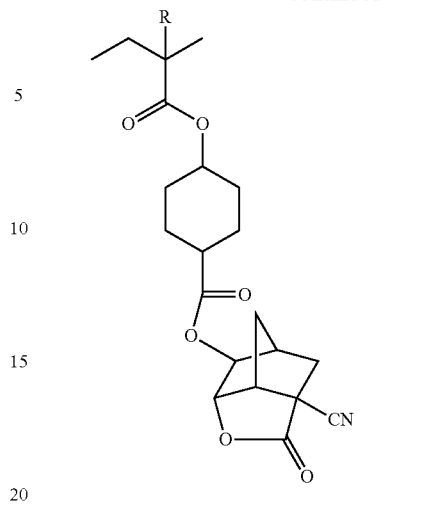
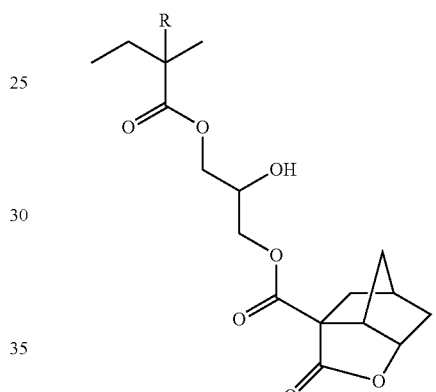
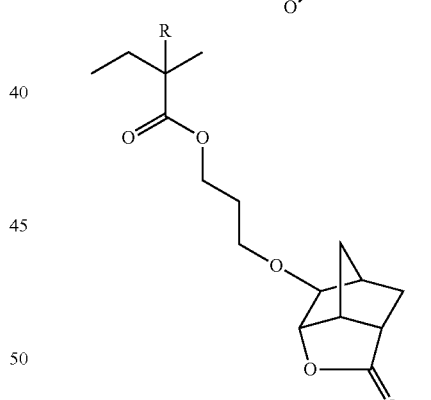
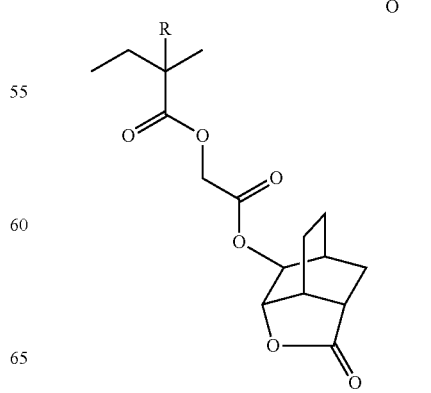

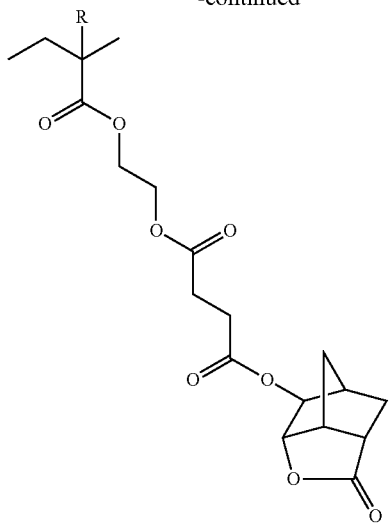

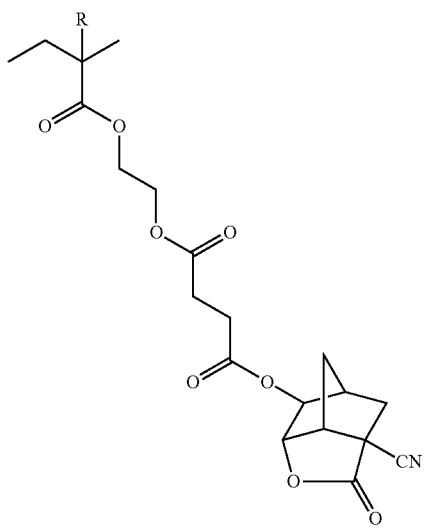

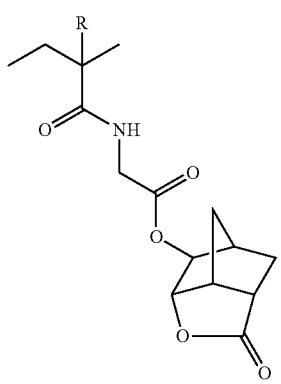

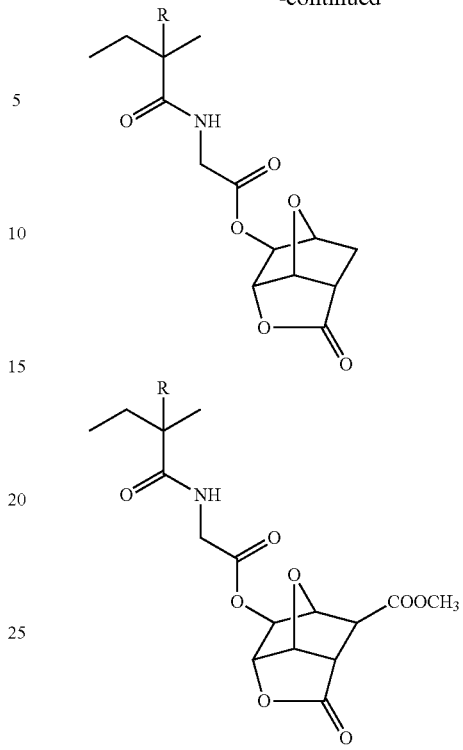

Two or more types of lactone repeating units selected from among those of general formula (1) can be simultaneously used in order to increase the effects of the present invention. In the simultaneous use, it is preferred to select two or more types of repeating units from among those of general formula (1) in which $n_s$ is 1 and simultaneously use the selected repeating units.

The content of the repeating unit containing a lactone structure based on all the repeating units of the resin is preferably in the range of 10 to 80 mol %, more preferably 15 to 70 mol % and further more preferably 20 to 60 mol %.

As other preferred repeating units (A), there can be mentioned, for example, those containing any of a carboxyl group, a sulfonamido group, a sulfonylimido group, a bis-sulfonylimido group and an aliphatic alcohol group substituted at its α-position with an electron withdrawing group (e.g., a hexafluoroisopropanol group). Of these, the repeating unit (A) containing a carboxyl group is more preferred.

The incorporation of the repeating unit containing any of these groups increases the resolution in contact hole usage. The repeating unit (A) is preferably any of a repeating unit wherein any of these groups is directly bonded to the principal chain of a resin such as a repeating unit of acrylic acid or methacrylic acid, a repeating unit wherein any of these groups is bonded via a connecting group to the principal chain of a resin and a repeating unit wherein any of these groups is introduced in a terminal of a polymer chain by the use of a chain transfer agent or polymerization initiator containing any of these groups in the stage of polymerization. The connecting group may have a mono- or polycyclohydrocarbon structure. The repeating unit of acrylic acid or methacrylic acid is especially preferred.

The content of the repeating unit (A) containing the above group based on all the repeating units of the acid-decomposable resin is preferably in the range of 0 to 20 mol %, more preferably 3 to 15 mol % and further more preferably 5 to 10 mol %.

Specific examples of the repeating unit (A) containing the above group will be shown below, which however in no way limit the scope of the present invention.

In the specific examples, Rx represents H, $CH_3$, $CH_2OH$ or $CF_3$.

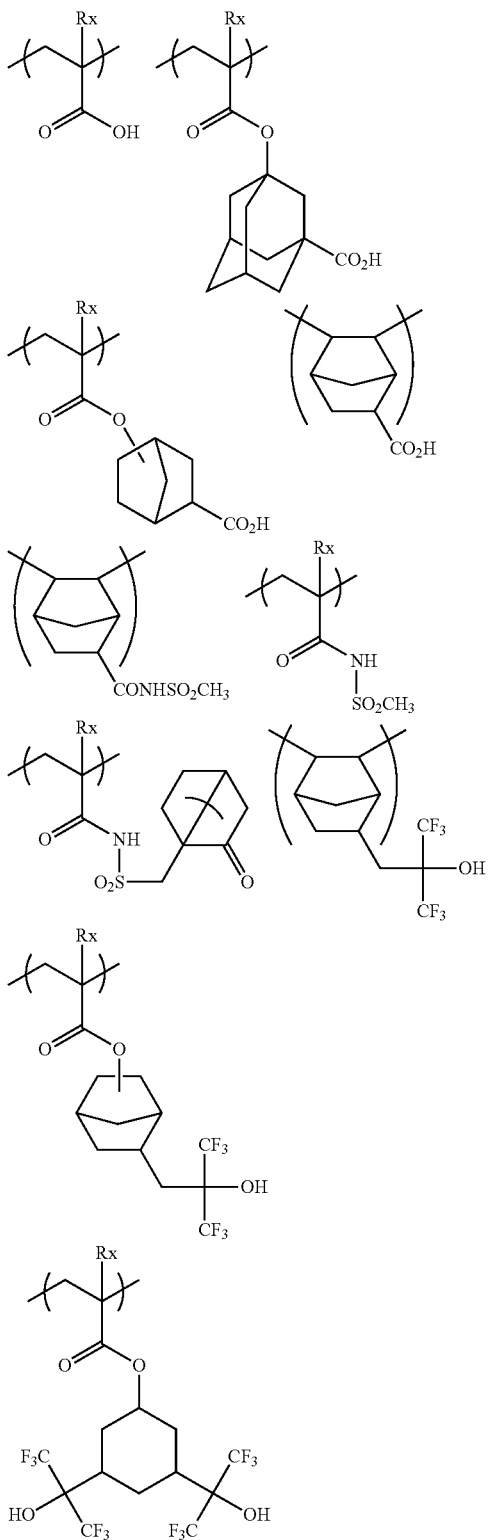

(B) Repeating Unit Containing a Group that is Decomposed when Acted on by an Acid to Thereby Produce a Polar Group Other than the Alcoholic Hydroxyl Group It is preferred for the acid-decomposable resin to further contain a repeating unit (B) containing a group that is decomposed when acted on by an acid to thereby produce a polar group other than the alcoholic hydroxyl group. It is especially preferred for the acid-decomposable resin to further contain a repeating unit containing a group that is decomposed when acted on by an acid to thereby produce a carboxyl group. If so, the focus latitude (depth of focus DOF) of the composition comprising the acid-decomposable resin can be enhanced.

It is preferred for the repeating unit (B) to have a structure in which the polar group is protected by a group that is decomposed when acted on by an acid to thereby be cleaved. As this polar group, there can be mentioned, for example, a phenolic hydroxyl group, a carboxyl group, a sulfonate group, a sulfonamido group, a sulfonylimido group, a (alkylsulfonyl)(alkylcarbonyl)methylene group, a (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like. As preferred polar groups, there can be mentioned a carboxyl group and a sulfonate group.

The acid-decomposable group is preferably a group as obtained by substituting the hydrogen atom of any of these polar groups with a group that is cleaved by the action of an acid.

As a group that is cleaved by the action of an acid, there can be mentioned, for example, a group represented by —$C(R_{36})(R_{37})(R_{38})$, —$C(R_{36})(R_{37})(OR_{39})$ or —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like. Particularly preferred is a tertiary alkyl ester group.

It is preferred for the repeating unit containing an acid-decomposable group that can be contained in the acid-decomposable resin to be any of those of general formula (AI) below.

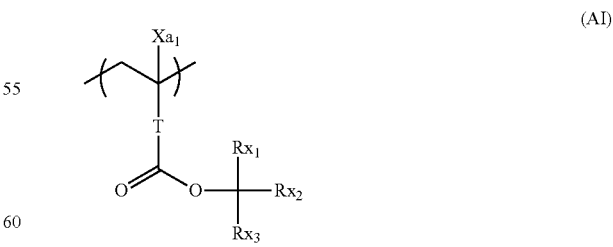

(AI)

In general formula (AI), $Xa_1$ represents a hydrogen atom, an optionally substituted methyl group, or a group represented by —$CH_2$—$R_9$. $R_9$ represents a hydroxyl group or a monovalent organic group. $R_9$ preferably represents an alkyl or an acyl group having 5 or less carbon atoms, more preferably an alkyl group having 3 or less carbon atoms, and further more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents a linear or branched alkyl group or a mono- or polycycloalkyl group.

At least two of $Rx_1$ to $Rx_3$ may be bonded to each other to thereby form a mono- or polycycloalkyl group.

As the bivalent connecting group represented by T, there can be mentioned, for example, an alkylene group, a group of the formula —(COO—Rt)- or a group of the formula —(O—Rt)-. In the formulae, Rt represents an alkylene group or a cycloalkylene group.

T is preferably a single bond or a group of the formula —(COO—Rt)-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group. Cycloalkyl groups having 5 or 6 carbon atoms are especially preferred.

In an especially preferred mode, $Rx_1$ is a methyl group or an ethyl group, and $Rx_2$ and $Rx_3$ are bonded to each other to thereby form any of the above-mentioned cycloalkyl groups.

One or more substituents may further be introduced in each of the groups above. As the substituents, there can be mentioned, for example, an alkyl group (preferably having 1 to 4 carbon atoms), a halogen atom, a hydroxy group, an alkoxy group (preferably having 1 to 4 carbon atoms), a carboxyl group, an alkoxycarbonyl group (preferably having 2 to 6 carbon atoms). Preferably, each of the substituents has 8 or less carbon atoms.

It is more preferred for the acid-decomposable resin to contain, as the repeating units of general formula (AI), any of the repeating units of general formula (I) below and/or any of the repeating units of general formula (II) below.

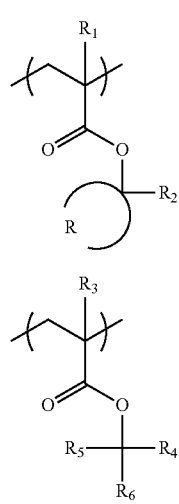

(I)

(II)

In general formulae (I) and (II), each of $R_1$ and $R_3$ independently represents a hydrogen atom, an optionally substituted methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and one or more substituents may be introduced therein.

The cycloalkyl group represented by $R_2$ may be monocyclic or polycyclic, and a substituent may be introduced therein.

$R_2$ preferably represents an alkyl group, more preferably an alkyl group having 1 to 10 carbon atoms, further more preferably 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and one or more substituents may be introduced therein. The alkyl groups are preferably those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and a substituent may be introduced therein. The cycloalkyl groups are preferably a monocycloalkyl group, such as a cyclopentyl group or a cyclohexyl group, and a polycycloalkyl group, such as a norbornyl group, a tetracyclodecanyl group, a tetracyclododecanyl group or an adamantyl group.

As the repeating units of general formula (I), there can be mentioned, for example, those of general formula (I-a) below.

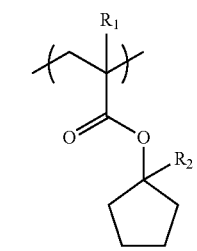

(1-a)

In the formula, $R_1$ and $R_2$ have the same meaning as in general formula (I).

The repeating units of general formula (II) are preferably those of general formula (II-1) below.

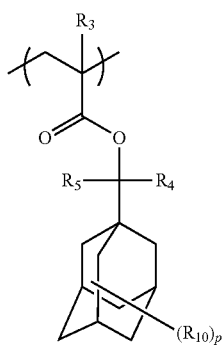
(II-1)

In general formula (II-1), $R_3$ to $R_5$ have the same meaning as in general formula (II).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, in which a hydroxyl group, a cyano group, an amino group, an alkylamido group or a sulfonamido group is introduced. An alkyl group in which a hydroxyl group is introduced is preferred. An isopropyl group is especially preferred as the branched alkyl group.

In the formula, p is an integer of 0 to 15, preferably in the range of 0 to 2, and more preferably 0 or 1.

It is more preferred for the acid-decomposable resin to be a resin containing, as the repeating units of general formula (AI), at least either any of the repeating units of general formula (I) or any of the repeating units of general formula (II). In another form, it is more preferred for the acid-decomposable resin to be a resin containing, as the repeating units of general formula (AI), at least two types selected from among the repeating units of general formula (I).

When the resin contains the repeating unit (B), the sum of contents of which based on all the repeating units of the resin is preferably in the range of 3 to 50 mol %, more preferably 5 to 40 mol % and further more preferably 7 to 30 mol %.

In this case, molar ratio of repeating unit (B) and repeating unit (P) is preferably in the range of 5:95 to 70:30, more preferably 7:93 to 50:50, and further more preferably 10:90 to 30:70.

Specific examples of the preferred repeating units (B) will be shown below, which however in no way limit the scope of the present invention.

In the specific examples, Rx and Xa1 each represents a hydrogen atom, $CH_3$, $CF_3$ or $CH_2OH$. Each of Rxa and Rxb represents an alkyl group having 1 to 4 carbon atoms. Z or each of Zs independently represents a substituent containing one or more polar groups. P represents 0 or a positive integer.

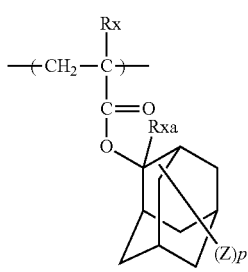
1

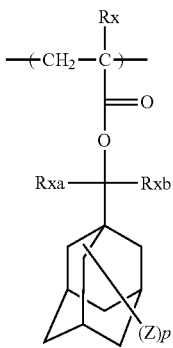
2

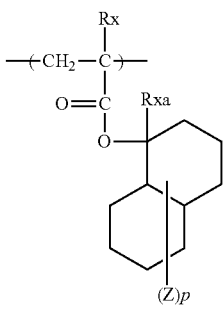
3

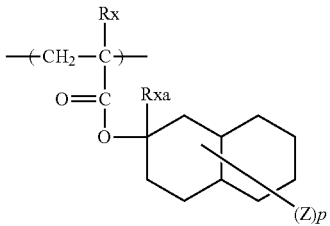
4

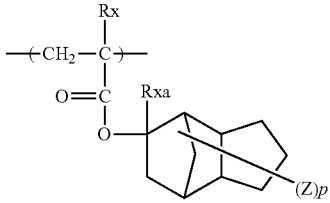
5

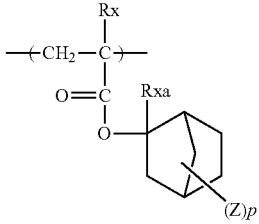
6

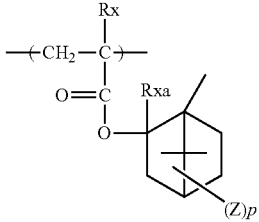
7

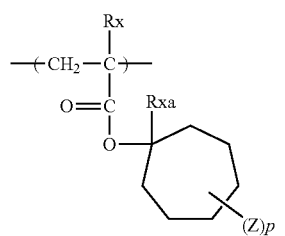
8
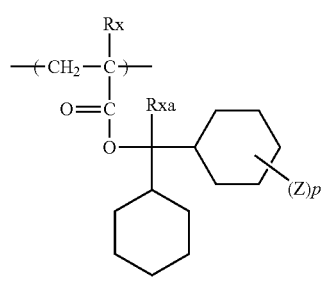
9
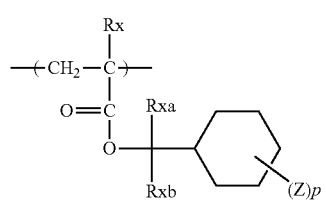
10
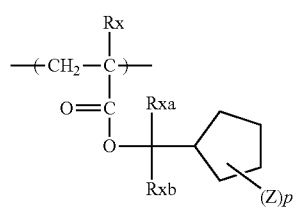
11
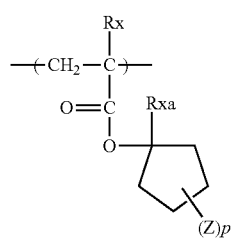
12
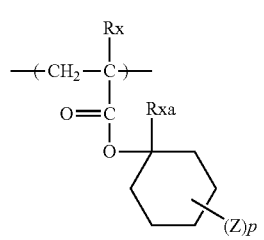
13
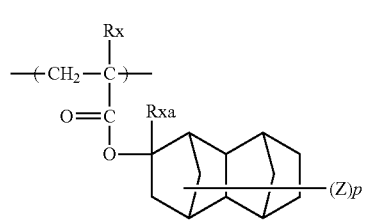
14
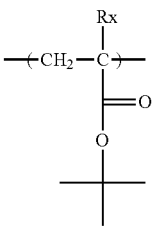
15
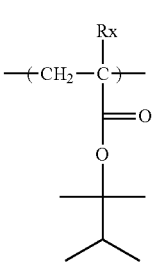
16
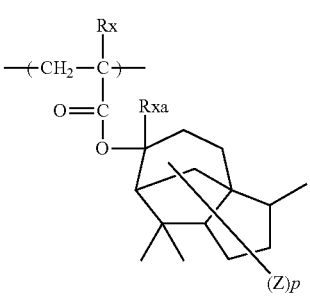
17
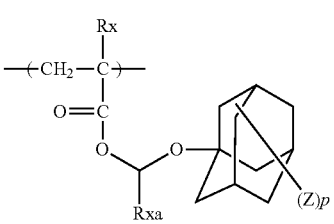
18
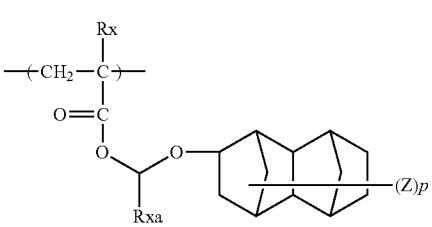
19
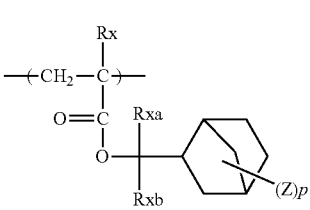
20

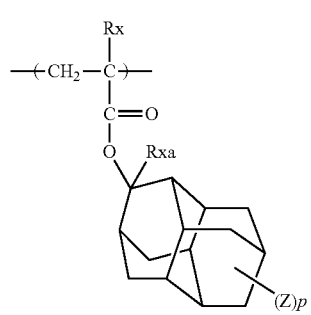
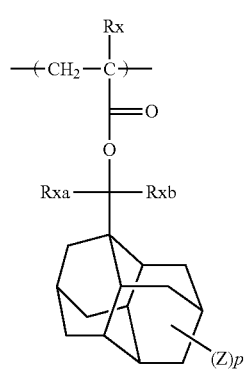
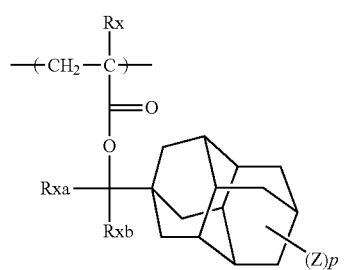
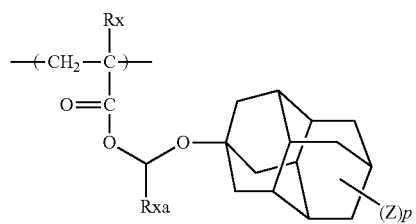
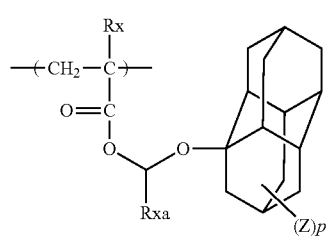
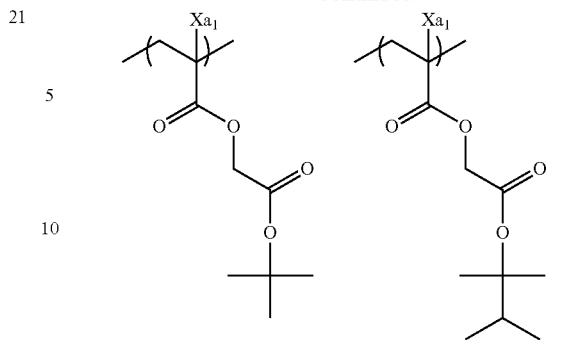
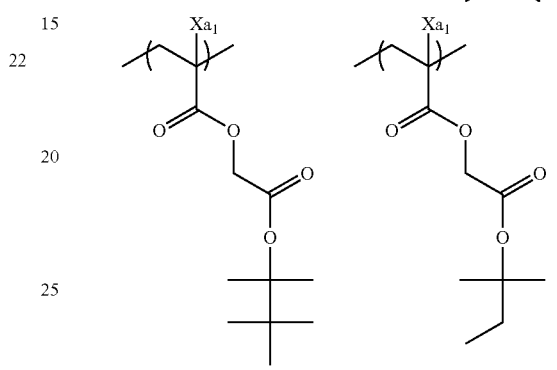
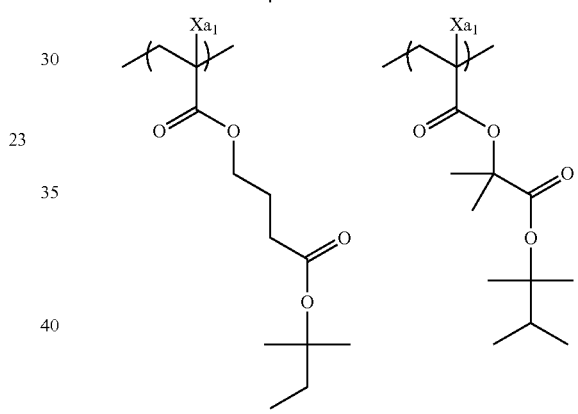
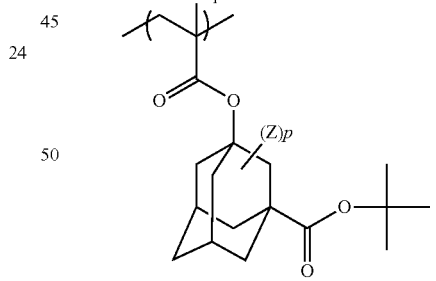
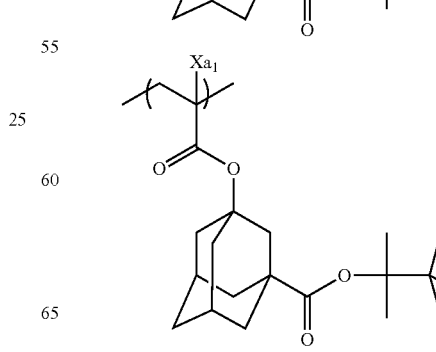

-continued
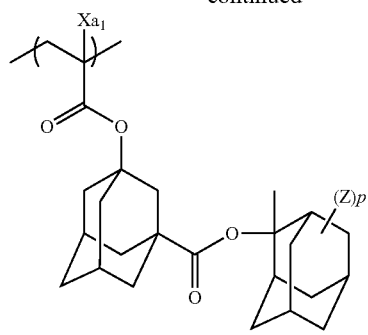
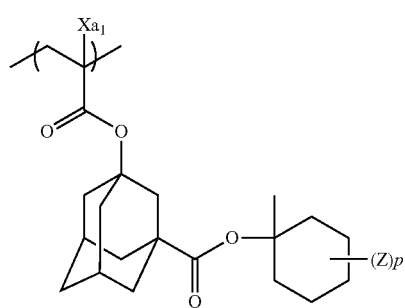
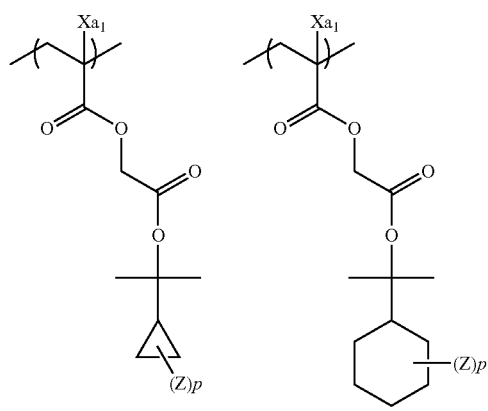
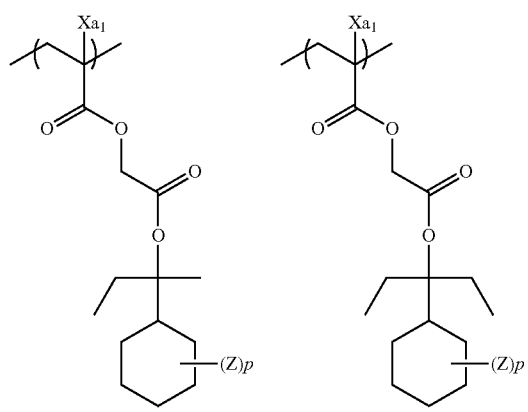
-continued
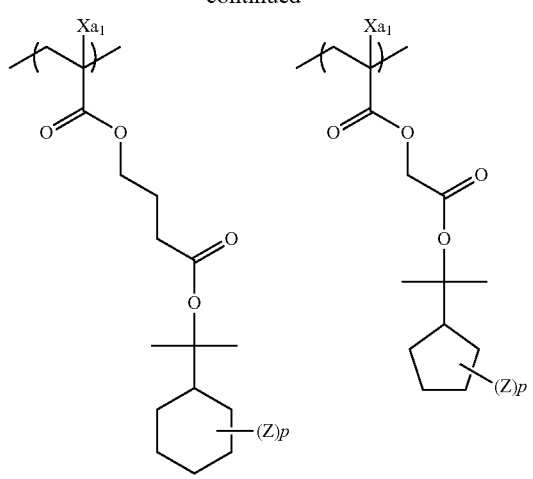
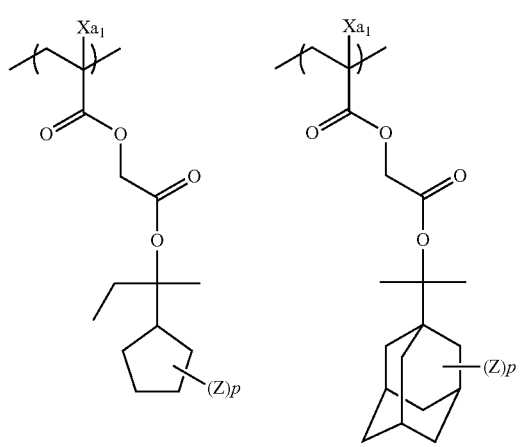
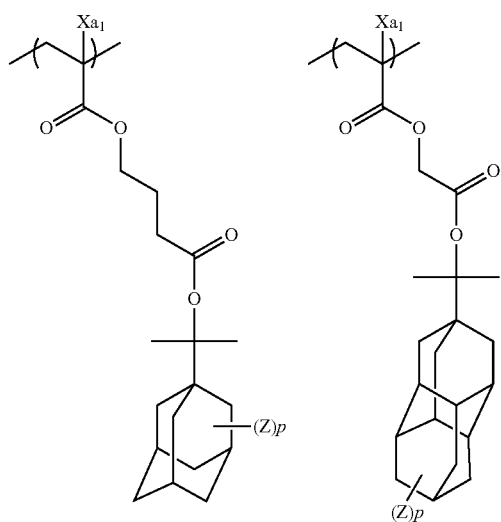

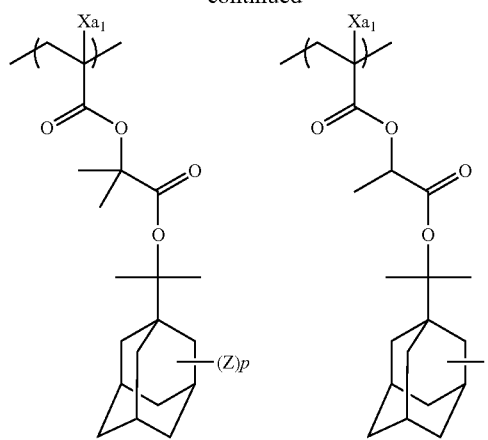
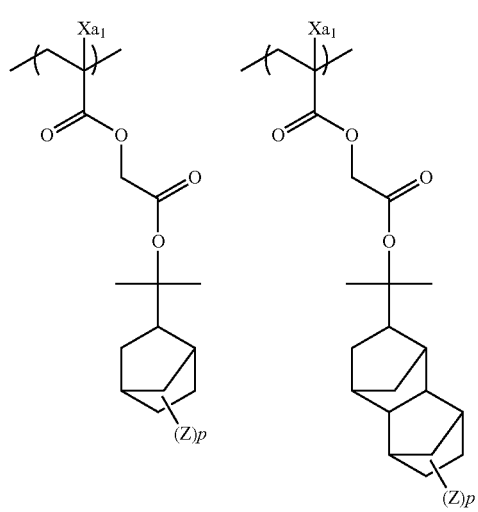
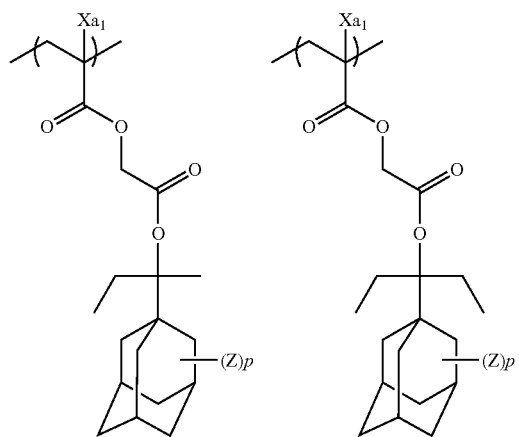
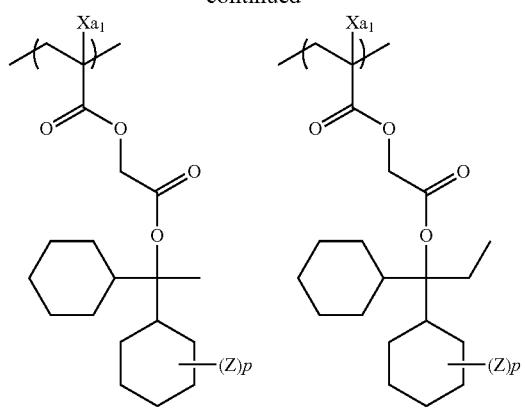
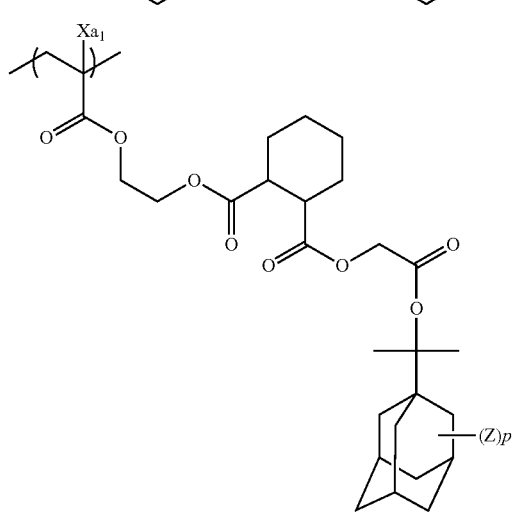
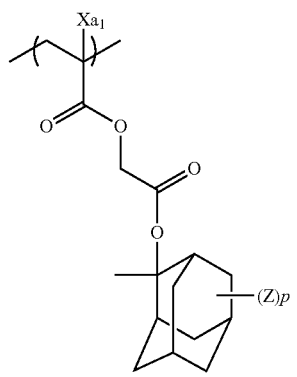
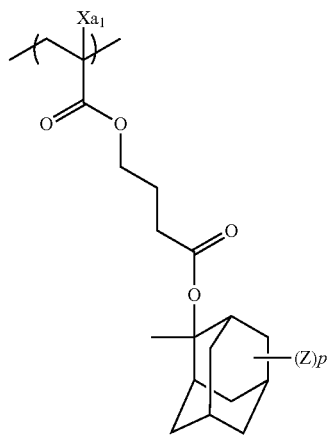

81
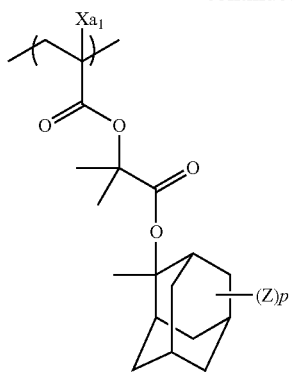
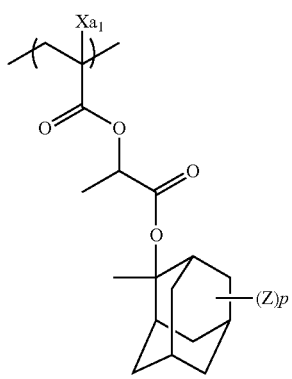
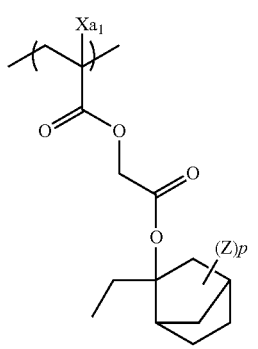
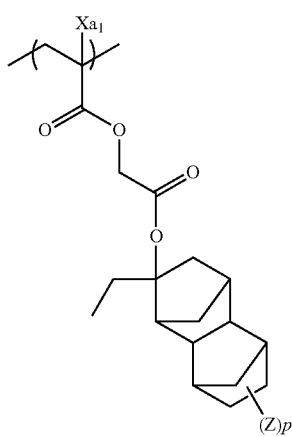
82
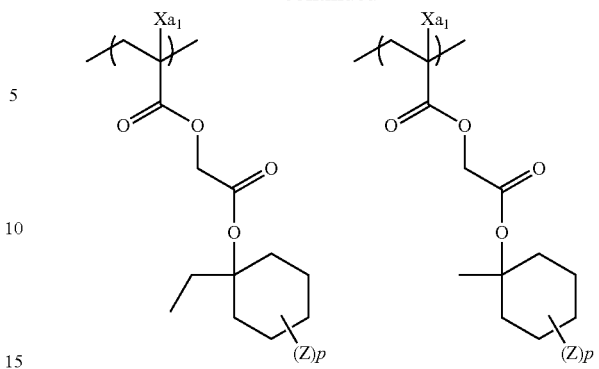
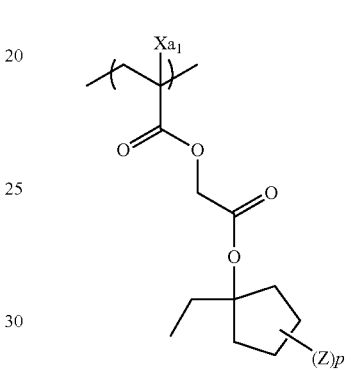
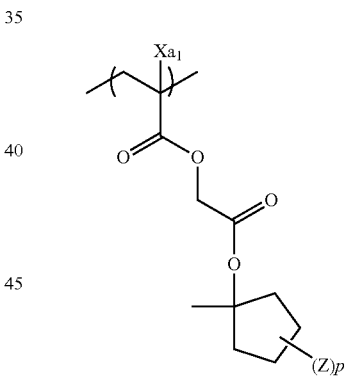
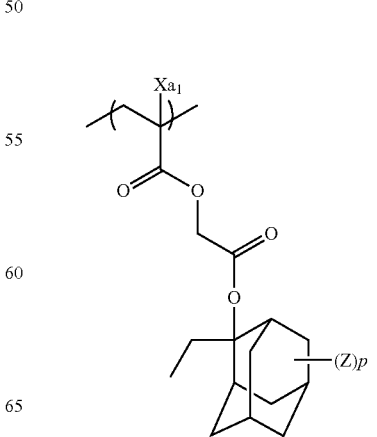

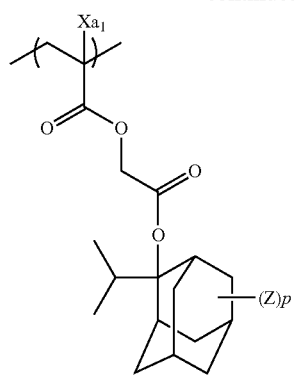
When the acid-decomposable resin contains a plurality of repeating units (B), the following combinations are preferred. In the following formulae, R each independently represents a hydrogen atom or a methyl group.
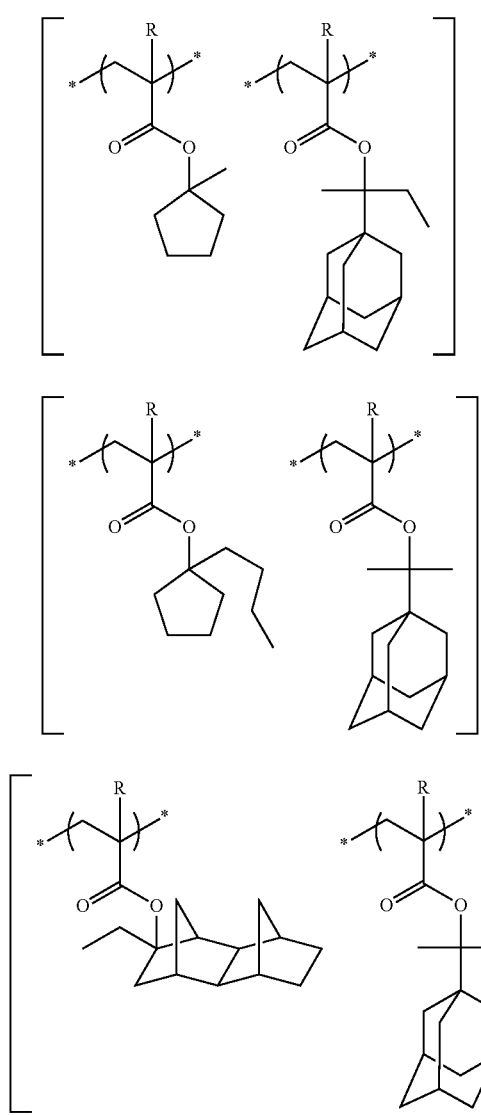
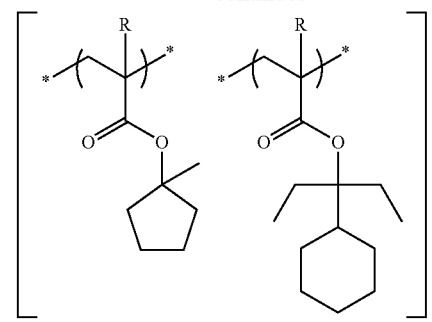
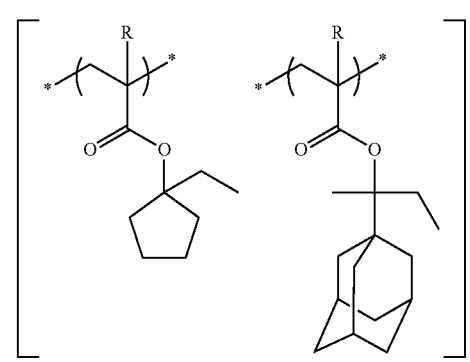
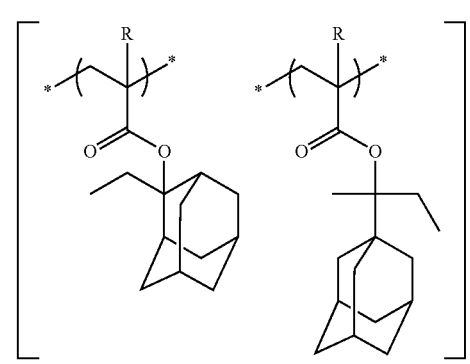
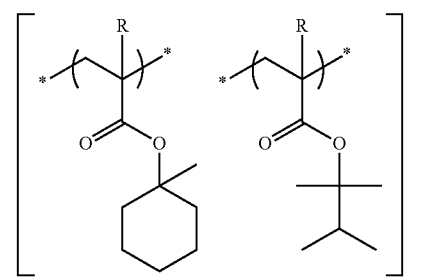
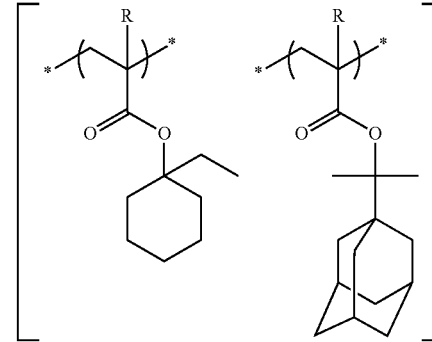

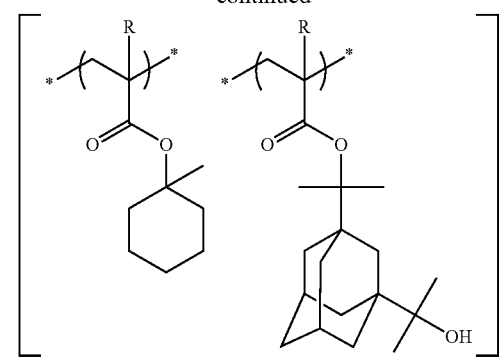
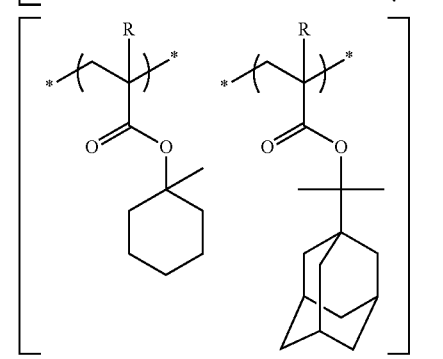
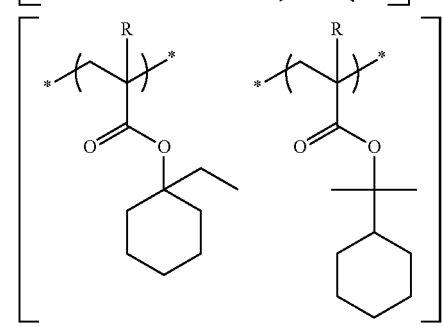
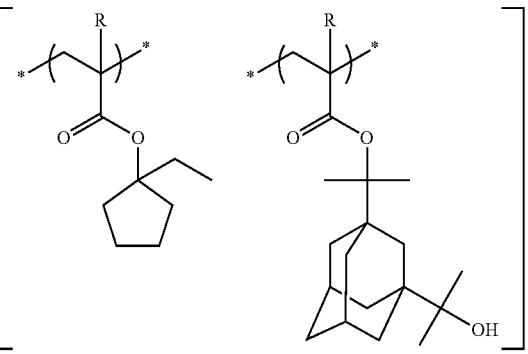
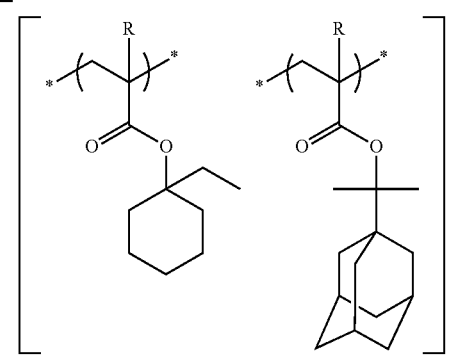
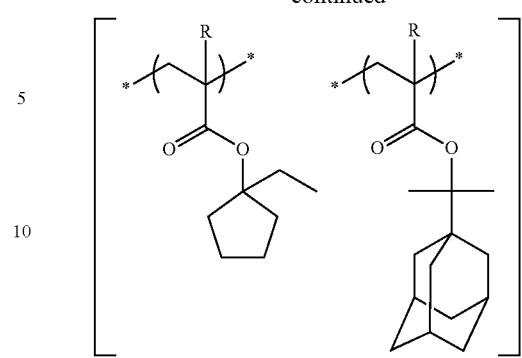
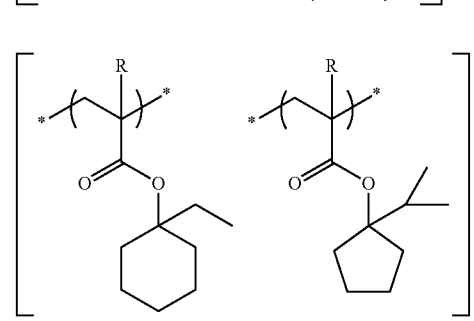
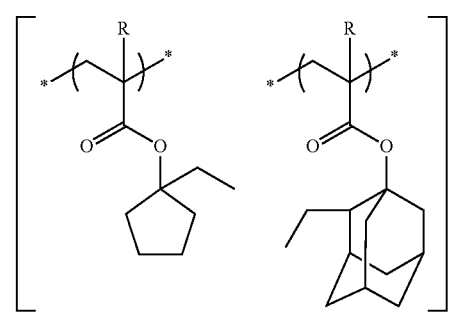
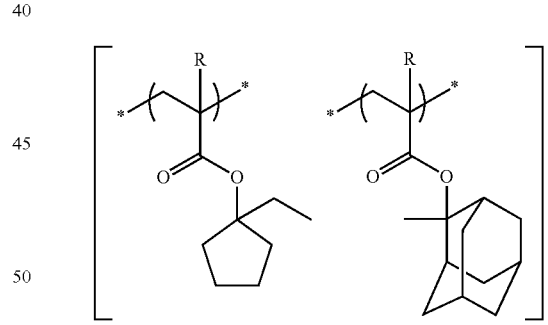
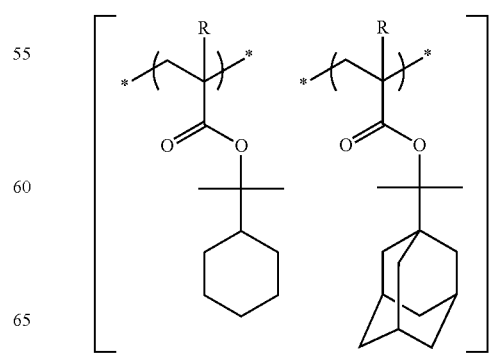

-continued

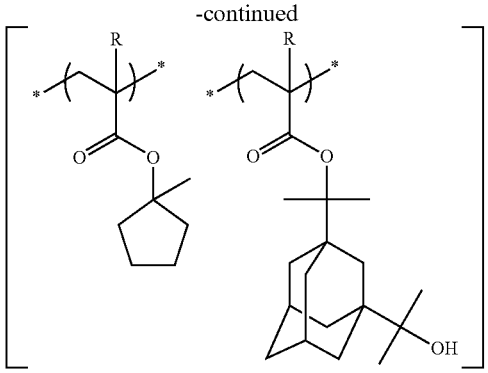

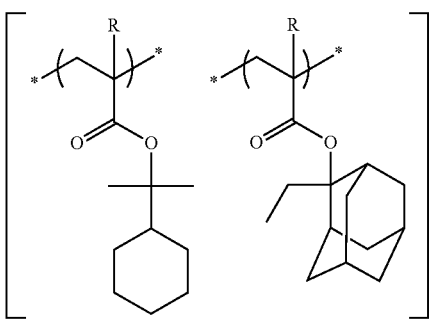

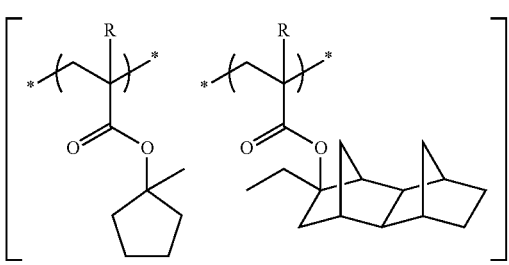

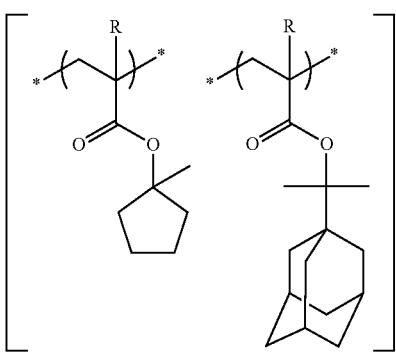

(C) Repeating Unit Having an Alicyclic Hydrocarbon Structure Containing No Polar Group, which Repeating Unit Exhibits No Acid Decomposability The acid-decomposable resin may further contain a repeating unit (C) having an alicyclic hydrocarbon structure containing no polar group, which repeating unit exhibits no acid decomposability. As the repeating unit (C), there can be mentioned, for example, any of those of general formula (IV) below.

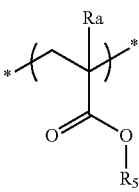

(IV)

In the general formula (IV), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. As the monocyclic hydrocarbon group, a cycloalkyl group having 3 to 12 carbon atoms and a cycloalkenyl group having 3 to 12 carbon atoms can be exemplified. Preferably, the monocyclic hydrocarbon group is a monocyclic hydrocarbon group having 3 to 7 carbon atoms. As such, a cyclopentyl group and a cyclohexyl group can be exemplified.

The polycyclic hydrocarbon groups include ring-assembly hydrocarbon groups and crosslinked-ring hydrocarbon groups.

As the ring-assembly hydrocarbon groups, for example, a bicyclohexyl group and a perhydronaphthalenyl group can be exemplified.

As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$]undecane rings; and tetracyclic hydrocarbon rings, such as tetracyclo[4.4.0.1$^{2,5}$.1$^{7,10}$]dodecane and perhydro-1,4-methano-5,8-methanonaphthalene rings.

Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenalene rings.

As preferred crosslinked-ring hydrocarbon rings, there can be mentioned a norbornyl group, an adamantyl group, a bicyclooctanyl group, a tricyclo[5.2.1.0$^{2,6}$]decanyl group and the like. As more preferred crosslinked-ring hydrocarbon rings, there can be mentioned a norbornyl group and an adamantyl group.

These alicyclic hydrocarbon groups may have one or more substituents. As preferred substituents, a halogen atom, an alkyl group, a hydroxyl group protected by a protective group, and an amino group protected by a protective group can be exemplified.

The halogen atom is preferably a bromine, chlorine or fluorine atom.

The alkyl group is preferably a methyl, ethyl, butyl or t-butyl group. The alkyl group may further have one or more substituents. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1-methyl-1-methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

When the acid-decomposable resin contains the repeating unit (C), the content thereof based on all the repeating units of the acid-composable resin is preferably in the range of 1 to 40 mol %, more preferably 1 to 20 mol %.

Specific examples of the repeating unit (C) will be shown below, which however in no way limit the scope of the present invention. In the formulae, Ra represents H, $CH_3$, $CH_2OH$ or $CF_3$.

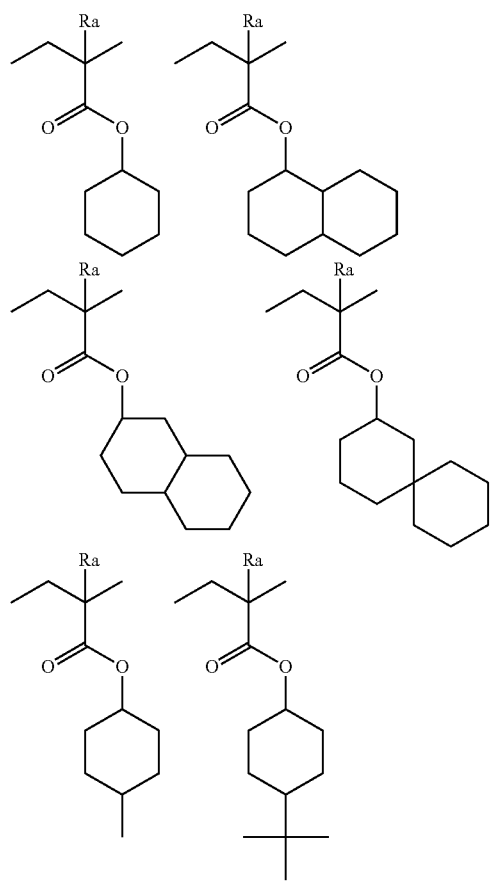

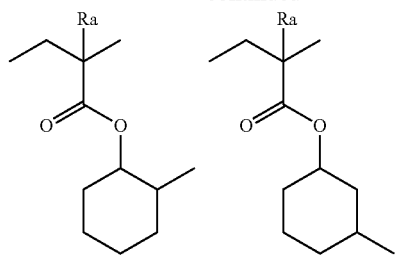

-continued

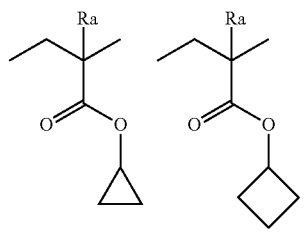

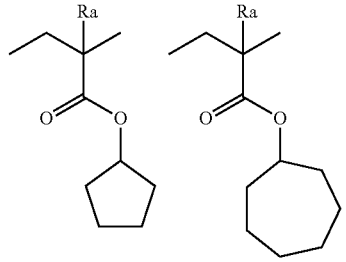

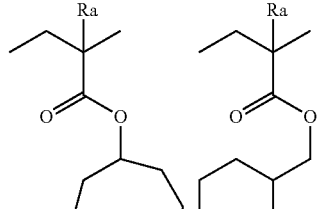

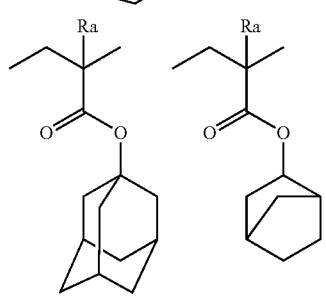

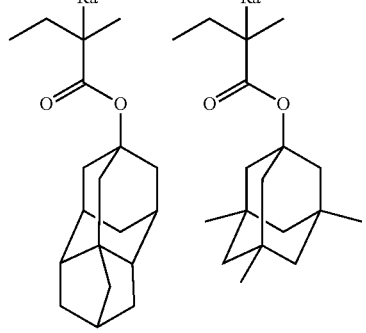

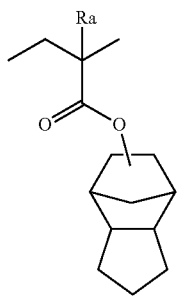

(D) Other Repeating Unit

Various repeating structural units other than those mentioned hereinbefore can be introduced in the acid-decomposable resin in order to regulate the dry etching resistance, standard developer adaptability, adherence to substrates, resist profile, and generally required properties for resist, such as resolving power, heat resistance, sensitivity, and the like.

As such other repeating structural units, those corresponding to the following monomers can be exemplified, which however are nonlimiting.

Such other repeating structural units would permit fine regulation of the properties required to have by the resin for use in the composition of the present invention, especially, (1) solubility in applied solvents, (2) film forming easiness (glass transition temperature), (3) alkali developability, (4) film thinning (selection of hydrophilicity/hydrophobicity and polar group), (5) adhesion of unexposed areas to substrate, and (6) dry etching resistance, etc.

As the above-mentioned monomers, compounds having an unsaturated bond capable of addition polymerization, selected from among acrylic esters, methacrylic esters, acrylamides, methacrylamides, allyl compounds, vinyl ethers, vinyl esters and the like can be exemplified.

The monomers are not limited to the above, and unsaturated compounds capable of addition polymerization that are copolymerizable with the monomers corresponding to the above various repeating structural units can be used in the copolymerization.

The molar ratios of individual repeating structural units contained in the resin for use in the composition of the present invention are appropriately determined from the viewpoint of regulation of not only the resist dry etching resistance but also the standard developer adaptability, substrate adhesion, resist profile and generally required properties of resists such as resolving power, heat resistance and sensitivity.

When the composition of the present invention is used in ArF exposure, it is preferred for the acid-decomposable resin to contain no aromatic group from the viewpoint of transparency to ArF light. It is especially preferred for the acid-decomposable resin to contain an alicyclic hydrocarbon structure of a single ring or multiple rings.

Further, it is preferred for the acid-decomposable resin to contain neither a fluorine atom nor a silicon atom from the viewpoint of compatibility with hydrophobic resins to be described hereinafter.

Preferred acid-decomposable resin is that whose repeating units consisting of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units.

In the event of exposing the actinic-ray- or radiation-sensitive resin composition of the present invention to KrF excimer laser beams, electron beams, X-rays or high-energy light rays of wavelength 50 nm or less (EUV, etc.), it is preferred for resin (B) to further have hydroxystyrene repeating units. More preferably, resin (B) has hydroxystyrene repeating units, hydroxystyrene repeating units protected by an acid-decomposable group and acid-decomposable repeating units of a (meth)acrylic acid tertiary alkyl ester, etc.

As preferred hydroxystyrene repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl(meth)acrylate and a dialkyl(1-adamantyl)methyl(meth)acrylate are more preferred.

The acid-decomposable resin of the present invention can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of the acid-decomposable resin in terms of polystyrene molecular weight as measured by GPC is preferably in the range of 1000 to 200,000, more preferably 2000 to 20,000, still more preferably 3000 to 15,000 and further preferably 5000 to 13,000.

The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is usually in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

In the present invention, the content ratio of the acid-decomposable resin based on the total solid content of the whole composition is preferably in the range of 30 to 99 mass, and more preferably 60 to 95 mass %.

The acid-decomposable resin may be used either individually or in combination. Moreover, the acid-decomposable resin may be used in combination with resins other than the foregoing acid-decomposable resins to an extent not detrimental to the effects of the present invention.

Specific examples of the acid-decomposable resin will be shown below. Further, in Table 1 below is specified weight average molecular weight (Mw), dispersity (Mw/Mn), and molar ratio of the repeating units (corresponding to individual repeating units in order from the left).

A-1

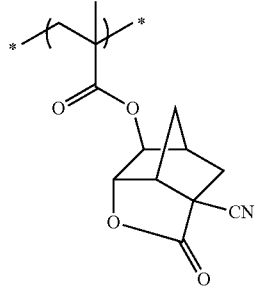

A-2

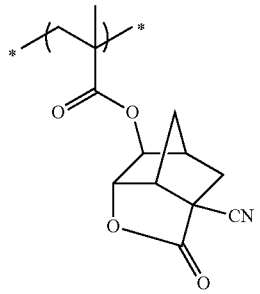 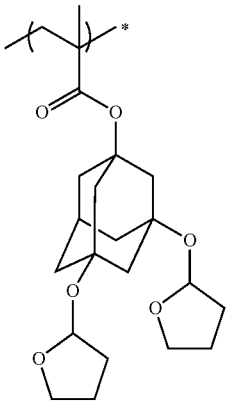

A-3

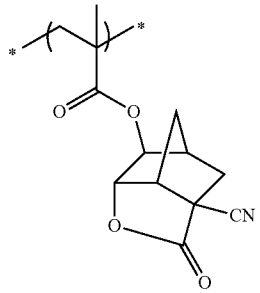

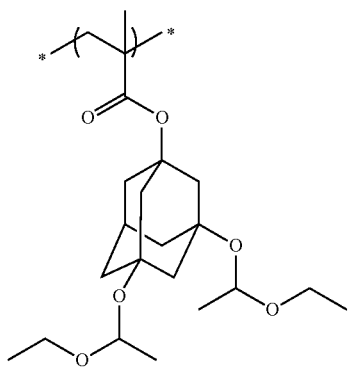

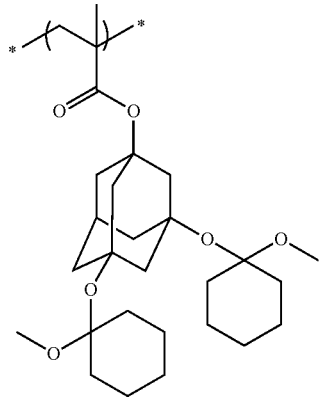

A-4

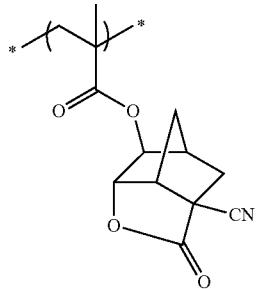

A-5
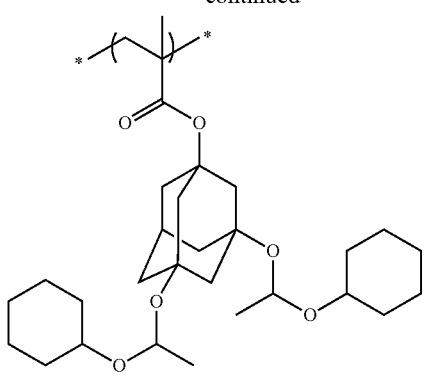
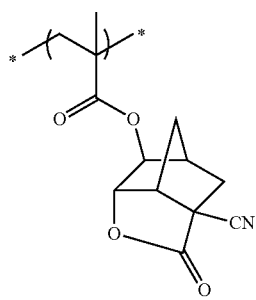
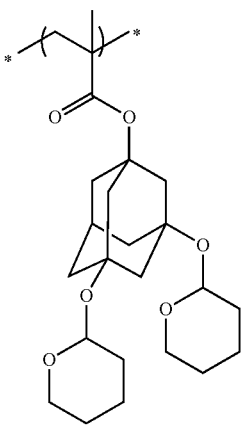
A-6
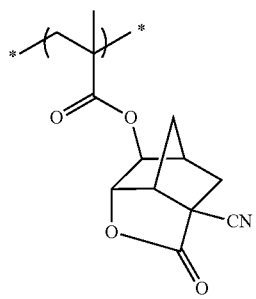
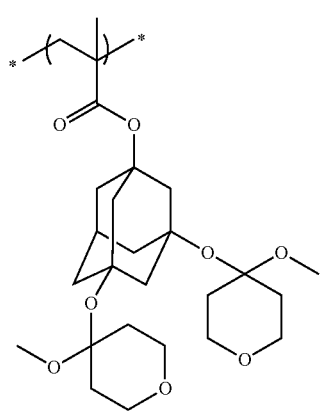
A-7
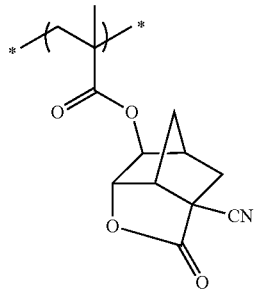
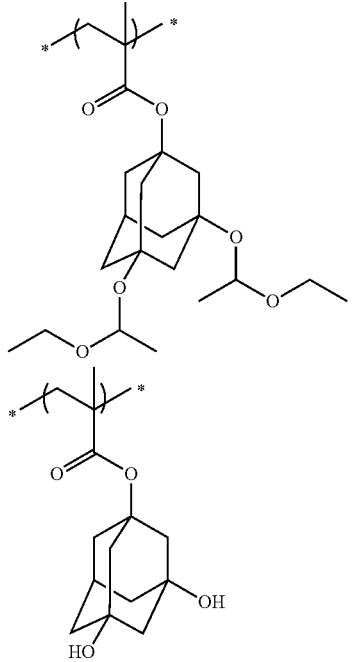
A-8
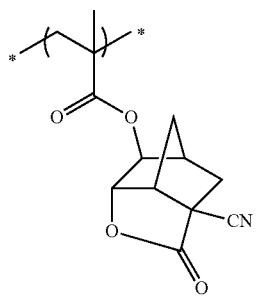
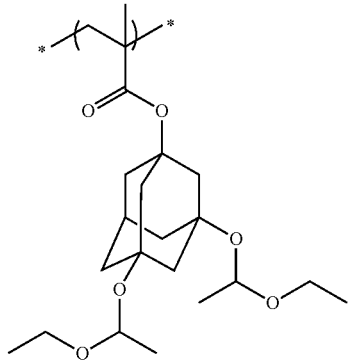

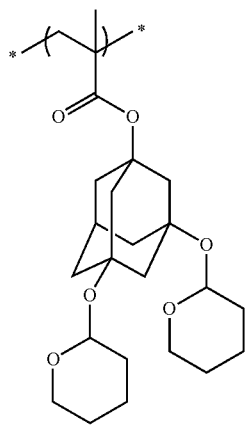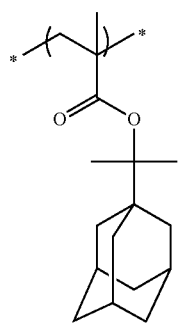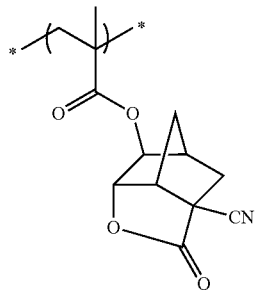
A-9
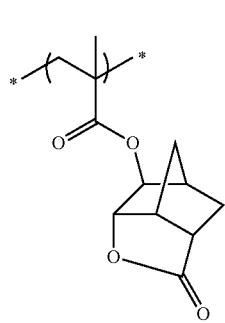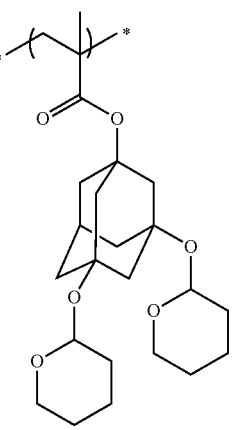
A-11
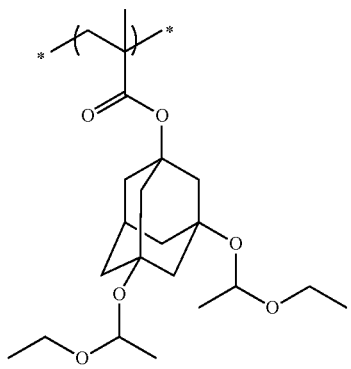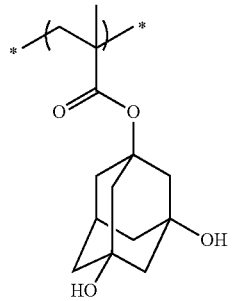
A-10
A-12

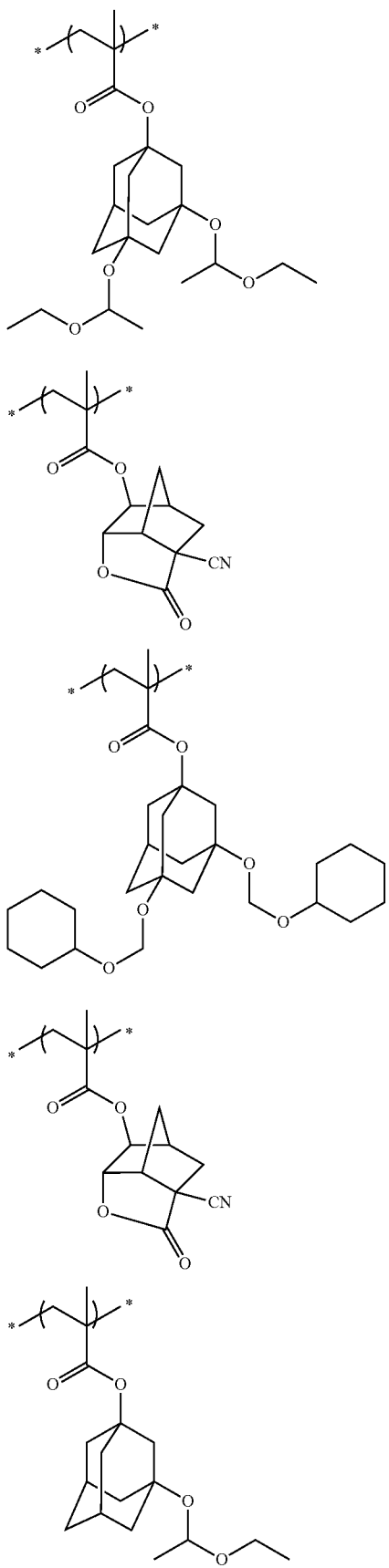
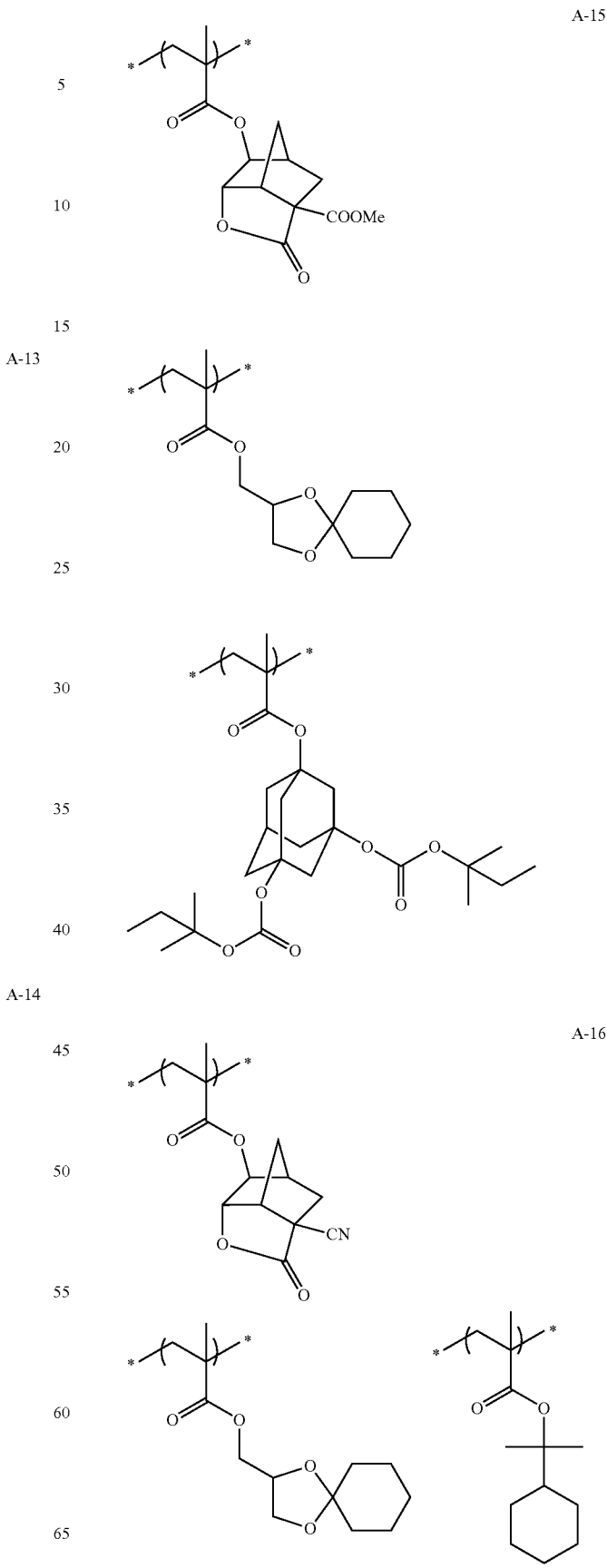

-continued
A-17
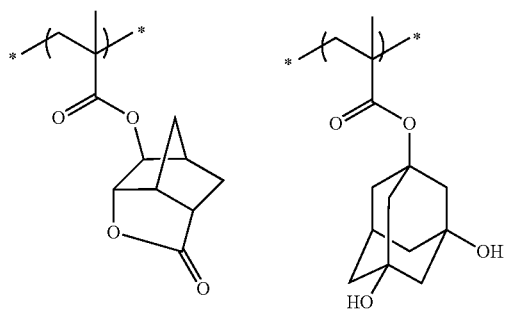
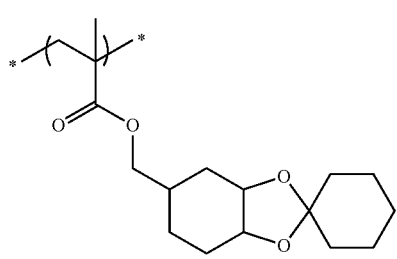
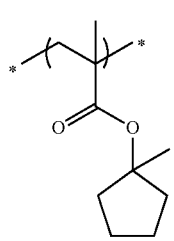
A-18
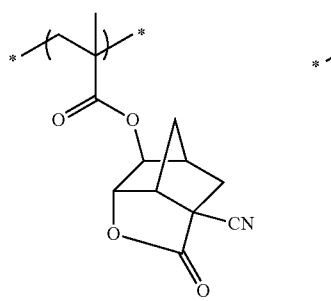
-continued
A-19
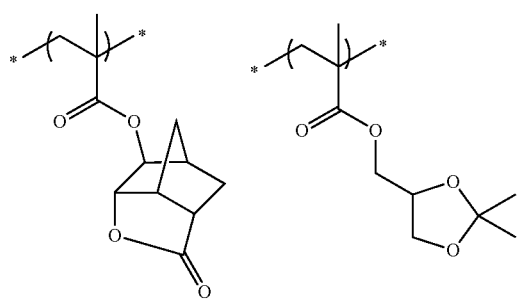
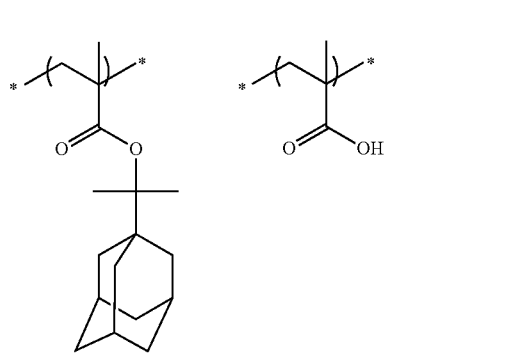
A-20
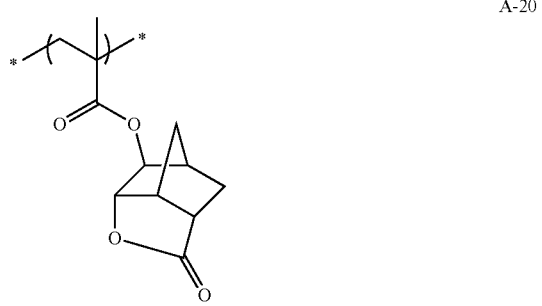
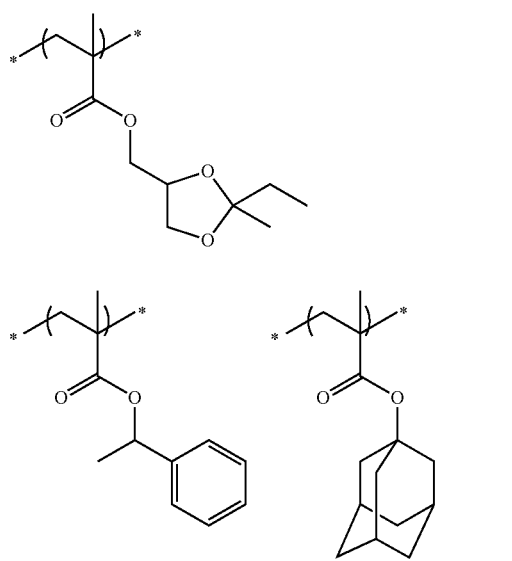

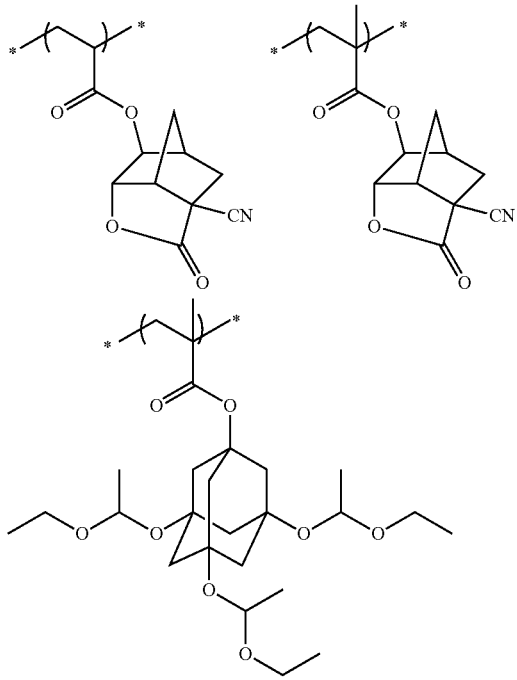
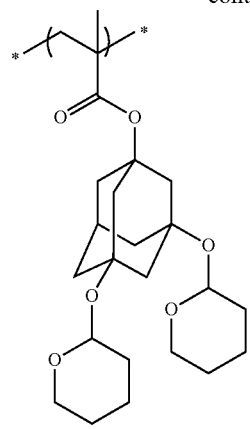
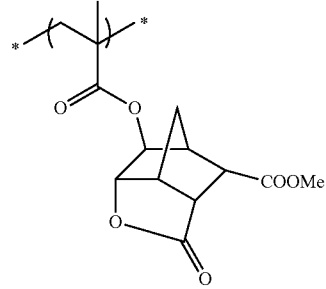
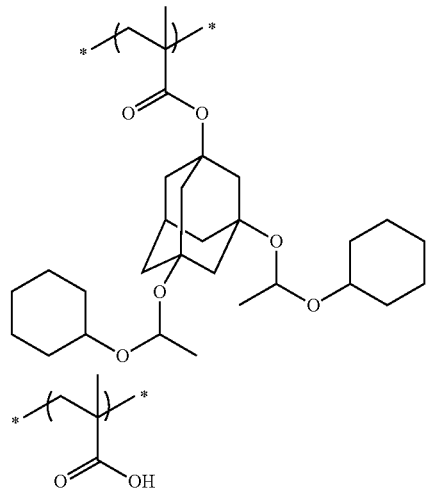
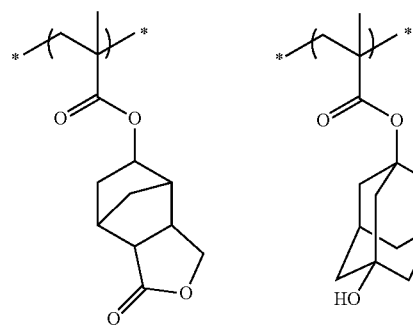

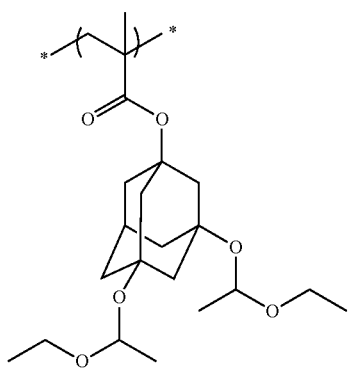
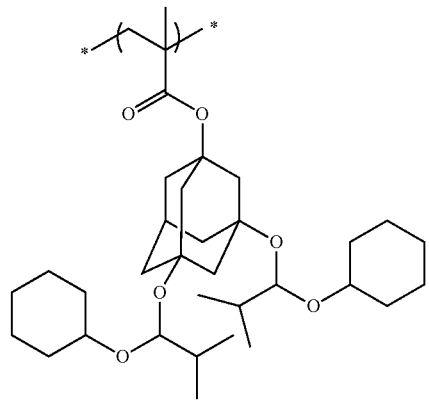
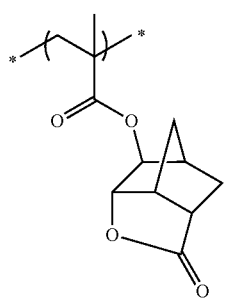
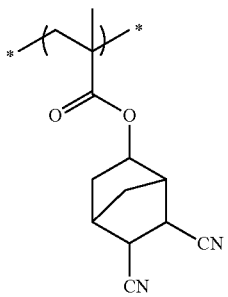
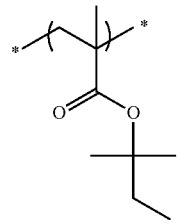
A-26
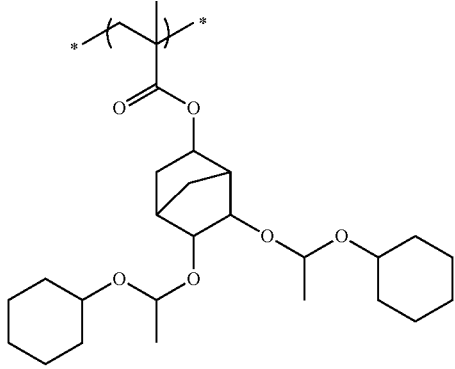
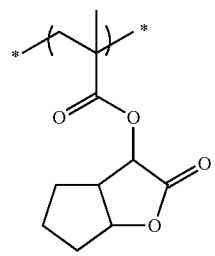
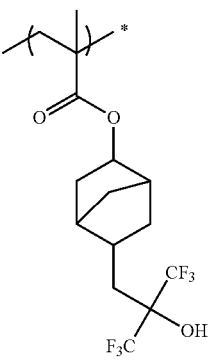
A-28
A-27
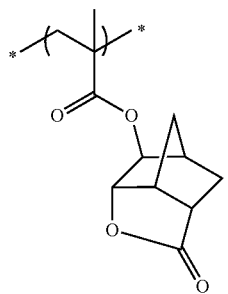
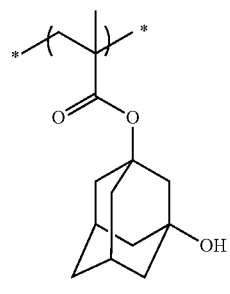
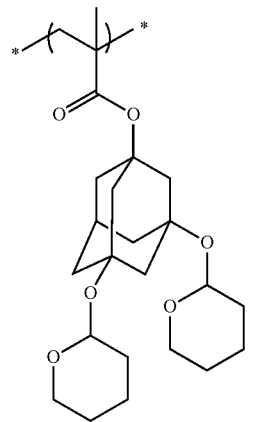
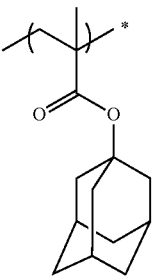

-continued
A-29
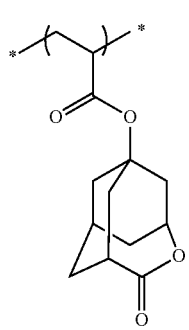 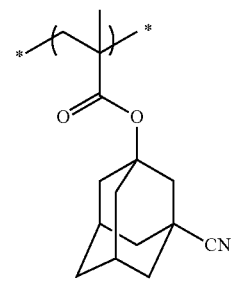
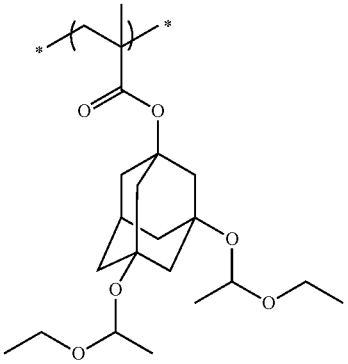
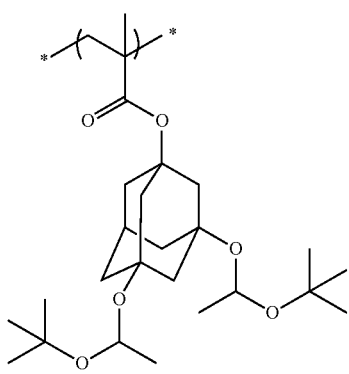
A-31
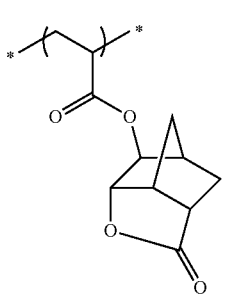 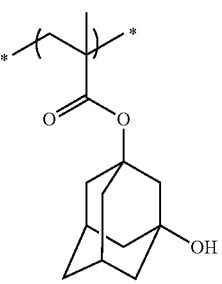
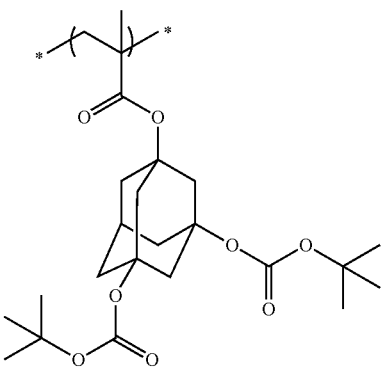
A-30
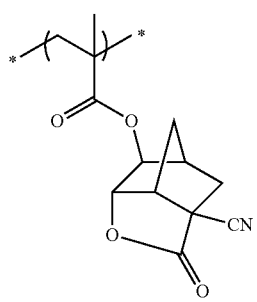 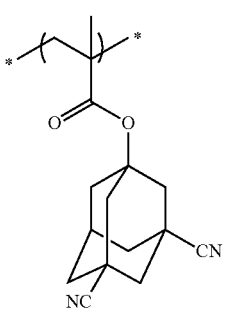
A-32
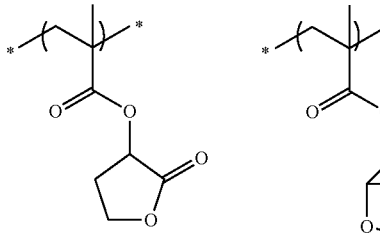
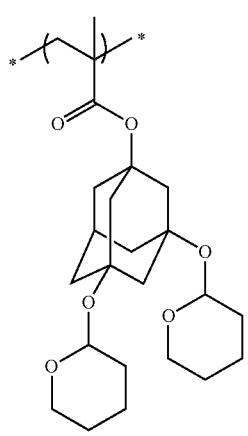
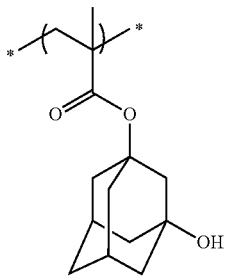

-continued
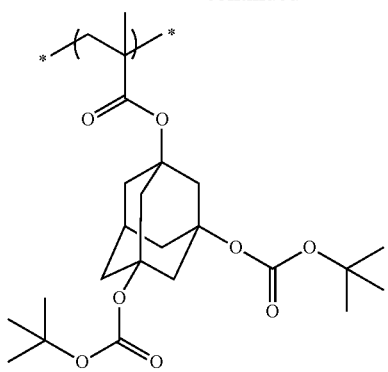
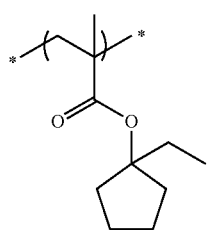
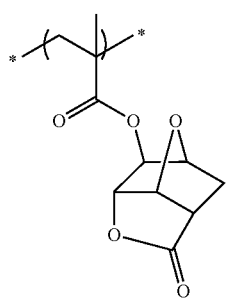
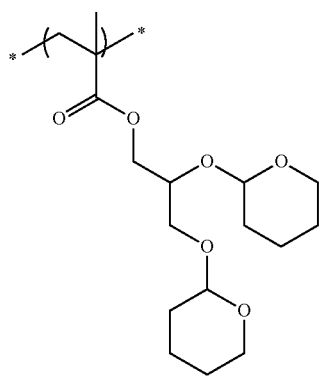
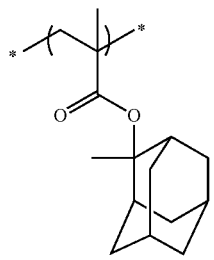
-continued
A-33
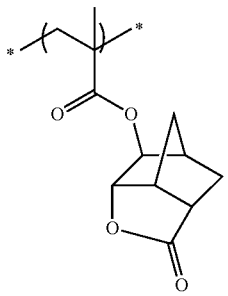
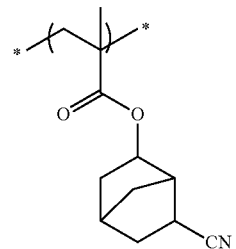
A-34
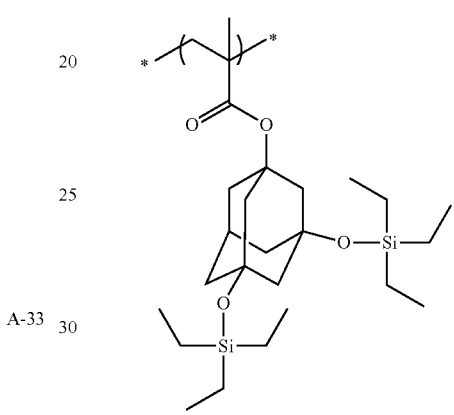
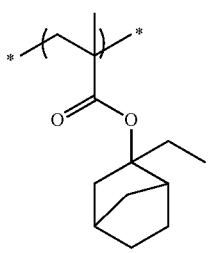
A-35
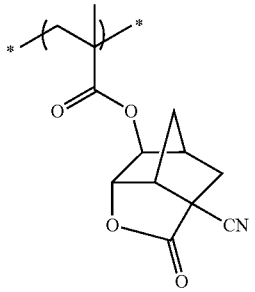
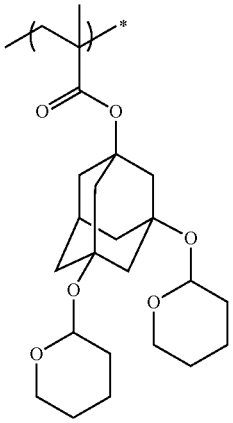

-continued
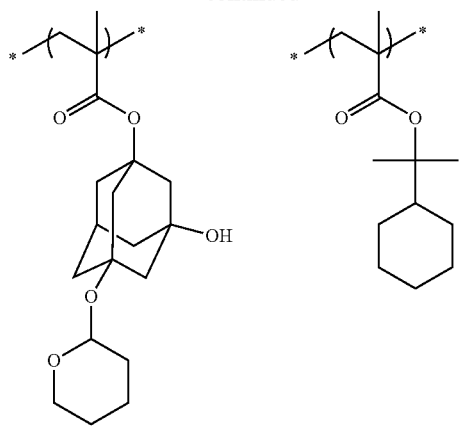
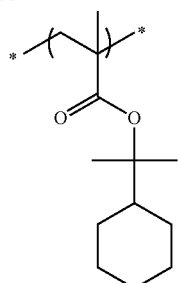
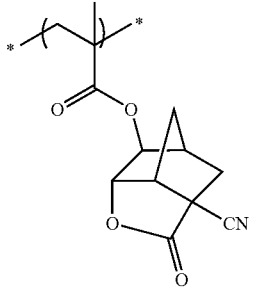
A-37
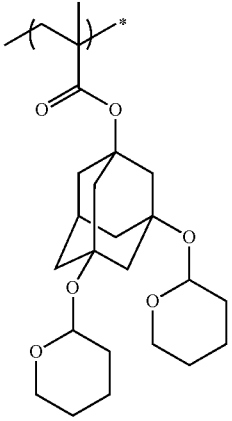
A-36
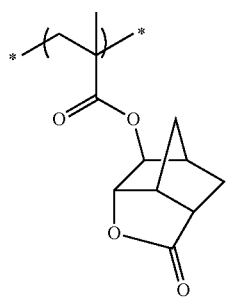
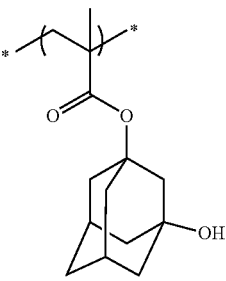
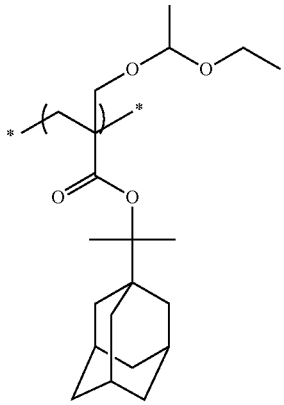
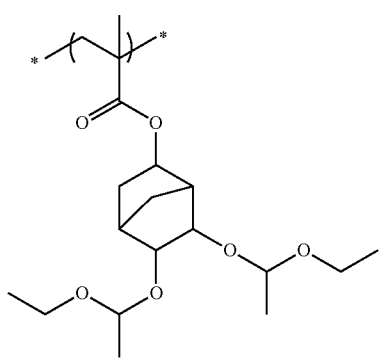
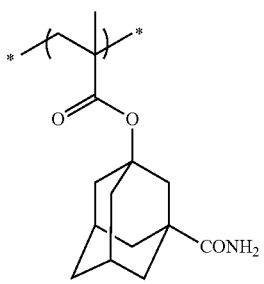
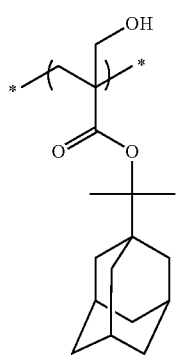
A-38
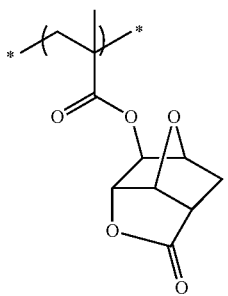

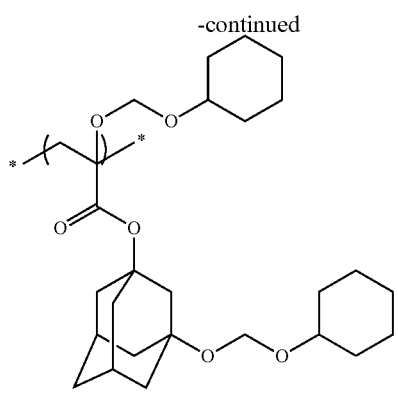
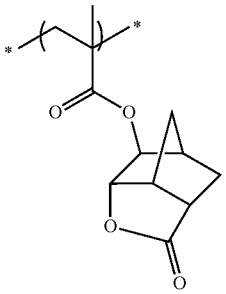
A-40
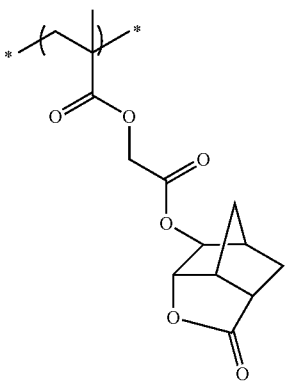
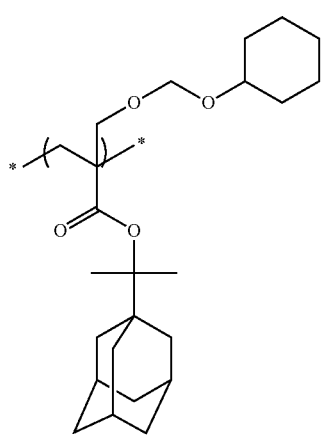
A-39
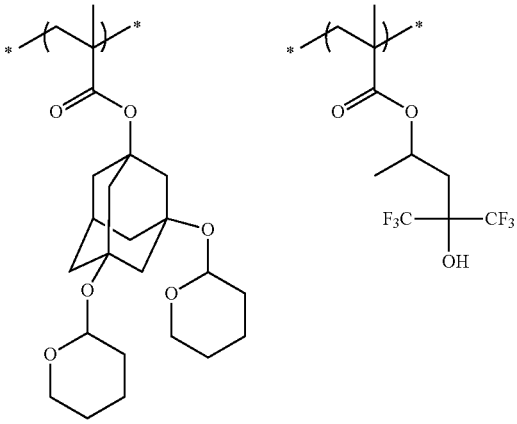
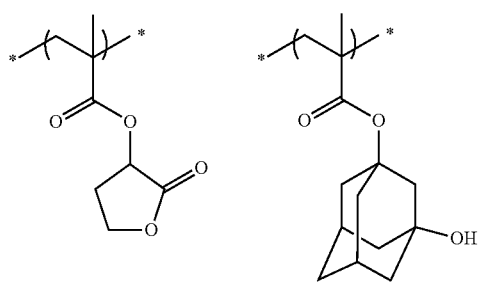
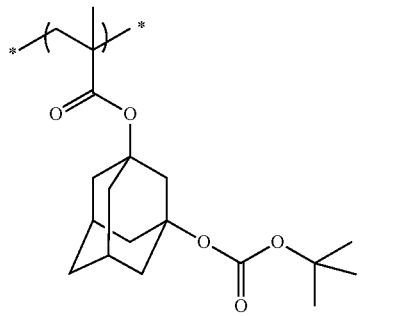
A-41
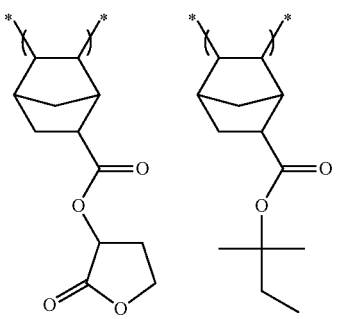
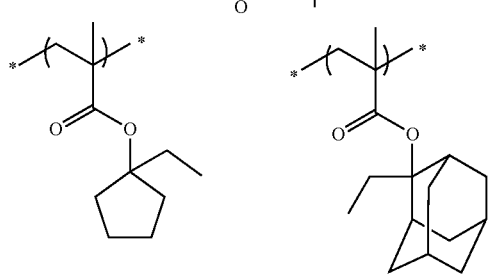

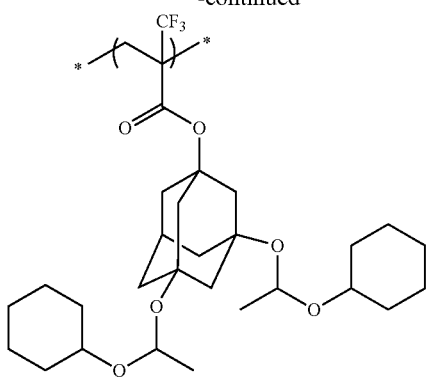
A-42
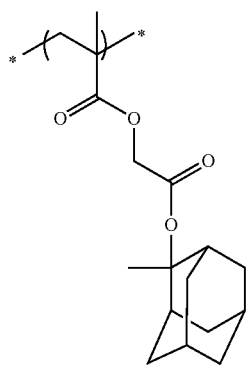
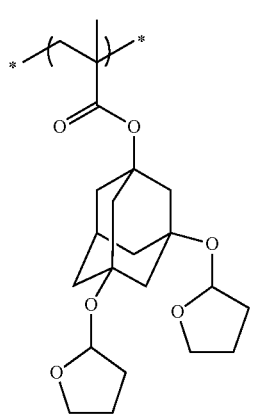
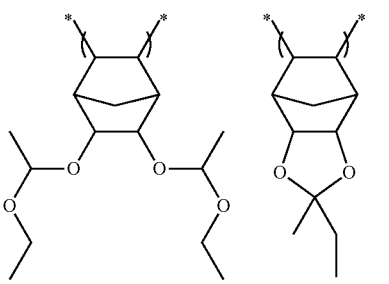
A-43
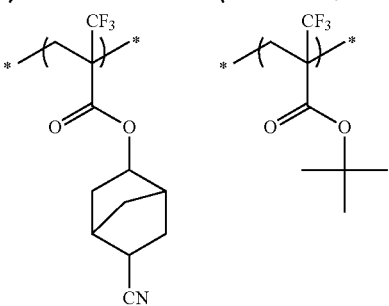
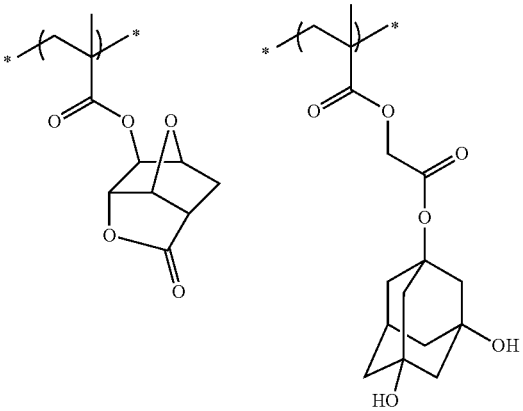
A-44
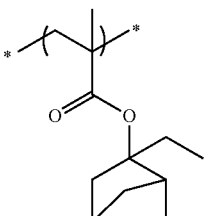
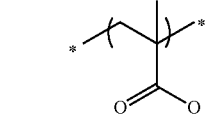
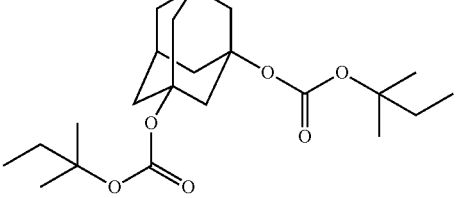

A-45
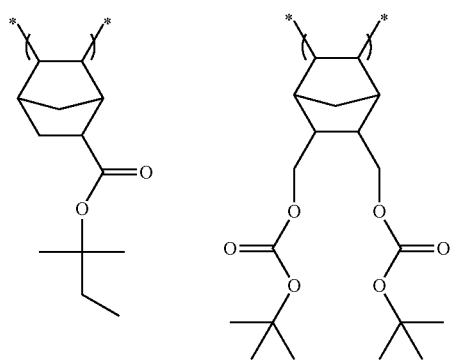
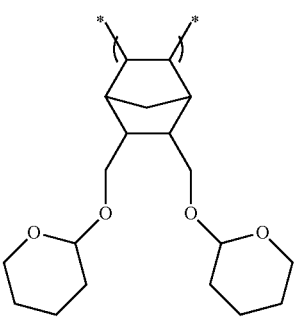
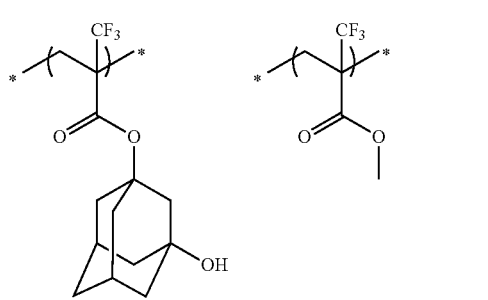
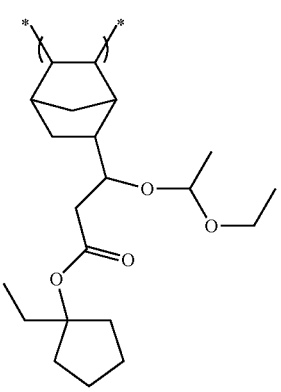
A-46
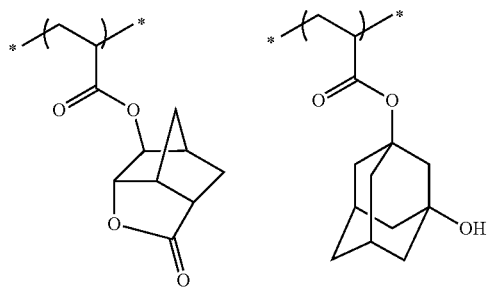
A-48
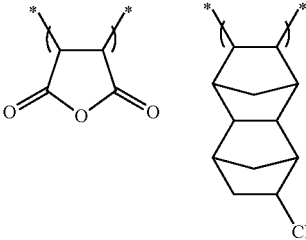
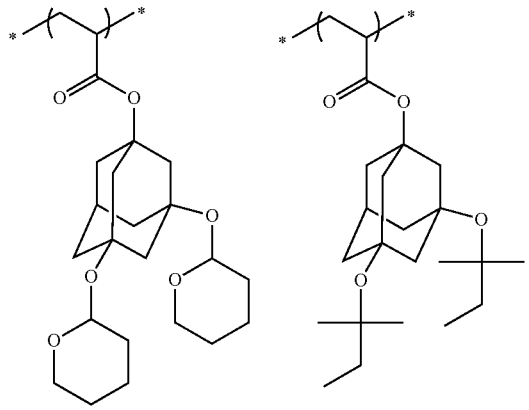
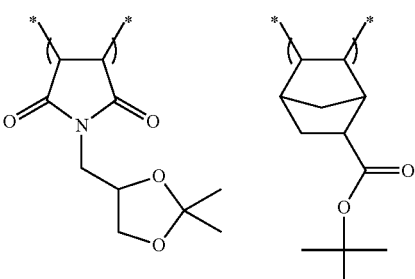
A-47
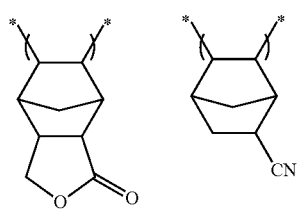
A-49
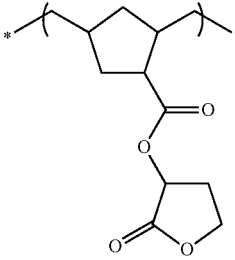

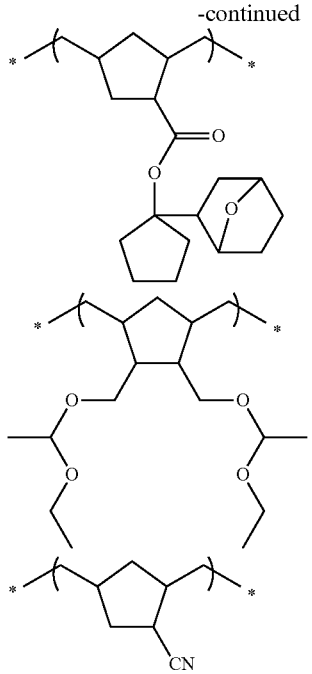
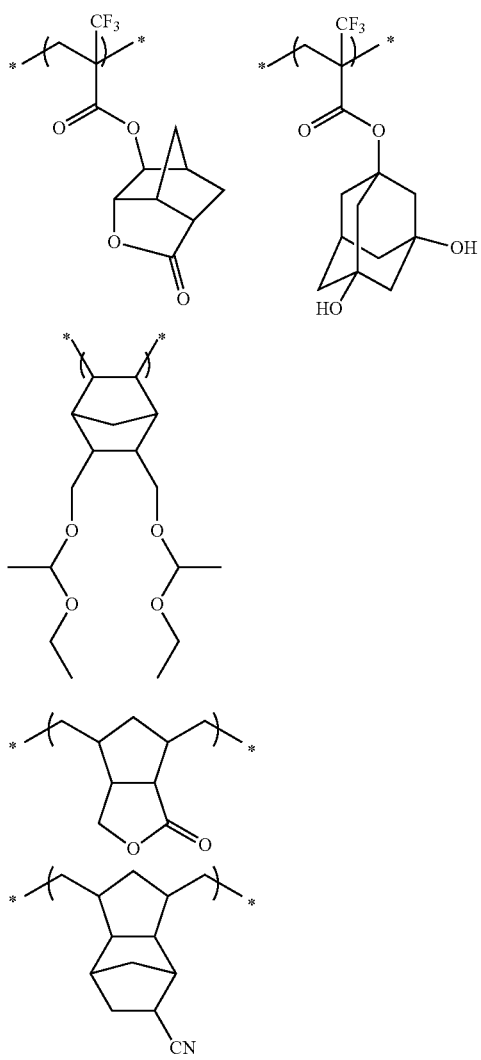
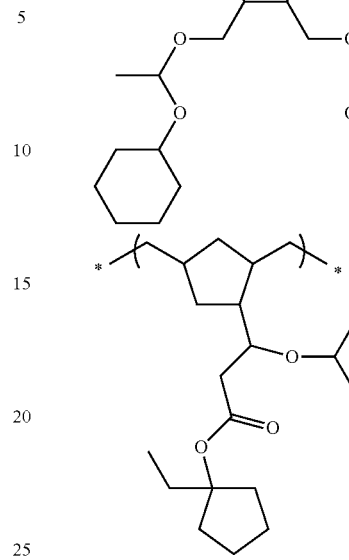
TABLE 1
| No. | Mw | Mw/Mn | Molar Ratio | | | | |
|---|---|---|---|---|---|---|---|
| A-1 | 9800 | 1.76 | 40 | 60 | | | |
| A-2 | 7700 | 1.80 | 45 | 55 | | | |
| A-3 | 7900 | 1.81 | 50 | 50 | | | |
| A-4 | 8400 | 1.79 | 50 | 50 | | | |
| A-5 | 9000 | 1.84 | 30 | 70 | | | |
| A-6 | 10500 | 1.77 | 50 | 50 | | | |
| A-7 | 9400 | 1.83 | 40 | 50 | 10 | | |
| A-8 | 9500 | 1.86 | 50 | 20 | 30 | | |
| A-9 | 7300 | 1.79 | 50 | 40 | 10 | | |
| A-10 | 9900 | 1.82 | 40 | 40 | 20 | | |
| A-11 | 10400 | 1.81 | 30 | 50 | 20 | | |
| A-12 | 7900 | 1.76 | 20 | 80 | | | |
| A-13 | 7900 | 1.76 | 40 | 60 | | | |
| A-14 | 7900 | 1.76 | 25 | 75 | | | |
| A-15 | 9000 | 1.72 | 40 | 20 | 40 | | |
| A-16 | 10100 | 1.75 | 50 | 30 | 20 | | |
| A-17 | 6500 | 1.48 | 35 | 5 | 50 | 10 | |
| A-18 | 13500 | 1.71 | 50 | 10 | 20 | 20 | |
| A-19 | 16100 | 1.78 | 50 | 30 | 10 | 10 | |
| A-20 | 5900 | 1.51 | 35 | 45 | 10 | 10 | |
| A-21 | 12000 | 1.81 | 25 | 25 | 50 | | |
| A-22 | 8100 | 1.66 | 40 | 50 | 10 | | |
| A-23 | 10500 | 1.71 | 30 | 20 | 50 | | |
| A-24 | 14200 | 1.81 | 55 | 40 | 5 | | |
| A-25 | 11000 | 1.88 | 35 | 10 | 55 | | |
| A-26 | 8500 | 1.68 | 40 | 10 | 50 | | |
| A-27 | 10200 | 1.69 | 30 | 15 | 40 | 15 | |
| A-28 | 6900 | 1.85 | 30 | 10 | 50 | 10 | |
| A-29 | 10000 | 1.71 | 30 | 10 | 60 | | |
| A-30 | 9500 | 1.61 | 30 | 10 | 30 | 30 | |
| A-31 | 15000 | 1.81 | 40 | 10 | 50 | | |
| A-32 | 12000 | 1.63 | 15 | 30 | 5 | 40 | 10 |
| A-33 | 12500 | 1.88 | 40 | 30 | 30 | | |
| A-34 | 8100 | 1.55 | 35 | 15 | 40 | 10 | |
| A-35 | 11000 | 1.61 | 40 | 40 | 5 | 15 | |
| A-36 | 12500 | 1.72 | 30 | 10 | 40 | 20 | |
| A-37 | 7200 | 1.66 | 40 | 40 | 5 | 15 | |
| A-38 | 5500 | 1.58 | 60 | 20 | 20 | | |
| A-39 | 10000 | 1.65 | 10 | 15 | 25 | 25 | 25 |
| A-40 | 16000 | 1.81 | 30 | 10 | 50 | 10 | |
| A-41 | 5100 | 1.54 | 15 | 20 | 65 | | |
| A-42 | 12000 | 1.65 | 40 | 10 | 20 | 30 | |
| A-43 | 6000 | 1.55 | 15 | 15 | 60 | 10 | |
| A-44 | 8000 | 1.77 | 40 | 10 | 30 | 20 | |

TABLE 1-continued

| No. | Mw | Mw/Mn | Molar Ratio | | | |
|---|---|---|---|---|---|---|
| A-45 | 4200 | 1.61 | 35 | 15 | 20 | 30 |
| A-46 | 11500 | 1.66 | 30 | 20 | 40 | 10 |
| A-47 | 4000 | 1.91 | 30 | 10 | 30 | 30 |
| A-48 | 6000 | 1.71 | 10 | 10 | 40 | 40 |
| A-49 | 12000 | 1.24 | 20 | 20 | 50 | 10 |
| A-50 | 5500 | 1.55 | 50 | 10 | 40 | |
| A-51 | 24000 | 3.68 | 30 | 10 | 40 | 20 |
| A-52 | 8000 | 2.05 | 30 | 10 | 50 | 10 |
| A-53 | 15000 | 1.25 | 30 | 20 | 50 | |
| A-54 | 14500 | 1.95 | 3 | 30 | 27 | 40 |
| A-55 | 11000 | 1.21 | 33 | 33 | 34 | |

(b) Acid Generator

The resist composition according to the present invention may contain an acid generator. As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that generate an acid when exposed to actinic rays or radiation employed in microresists, etc., and mixtures thereof.

As the acid generator, a diazonium salt, a phosphonium salt, a sulfonium salt, an iodonium salt, an imide sulfonate, an oxime sulfonate, diazosulfone, disulfone and o-nitrobenzyl sulfonate can be exemplified.

Further, use can be made of compounds obtained by introducing any of the above groups or compounds that generate an acid when exposed to actinic rays or radiation in a polymer principal chain or side chain, for example, compounds described in U.S. Pat. No. 3,849,137, DE 3914407, JP-A's-63-26653, 55-164824, 62-69263, 63-146038, 63-163452, 62-153853, 63-146029, etc.

Furthermore, use can be made of compounds that generate an acid when exposed to light described in U.S. Pat. No. 3,779,778, EP 126,712, etc.

As preferred compounds among the acid generators, those represented by the following general formulae (ZI), (ZII) and (ZIII) can be exemplified.

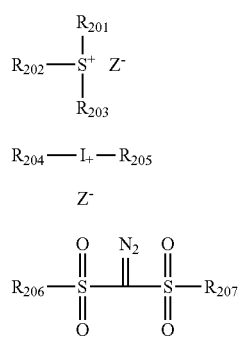

In the above general formula (ZI), each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other via a single bond or a connecting group to thereby form a ring structure. As the connecting group, there can be mentioned, for example, an ether bond, a thioether bond, an ester bond, an amido bond, a carbonyl group, a methylene group or an ethylene group. As the group formed by the mutual bonding of two of $R_{201}$ to $R_{203}$, there can be mentioned, for example, an alkylene group, such as a butylene group or a pentylene group.

$Z^-$ represents a nonnucleophilic anion.

As the nonnucleophilic anion represented by $Z^-$, a sulfonate anion, a carboxylate anion, a sulfonylimido anion, a bis(alkylsulfonyl)imido anion, and a tris(alkylsulfonyl)methyl anion can be exemplified.

The nonnucleophilic anion means an anion whose capability of inducing a nucleophilic reaction is extremely low. Any decomposition over time attributed to an intramolecular nucleophilic reaction can be suppressed by the use of this anion. Therefore, when this anion is used, the stability over time of the relevant composition and the film formed therefrom can be enhanced.

As the sulfonate anion, an aliphatic sulfonate anion, an aromatic sulfonate anion, and a camphor sulfonate anion can be exemplified.

As the carboxylate anion, an aliphatic carboxylate anion, an aromatic carboxylate anion, and an aralkyl carboxylate anion can be exemplified.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group can be exemplified.

As a preferred aromatic group of the aromatic sulfonate anion, an aryl group having 6 to 14 carbon atoms, such as a phenyl group, a tolyl group and a naphthyl group can be exemplified.

The alkyl group, cycloalkyl group and aryl group of the aliphatic sulfonate anion and aromatic sulfonate anion may have one or more substituents. As the substituent of the alkyl group, cycloalkyl group and aryl group of the aliphatic sulfonate anion and aromatic sulfonate anion, a nitro group, a halogen atom (fluorine atom, chlorine atom, bromine atom or iodine atom), a carboxy group, a hydroxy group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms) can be exemplified. The aryl group or ring structure of these groups may further have an alkyl group (preferably having 1 to 15 carbon atoms) as its substituent.

As preferred aromatic sulfonate anion, an aryl sulfonate anion corresponding to the acid represented by the following formula (BI) can be exemplified.

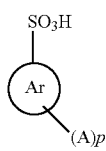

(BI)

In the formula (BI),

Ar represents an aromatic ring optionally further other substituents than group represented by A.

p is an integer of 0 or greater.

A represents a group containing one or more hydrocarbon groups each having 3 or more carbon atoms.

When p is 2 or greater, each of As may be the same or different from each other.

The general formula (BI) will be further explained.

The aromatic ring represented by Ar is preferably an aromatic ring having 6 to 30 carbon atoms.

As the aromatic ring, there can be mentioned, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an iodolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, a phenazine ring or the like. Of these, a benzene ring, a naphthalene ring and an anthracene ring are preferred, and a benzene ring is more preferred.

As substituents other than group represented by A, a group containing one or more hydrocarbon group each having 1 or more carbon atoms, a halogen atom (such as a fluorine atom, a chlorine atom, a bromine atom, and an iodine atom), a hydroxyl group, a cyano group, a nitro group, and a carboxyl group can be exemplified. As the group containing one or more hydrocarbon group each having 1 or more carbon atoms, for example, an alkoxy group such as a methoxy group, an ethoxy group, a tert-butyl group; an aryloxy group such as a phenoxy group and a p-tryloxy group; an alkyl thioxy group such as a methylthioxy group, an ethylthioxy group, and a tert-butylthioxy group; an arylthioxy group such as a phenylthioxy group and a p-tolylthioxy group; an alkoxycarbonyl group such as a methoxycarbonyl group, a butoxycarbonyl group, and a phenoxycarbonyl group; an acetoxy group; a linear or branched alkyl group such as a methyl group, an ethyl group, a propyl group, a butyl group, a heptyl group, a hexyl group, a dodecyl group, a 2-ethylhexyl group; an alkenyl group such as a vinyl group, a propenyl group, and a hexenyl group; an alkynyl group such as an acethylene group, a propynyl group, and a hexynyl group; an aryl group such as a phenyl group and a tolyl group; and an acyl group such as a benzoyl group, an acetyl group, and a toluoyl group. When two or more substituents are present, at least two of them may bond to each other to form a ring.

As the hydrocarbon group in the group represented by A containing one or more hydrocarbon groups each having 3 or more carbon atoms, a noncyclic hydrocarbon group and a cyclic aliphatic group can be exemplified.

As the group represented by A, a group in which the atom adjacent to Ar is tertiary or quaternary carbon atom.

As the noncyclic hydrocarbon group represented by A, an isopropyl group, a t-butyl group, a t-pentyl group, a neopentyl group, a s-butyl group, an isobutyl group, an isohexyl group, a 3,3-jimethylpentyl group, and a 2-ethylhexyl group can be exemplified. The noncyclic hydrocarbon group has preferably 12 or less, more preferably 10 or less carbon atoms.

As the cyclic aliphatic group, a cycloalkyl group such as a cyclobutyl group, a cyclopentyl group, a cyclohexyl group, a cycloheptyl group, and a cyclooctyl group; an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group can be exemplified. Each of these groups may have one or more substituents. The cyclic aliphatic group has preferably 15 or less, more preferably 12 or less carbon atoms.

When the noncyclic hydrocarbon group or the cyclic aliphatic group has one or more substituents, the followings can be exemplified as the substituents. That is, as the substituents, a halogen atom such as a fluorine atom, a chlorine atom, a bromine atom, or an iodine atom; an alkoxy group such as a methoxy group, an ethoxy group, or a tert-butyl group; an aryloxy group such as phenoxy group or a p-tolyloxy group; an alkylthioxy group such as a methylthioxy group, an ethylthioxy group, or a tert-butylthioxy group; an arylthioxy group such as a phenylthioxy group or a p-tolylthioxy group; an alkoxycarbonyl group such as a methoxycarbonyl group, a butoxycarbonyl group, or a phenoxycarbonyl group; an acetoxy group; a linear or branched alkyl group such as a methyl group, an ethyl group, a propyl group, a butyl group, a heptyl group, a hexyl group, a dodecyl group, or a 2-ethylhexyl group; a cycloalkyl group such as a cyclohexyl group; an alkenyl group such as a vinyl group, a propenyl group, or a hexenyl group; an aryl group such as a phenyl group or a tolyl group; a hydroxy group; a carboxy group; a sulfonic group; a carbonyl group; and a cyano group can be exemplified Specific examples of the noncyclic hydrocarbon group or the cyclic aliphatic group represented by A will be shown below.

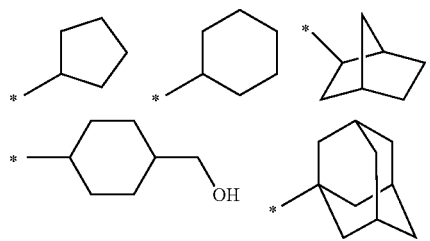

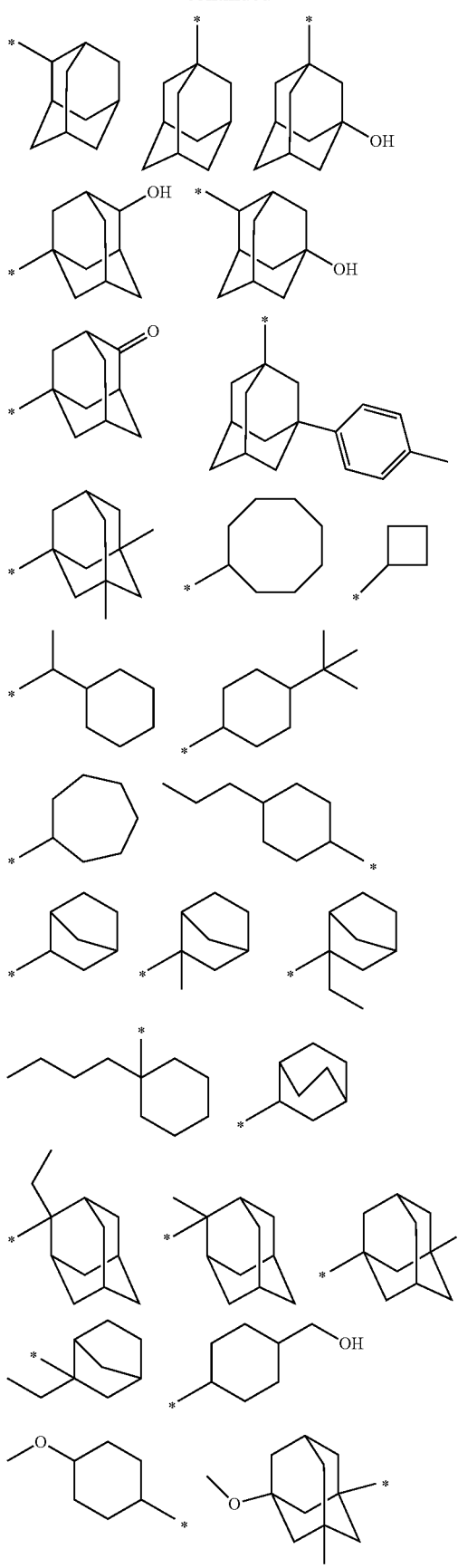
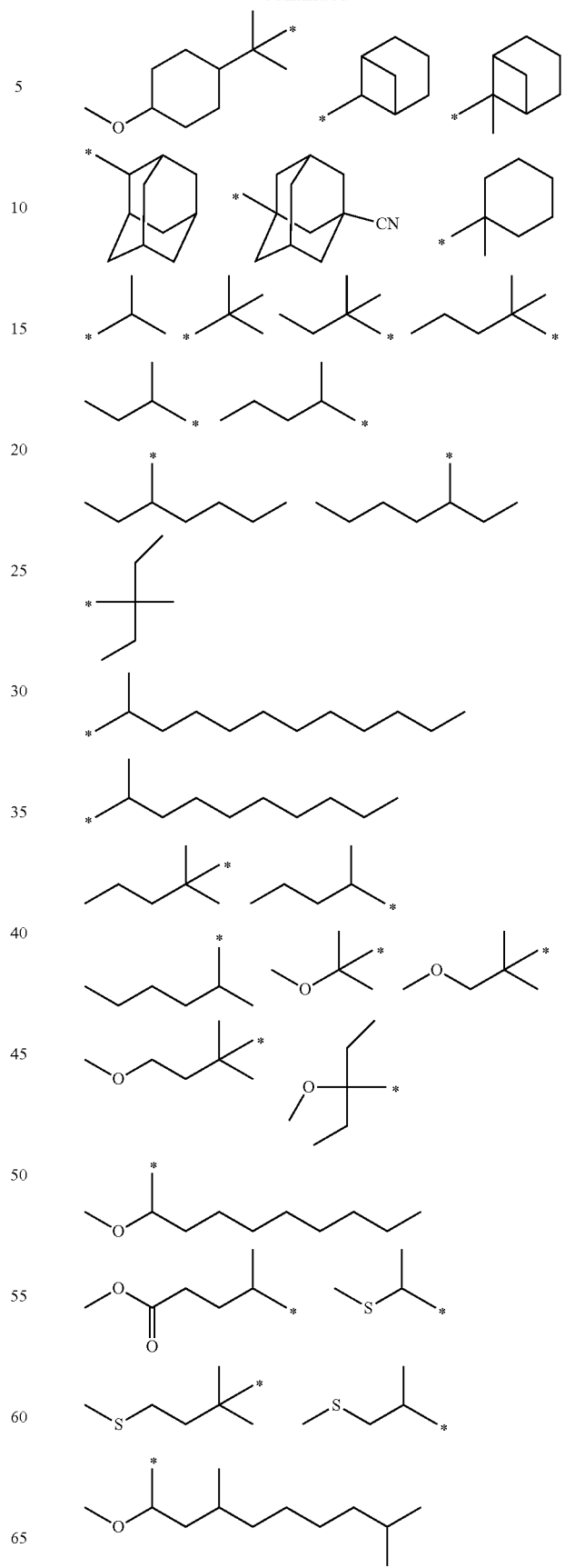

-continued

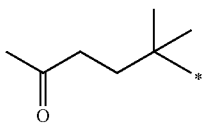

Among the above structures, those shown below are preferred from the viewpoint of inhibiting the diffusion of acids.

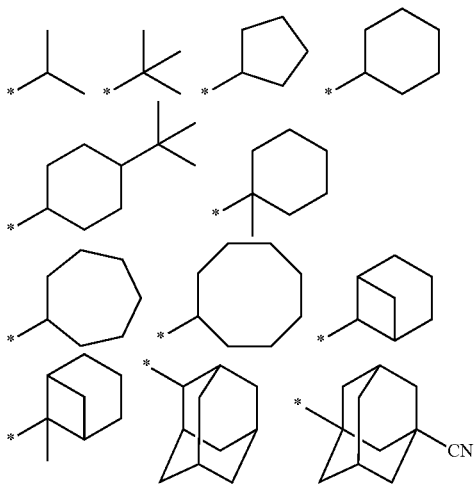

In the formula, p is an integer of 0 or greater. There is no particular upper limit thereof as long as the number is chemically practicable. From the viewpoint of inhibiting the diffusion of acids, p is usually in the range of 0 to 5, preferably 1 to 4, further more preferably 2 or 3 and most preferably 3.

From the viewpoint of inhibiting the diffusion of acids, it is preferred for the substitution with the group represented by A to occur at least one ortho position (o-position) of the sulfonate group. In a more preferred structure, the substitution with the group represented by A occurs at two ortho positions (o-positions).

The acid generator in its one form is any of compounds capable of generating acids of general formula (BII) below.

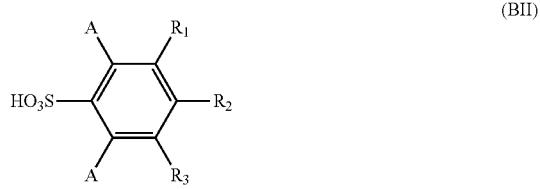

In the formula, groups represented by A has the same meaning as that of general formula (BI). Two A's may be identical to or different from each other. Each of $R_1$ to $R_3$ independently represents a hydrogen atom, a group containing a hydrocarbon group having 1 or more carbon atoms, a halogen atom, a hydroxyl group, a cyano group or a nitro group. Examples of hydrocarbon groups each having 1 or more carbon atoms are the same as set forth above.

Further, as the preferred sulfonate anion, an anion configured to generate the acid represented by general formula (I-A) below can be exemplified.

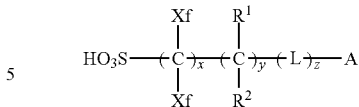

In the formula, each of Xfs independently represents a fluorine atom or an alkyl group having at least one hydrogen atom thereof substituted with one or more fluorine atoms. Each of $R^1$ and $R^2$ independently represents a hydrogen atom, a fluorine atom, an alkyl group or an alkyl group having at least one hydrogen atom thereof substituted with one or more fluorine atoms. When y≥2, the multiple $R^1$s, and also the multiple $R^2$s, may be identical to or different from each other. L represents a single bond or a bivalent connecting group. When z≥2, the multiple Ls may be identical to or different from each other. In the formula, x is an integer of 1 to 20, y an integer of 0 to 10 and z an integer of 0 to 10.

The general formula (I-A) will be described in greater detail below.

The alkyl group in Xf preferably has 1 to 10 carbon atoms, and more preferably 1 to 4 carbon atoms. The alkyl group having at least one hydrogen atom thereof substituted with one or more fluorine atoms is preferably a perfluoroalkyl group.

Xf is preferably a fluorine atom or a perfluoroalkyl group having 1 to 4 carbon atoms. More specifically, a fluorine atom or $CF_3$ are particularly preferred.

As an alkyl group or an alkyl group constituting the one having at least one hydrogen atom thereof substituted with one or more fluorine atoms, those having 1 to 4 carbon atoms are preferred. A perfluoroalkyl group having 1 to 4 carbon atoms are more preferred. Specifically, $CF_3$ is particularly preferred.

In the formula, y is preferably 0 to 4, more preferably 0; x is preferably 1 to 8, more preferably 1 to 4; and z is preferably 0 to 8, more preferably 0 to 4. As the bivalent connecting group represented by L, there can be mentioned, for example, —COO—, —OCO—, —CO—, —O—, —S—, —SO—, —SO$_2$—, an alkylene group, a cycloalkylene group or an alkenylene group. Of these, —COO—, —OCO—, —CO—, —O—, and —SO$_2$— are preferred. —COO—, —OCO—, and —SO$_2$— are more preferred.

As the group with a cyclic structure represented by A, there can be mentioned, for example, an alicyclic group, an aryl group or a group with a heterocyclic structure (in which aromaticity is optional).

The alicyclic group represented by A may either be monocyclic or polycyclic. As the alicyclic group of a single ring, a monocyclic cycloalkyl group such as a cyclopentyl group, a cyclohexyl group, or a cyclooctyl group is preferred. As the alicyclic group of multiple rings, a polycyclic cycloalkyl group such as a norbornyl group, a tricyclodecanyl group, a tetracyclodecanyl group, a tetracyclododecanyl group or an adamantyl group is preferred. In particular, employing a bulky alicyclic group which has a ring having 7 or more carbon atoms such as a norbornyl group, a tricyclodecanyl group, a tetracyclodecanyl group, a tetracyclododecanyl group, and an adamantyl group as the group A can reduce in-film diffusion in the PEB (post-exposure bake) stage, thereby enhancing MEEF (Mask Error Enhancement Factor).

The aryl group represented by A is, for example, a phenyl group, a naphthyl group, a phenanthryl group or an anthryl group. Of these, a naphthyl group exhibiting a low absorbance to a light of 193 nm wavelength is especially preferably used.

As the group with the heterocyclic structure, those with a furan ring, a thiophene ring, a benzofuran ring, a benzothiophene ring, a dibenzofuran ring, a dibenzothiophene ring, a pyridine ring, and a pyperidine ring can be exemplified. Of these, those with a furan ring, a thiophene ring, a pyridine ring or a pyperidine ring are particularly preferred. Further, a cyclic structure with a lactone unit can also be employed as the group with the heterocyclic structure.

The group with a cyclic structure may have one or more substituents. As the substituents, an alkyl group (may be linear, branched or cyclic, preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group can be exemplified.

As the aliphatic moiety of the aliphatic carboxylate anion, the same alkyl groups and cycloalkyl groups as mentioned with respect to the aliphatic sulfonate anion can be exemplified.

As the aromatic group of the aromatic carboxylate anion, the same aryl groups as mentioned with respect to the aromatic sulfonate anion can be exemplified.

As a preferred aralkyl group of the aralkyl carboxylate anion, an aralkyl group having 6 to 12 carbon atoms, such as a benzyl group, a phenethyl group, a naphthylmethyl group, a naphthylethyl group, and a naphthylbutyl group can be exemplified.

The alkyl group, cycloalkyl group, aryl group and aralkyl group of the aliphatic carboxylate anion, aromatic carboxylate anion and aralkyl carboxylate anion may have one or more substituents. As the substituent of the alkyl group, cycloalkyl group, aryl group and aralkyl group of the aliphatic carboxylate anion, aromatic carboxylate anion and aralkyl carboxylate anion, the same halogen atom, alkyl group, cycloalkyl group, alkoxy group, and alkylthio group, etc. as mentioned with respect to the aromatic sulfonate anion can be exemplified.

As the sulfonylimido anion, a saccharin anion can be exemplified.

The alkyl group of the bis(alkylsulfonyl)imido anion and tris(alkylsulfonyl)methyl anion is preferably an alkyl group having 1 to 5 carbon atoms. As such, a methyl group, an ethyl group, a propyl group, an isopropyl group, an n-butyl group, an isobutyl group, a sec-butyl group, a pentyl group, and a neopentyl group can be exemplified. As a substituent of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified. An alkyl group substituted with one or more fluorine atoms is preferred.

As the other nonnucleophilic anions, $BF_4^-$, $PF_6^-$, and $SbF_6^-$ can be exemplified.

As the organic groups represented by $R_{201}$, $R_{202}$ and $R_{203}$, there can be mentioned, for example, the corresponding groups of compounds (ZI-1), (ZI-2), (ZI-3) or (ZI-4) to be described hereinafter.

Compounds having two or more of the structures of the general formula (ZI) may be used as the acid generator. For example, use may be made of a compound having a structure in which at least one of the $R_{201}$ to $R_{203}$ of one of the compounds of the general formula (ZI) is bonded to at least one of the $R_{201}$ to $R_{203}$ of another of the compounds of the general formula (ZI).

As preferred (ZI) components, the following compounds (ZI-1) to (ZI-4) can be exemplified.

The compounds (ZI-1) are arylsulfonium compounds of the general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonyl compound, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, a pyrrole residue, a furan residue, a thiophene residue, an indole residue, a benzofuran residue, and a benzothiophene residue can be exemplified. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have one or more substituents. As the substituent, an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxy group, and a phenylthio group can be exemplified. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the phenyl group.

Now, the compounds (ZI-2) will be described.

The compounds (ZI-2) are compounds represented by the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group, and a vinyl group. More preferred groups include a linear or branched 2-oxoalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As more preferred cycloalkyl group, a 2-oxocycloalkyl group can be exemplified.

The 2-oxoalkyl group may be linear or branched. A group having $>C=O$ at the 2-position of the above-described alkyl group can be preferably exemplified.

The 2-oxocycloalkyl group is preferably a group having $>C=O$ at the 2-position of the above-described cycloalkyl group.

As preferred alkoxy groups of the alkoxycarbonylmethyl group, alkoxy groups having 1 to 5 carbon atoms can be exemplified. As such, there can be mentioned, for example, a methoxy group, an ethoxy group, a propoxy group, a butoxy group and a pentoxy group.

The organic groups containing no aromatic ring represented by $R_{201}$ to $R_{203}$ may further have one or more substituents. As the substituents, a halogen atom, an alkoxy group (having, for example, 1 to 5 carbon atoms), a hydroxy group, a cyano group and a nitro group can be exemplified.

Now the compounds (ZI-3) will be described. The compounds (ZI-3) are those represented by the following general formula (ZI-3) which have a phenacylsulfonium salt structure.

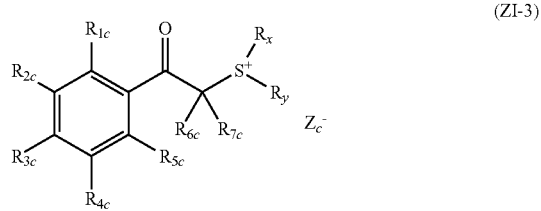

(ZI-3)

In the formula (ZI-3), each of $R_{1c}$ to $R_{5c}$ independently represents a hydrogen atom, an alkyl group, a cycloalkyl group, an alkoxy group, a halogen atom, or a phenylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Z_c^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having $>C=O$ at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.
Specific examples of the cation part in the compound (ZI-3) will be described below.
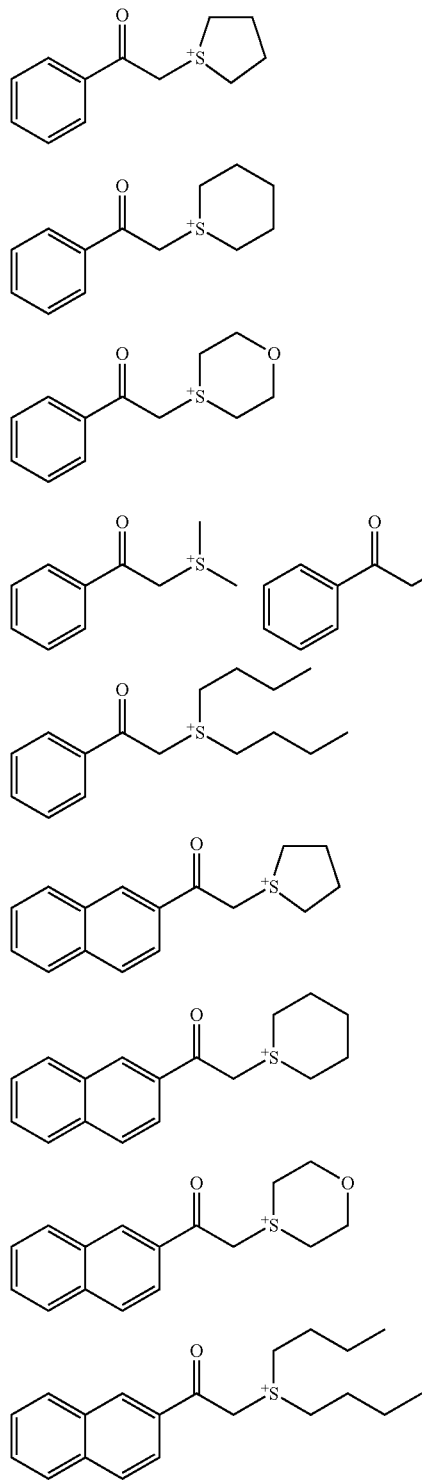
-continued
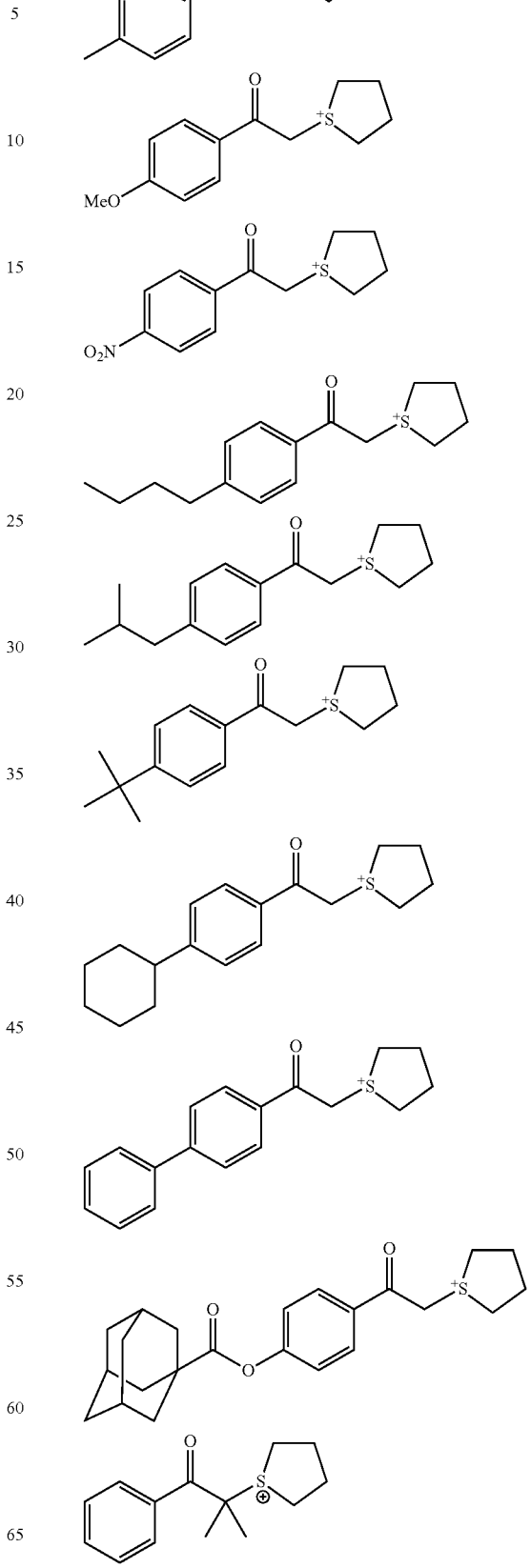

-continued
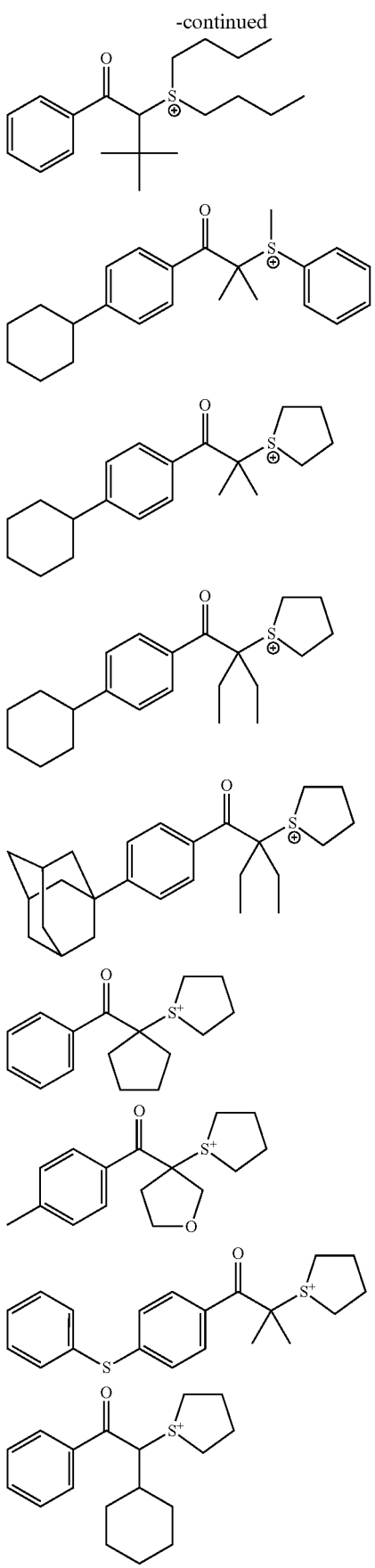
-continued
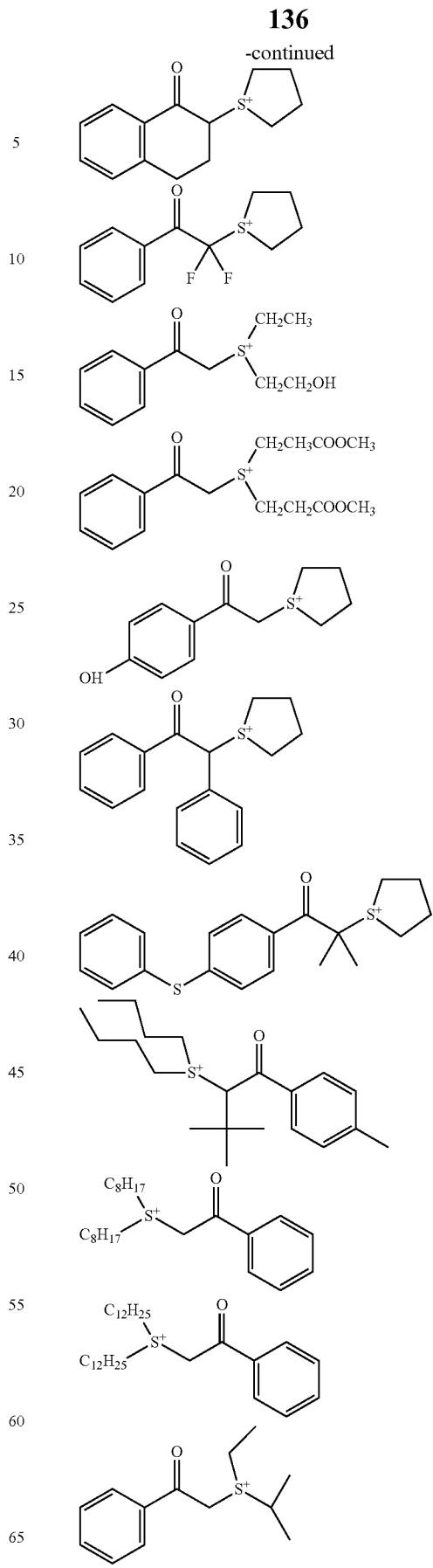

-continued

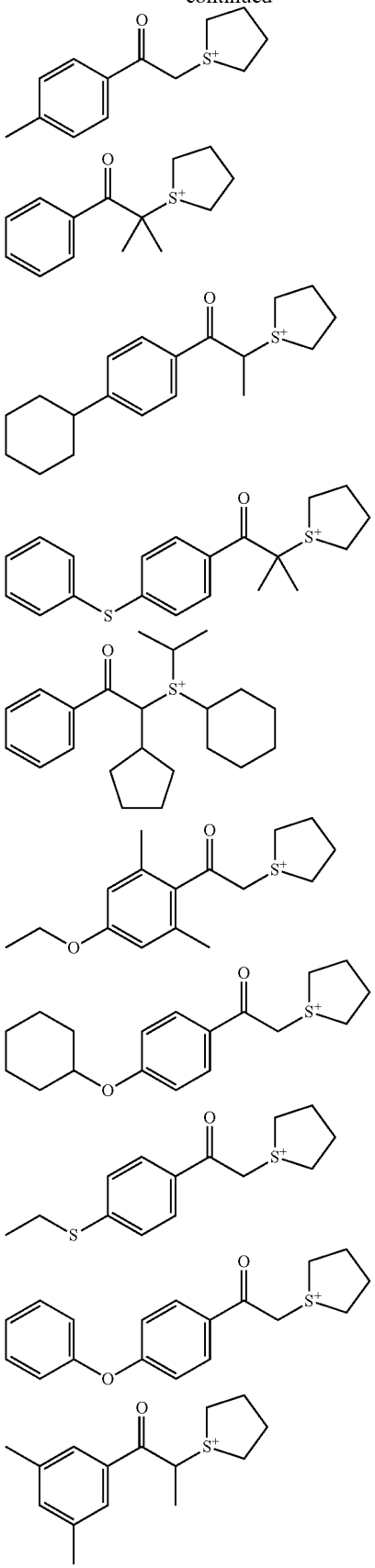

The compounds (ZI-4) are those of general formula (ZI-4) below.

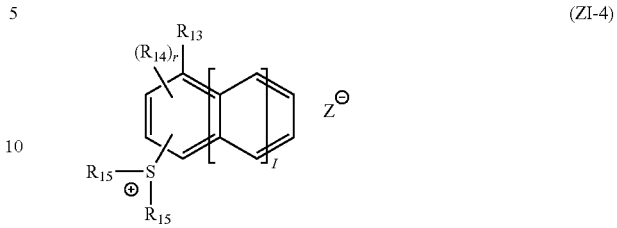

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have one or more substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have one or more substituents.

Each of $R_{15}$s independently represents an alkyl group, a cycloalkyl group or a naphthyl group, provided that the two $R_{15}$s may be bonded to each other to thereby form a ring. These groups may have one or more substituents.

In the formula, l is an integer of 0 to 2, and r is an integer of 0 to 8.

$Z^-$ represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have one or more substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have one or more substituents. As such substituents, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have one or more substituents. As such substituents, there can be mentioned, for example, a hydroxyl group, an alkoxy group, an alkoxycarbonyl group, a halogen atom (especially, a fluorine atom) or the like.

In the formula, l is preferably 0 or 1, more preferably 1, and r is preferably 0 to 2.

Specific examples of the cation part in the compound (ZI-4) will be shown below.

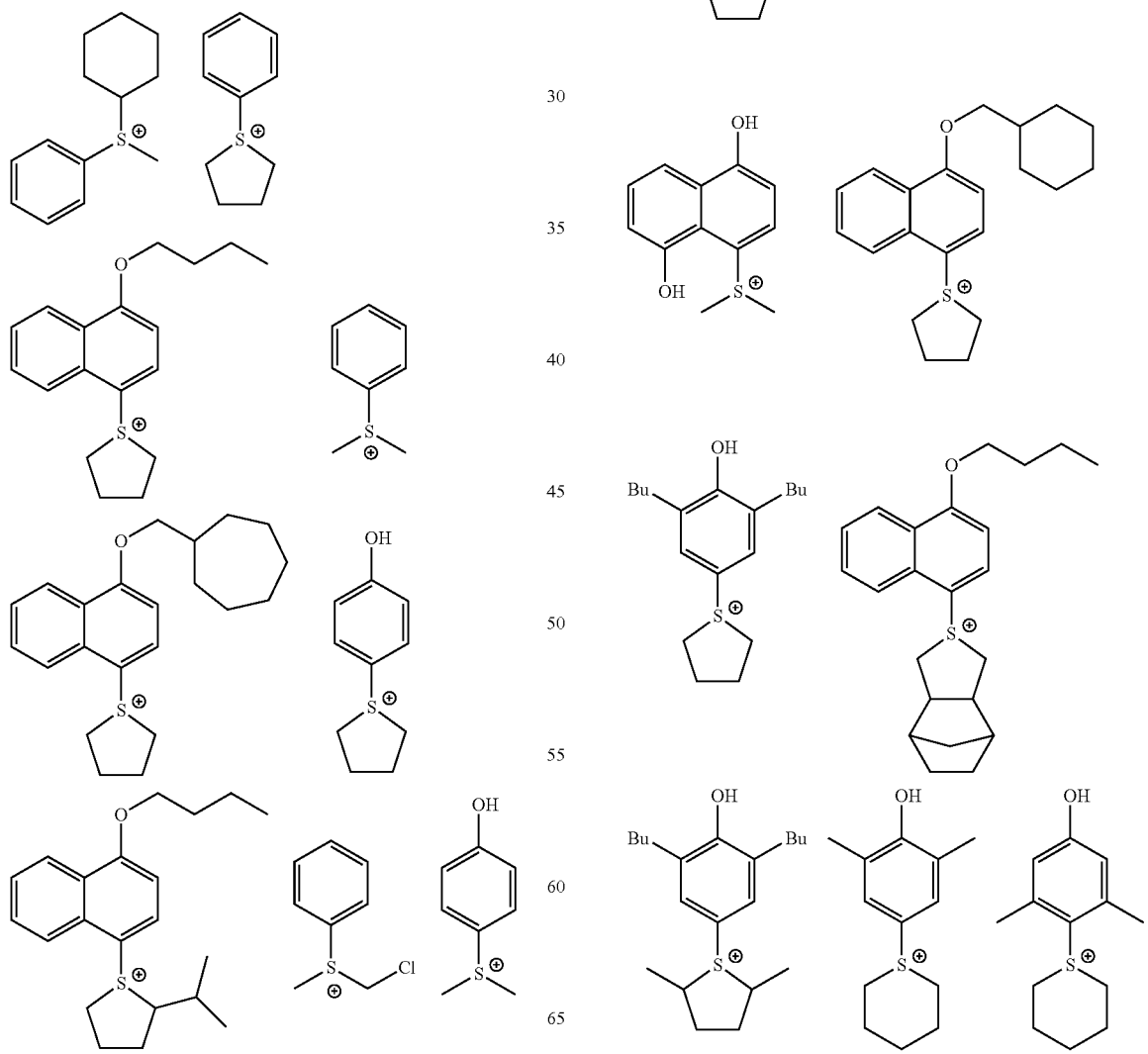

143
-continued
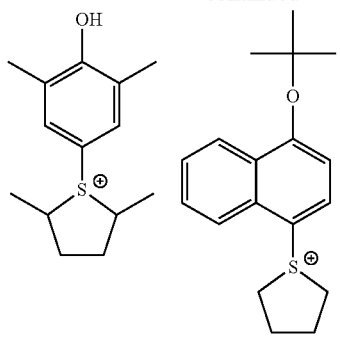
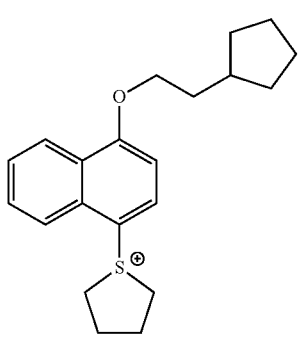
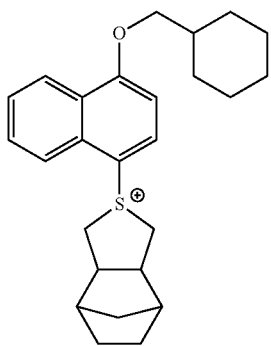
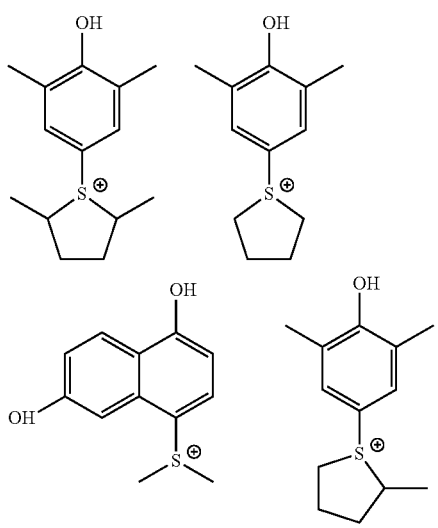
144
-continued
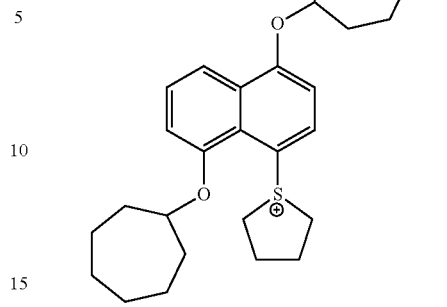
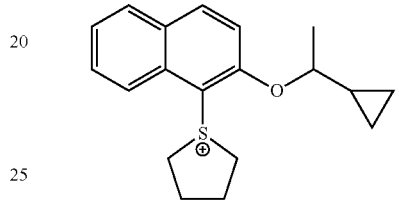
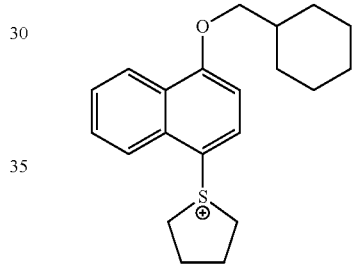
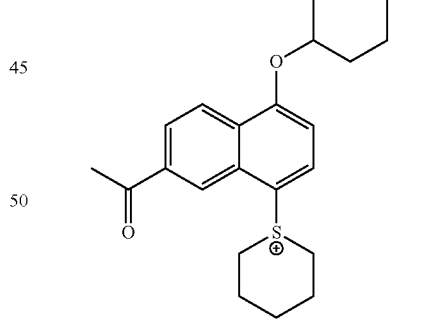
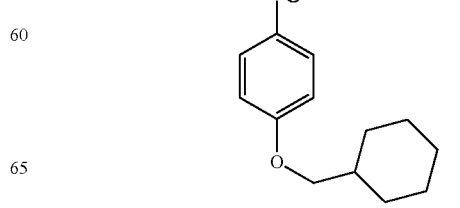

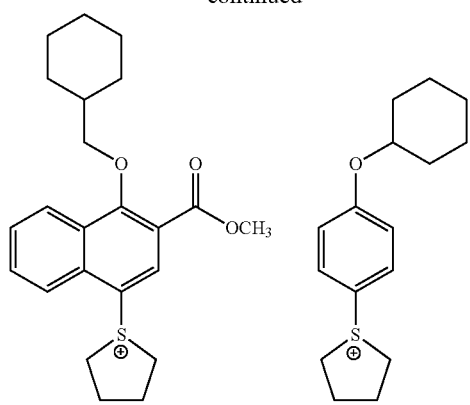
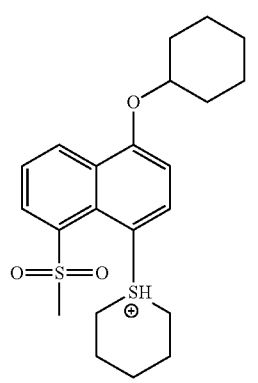
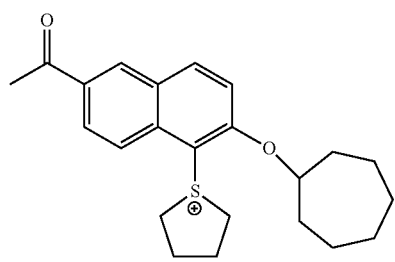
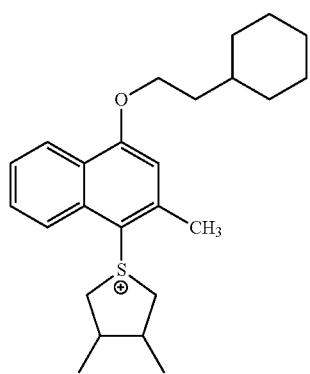
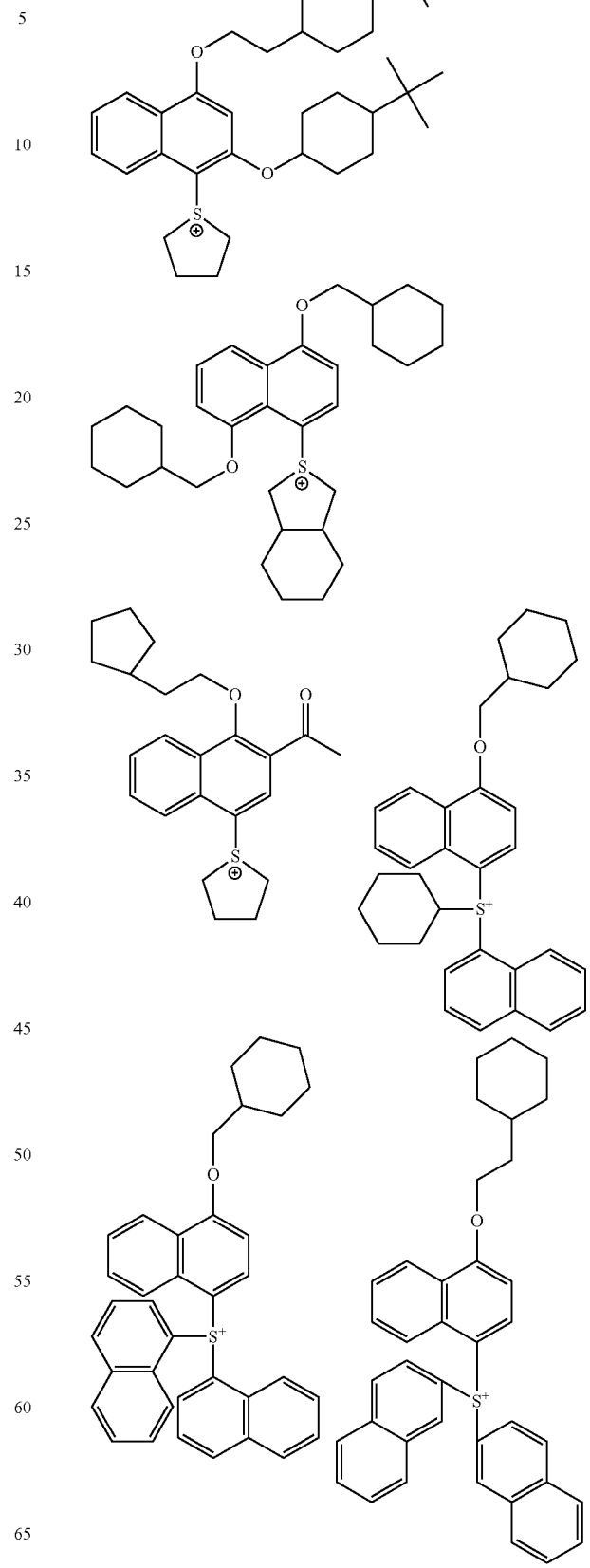

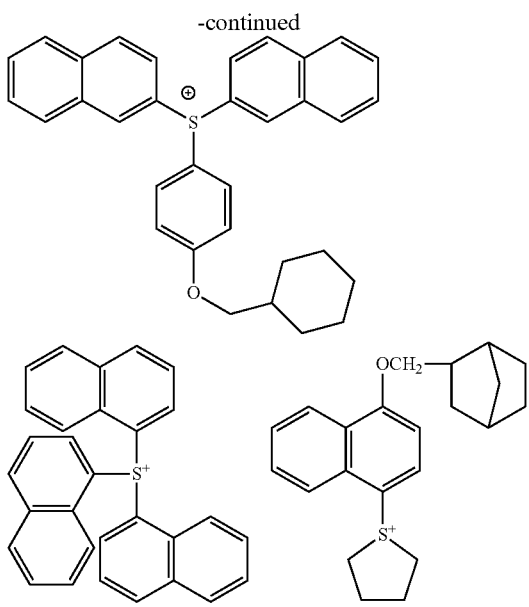

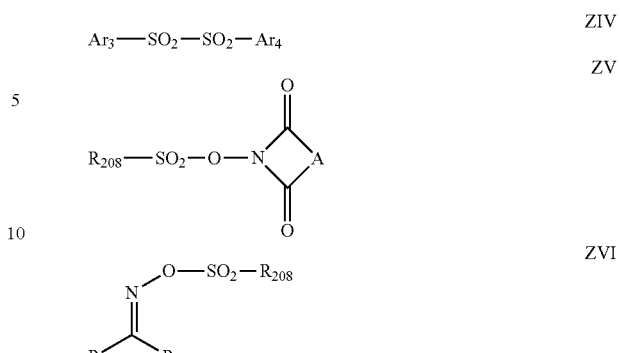

Now, general formulae (ZII) and (ZIII) will be described.

In general formulae (ZII) and (ZIII), each of $R_{204}$ to $R_{207}$ independently represents an aryl group, an alkyl group or a cycloalkyl group.

The aryl group represented by each of $R_{204}$ to $R_{207}$ is preferably a phenyl group or a naphthyl group, more preferably a phenyl group. The aryl group may be one having a heterocyclic structure containing an oxygen atom, nitrogen atom, sulfur atom, etc. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified.

As preferred alkyl groups and cycloalkyl groups represented by $R_{204}$ to $R_{207}$, a linear or branched alkyl group having 1 to 10 carbon atoms and a cycloalkyl group having 3 to 10 carbon atoms can be exemplified. As the alkyl group, for example, a methyl group, an ethyl group, a propyl group, a butyl group and a pentyl group can be exemplified. As the cycloalkyl group, for example, a cyclopentyl group, a cyclohexyl group and a norbornyl group can be exemplified.

The aryl group, alkyl group and cycloalkyl group represented by $R_{204}$ to $R_{207}$ may have one or more substituents. As a possible substituent on the aryl group, alkyl group and cycloalkyl group represented by $R_{204}$ to $R_{207}$, an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxy group, and a phenylthio group can be exemplified.

$Z^-$ represents a nonnucleophilic anion. As such, the same nonnucleophilic anions as mentioned with respect to the $Z^-$ in the general formula (ZI) can be exemplified.

As the acid generators, the compounds represented by the following general formulae (ZIV), (ZV) and (ZVI) can further be exemplified.

In the general formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, the compounds represented by the general formulae (ZI) to (ZIII) are more preferred.

As a preferred acid generator, a compound that generates an acid having one sulfonate group or imido group. As a more preferred acid generator, a compound that generates a monovalent perfluoroalkanesulfonic acid, a compound that generates a monovalent aromatic sulfonic acid substituted with one or more fluorine atoms or fluorine-atom-containing group, and a compound that generates a monovalent imidic acid substituted with one or more fluorine atoms or fluorine-atom-containing group can be exemplified. As a still more preferred acid generator, any of sulfonium salts of fluorinated alkanesulfonic acid, fluorinated benzenesulfonic acid, fluorinated imidic acid and fluorinated methide acid can be exemplified. As acid generators, it is especially preferred for the generated acid to be a fluorinated alkanesulfonic acid, fluorinated benzenesulfonic acid or fluorinated imidic acid, each of which having pKa's of −1 or below in order to improve the sensitivity.

As the acid generator, use may be made of a carboxylic acid onium salt. When the carboxylic acid onium salt is contained, the transparency to light of wavelength 220 nm or shorter can be ensured, and the sensitivity and resolving power can be enhanced. Further, the iso/dense bias and exposure margin can be enhanced by containing the carboxylic acid onium salt.

The carboxylic acid onium salt is preferably an iodonium salt or a sulfonium salt. As the anion thereof, it is preferred to use, for example, a $C_1$ to $C_{30}$ linear or branched alkyl, or mono- or polycycloalkyl carboxylate anion. A carboxylate anion wherein the hydrogen atoms of the alkyl or cycloalkyl group are partially or wholly replaced by fluorine atoms (hereinafter also referred to as a fluorinated carboxylate anion) is especially preferred. An oxygen atom may be introduced in the alkyl or cycloalkyl chain.

As the fluorinated carboxylate anion, there can be mentioned, for example, any of the anions of fluoroacetic acid, difluoroacetic acid, trifluoroacetic acid, pentafluoropropionic acid, heptafulorobutyric acid, nonafluoropentanoic acid, perfluorododecanoic acid, perfluorotridecanoic acid, perfluorocyclohexanecarboxylic acid and 2,2-bistrifluoromethylpropionic acid.

If the resist composition contains the carboxylic acid onium salt, the content ratio of which based on the total solid content of the whole composition is usually in the range of 0.1 to 20 mass %, preferably in the range of 0.5 to 10 mass %, and more preferably 1 to 7 mass %.

When the resist composition of the present invention contains an acid generator, it is optional for the acid that can be generated by the acid generator to contain a fluorine atom. For example, when the acid generator contains an anion, it is optional for the anion to contain a fluorine atom.

As described earlier, the resist composition of the present invention comprises the resin containing a repeating unit containing a group that is decomposed when acted on by an acid to thereby produce an alcoholic hydroxyl group. This resin exhibits a lower activation energy in the reaction between resin and acid than that of a resin containing only a repeating unit containing a group that is decomposed when acted on by an acid to thereby produce a carboxyl group as the repeating unit containing an acid-decomposable group. Therefore, even when use is made of an acid generator that generates an acid of relatively low acid strength, for example, an acid containing no fluorine atom, the effects of the present invention can be fully attained.

Especially preferred examples of the acid generators will be shown below.

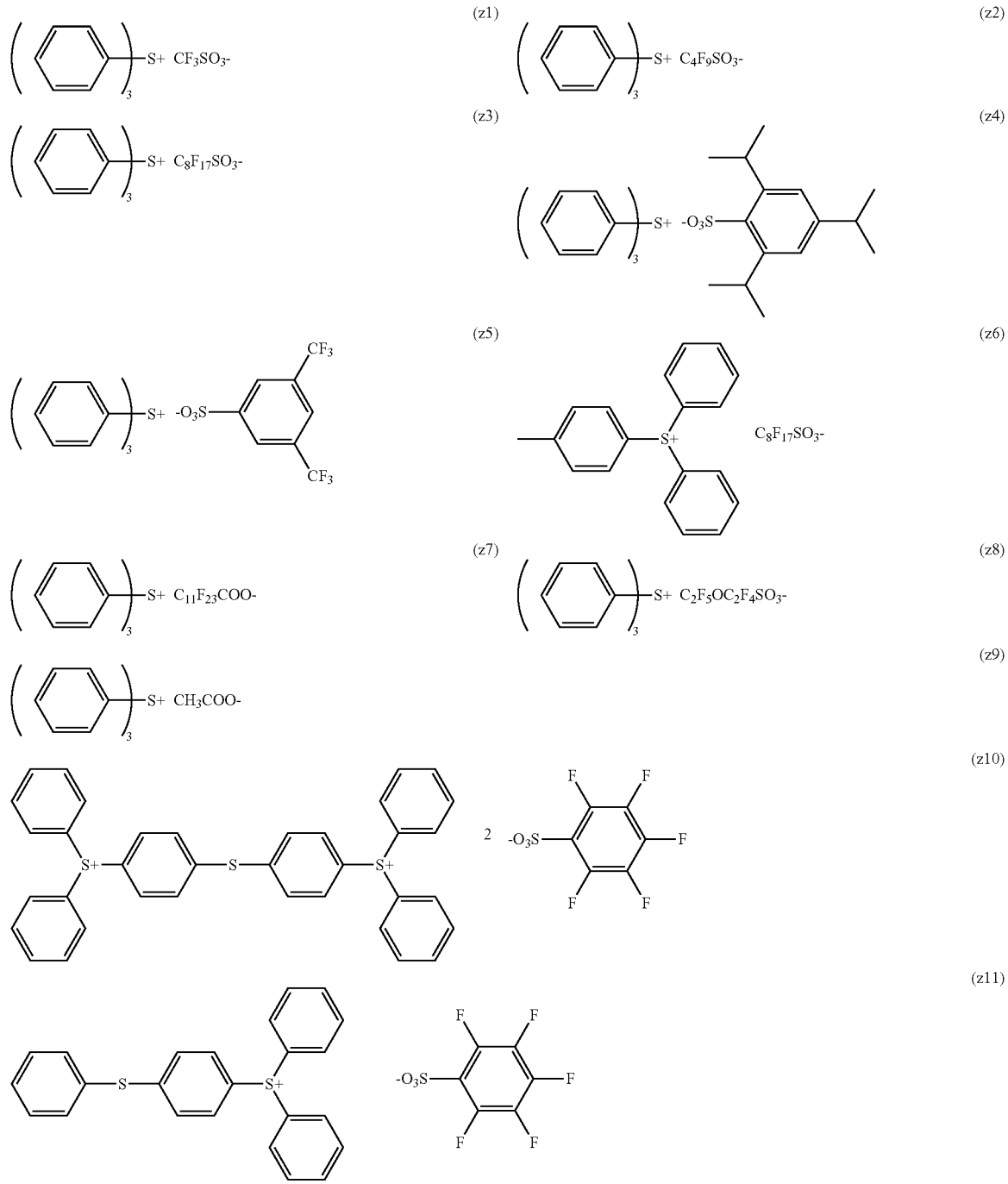

-continued
(z12) 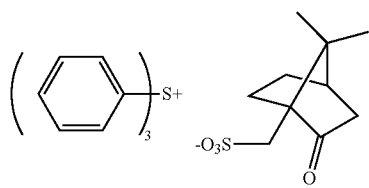
(z13) 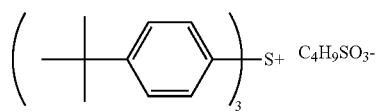
(z14) 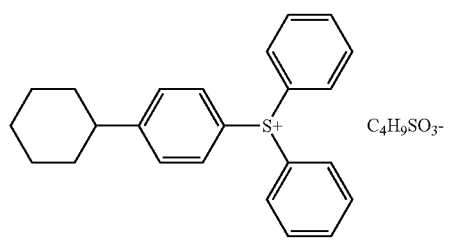
(z15)
(z16) 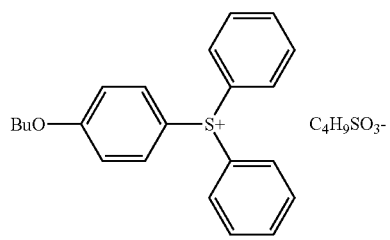
(z17)
(z18) 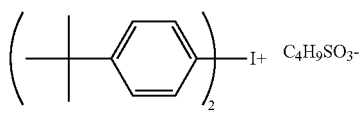
(z19)
(z20) 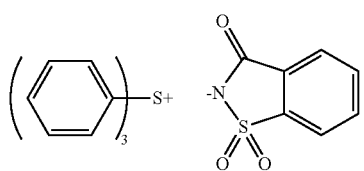
(z21)
(z22) 
(z23)
(z24) 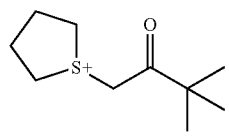
(z25)
(z26) 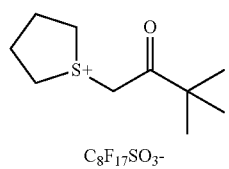
(z27) 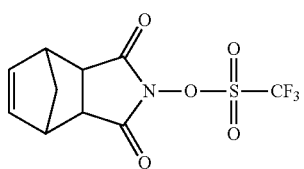

-continued
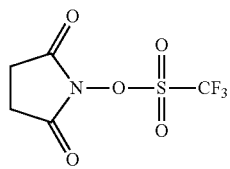
(z28)
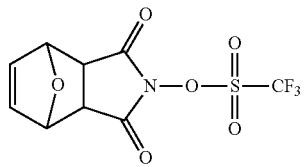
(z29)
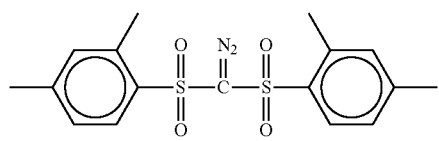
(z30)
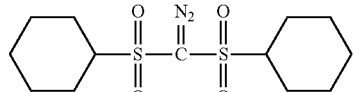
(z31)
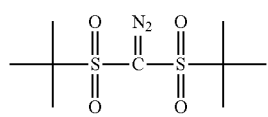
(z32)
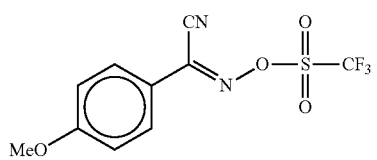
(z33)
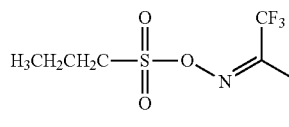
(z34)
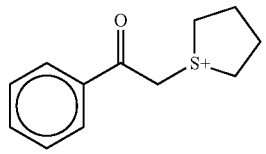
(z35)
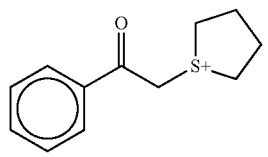
(z36)
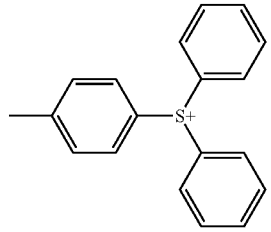
(z37)
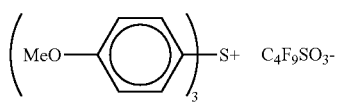
(z38)
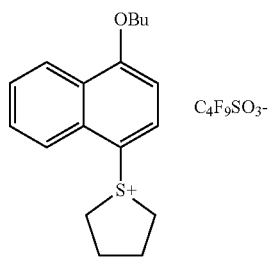
(z39)
(z40)
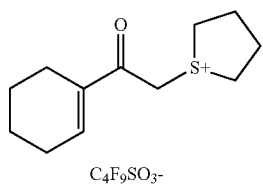
(z41)
(z42)

-continued
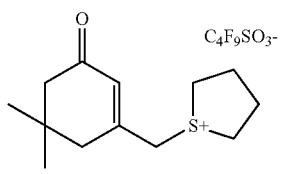
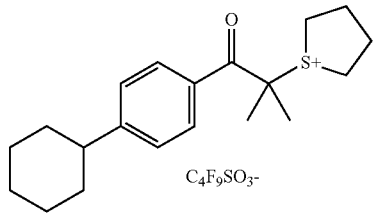 (z44)
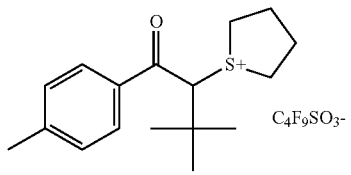
(z45) 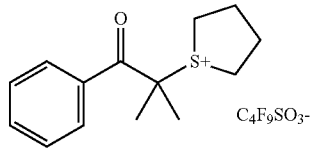 (z46)
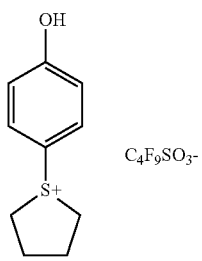
(z47) 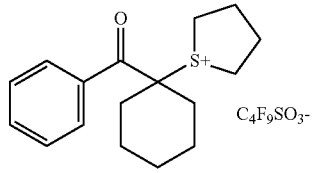 (z48)
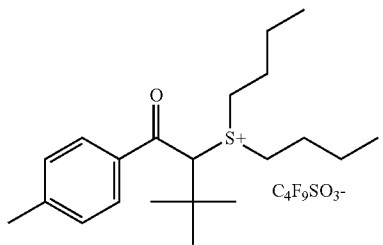
(z49) 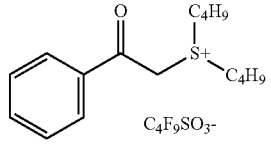 (z50)
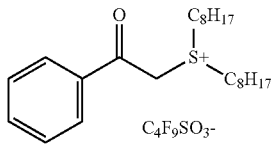
(z51) 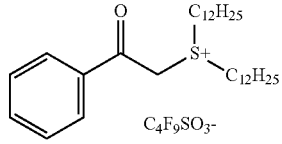 (z52)
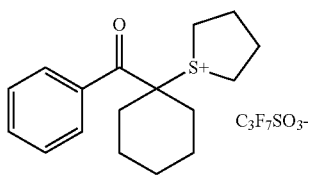
(z53) 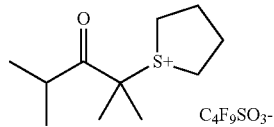 (z54)
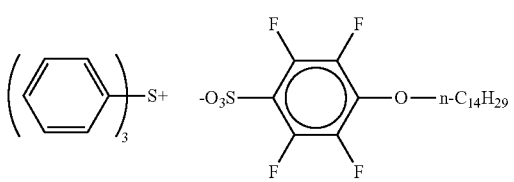
(z55)
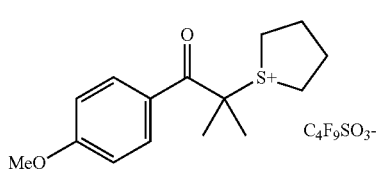
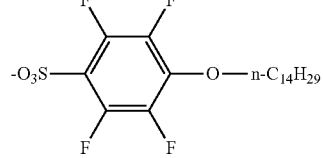 (z56)

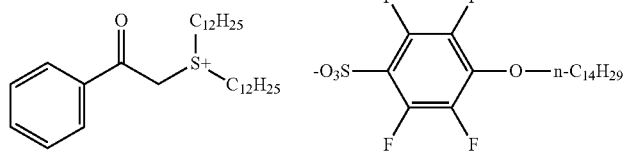
(z57)
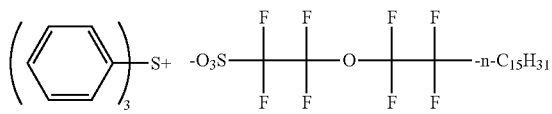
(z58)
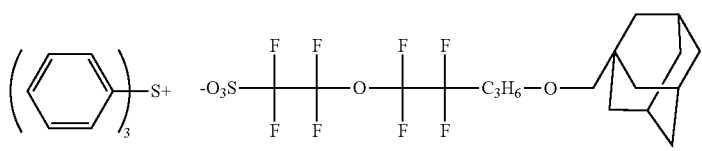
(z59)
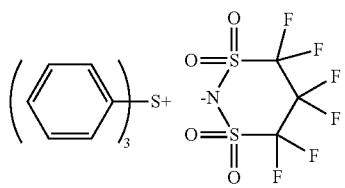
(z60)
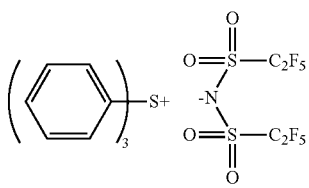
(z61)
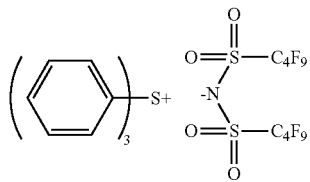
(z62)
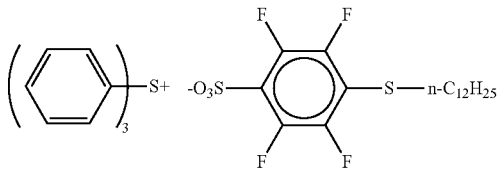
(z63)
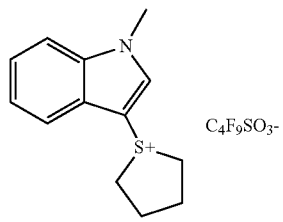
(z64)
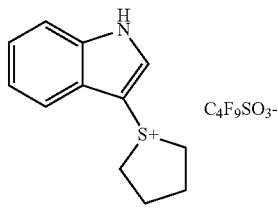
(z65)
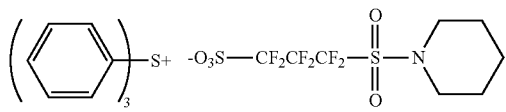
(z66)
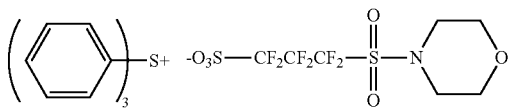
(z67)
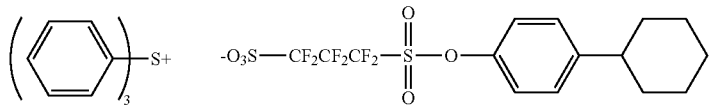
(z68)
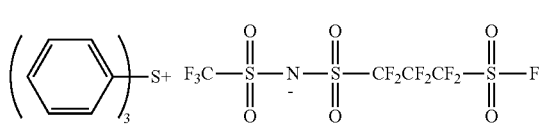
(z69)
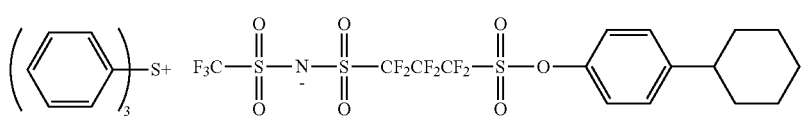
(z70)

-continued
(z71)
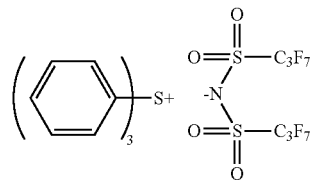
(z72)
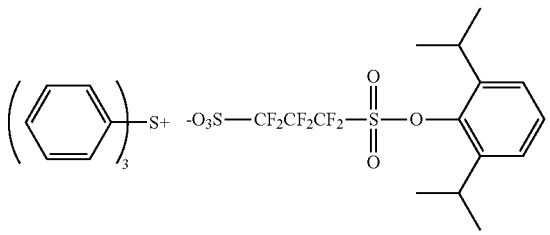
(z73)
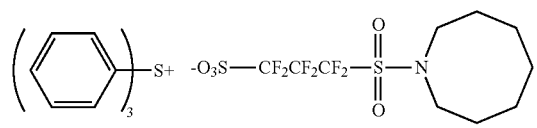
(z74)
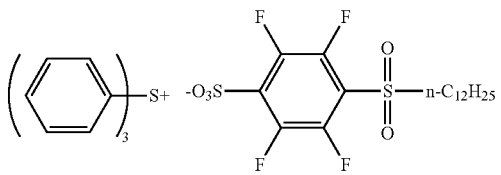
(z75)
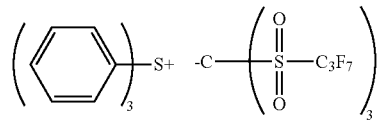
(z76)
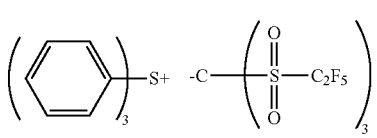
(z77)
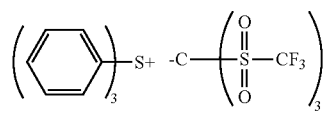
(z78)
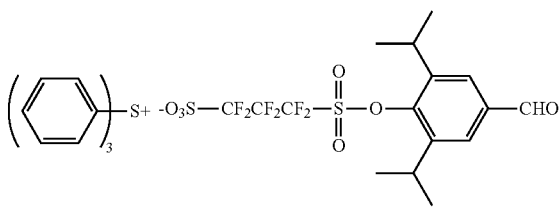
(z79)
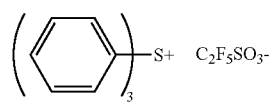
(z80)
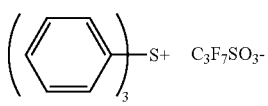
(z81)
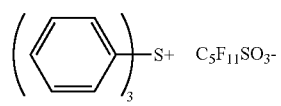
(z82)
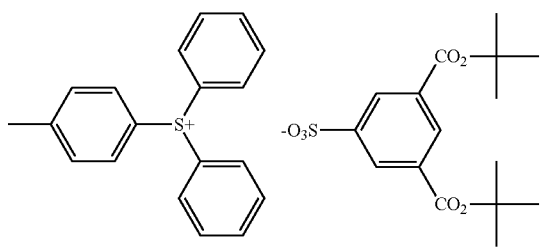
(z83)
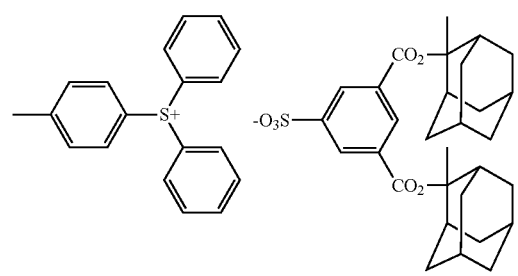
(z84)
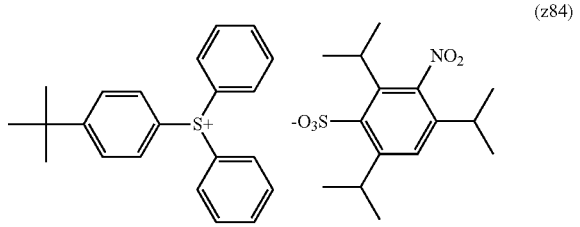

-continued
(z85)
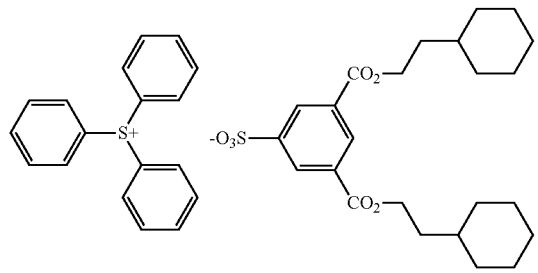
(z86)
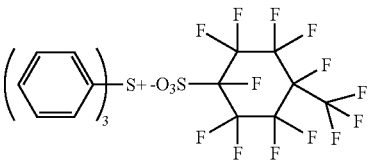
(z87)
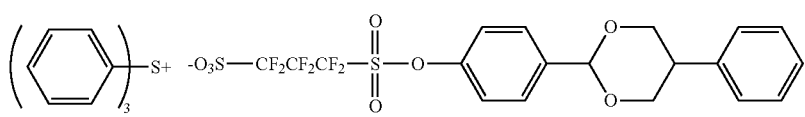
(z88)
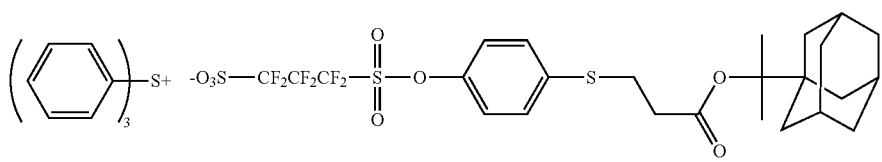
(z89)
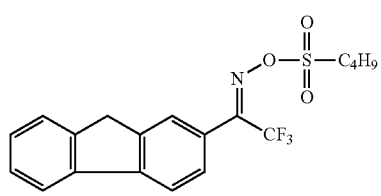
(z90)
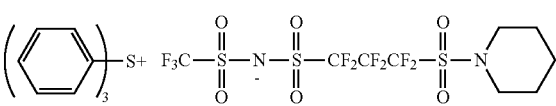
(z91)
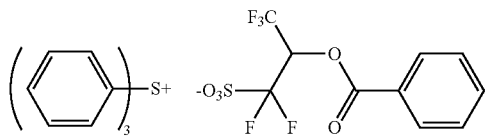
(ZL-1)
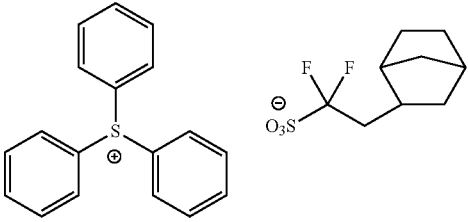
(ZL-2)
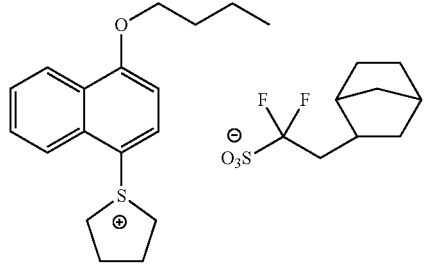
(ZL-3)
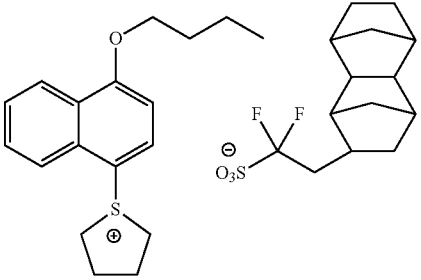
(ZL-4)
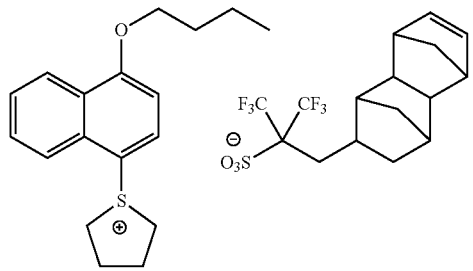
(ZL-5)
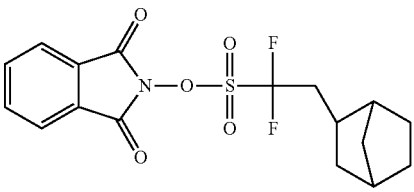

-continued
(ZL-6)
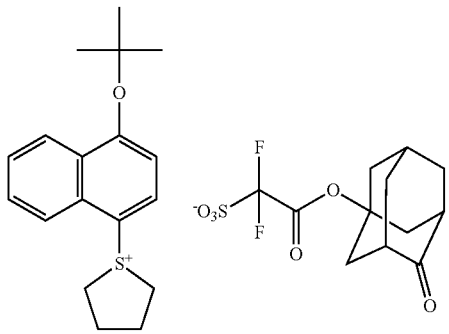
(ZL-7)
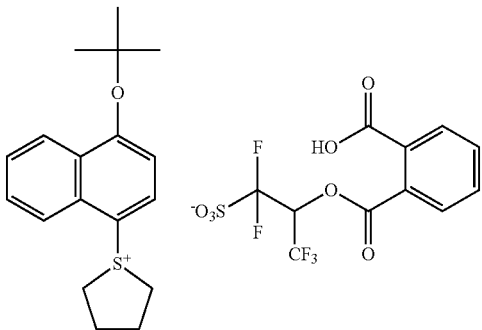
(ZL-8)
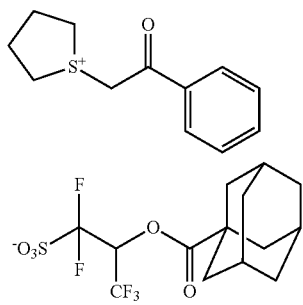
(ZL-9)
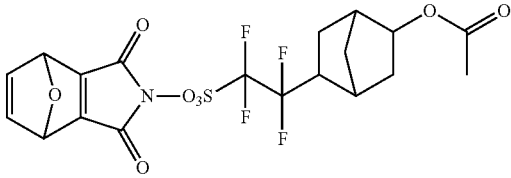
(ZL-10)
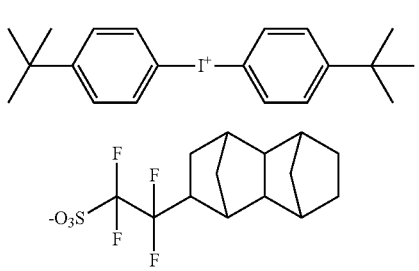
(ZL-11)
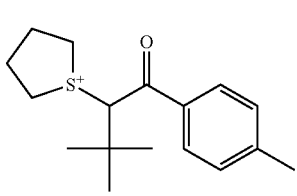
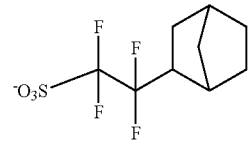
(ZL-12)
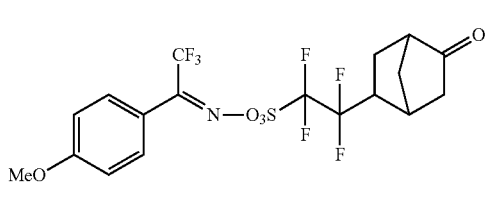
(ZL-13)
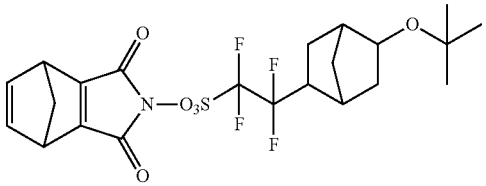
(ZL-14)
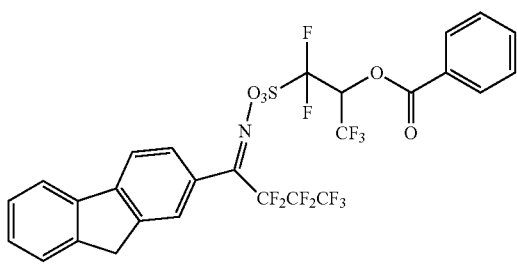
(ZL-15)
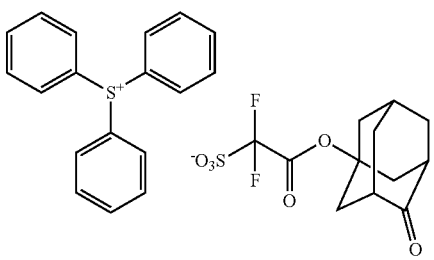

-continued
(ZL-16)
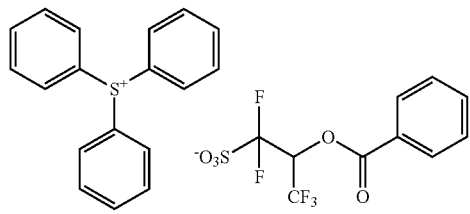
(ZL-17)
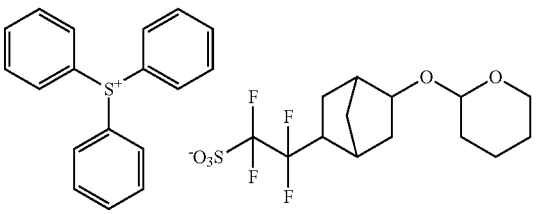
(ZL-18)
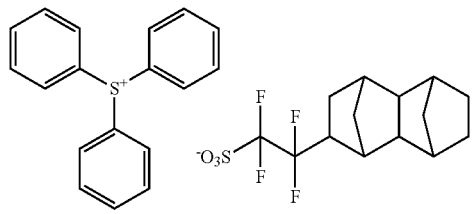
(ZL-19)
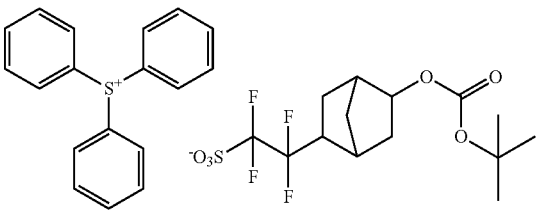
(ZL-20)
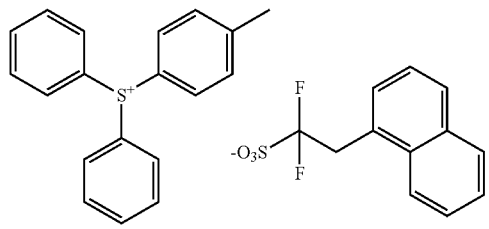
(ZL-21)
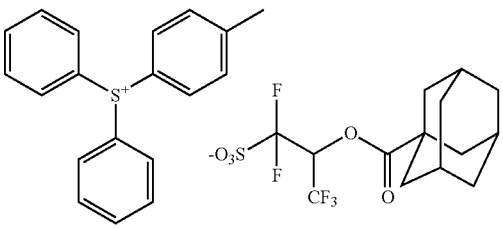
(ZL-22)
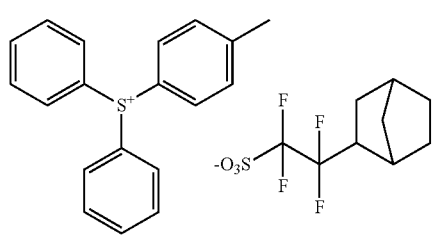
(ZL-23)
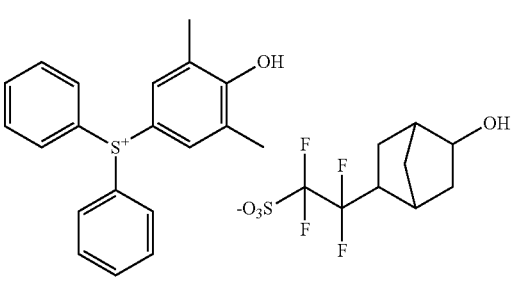
(ZL-24)
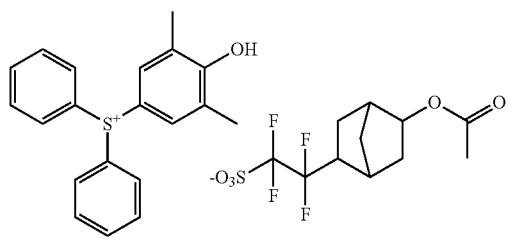
(ZL-25)
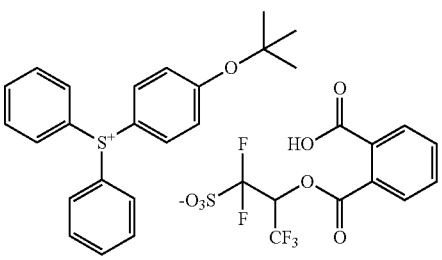
(ZL-26)
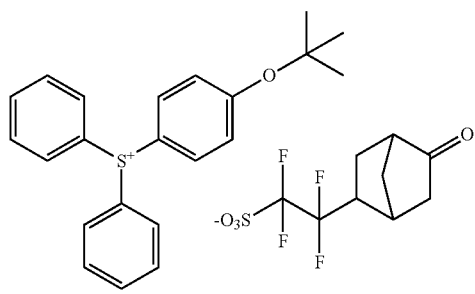
(ZL-27)
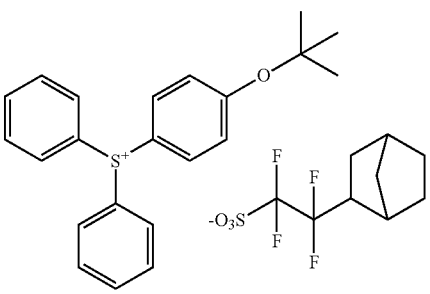

-continued
(ZL-28)
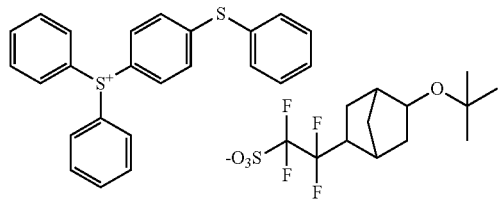
(ZL-29)
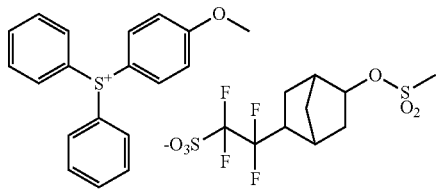
(ZL-30)
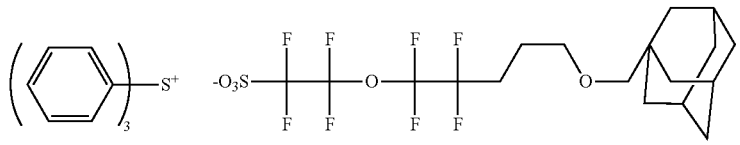
(ZL-31)
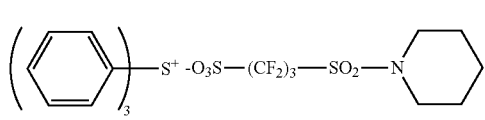
(ZL-32)
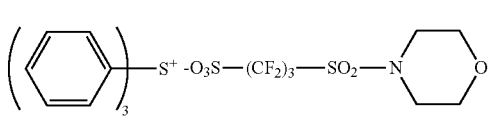
(ZL-33)
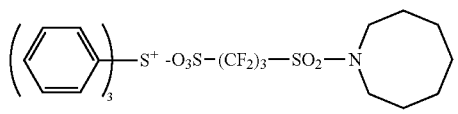
(ZL-34)
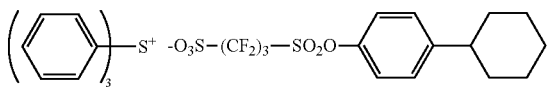
(ZL-35)
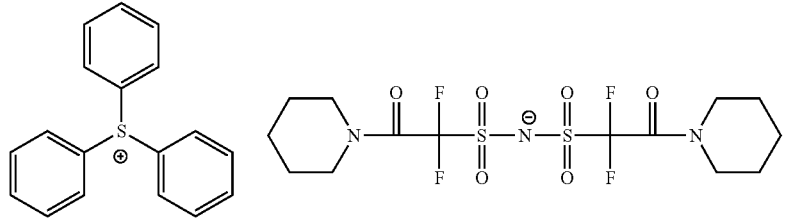
(ZL-36)
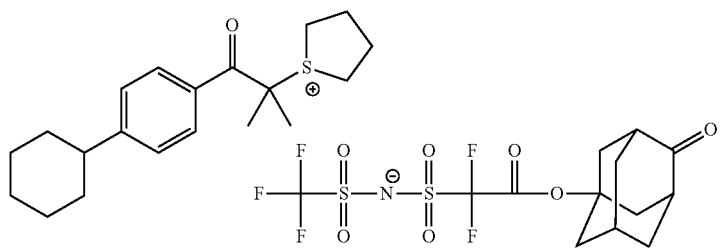
(ZL-37)
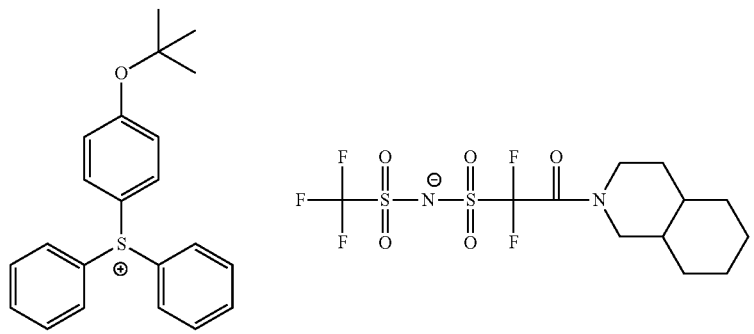

-continued
(ZL-38)
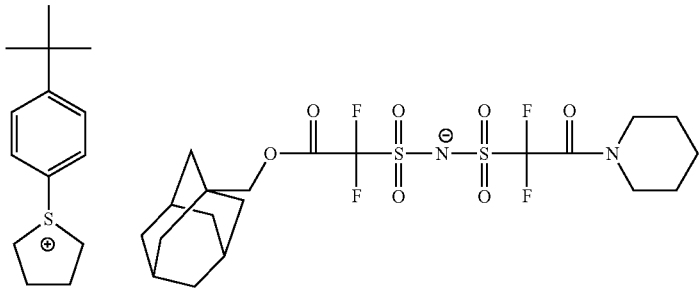
(ZL-39)
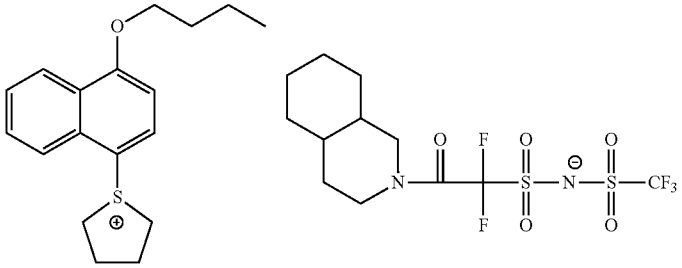
(ZL-40)
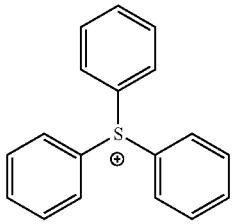
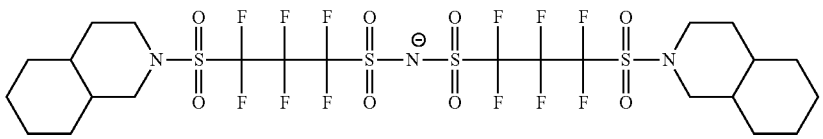
(ZL-41)
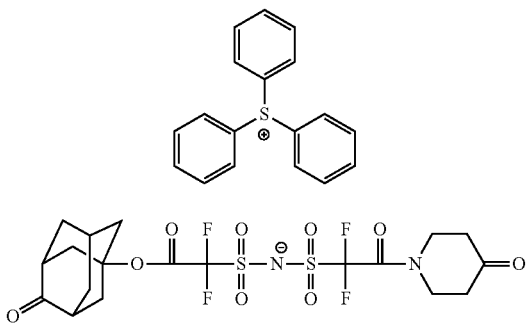
(ZL-42)
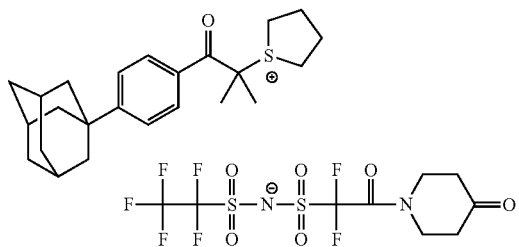
(ZL-43)
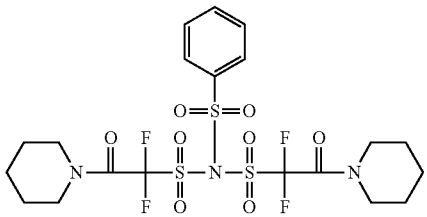
(ZL-44)
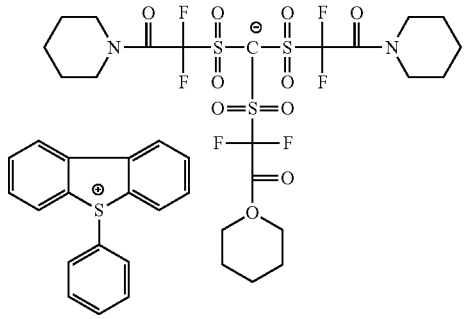

-continued
(ZL-45)
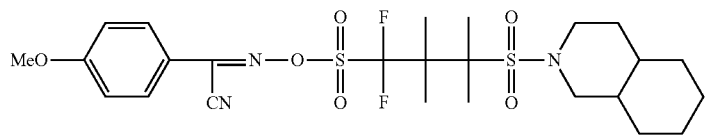
(ZL-46)
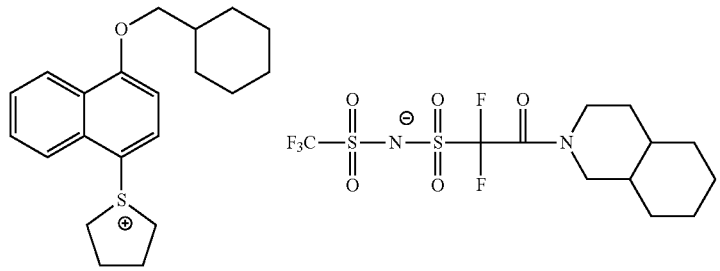
(ZL-47)
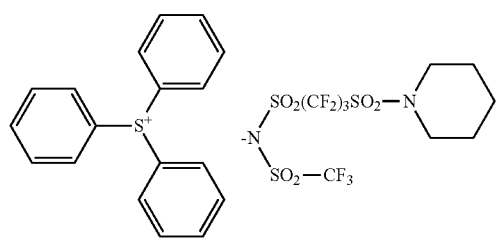
(ZL-48)
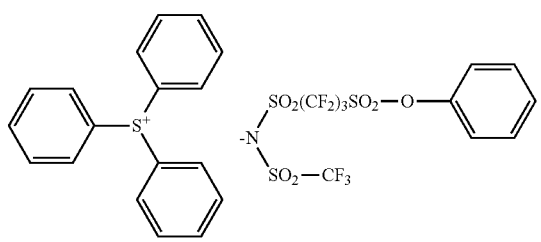
(ZL-49)
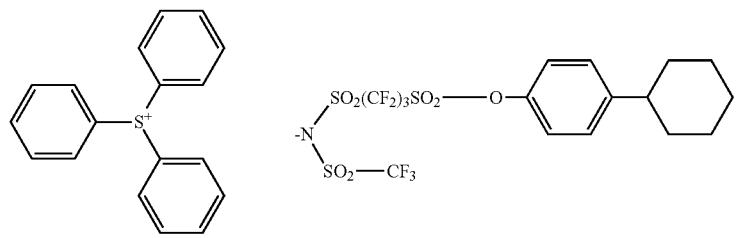
(ZL-50)
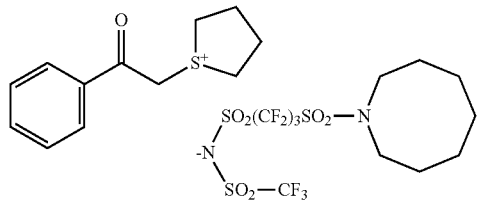
(ZL-51)
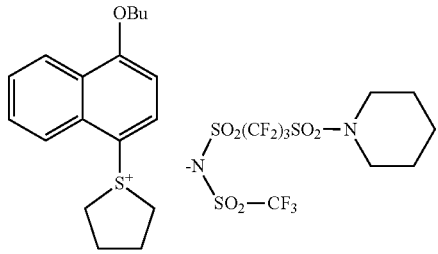
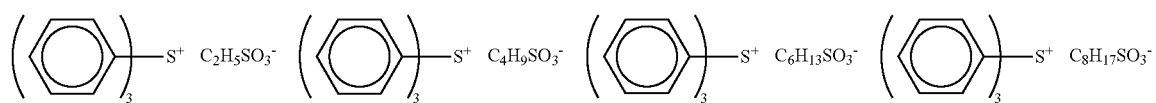
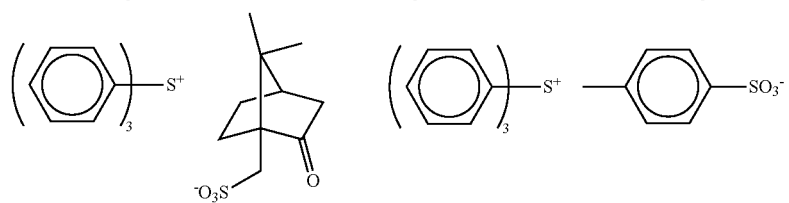

-continued

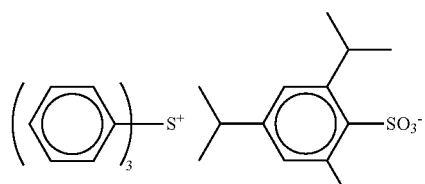 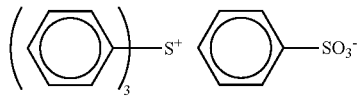

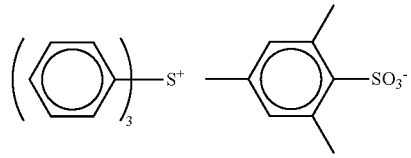 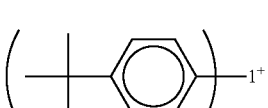 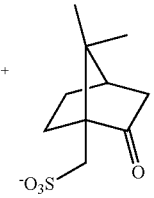 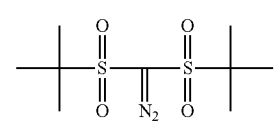

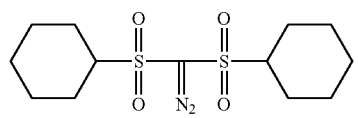  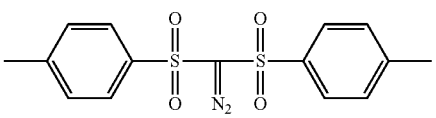

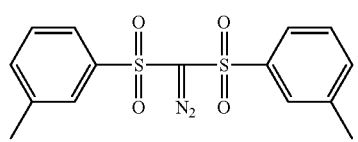 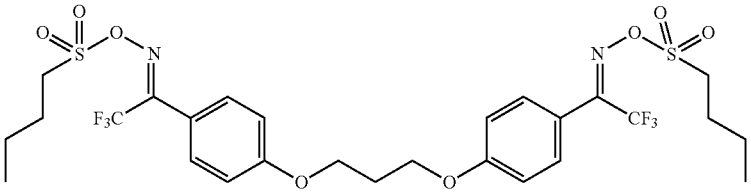

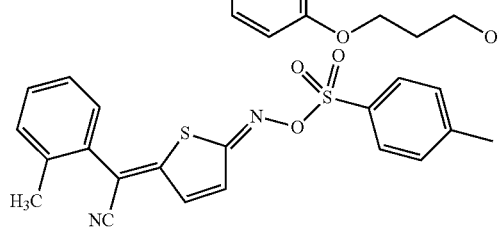

The acid generators can be used either individually or in combination of two or more kinds.

When the composition of the present invention contains an acid generator, the content thereof based on the total solids of the composition is preferably in the range of 0.1 to 20 mass %, more preferably 0.5 to 17.5 mass % and further more preferably 1 to 15 mass %.

(c) Basic Compound

The resist composition according to the present invention may further contain one or more basic compounds. As preferred basic compounds, the compounds having the structures represented by the following formulae (A) to (E) can be exemplified.

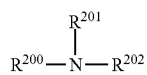 (A)

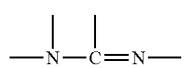 (B)

 (C)

 (D)

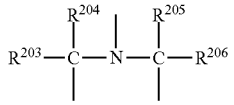 (E)

In the general formulae (A) and (E), $R^{200}$, $R^{201}$ and $R^{202}$ each independently represents a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded to each other to form a ring.

$R^{203}$, $R^{204}$, $R^{205}$ and $R^{206}$ each independently represents an alkyl group having 1 to 20 carbon atoms.

With respect to the above alkyl group, as a preferred substituted alkyl group, an aminoalkyl group having 1 to 20 carbon atoms, a hydroxyalkyl group having 1 to 20 carbon atoms, and a cyanoalkyl group having 1 to 20 carbon atoms can be exemplified. More preferably, the alkyl groups are unsubstituted.

As preferred basic compounds, guanidine, aminopyrrolidine, pyrazole, pyrazoline, piperazine, aminomorpholine, aminoalkylmorpholine and piperidine can be exemplified. As more preferred compounds, those with an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond can be exemplified.

As the compounds with an imidazole structure, imidazole, 2,4,5-triphenylimidazole, benzimidazole, and 2-phenylbenzoimidazole can be exemplified.

As the compounds with a diazabicyclo structure, 1,4-diazabicyclo[2,2,2]octane, 1,5-diazabicyclo[4,3,0]non-5-ene, and 1,8-diazabicyclo[5,4,0]undec-7-ene can be exemplified.

As the compounds with an onium hydroxide structure, tetrabutylammonium hydroxide, triarylsulfonium hydroxide, phenacylsulfonium hydroxide, and sulfonium hydroxides having a 2-oxoalkyl group, such as triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified.

As the compounds with an onium carboxylate structure, those having a carboxylate at the anion moiety of the compounds with an onium hydroxide structure, such as acetate, adamantane-1-carboxylate, and perfluoroalkyl carboxylate can be exemplified.

As the compounds with a trialkylamine structure, tri(n-butyl)amine and tri(n-octyl)amine can be exemplified.

As the aniline compounds, 2,6-diisopropylaniline, N,N-dimethylaniline, N,N-dibutylaniline, and N,N-dihexylaniline can be exemplified.

As the alkylamine derivatives having a hydroxy group and/or an ether bond, ethanolamine, diethanolamine, triethanolamine, N-phenyldiethanolamine, and tris(methoxyethoxyethyl)amine can be exemplified.

As the aniline derivatives having a hydroxy group and/or an ether bond, N,N-bis(hydroxyethyl)aniline can be exemplified.

As preferred basic compounds, an amine compound having a phenoxy group, an ammonium salt compound having a phenoxy group, an amine compound having a sulfonic ester group, and an ammonium salt compound having a sulfonic ester group can further be exemplified.

In these compounds, it is preferred for at least one alkyl group to be bonded to a nitrogen atom. More preferably, an oxygen atom is contained in the chain of the alkyl group, thereby forming an oxyalkylene group. With respect to the number of oxyalkylene groups in each molecule, one or more is preferred, three to nine more preferred, and four to six further more preferred. Of these oxyalkylene groups, the groups of the formulae —CH$_2$CH$_2$O—, —CH(CH$_3$)CH$_2$O— and —CH$_2$CH$_2$CH$_2$O— are especially preferred.

As specific examples of these compounds, there can be mentioned, for example, the compounds (C1-1) to (C3-3) given as examples in section [0066] of US Patent Application Publication No. 2007/0224539 A.

The total amount of basic compound used based on the solid contents of the actinic ray-sensitive or radiation-sensitive resin composition is generally in the range of 0.001 to 10 mass %, preferably 0.01 to 5 mass %.

The molar ratio of the total amount of acid generators to the total amount of basic compounds is preferably in the range of 2.5 to 300, more preferably 5.0 to 200 and further more preferably 7.0 to 150. When this molar ratio is extremely lowered, the possibility of sensitivity and/or resolution deterioration is invited. On the other hand, when the molar ratio is extremely raised, any pattern thickening might occur during the period between exposure and postbake.

(d) Solvent

The resist composition according to the present invention may further contain solvent. As the solvent, an organic solvent such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate can be exemplified.

As alkylene glycol monoalkyl ether carboxylates, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate can be exemplified.

As alkylene glycol monoalkyl ethers, propylene glycol monomethyl ether, propylene glycol monoethyl ether, propylene glycol monopropyl ether, propylene glycol monobutyl ether, ethylene glycol monomethyl ether, and ethylene glycol monoethyl ether can be exemplified.

As alkyl lactates, methyl lactate, ethyl lactate, propyl lactate and butyl lactate can be exemplified.

As alkyl alkoxypropionates, ethyl 3-ethoxypropionate, methyl 3-methoxypropionate, methyl 3-ethoxypropionate, and ethyl 3-methoxypropionate can be exemplified.

As cyclolactones, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone can be exemplified.

As optionally cyclized monoketone compounds, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone can be exemplified.

As alkylene carbonates, propylene carbonate, vinylene carbonate, ethylene carbonate, and butylene carbonate can be exemplified.

As alkyl alkoxyacetates, acetic acid 2-methoxyethyl ester, acetic acid 2-ethoxyethyl ester, acetic acid 2-(2-ethoxyethoxy)ethyl ester, acetic acid 3-methoxy-3-methylbutyl ester, and acetic acid 1-methoxy-2-propyl ester can be exemplified.

As alkyl pyruvates, methyl pyruvate, ethyl pyruvate and propyl pyruvate can be exemplified.

As a preferably employable solvent, a solvent having a boiling point measured at ordinary temperature under ordinary pressure of 130° C. or above can be mentioned. As the solvent, cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester, and propylene carbonate can be exemplified.

These solvents may be used either individually or in combination. When in the latter case, a mixed solvent consisting of a mixture of a solvent having a hydroxy group in its structure and a solvent having no hydroxy group may be used as the organic solvent.

As the solvent having a hydroxy group, an alkylene glycol monoalkyl ether and ethyl lactate can be exemplified. Of these, propylene glycol monomethyl ether, and ethyl lactate are especially preferred.

As the solvent having no hydroxy group, an alkylene glycol monoalkyl ether acetate, an alkylalkoxypropionate, a monoketone compound optionally with a ring structure, a cyclic lactone, and an alkyl acetate can be exemplified. Of these, a propylene glycol monomethyl ether acetate, an ethylehoxypropionate, a 2-heptanone, a γ-butyl lactone, a cyclohexanone, or a butyl acetate is more preferred, and a propylene glycol monomethyl ether acetate, an ethylehoxypropionate, or a 2-heptanone is especially preferred.

When employing a mixed solvent consisting of a mixture of a solvent having a hydroxy group in its structure and a solvent having no hydroxy group, the mass ratio between them is preferably in the range of 1/99 to 99/1, more preferably 10/90 to 90/10, and further more preferably 20/80 to 60/40.

The mixed solvent containing 50 mass % or more of a solvent having no hydroxy group is especially preferred from the viewpoint of uniform applicability.

It is preferred for the solvent to be a mixed solvent consisting of two or more solvents and to contain propylene glycol monomethyl ether acetate.

(e) Hydrophobic Resin

The resist composition of the present invention may further contain a hydrophobic resin. When the hydrophobic resin is contained, the hydrophobic resin is localized in a surface layer of resist film, so that in the use of water as an immersion medium, the receding contact angle of the film with the immersion liquid can be increased to thereby enhance the immersion liquid tracking property of the film.

The receding contact angle of a film after baking and before exposing is preferably in the range of 60° to 90°, more preferably 65° or higher, further more preferably 70° or higher, and particularly preferably 75° or higher as measured under the conditions of temperature 23±3° C. and humidity 45±5%.

Although the hydrophobic resin is unevenly localized on any interface, as different from the surfactant, the hydrophobic resin does not necessarily have to have a hydrophilic group in its molecule and does not need to contribute toward uniform mixing of polar/nonpolar substances.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the film in dynamic condition is important, and it is required for the actinic ray-sensitive or radiation-sensitive resin composition to be capable of tracking the high-speed scanning of the exposure head without leaving droplets.

The hydrophobic resin (HR) is preferably a resin containing at least one of fluorine atom and silicon atom. The fluorine atom or the silicon atom in the hydrophobic resin (HR) may present either in the principal chain or in the side chain. The hydrophobicity (water following property) of the film surface can be increased and the amount of development residue (scum) can be reduced by the containment of the fluorine atom or the silicon atom in the hydrophobic resin.

When the hydrophobic resin (HR) contains fluorine atom, the resin preferably has, as a partial structure containing one or more fluorine atoms, an alkyl group containing one or more fluorine atoms, a cycloalkyl group containing one or more fluorine atoms, or an aryl group containing one or more fluorine atoms.

The alkyl group containing one or more fluorine atoms is a linear or branched alkyl group having at least one hydrogen atom thereof substituted with one or more fluorine atoms. The group preferably has 1 to 10 carbon atoms, more preferably 1 to 4 carbon atoms. Further, other substituents than fluorine atom may also be contained.

The cycloalkyl group containing one or more fluorine atoms is a monocyclic or polycyclic alkyl group having at least one hydrogen atom thereof substituted with one or more fluorine atoms. Further, other substituents than fluorine atom may also be contained.

The aryl group containing one or more fluorine atoms is an aryl group having at least one hydrogen atom of an aryl group substituted with one or more fluorine atoms. As the aryl group, a phenyl or a naphthyl group can be exemplified. Further, other substituents than fluorine atom may also be contained.

As preferred alkyl groups containing one or more fluorine atoms, cycloalkyl groups containing one or more fluorine atoms and aryl groups containing one or more fluorine atoms, groups of the following general formulae (F2) to (F4) can be exemplified.

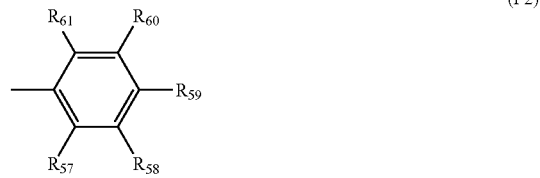

(F2)

(F3)

(F4)

In the general formulae (F2) to (F4), each of $R_{57}$ to $R_{68}$ independently represents a hydrogen atom, a fluorine atom or an alkyl group in condition that: at least one of $R_{57}$-$R_{61}$ represents a fluorine atom or an alkyl group having at least one hydrogen atom thereof substituted with one or more fluorine atoms; at least one of $R_{62}$-$R_{64}$ represents a fluorine atom or an alkyl group having at least one hydrogen atom thereof substituted with one or more fluorine atoms; and at least one of $R_{65}$-$R_{68}$ represents a fluorine atom or an alkyl group having at least one hydrogen atom thereof substituted with one or more fluorine atoms. These alkyl groups preferably are those having 1 to 4 carbon atoms. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group having at least one hydrogen atom thereof substituted with one or more fluorine atoms, more preferably a perfluoroalkyl group having 1 to 4 carbon atoms. $R_{62}$ and $R_{63}$ may be bonded to each other to form a ring.

Specific examples of the groups represented by the general formula (F2) include a p-fluorophenyl group, a pentafluorophenyl group, and a 3,5-di(trifluoromethyl)phenyl group.

Specific examples of the groups represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups represented by the general formula (F4) include —C(CF$_3$)$_2$OH, —C(C$_2$F$_5$)$_2$OH, —C(CF$_3$)(CH$_3$)OH, —CH(CF$_3$)OH and the like. Of these, —C(CF$_3$)$_2$OH is particularly preferred.

Preferred repeating units containing one or more fluorine atoms are as follows.

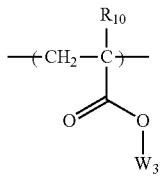

(C-Ia)

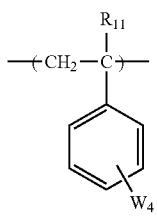

(C-Ib)

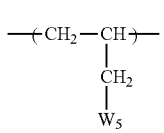

(C-Ic)

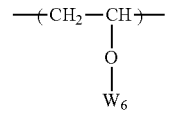

(C-Id)

In the formulae, $R_{10}$ and $R_{11}$ each independently represents a hydrogen atom, a fluorine atom, and an alkyl group. As the alkyl group, a linear or branched alkyl group having 1 to 4 carbon atoms is preferred. As an alkyl group with one or more substituents, a fluorinated alkyl group can especially be exemplified.

Each of $W_3$ to $W_6$ independently represents an organic group containing one or more fluorine atoms. Specifically, groups represented by the general formulae (F2) to (F4) can be exemplified.

The following units may also be employed as the repeating unit containing one or more fluorine atoms.

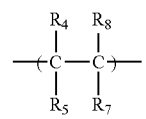

(C-II)

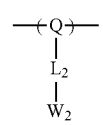

(C-III)

In the formulae, each of $R_4$ to $R_7$ independently represents a hydrogen atom, a fluorine atom, and an alkyl group with the proviso that at least one of $R_4$ to $R_7$ represents a fluorine atom and $R_4$ and $R_5$ or $R_6$ and $R_7$ may form a ring. As the alkyl group, a linear or branched alkyl group having 1 to 4 carbon atoms is preferred. As an alkyl group with one or more substituents, a fluorinated alkyl group can especially be exemplified.

$W_2$ represents an organic group containing one or more fluorine atoms. Specifically, groups represented by the general formulae (F2) to (F4) can be exemplified.

Q represents an alicyclic structure. The alicyclic structure may contain one or more substituents, and may either be monocyclic or polycyclic. When the alicyclic structure contains a polycyclic structure, it may be a bridged type. As the monocyclic one, a cycloalkyl group having 3 to 8 carbon atoms such as a cyclopenryl group, a cyclohexyl group, a cyclobutyl group, or a cyclobutyl group is preferred. As the polycyclic one, a group containing bicyclo-, tricyclo-, or tetracyclo-structure having 5 or more carbon atoms can be exemplified. The polycyclic one preferably is a cycloalkyl group having 6 to 20 carbon atoms such as an adamantyl group, a norbornyl group, a dicyclopentyl group, a tricyclodecanyl group, or a tetracyclododecyl group. At least a part of carbon atoms in the cycloalkyl group may be substituted with one or more heteroatoms such as oxygen atoms.

$L_2$ represents a single bond or divalent connecting group. As the divalent connecting group, a substituted or nonsubstituted arylene group, a substituted or nonsubstituted alkylene group, —O—, —SO$_2$—, —CO—, —N(R)— (R represents a hydrogen atom or an alkyl group), —NHSO$_2$—, or a combination of two or more of these groups.

The hydrophobic resin (HR) may contain one or more silicon atoms. As partial structure containing one or more silicon atoms, an alkylsilyl structure or a cyclosiloxane structure can be exemplified. Preferred alkylsilyl structure is the one containing one or more trialkylsilyl groups.

As the alkylsilyl structure and cyclosiloxane structure, any of the groups represented by the following general formulae (CS-1) to (CS-3) can be exemplified.

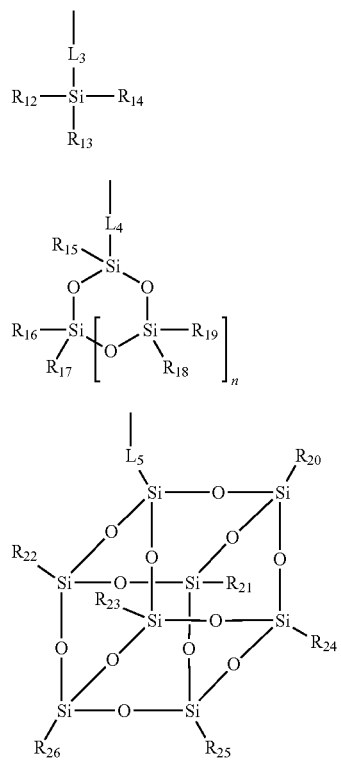

In the general formulae (CS-1) to (CS-3), each of $R_{12}$ to $R_{25}$ independently represents a linear or branched alkyl group or a cycloalkyl group. The alkyl group preferably has 1 to 20 carbon atoms. The cycloalkyl group preferably has 3 to 20 carbon atoms.

Each of $L_3$ to $L_5$ represents a single bond or a bivalent connecting group. As the bivalent connecting group, any one or a combination of two or more groups selected from the group consisting of an alkylene group, a phenylene group, an ether group, a thioether group, a carbonyl group, an ester group, an amido group, a urethane group and a urea group can be exemplified.

In the formulae, n is an integer of 1 to 5, and preferably an integer of 2 to 4.

Specific examples of the repeating units containing a fluorine atom or a silicon atom will be shown below. In the specific examples, $X_1$ represents a hydrogen atom, —$CH_3$, —F or —$CF_3$, and $X_2$ represents —F or —$CF_3$.

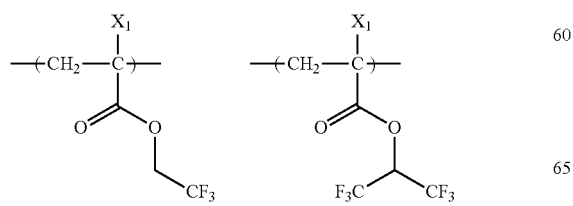

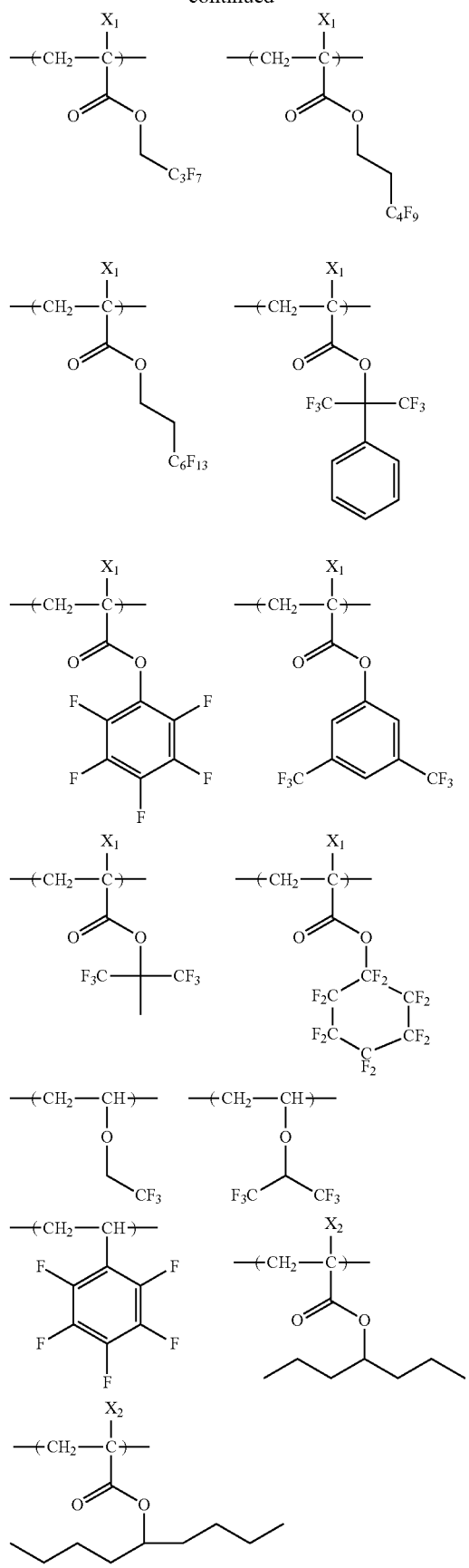

-continued
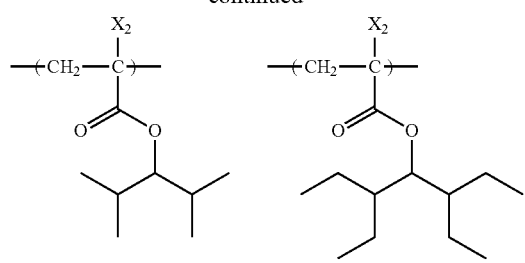
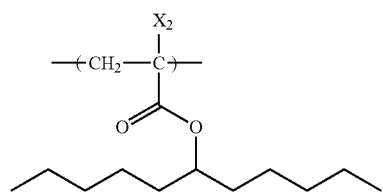
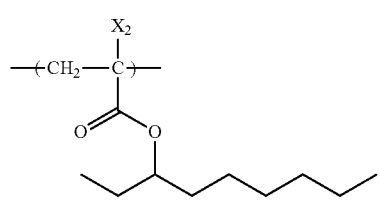
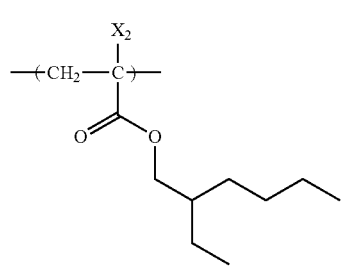
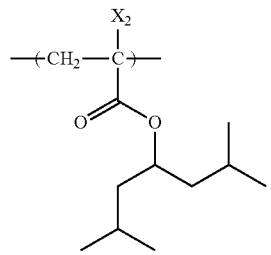
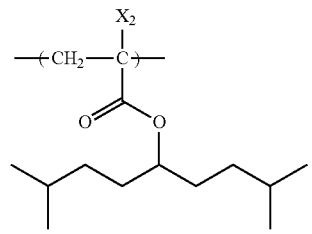
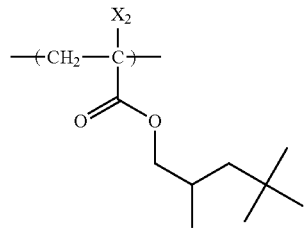
-continued
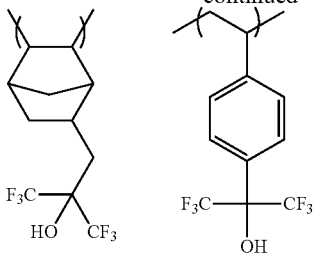
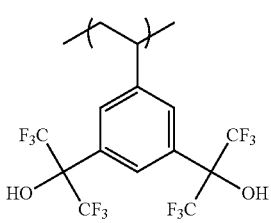
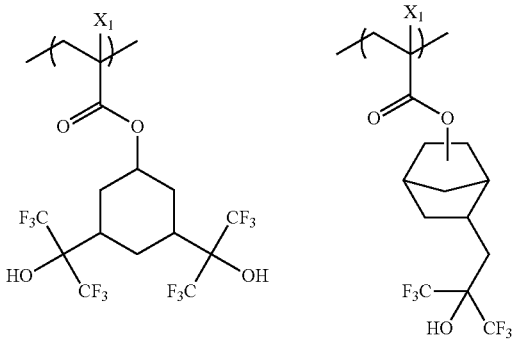
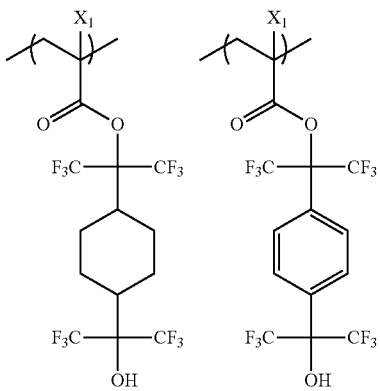
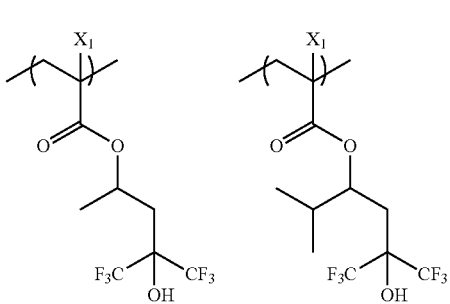

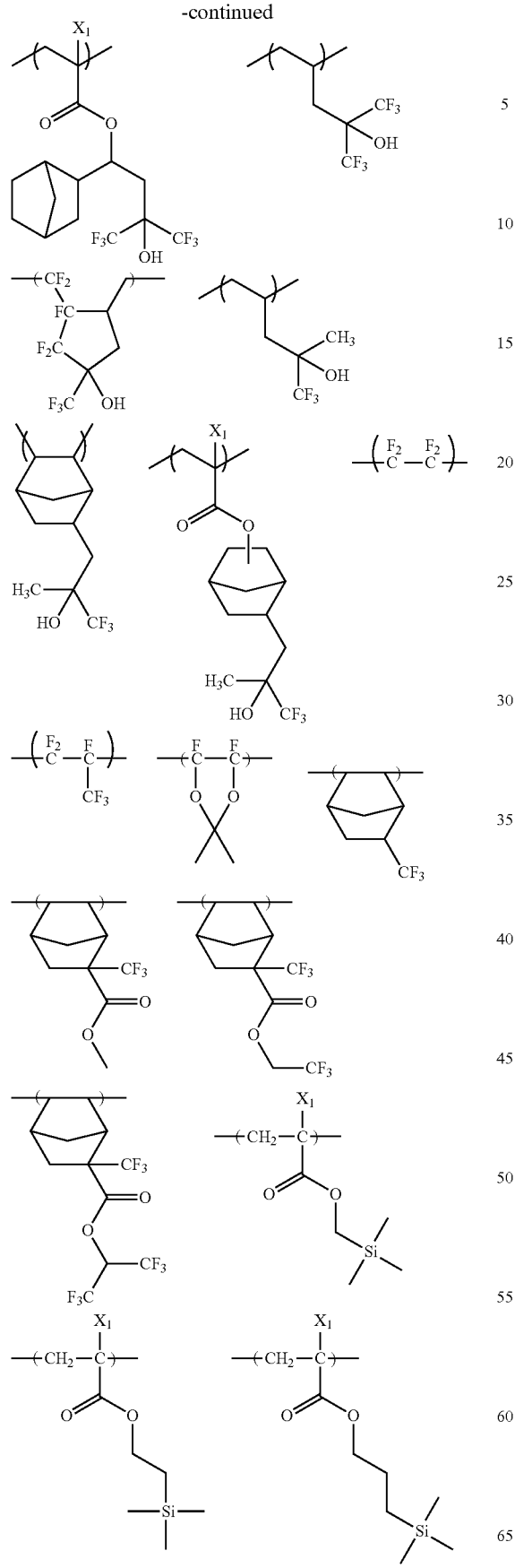
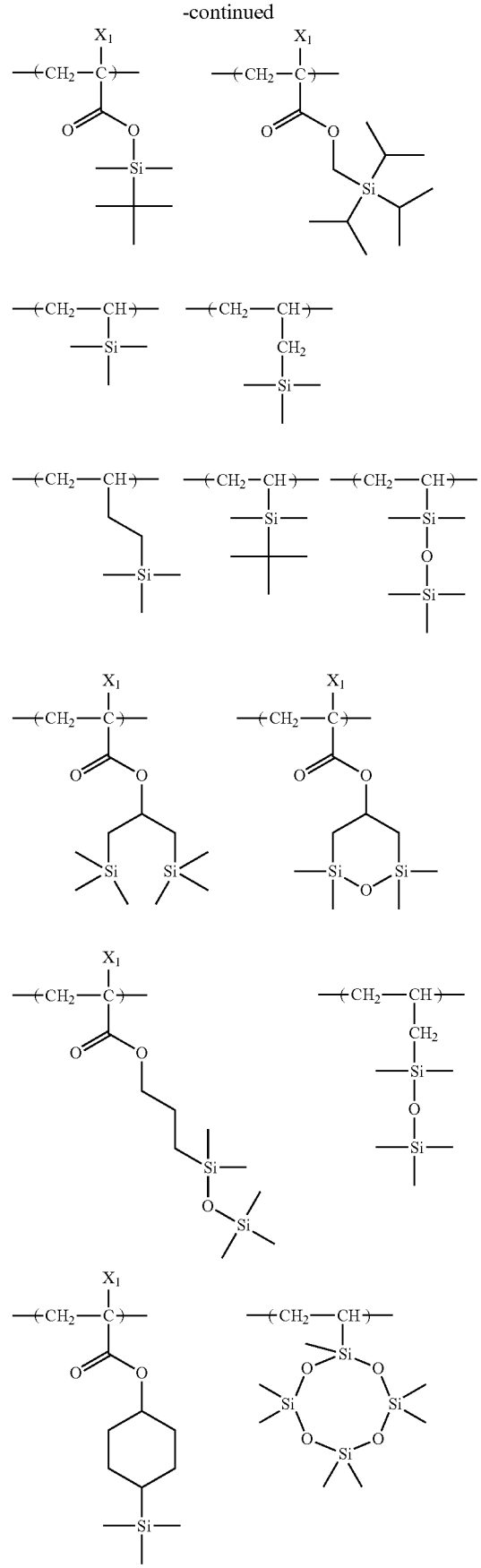

-continued

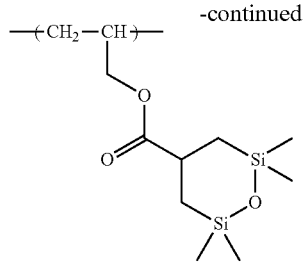

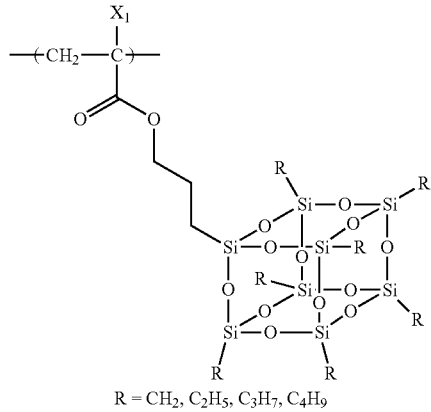

R = CH₂, C₂H₅, C₃H₇, C₄H₉

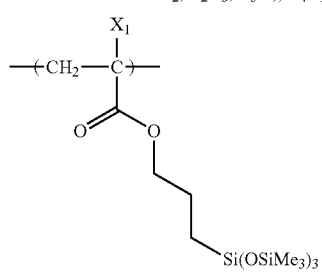

Further, the hydrophobic resin (HR) may contain at least one group selected from among the following groups (x) and (z):

(x) a polar group;
(z) a group that is decomposed by the action of an acid.

As the polar group (x), a phenolic hydroxy group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl) methylene group, a bis(alkylsulfonyl)imido group, a tris (alkylcarbonyl)methylene group, and a tris(alkylsulfonyl) methylene group can be exemplified.

As preferred polar groups, a fluoroalcohol group, a sulfonimido group, and a bis(carbonyl)methylene group can be exemplified. As preferred fluoroalcohol group, a hexafluoroisopropanol group can be exemplified.

As the repeating unit containing a polar group (x), use can be made of any of a repeating unit resulting from direct bonding of an polar group to the principal chain of a resin like a repeating unit of acrylic acid or methacrylic acid; a repeating unit resulting from bonding, via a connecting group, of a polar group to the principal chain of a resin; and a repeating unit resulting from polymerization with the use of a chain transfer agent or polymerization initiator having a polar group to introduce the same in a polymer chain terminal.

The content of repeating units containing a polar group (x) based on all the repeating units of the polymer is preferably in the range of 1 to 50 mol %, more preferably 3 to 35 mol %, and still more preferably 5 to 20 mol %.

Specific examples of the repeating units containing a polar group will be shown below. In the formulae, Rx represents H, CH₃, CH₂OH, or CF₃.

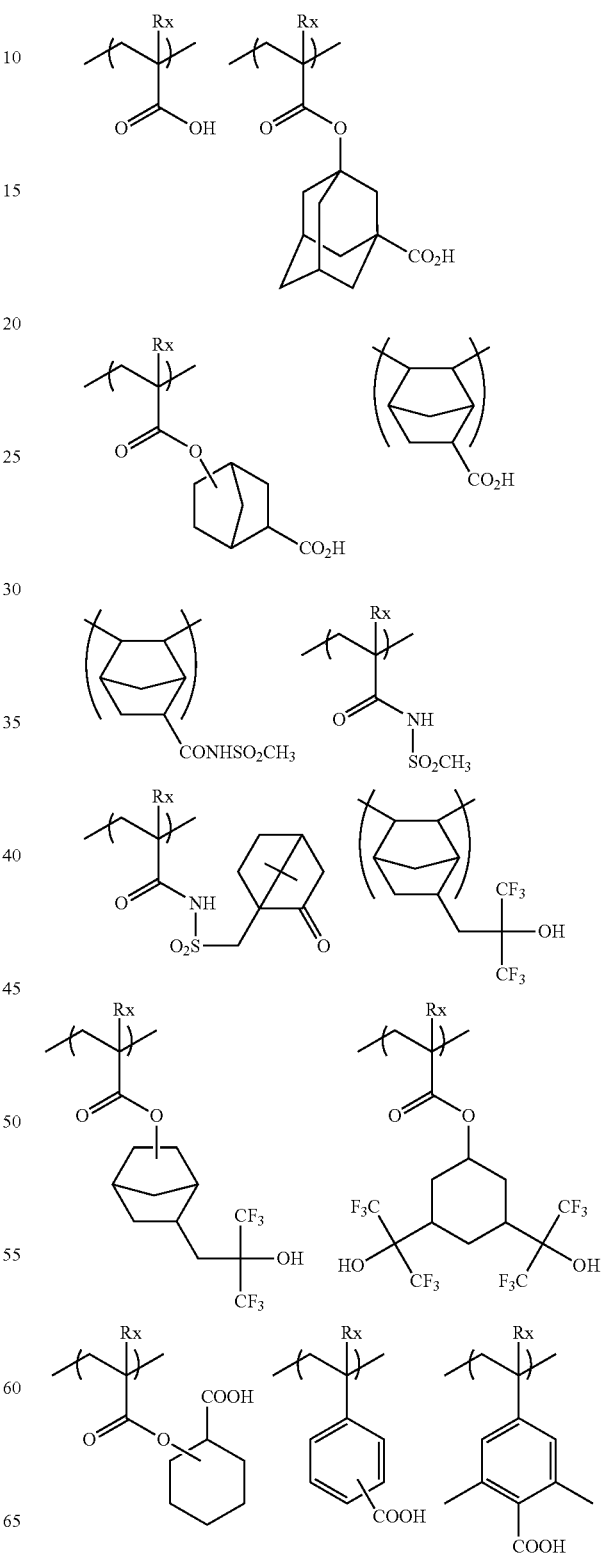

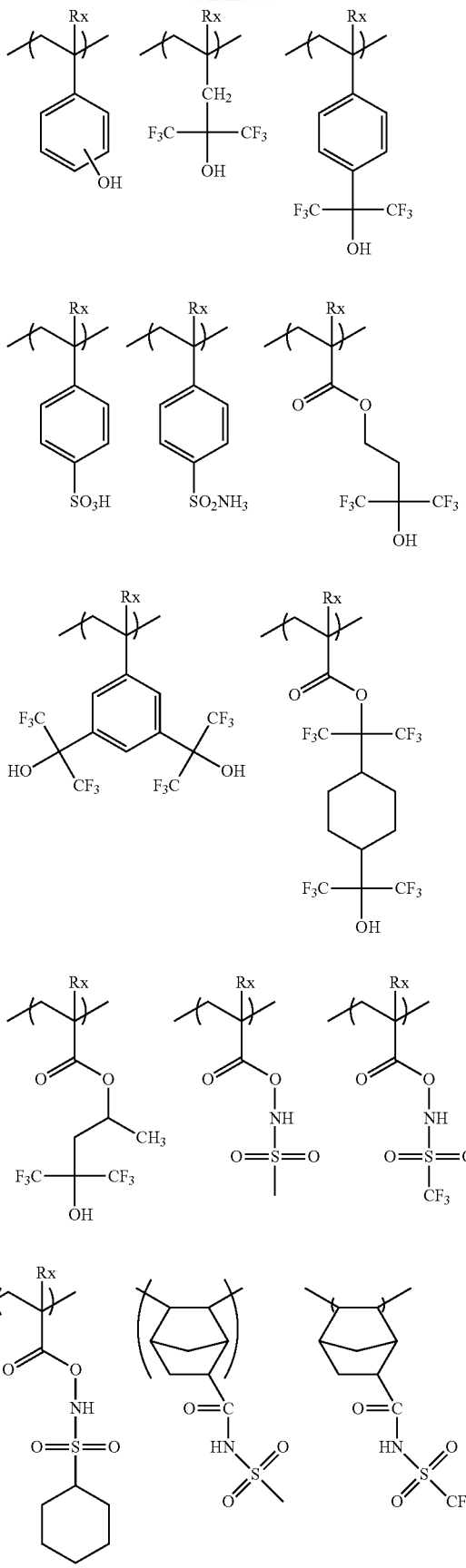

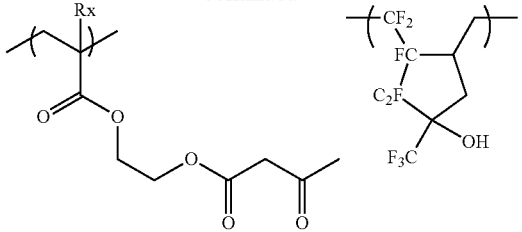

As the repeating unit containing a group (z) that is decomposed by the action of an acid, for example, those explained in connection with the acid-decomposable resin can be exemplified.

The content of repeating units containing such a group (z) based on all the repeating units of the hydrophobic resin is preferably in the range of 1 to 80 mol %, more preferably 10 to 80 mol %, and still more preferably 20 to 60 mol %.

The hydrophobic resin (HR) may further have any of the repeating units represented by the following general formula (VI).

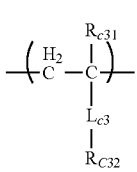
(VI)

In the formula (VI), $R_{c31}$ represents a hydrogen atom, an alkyl group, an alkyl group optionally substituted with one or more fluorine atoms, a cyano group or a group of the formula —$CH_2$—O—$R_{ac2}$ in which $R_{ac2}$ represents a hydrogen atom, an alkyl group or an acyl group. $R_{c31}$ is preferably a hydrogen atom, a methyl group, a hydroxymethyl group, or a trifluoromethyl group, more preferably a hydrogen atom or a methyl group.

$R_{c32}$ represents a group containing an alkyl group, a cycloalkyl group, an alkenyl group, a cycloalkenyl group, or an aryl group. These groups may be substituted with fluorine atom and/or silicon atom.

$L_{c3}$ represents a single bond or a bivalent connecting group.

The alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms such as a phenyl group or a naphthyl group.

These groups may have one or more substituents.

Preferably, $R_{c32}$ represents an unsubstituted alkyl group or an alkyl group substituted with one or more fluorine atoms.

$L_{c3}$ represents a single bond or a bivalent connecting group. As the bivalent connecting group represented by $L_{c3}$, an alkylene group (preferably having 1 to 5 carbon atoms), an oxy group, a phenylene group, or an ester bond (a group represented by —COO—) can be exemplified.

The hydrophobic resin (HR) may contain a repeating unit represented by the general formula (VII) or (VIII) as the one represented by the general formula (VI).

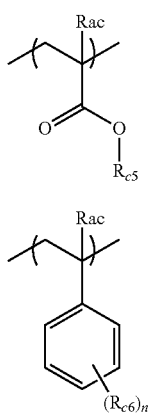

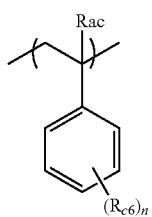

In the general formula (VII), $R_{c5}$ represents a hydrocarbon group having at least one cyclic structure in which neither a hydroxyl group nor a cyano group is contained.

Rac represents a hydrogen atom, an alkyl group, an alkyl group that may be substituted with a fluorine atom, a cyano group or a group of the formula —$CH_2$—O—$Rac_2$ in which $Rac_2$ represents a hydrogen atom, an alkyl group or an acyl group. Rac is preferably a hydrogen atom, a methyl group, a hydroxymethyl group or a trifluoromethyl group, especially preferably a hydrogen atom or a methyl group.

The cyclic structures contained in $R_{c5}$ include a monocyclic hydrocarbon group and a polycyclic hydrocarbon group. As the monocyclic hydrocarbon group, there can be mentioned, for example, a cycloalkyl group having 3 to 12 carbon atoms or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

In the general formula (VIII), Rc6 represents an alkyl group, a cycloalkyl group, an alkenyl group, a cycloalkenyl group, an alkoxycarbonyl group or an alkylcarbonyloxy group. These groups may be substituted with a fluorine atom or a silicon atom.

The alkyl group represented by $R_{c6}$ is preferably a linear or branched alkyl group having 1 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

In the formula, n is an integer of 0 to 5. When n is 2 or greater, the plurality of $R_{c6}$s may be identical to or different from each other.

It is preferred for $R_{c6}$ to represent an unsubstituted alkyl group or an alkyl group substituted with a fluorine atom. A trifluoromethyl group and a t-butyl group are especially preferred.

The hydrophobic resin may further contain any of the repeating units represented by general formula (CII-AB) below.

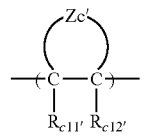

In the formula (CII-AB), each of $R_{c11'}$ and $R_{c12'}$ independently represents a hydrogen atom, a cyano group, a halogen atom or an alkyl group.

Zc' represents an atomic group required for forming an alicyclic structure in cooperation with two carbon atoms (C—C) to which $R_{c11'}$ and $R_{c12'}$ are respectively bonded.

Further, the general formula (CII-AB) is preferable to be one of the formulae (CII-AB1) or (CII-AB2) below.

CII-AB1

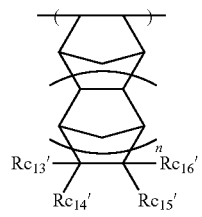

-continued

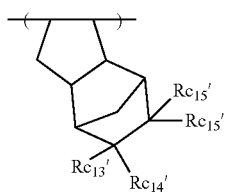

AII-AB2

In the formulae (CII-AB1) and (CII-AB2), each of $R_{c13'}$ to $R_{c16'}$ independently represents a hydrogen atom, a halogen atom, an alkyl group, or a cycloalkyl group.

At least two of $R_{c13'}$ to $R_{c16'}$ may bond to each other to form a ring.

In the formula (CII-AB), n represents 0 or 1.

Specific examples of the repeating units represented by the general formulae (VI) or (CII-AB) will be shown below. In the formulae, Ra represents H, $CH_3$, $CH_2OH$, $CF_3$ or CN.

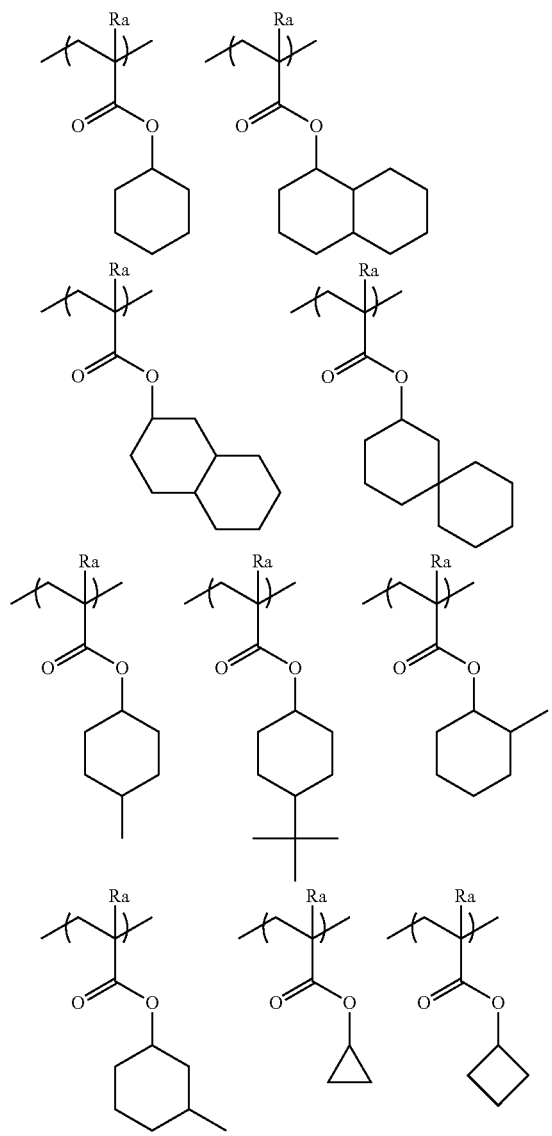

-continued

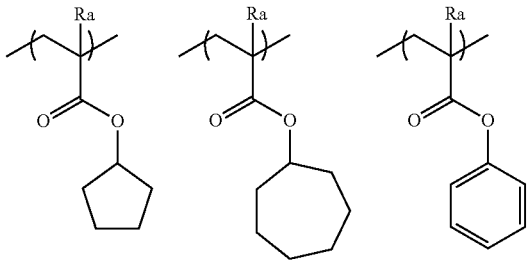

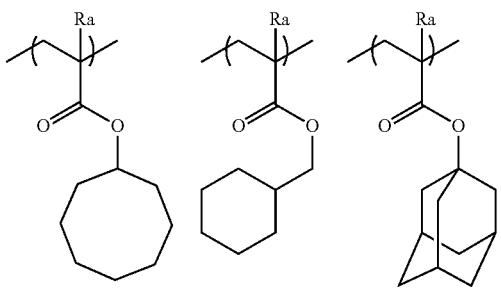

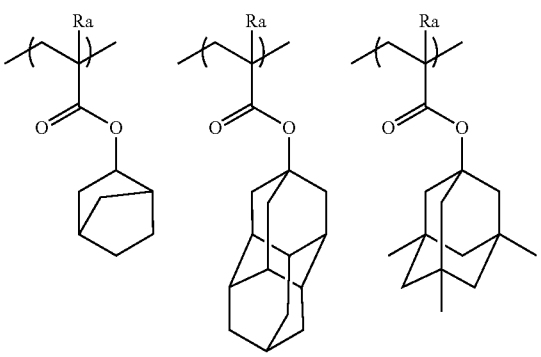

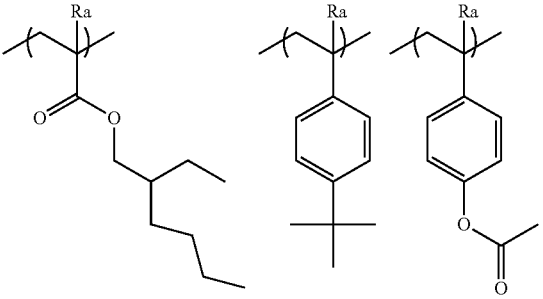

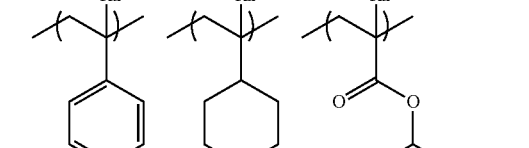

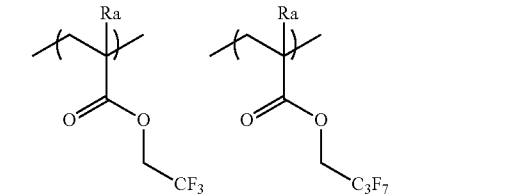

-continued
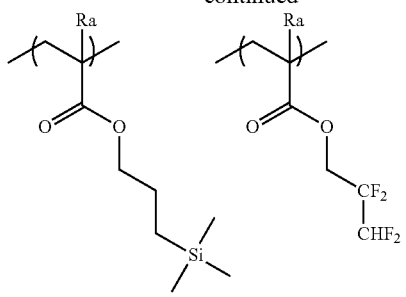
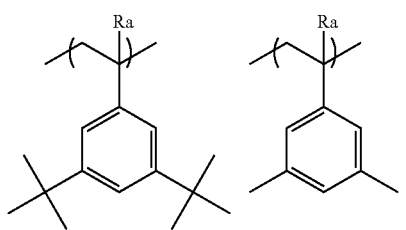
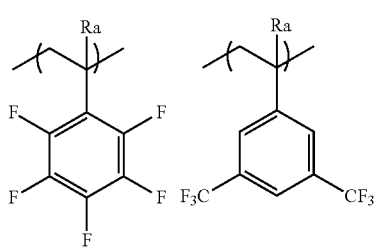
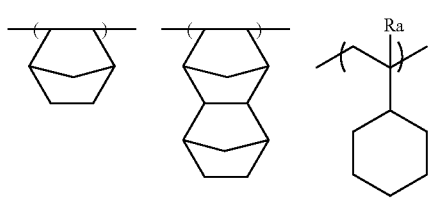
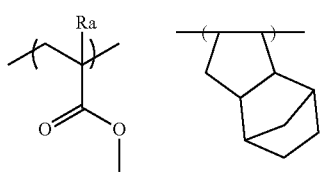
Specific examples of the hydrophobic resins (HR) will be shown below. The following Table 2 shows the molar ratio of individual repeating units (corresponding to individual repeating units in order from the left), weight average molecular weight, and degree of dispersal with respect to each of the resins.
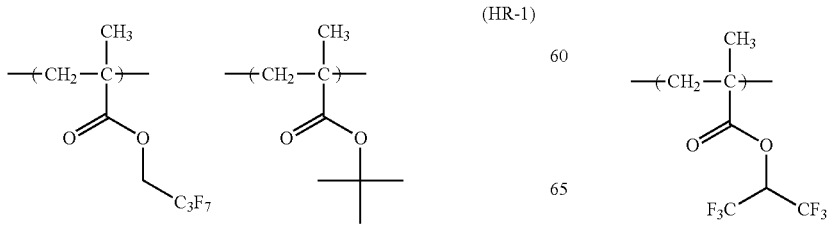
(HR-1)
-continued
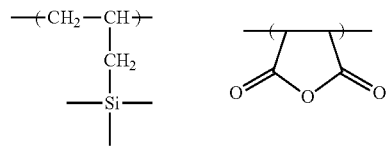
(HR-2)
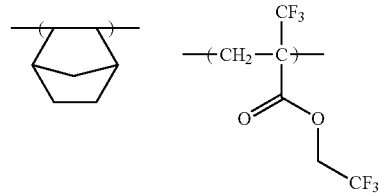
(HR-3)
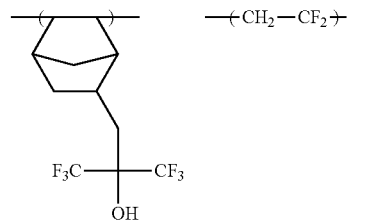
(HR-4)
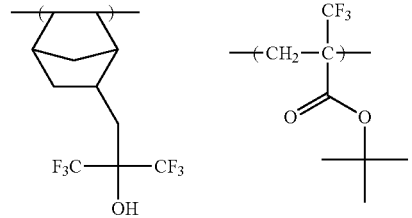
(HR-5)
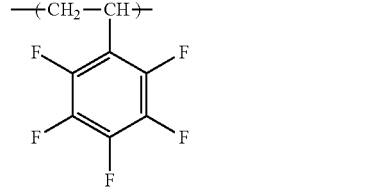
(HR-6)
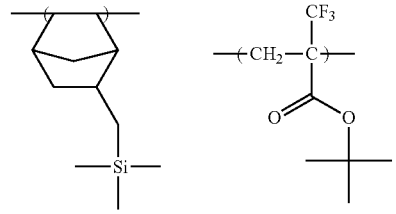
(HR-7)
(HR-8)

-continued
(HR-9)
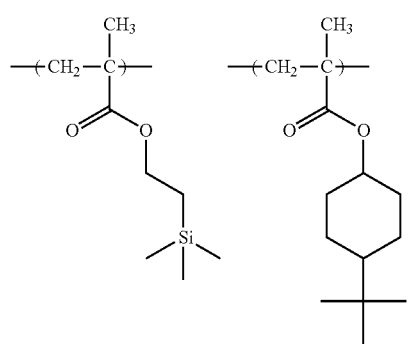
(HR-10)
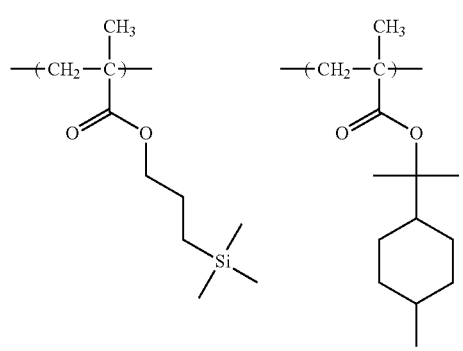
(HR-11)
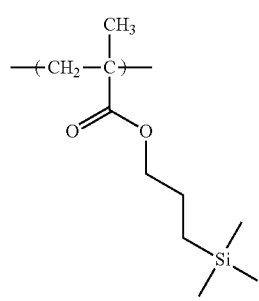
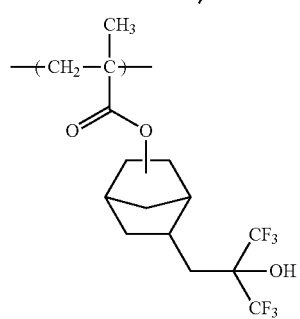
(HR-12)
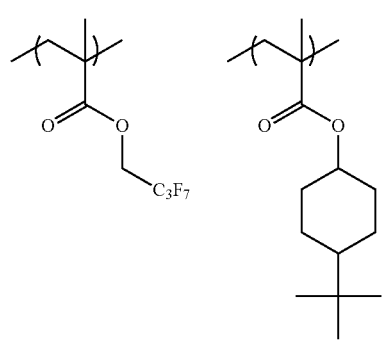
-continued
(HR-13)
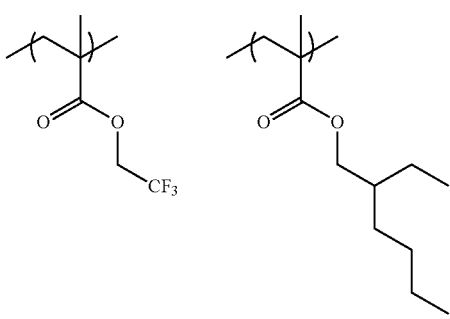
(HR-14)
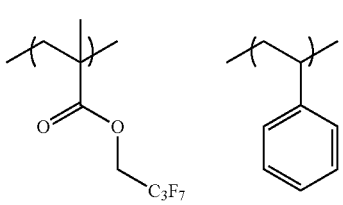
(HR-15)
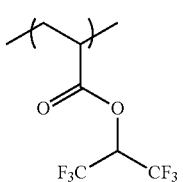
(HR-16)
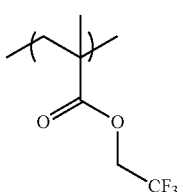
(HR-17)
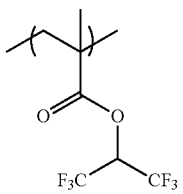
(HR-18)
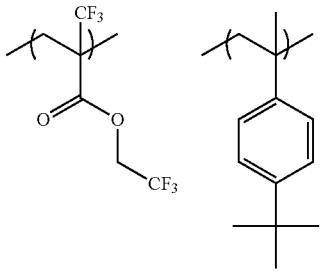

(HR-19) 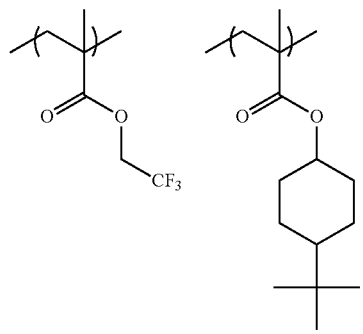
(HR-20) 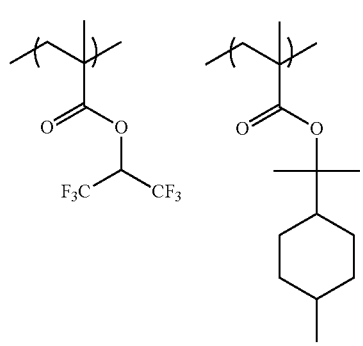
(HR-21) 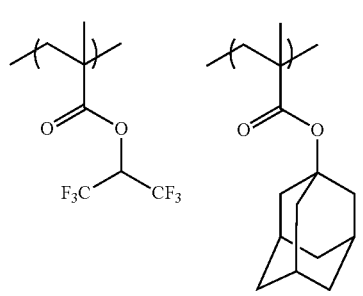
(HR-22) 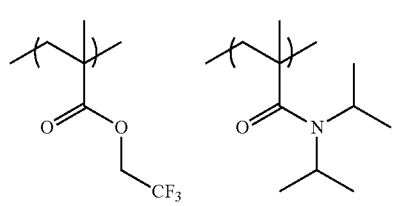
(HR-23) 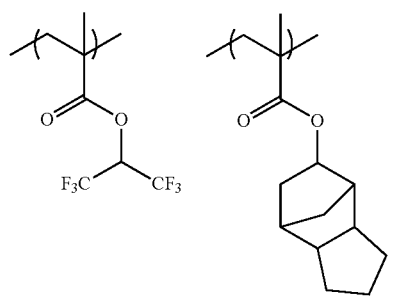
(HR-24) 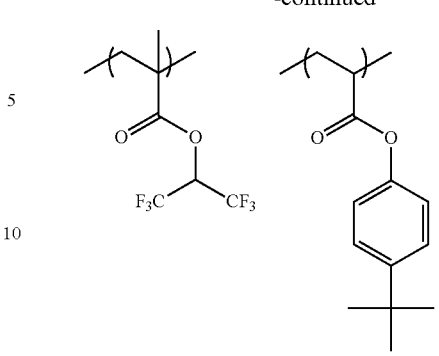
(HR-25) 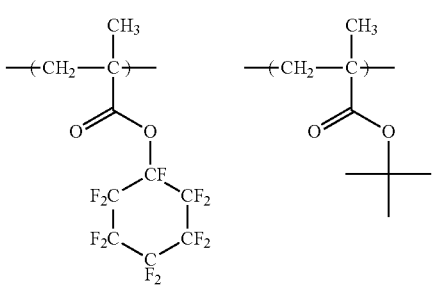
(HR-26) 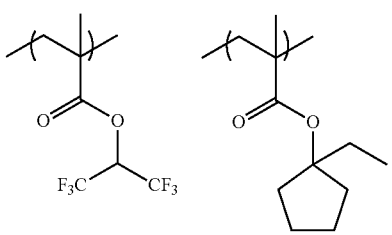
(HR-27) 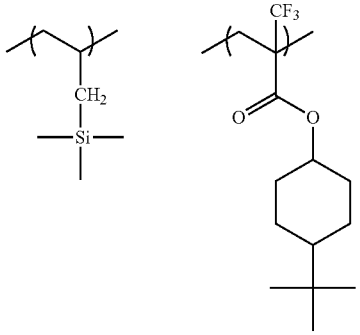
(HR-28) 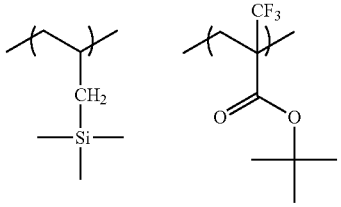
(HR-29) 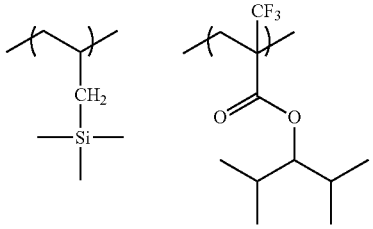

-continued
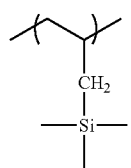 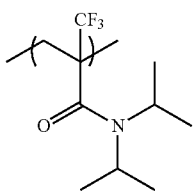
(HR-30)
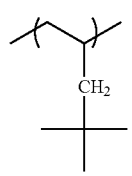 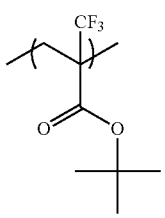
(HR-31)
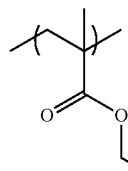
(HR-32)
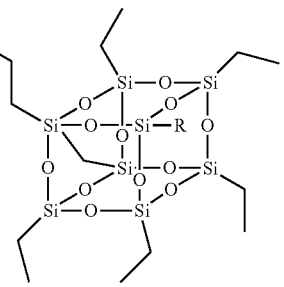
(HR-33)
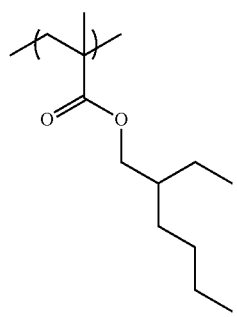
-continued
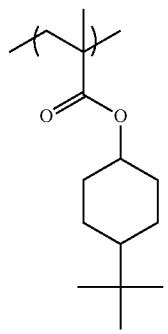
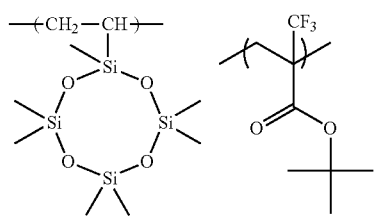
(HR-34)
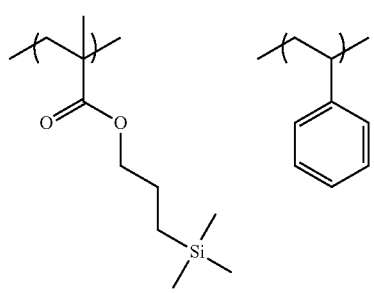
(HR-35)
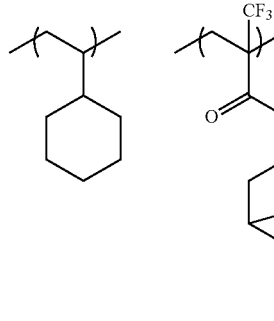
(HR-36)
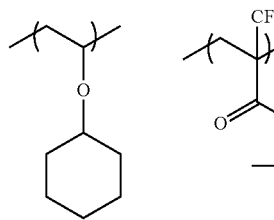
(HR-37)

(HR-38)
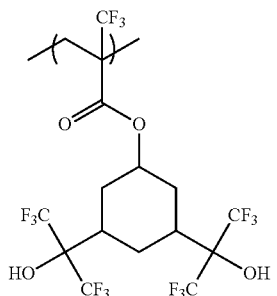 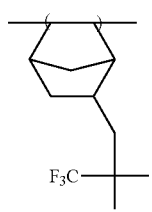
(HR-39)
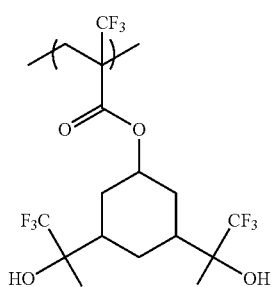 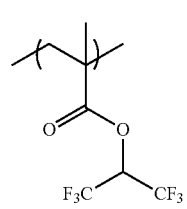
(HR-40)
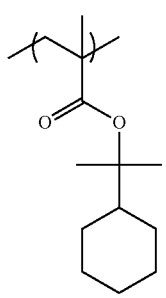 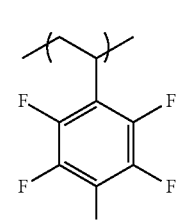
(HR-41)
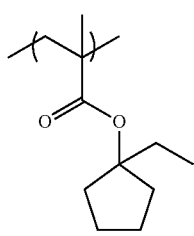 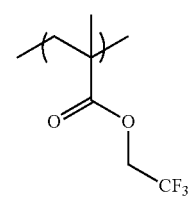
(HR-42)
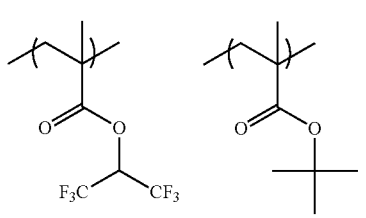
(HR-43)
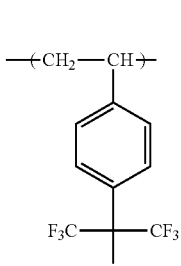 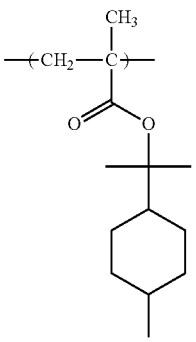
(HR-44)
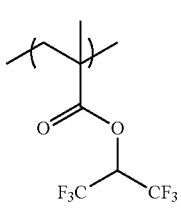 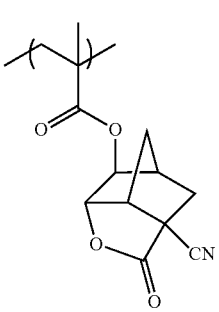
(HR-45)
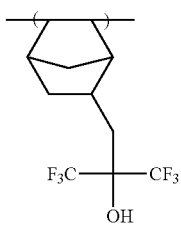 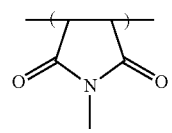
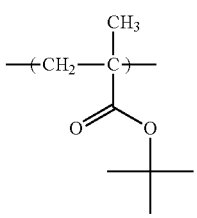
(HR-46)
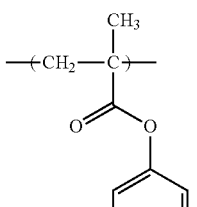 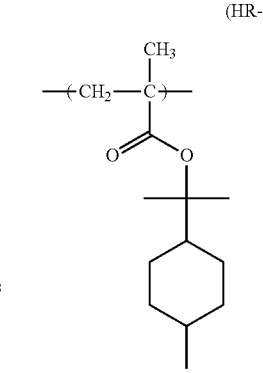

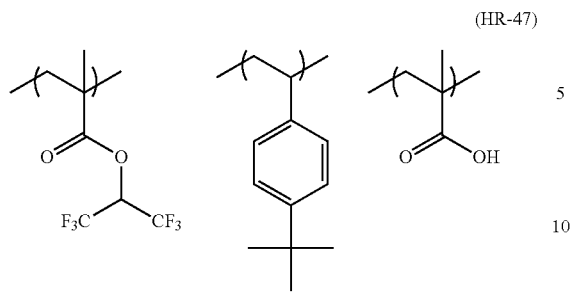
(HR-47)
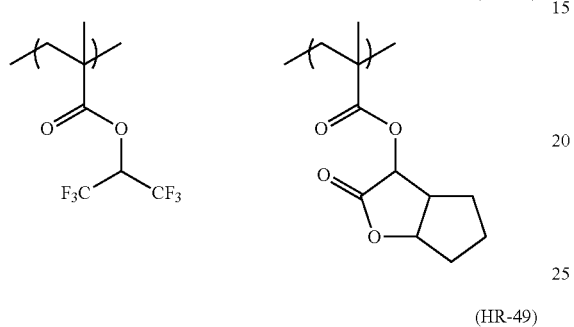
(HR-48)
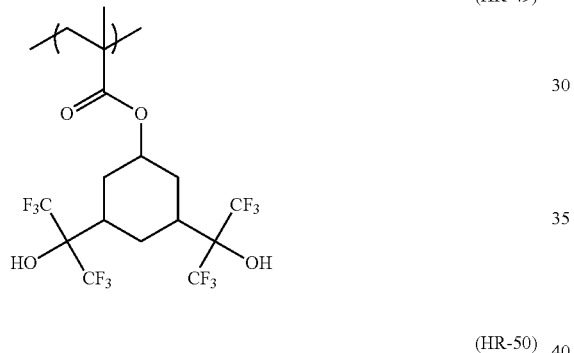
(HR-49)
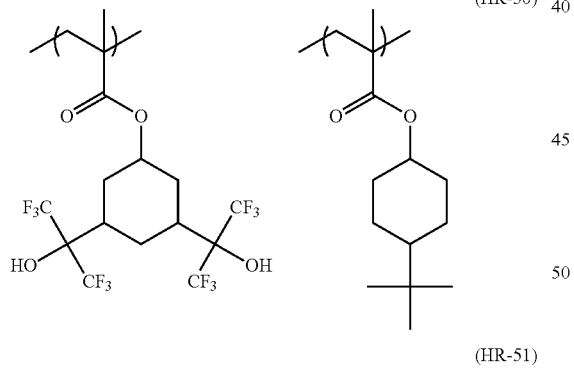
(HR-50)
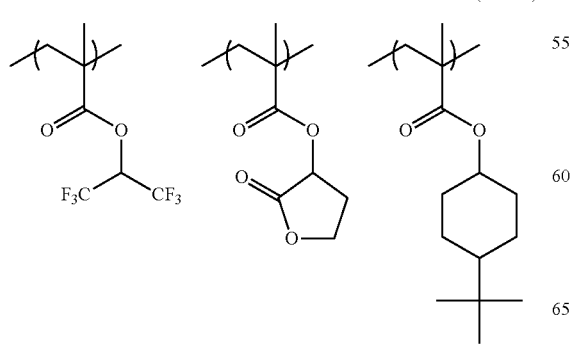
(HR-51)
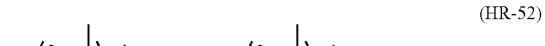
(HR-52)
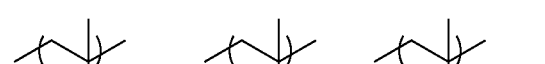
(HR-53)
(HR-54)
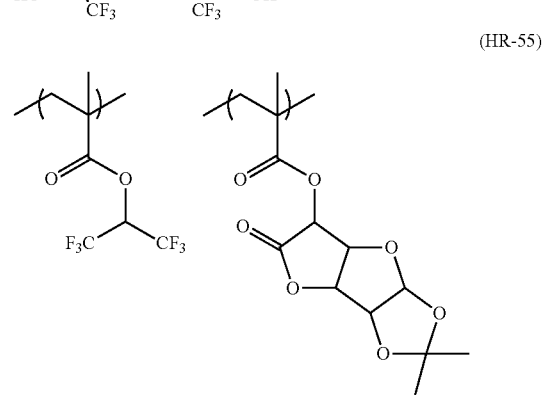
(HR-55)
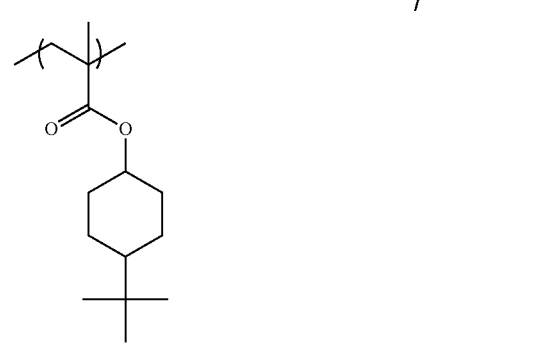

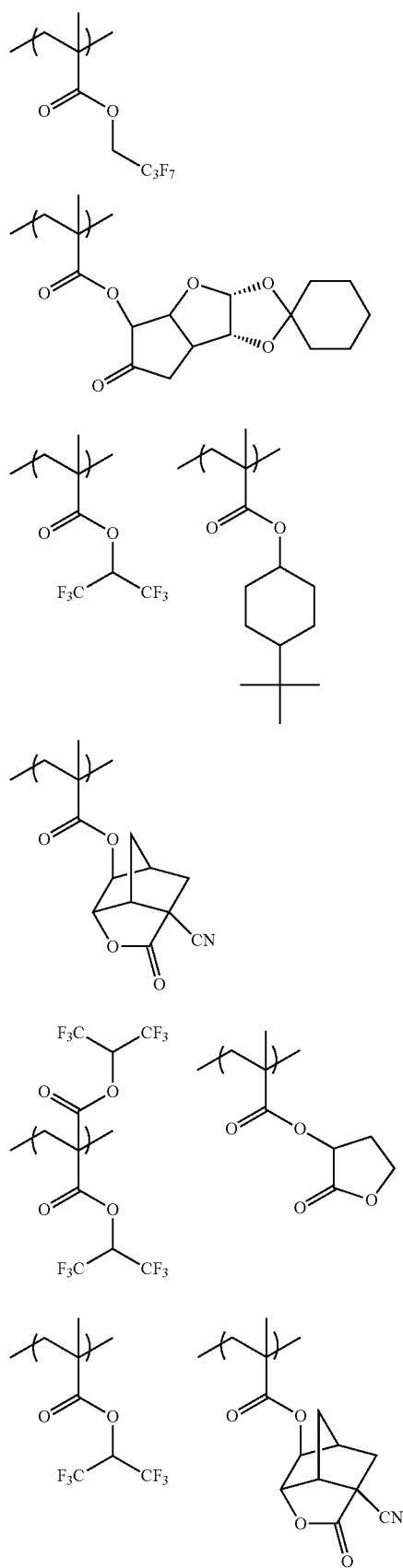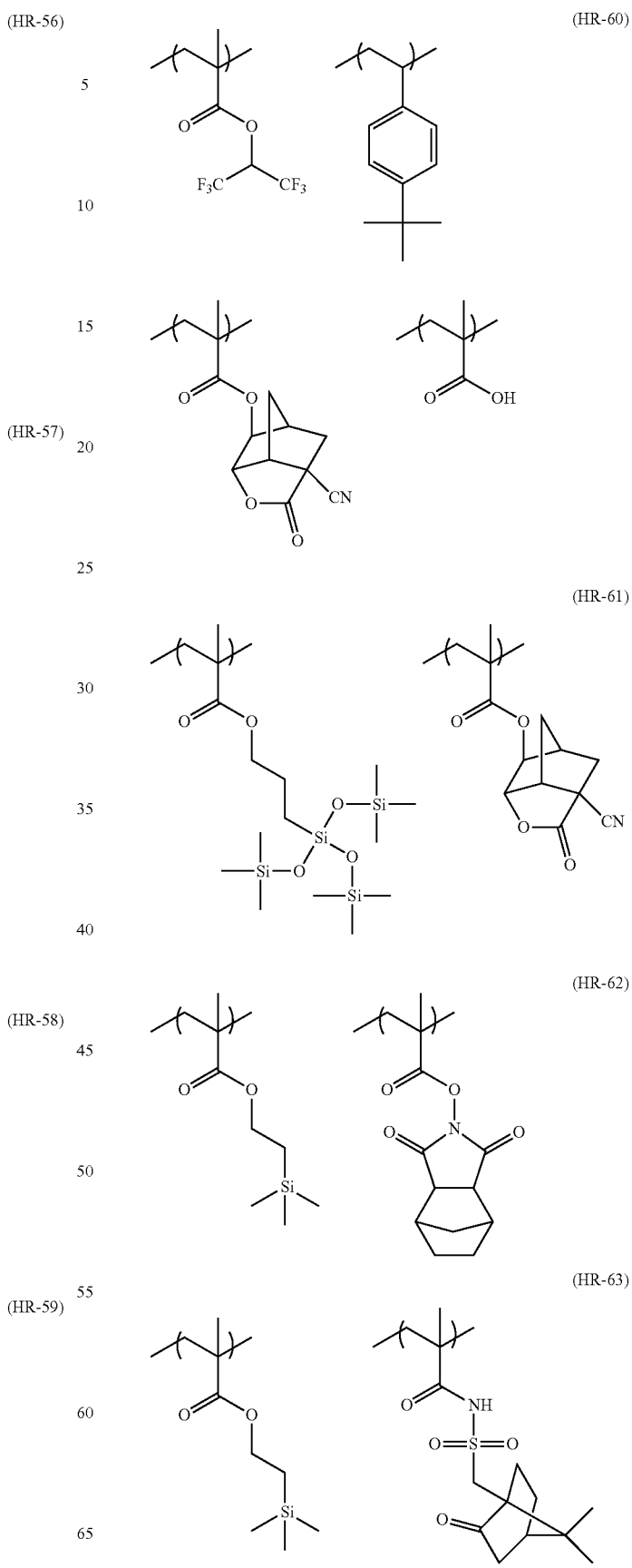

(HR-64)
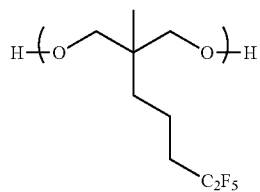
(HR-65)
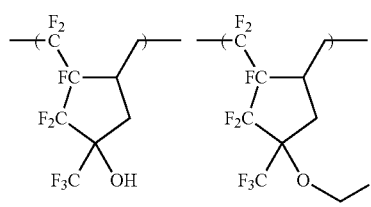
(HR-66)
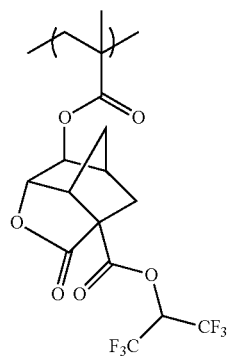
(HR-67)
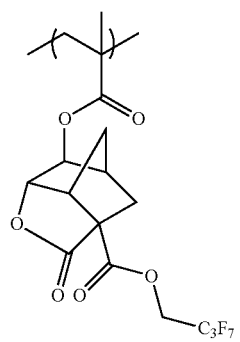
(HR-68)
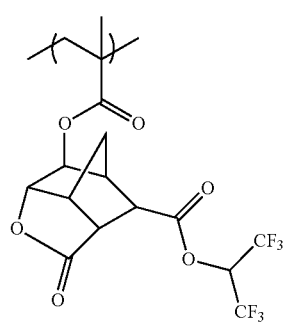
(HR-69)
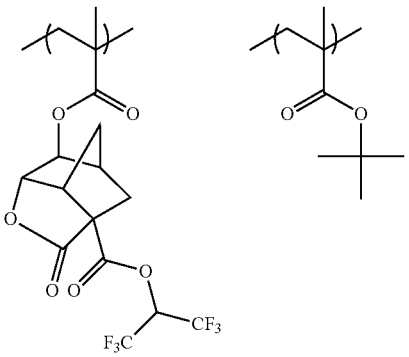
(HR-70)
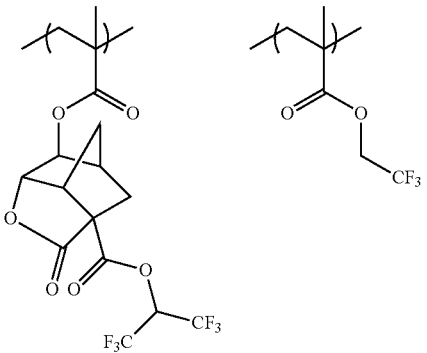
(HR-71)
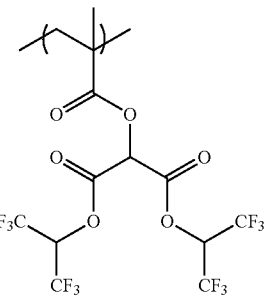
(HR-72)
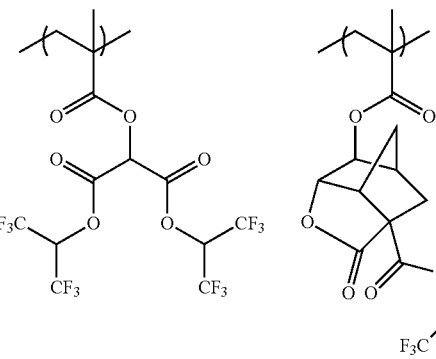

(HR-73)
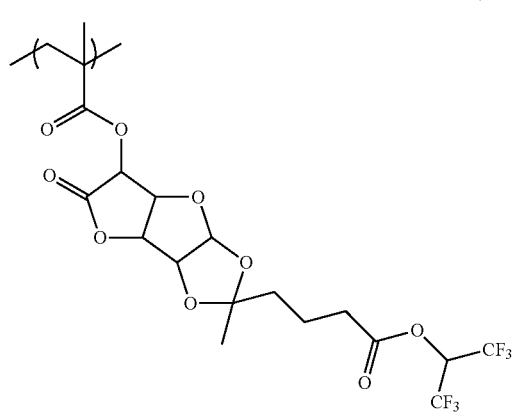
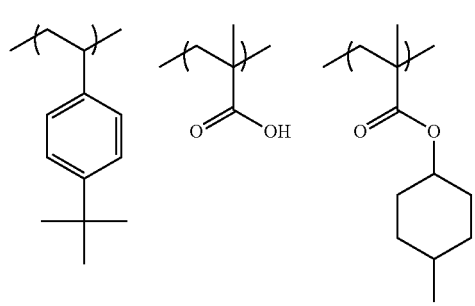
(HR-74)
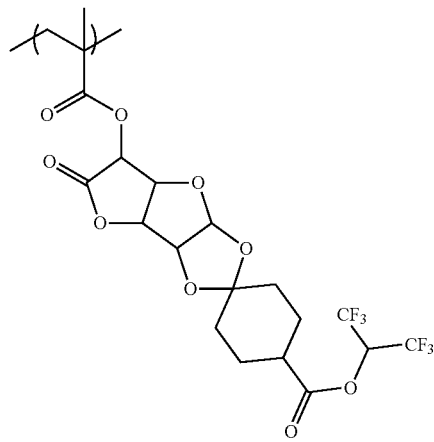
(HR-75)
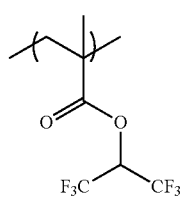
(HR-76)
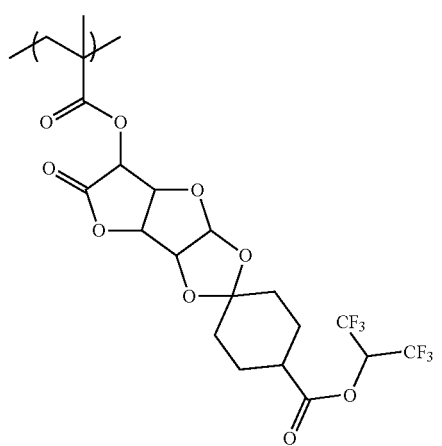
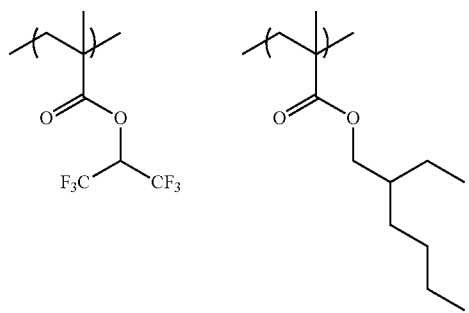
(HR-77)
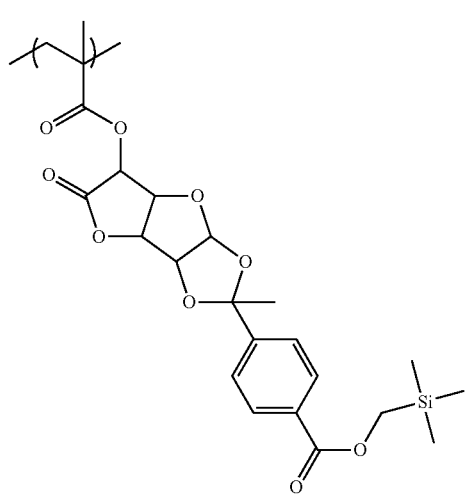

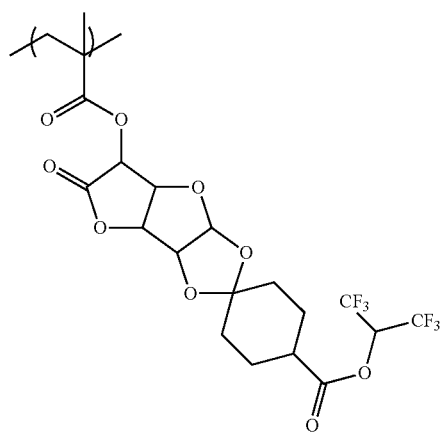
(HR-78)
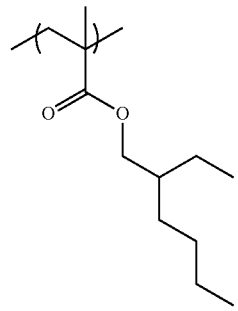
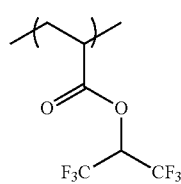
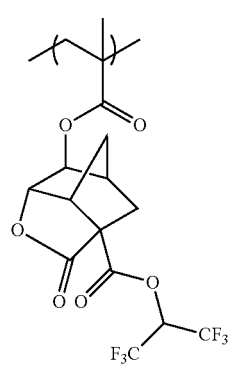
(HR-81)
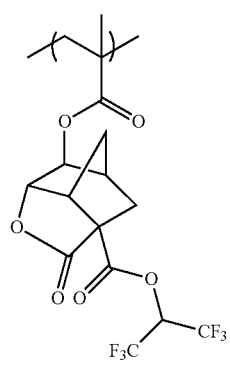
(HR-79)
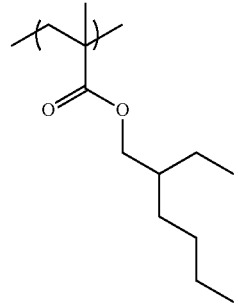
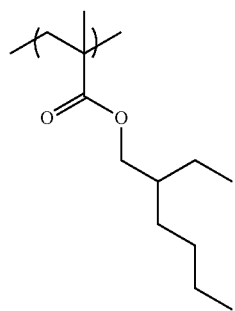
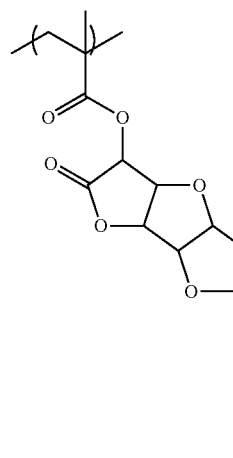
(HR-82)
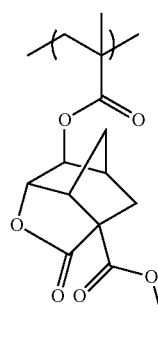 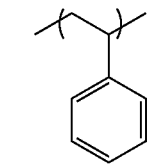
(HR-80)

215
-continued
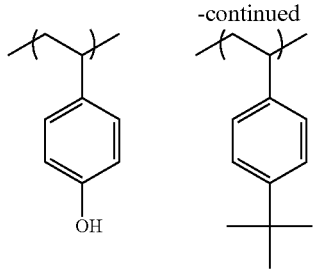
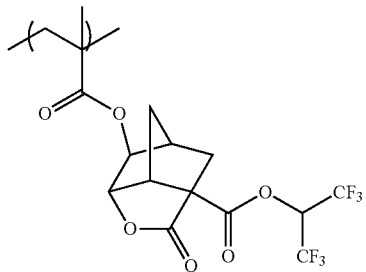
(HR-83)
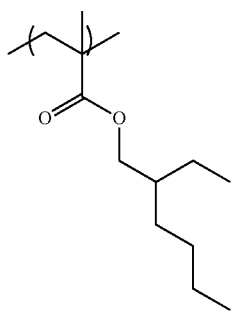
(HR-84)
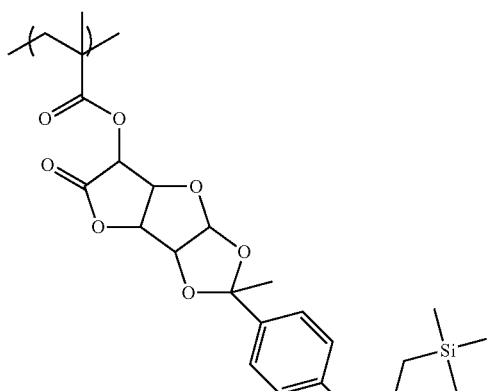
(HR-85)
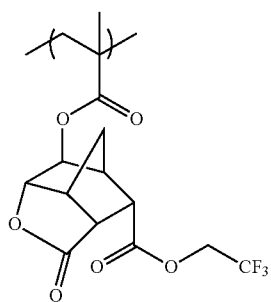
216
-continued
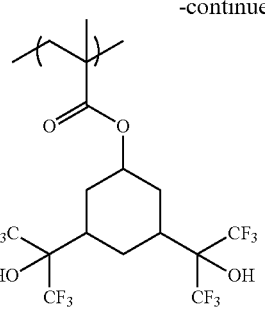
(HR-86)
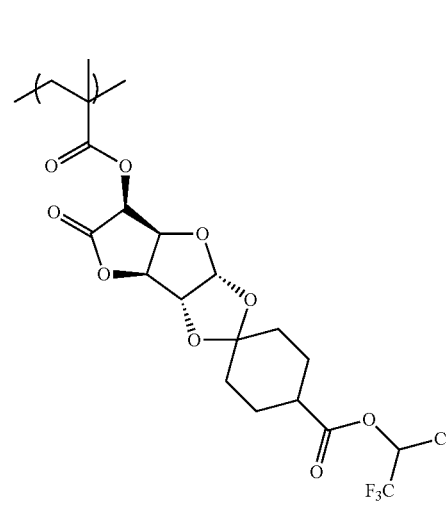
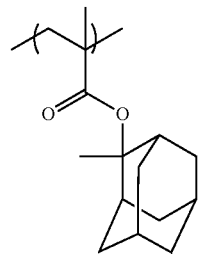
(HR-87)
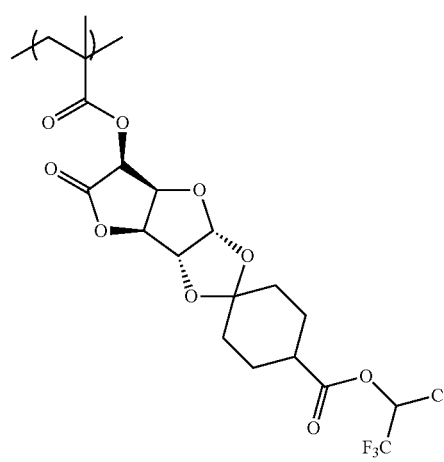

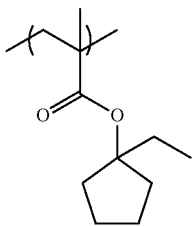
(HR-88)
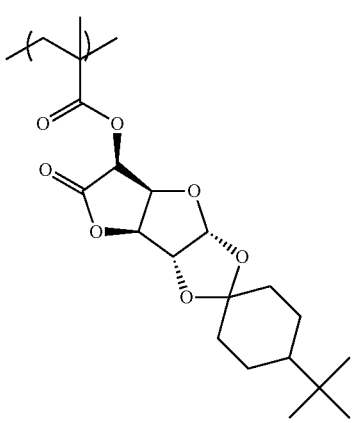
(HR-89)
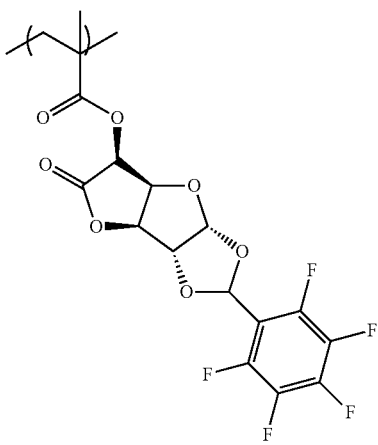
(HR-90)
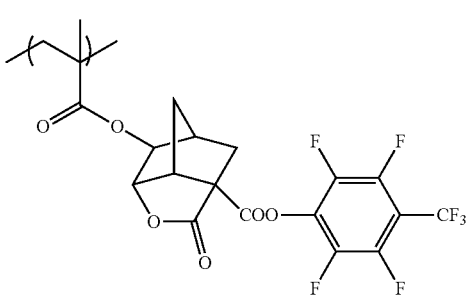
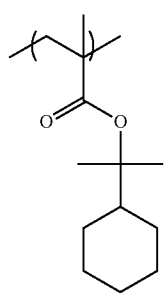
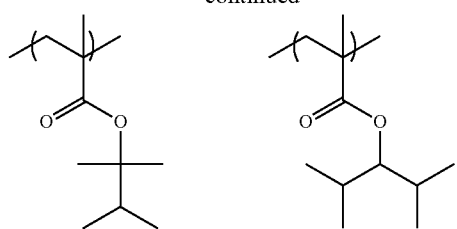
TABLE 2
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |

TABLE 2-continued

| Resin | Composition | Mw | Mw/Mn |
|---|---|---|---|
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

When the hydrophobic resin (HR) contains fluorine atoms, the content of the fluorine atoms based on the molecular weight of the hydrophobic resin (HR) is preferably in the range of 5 to 80 mass %, and more preferably 10 to 80 mass %. The repeating unit containing fluorine atoms preferably exists in the hydrophobic resin (HR) in an amount of 10 to 100 mass %, more preferably 30 to 100 mass %.

When the hydrophobic resin (HR) contains silicon atoms, the content of the silicon atoms based on the molecular weight of the hydrophobic resin (HR) is preferably in the range of 2 to 50 mass %, more preferably 2 to 30 mass %. The repeating unit containing silicon atoms preferably exists in the hydrophobic resin (HR) in an amount of 10 to 100 mass %, more preferably 20 to 100 mass %.

The weight average molecular weight of the hydrophobic resin (HR) in terms of standard polystyrene molecular weight is preferably in the range of 1,000 to 100,000, more preferably 1,000 to 50,000, and still more preferably 2,000 to 15,000.

The hydrophobic resin may either be used individually or in combination. The content of the hydrophobic resin (HR) in the resist composition based on the total solids thereof can be adjusted for enabling the receding contact angle to fall within the abovementioned range, but is preferably in the range of 0.01 to 10 mass %, more preferably 0.1 to 9 mass %, and most preferably 0.5 to 8 mass %.

Impurities such as metals in the hydrophobic resin (HR) should naturally be of low quantity as in the acid-decomposable resin. The content of residual monomers and oligomer components is preferably in the range of 0 to 10 mass %, more preferably 0 to 5 mass %, and still more preferably 0 to 1 mass %. Accordingly, there can be obtained a composition being free from in-liquid foreign matters and a change in sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8, and most preferably 1 to 1.5.

A variety of commercially available products can be used as the hydrophobic resin (HR), and also the resin can be synthesized in accordance with conventional methods (for example, by radical polymerization). As general synthesizing methods, a batch polymerization method in which a monomer species and an initiator are dissolved in a solvent and heated to carry out polymerization and a dropping polymerization method in which a solution of monomer species and initiator is dropped into a hot solvent over a period of 1 to 10 hours can be exemplified. Of these, the dropping polymerization method is preferred. As a reaction solvent, ethers such as tetrahydrofuran, 1,4-dioxane or diisopropyl ether, ketones such as methyl ethyl ketone or methyl isobutyl ketone, ester solvents such as ethyl acetate, amide solvents such as dimethylformamide or dimethylacetamide, and the aforementioned solvent capable of dissolving the composition according to the present invention, such as propylene glycol monomethyl ether acetate, propylene glycol monomethyl ether or cyclohexanone can be exemplified. Preferably, the polymerization is carried out with the use of the same solvent as that used in the composition according to the present invention. This would inhibit particle generation during storage.

The polymerization reaction is preferably carried out in an atmosphere consisting of an inert gas such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxy group are more preferred. As specific preferred initiators, azobisisobutyronitrile, azobisdimethylvaleronitrile, and dimethyl 2,2'-azobis(2-methylpropionate) can be exemplified. The reaction concentration is in the range of 5 to 50 mass %, preferably 30 to 50 mass %. The reaction temperature is generally in the range of 10° to 150° C., preferably 30° to 120° C., and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents, and the like. Of these, it is preferred to employ a solvent containing at least an alcohol (especially methanol or the like) or water as the precipitation or re-precipitation solvent.

The amount of precipitation or re-precipitation solvent used can be determined according to intended efficiency, yield, etc. and is generally in the range of 100 to 10,000 parts by mass, preferably 200 to 2,000 parts by mass, and more preferably 300 to 1,000 parts by mass per 100 parts by mass of the polymer solution.

The temperature at which the precipitation or re-precipitation is carried out can be determined according to efficiency and operation easiness, and is generally in the range of about 0° to 50° C., and preferably about room temperature (for example, about 20° to 35° C.). The operation of precipitation or re-precipitation can be carried out by a known method such as a batch or continuous method, with the use of a common mixing vessel such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° C. to 100° C., preferably about 30° C. to 50° C. at ordinary pressure or reduced pressure (preferably at reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d), and separating the precipitated resin (step e).

A liquid immersion exposure may be carried out for the film produced from the composition of the present invention. Namely, the film may be exposed to actinic rays or radiation under the conditions that the space between the film and a lens is filled with a liquid whose refractive index is higher than that of air. Any liquid whose refractive index is higher than that of air can be employed as the immersion liquid. However, pure water is especially preferred.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

For the attainment of further wavelength shortening, use can be made of a medium whose refractive index is 1.5 or higher. Such a medium may be either an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power.

The additive is preferably an aliphatic alcohol with a refractive index approximately equal to that of water, for example, methyl alcohol, ethyl alcohol, isopropyl alcohol, etc. The addition of an alcohol with a refractive index approximately equal to that of water is advantageous in that even when the alcohol component is evaporated from water to cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through, for example, an ion exchange filter.

Desirably, the electrical resistance of the water is 18.3 MΩcm or higher, and the TOC (organic matter concentration) thereof is 20 ppb or below. Prior deaeration of the water is also desired.

Raising the refractive index of the liquid for liquid immersion would enable an enhancement of lithography performance. From this viewpoint, an additive suitable for refractive index increase may be added to the water. Alternatively, heavy water ($D_2O$) may be used in place of water.

For the prevention of direct contact of a film with a liquid for liquid immersion, a film that is highly insoluble in the liquid for liquid immersion (hereinafter also referred to as a "top coat") may be provided between the film formed by the composition according to the present invention and the liquid for liquid immersion. The functions to be fulfilled by the top coat are applicability to an upper layer portion of the film, transparency in radiation of especially 193 nm, and high insolubility in the liquid for liquid immersion. Preferably, the top coat does not mix with the film and is uniformly applicable to an upper layer of the film.

From the viewpoint of transparency in radiation of 193 nm, the top coat preferably consists of a polymer not abundantly containing an aromatic moiety. As such, a hydrocarbon polymer, an acrylic ester polymer, polymethacrylic acid, polyacrylic acid, polyvinyl ether, a siliconized polymer, and a fluoropolymer can be exemplified. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having low permeation into the film. Detachability by a developer containing an organic solvent is preferred from the viewpoint of simultaneous attainment of the detachment step with the development processing step for the resist film.

Preferably, the refractive index difference between the top coat and the liquid for liquid immersion is nil or slight. If so, the resolving power can be enhanced. When the exposure light source is an ArF excimer laser (wavelength: 193 nm), it is preferred to use water as the liquid for liquid immersion. From the viewpoint of making the relative index be close to that of immersion liquid, the top coat preferably contains fluorine atoms. Further, from the viewpoint of transparency and refractive index, it is preferred for the top coat to be a thin film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the actinic ray-sensitive or radiation-sensitive resin composition and be a non-water-soluble medium. When the liquid for liquid immersion is an organic solvent, the top coat may be soluble or insoluble in water.

(f) Surfactant

The resist composition according to the present invention may further contain one or more surfactants. The composition according to the present invention when containing the above surfactant would, in the use of an exposure light source of 250 nm or below, especially 220 nm or below, realize favorable sensitivity and resolving power and produce a resist pattern with less adhesion and development defects.

It is especially preferred to use a fluorinated and/or siliconized surfactant as the surfactant.

As fluorinated and/or siliconized surfactants, there can be mentioned, for example, those described in section [0276] of US Patent Application Publication No. 2008/0248425. Further, as useful commercially available surfactants, fluorinated surfactants or siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS) can be exemplified. Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). In particular, polymers each having a fluoroaliphatic group derived from such a fluoroaliphatic compound may be used as the surfactant. The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly(oxyalkylene)methacrylate, in which copolymer may have an irregular distribution or may result from block copolymerization.

As the poly(oxyalkylene) group, a poly(oxyethylene) group, a poly(oxypropylene) group, and a poly(oxybutylene) group can be exemplified. Further, use can be made of a unit having alkylene groups of different chain lengths in a single chain, such as poly(oxyethylene-oxypropylene-oxyethylene block concatenation) or poly(oxyethylene-oxypropylene block concatenation).

Moreover, the copolymer from a monomer having a fluorinated aliphatic group and a poly(oxyalkylene)acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene)acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene)acrylate (or methacrylate), a copolymer from an acrylate (or methacrylate) having a $C_6F_{13}$ group, poly(oxyethylene) acrylate (or methacrylate) and poly(oxypropylene)acrylate (or methacrylate), a copolymer from an acrylate (or methacrylate) having a $C_8F_{17}$ group and a poly(oxyalkylene)acrylate (or methacrylate), a copolymer from an acrylate (or methacrylate) having a $C_8F_{17}$ group, poly(oxyethylene)acrylate (or methacrylate) and poly(oxypropylene)acrylate (or methacrylate), or the like.

Further, use may be made of surfactants other than the fluorinated and/or siliconized surfactants, described in section [0280] of US Patent Application Publication No. 2008/0248425.

These surfactants may be used either individually or in combination.

When the resist composition according to the present invention contains the surfactant, the total amount thereof used based on the total solids of the composition is preferably in the range of 0 to 2 mass %, more preferably 0.0001 to 2 mass %, and most preferably 0.0005 to 1 mass %.

(g) Other Additive

The resist composition according to the present invention may further contain a dissolution inhibiting compound, a dye, a plasticizer, a photosensitizer, a light absorber, a compound capable of increasing the solubility in a developer (for example, a phenolic compound of 1000 or less molecular weight or a carboxylated alicyclic or aliphatic compound of 1000 or less molecular weight), etc.

The resist composition according to the present invention may further contain a dissolution inhibiting compound. Here the "dissolution inhibiting compound" means compound having 3000 or less molecular weight that is decomposed by the action of an acid to increase the solubility in an alkali developer.

From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure can be the same as described earlier.

When the composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

When the resist composition according to the present invention contains the dissolution inhibiting compound, the total amount thereof used based on the total solids of the composition is preferably in the range of 3 to 50 mass %, and more preferably 5 to 40 mass %.

Specific examples of the dissolution inhibiting compound will be shown below.

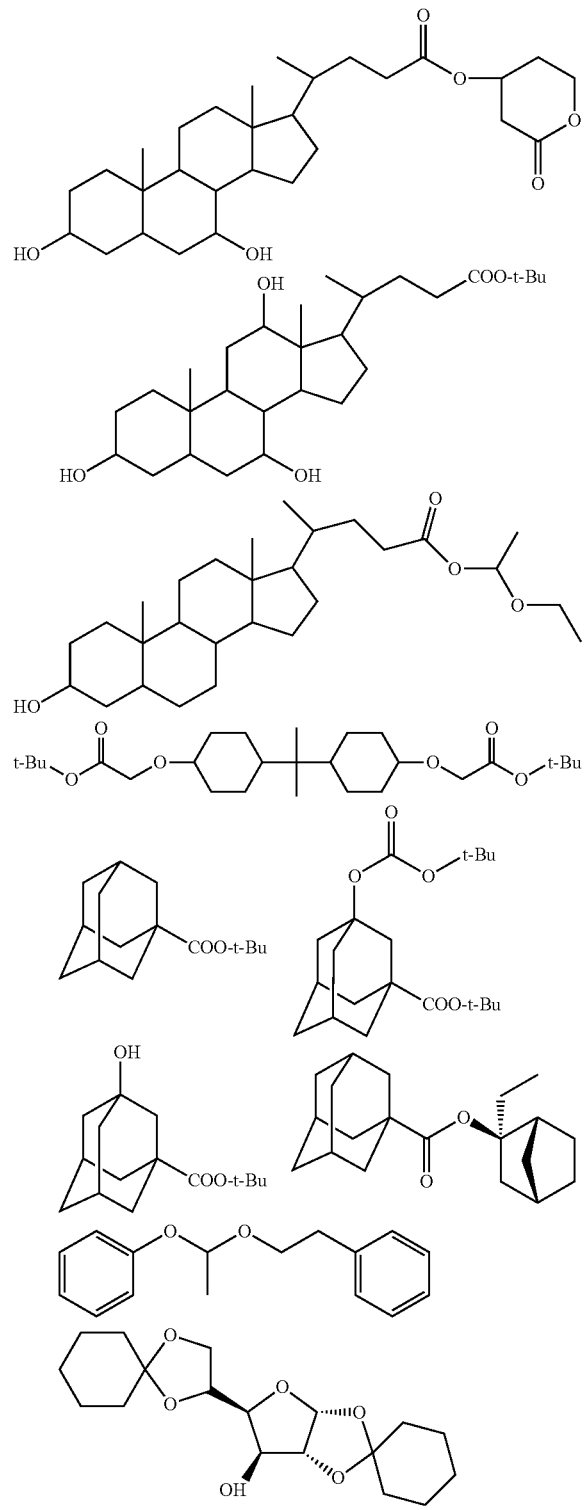

The above phenolic compound of 1000 or less molecular weight can be easily synthesized by persons of ordinary skill in the art while consulting the processes described in, for example, JP-As 4-122938 and 2-28531, U.S. Pat. No. 4,916,210, and EP 219294.

As the nonlimiting examples of the carboxylated alicyclic or aliphatic compound, a carboxylic acid derivative of steroid structure such as cholic acid, deoxycholic acid or lithocholic acid, an adamantanecarboxylic acid derivative, adamantanedicarboxylic acid, cyclohexanecarboxylic acid, and cyclohexanedicarboxylic acid can be exemplified.

<Method of Forming a Pattern>

The method of forming a pattern according to the present invention comprises (A) forming any of the above described resist compositions into a film, (B) exposing the film to light and (C) developing the exposed film using a developer containing an organic solvent. This method may further comprise (D) rinsing the developed film by use of a rinse liquid.

The method preferably comprises a prebake (PB) operation performed after the film formation but before the exposure operation. The method also preferably comprises a post-exposure bake (PEB) operation performed after the exposure operation but before the development operation.

In both the PB and the PEB operation, the baking is preferably performed at 40 to 130° C., more preferably 50 to 120° C. and further more preferably 60 to 110° C. The exposure latitude (EL) and resolving power can be markedly enhanced by carrying out the PEB operation at low temperatures ranging from 60 to 90° C.

The baking time is preferably in the range of 30 to 300 seconds, more preferably 30 to 180 seconds, and further more preferably 30 to 90 seconds.

In the method of forming a pattern according to the present invention, the operation of forming a film of the composition on a substrate, the operation of exposing the film to light, the baking operation and the developing operation can be carried out using generally known techniques.

The light source for use in the above exposure is not limited. As such, there can be mentioned, for example, a KrF excimer laser (wavelength: 248 nm), an ArF excimer laser (wavelength: 193 nm), an $F_2$ excimer laser (wavelength: 157 nm), an EUV exposure apparatus (wavelength: 13 nm), and an electron beam exposure apparatus. Note that, in this specification, examples of "light" include an electron beam.

In the exposure of the film formed from the composition of the present invention, a liquid immersion exposure may be carried out. The resolution can be enhanced by the liquid immersion exposure. Any liquid with a refractive index higher than that of air can be employed as the immersion medium. Preferably, pure water is employed.

In the liquid immersion exposure, the above-mentioned hydrophobic resin may be added to the composition in advance. Alternatively, the formation of the film may be followed by providing thereon a film that is highly insoluble in the immersion liquid (hereinafter also referred to as a "top coat"). The expected performance of the top coat, the method of using the same, etc. are described in Chapter 7 of "Process and Material of Liquid Immersion Lithography" published by CMC Publishing Co., Ltd.

From the viewpoint of the transparency to a laser of 193 nm wavelength, the top coat is preferably formed of a polymer not abundantly containing an aromatic moiety. As such a polymer, there can be mentioned, for example, a hydrocarbon polymer, an acrylic ester polymer, polymethacrylic acid, polyacrylic acid, polyvinyl ether, a siliconized polymer or a fluoropolymer. Any of the above-mentioned hydrophobic resins can be appropriately used as the top coat, and commercially available top coat materials can also be appropriately used.

At the detachment of the top coat after the exposure, use may be made of a developer. Alternatively, a separate peeling agent may be used. The peeling agent is preferably a solvent exhibiting less permeation into the film. Detachability by a developer is preferred from the viewpoint of simultaneously performing the detachment operation and the operation of film development processing.

The substrate for film formation in the present invention is not particularly limited. Use can be made of substrates commonly employed in a semiconductor production process for an IC or the like, a circuit board production process for a liquid crystal, a thermal head or the like and other photoapplication lithography processes. As such substrates, there can be mentioned, for example, inorganic substrates of silicon, SiN, $SiO_2$ and the like, and coated inorganic substrates, such as SOG. Further, according to necessity, an organic antireflection film may be provided between the film and the substrate.

As the developers containing an organic solvent, there can be mentioned, for example, developers containing a polar solvent, such as a ketone solvent, an ester solvent, an alcohol solvent, an amide solvent or an ether solvent, and a hydrocarbon solvent.

As the ketone solvent, there can be mentioned, for example, 1-octanone, 2-octanone, 1-nonanone, 2-nonanone, acetone, methyl amyl ketone (MAK, 2-heptanone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone or propylene carbonate.

As the ester solvent, there can be mentioned, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate (EEP), 3-methoxybutyl acetate, 3-methyl-3-methoxybutyl acetate, methyl formate, ethyl formate, butyl formate, propyl formate, ethyl lactate, butyl lactate, propyl lactate, methyl propionate, ethyl propionate or propyl propionate. In particular, acetic acid alkyl esters, such as methyl acetate, butyl acetate, ethyl acetate, isopropyl acetate and amyl acetate, and propionic acid alkyl esters, such as methyl propionate, ethyl propionate and propyl propionate, are preferred.

As the alcohol solvent, there can be mentioned, for example, an alcohol, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol, such as ethylene glycol, diethylene glycol or triethylene glycol; or a glycol ether, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol.

As the ether solvent, there can be mentioned, for example, not only any of the above-mentioned glycol ethers but also dioxane, tetrahydrofuran or the like.

As the amide solvent, there can be mentioned, for example, N-methyl-2-pyrrolidone, N,N-dimethylacetamide, N,N-dimethylformamide, hexamethylphosphoric triamide or 1,3-dimethyl-2-imidazolidinone.

As the hydrocarbon solvent, there can be mentioned, for example, an aromatic hydrocarbon solvent, such as toluene or xylene, or an aliphatic hydrocarbon solvent, such as pentane, hexane, octane or decane.

Two or more of these solvents may be mixed together before use. Alternatively, each of the solvents may be used in a mixture with a solvent other than those mentioned above and/or water within a proportion not detrimental to full exertion of performance. The water content of the whole developer is preferably below 10 mass %. More preferably, the developer contains substantially no water. Namely, it is preferred for the developer to consist substantially only of an organic solvent. Even if so, the developer can contain any of surfactants to be described hereinafter. Also, even if so, the developer may contain unavoidable impurities from the atmosphere.

The amount of organic solvent used in the developer is preferably in the range of 80 to 100 mass %, more preferably 90 to 100 mass % and further more preferably 95 to 100 mass % based on the whole amount of the developer.

It is especially preferred for the organic solvent contained in the developer to be at least one member selected from among a ketone solvent, an ester solvent, an alcohol solvent, an amide solvent and an ether solvent.

The vapor pressure of the developer containing an organic solvent at 20° C. is preferably 5 kPa or below, more preferably 3 kPa or below and most preferably 2 kPa or below. When the vapor pressure of the developer is 5 kPa or below, the evaporation of the developer on the substrate or in a development cup can be suppressed so that the temperature uniformity within the plane of the wafer can be enhanced to thereby improve the dimensional uniformity within the plane of the wafer.

As particular examples of the developers exhibiting a vapor pressure of 5 kPa or below, there can be mentioned a ketone solvent, such as 1-octanone, 2-octanone, 1-nonanone, 2-nonanone, methyl amyl ketone (MAK: 2-heptanone), 4-heptanone, 2-hexanone, diisobutyl ketone, cyclohexanone, methylcyclohexanone, phenylacetone or methyl isobutyl ketone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, butyl formate, propyl formate, ethyl lactate, butyl lactate or propyl lactate; an alcohol solvent, such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an ether solvent, such as tetrahydrofuran; an amide solvent, such as N-methyl-2-pyrrolidone, N,N-dimethylacetamide or N,N-dimethylformamide; an aromatic hydrocarbon solvent, such as toluene or xylene, and an aliphatic hydrocarbon solvent, such as octane or decane.

As particular examples of the developers exhibiting a vapor pressure of 2 kPa or below, there can be mentioned a ketone solvent, such as 1-octanone, 2-octanone, 1-nonanone, 2-nonanone, methyl amyl ketone (MAK:

2-heptanone), 4-heptanone, 2-hexanone, diisobutyl ketone, cyclohexanone, methylcyclohexanone or phenylacetone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, ethyl lactate, butyl lactate or propyl lactate; an alcohol solvent, such as n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an amide solvent, such as N-methyl-2-pyrrolidone, N,N-dimethylacetamide or N,N-dimethylformamide; an aromatic hydrocarbon solvent, such as xylene, and an aliphatic hydrocarbon solvent, such as octane or decane.

According to necessity, an appropriate amount of surfactant can be added to the developer.

The surfactant is not particularly limited. For example, use can be made of any of ionic and nonionic fluorinated and/or siliconized surfactants. As such fluorinated and/or siliconized surfactants, there can be mentioned, for example, those described in JP-A's S62-36663, S61-226746, S61-226745, S62-170950, S63-34540, H7-230165, H8-62834, H9-54432 and H9-5988 and U.S. Pat. Nos. 5,405,720, 5,360,692, 5,529,881, 5,296,330, 5,436,098, 5,576,143, 5,294,511 and 5,824,451. Nonionic surfactants are preferred. Using a nonionic fluorinated surfactant or siliconized surfactant is more preferred.

The amount of surfactant used is generally in the range of 0.001 to 5 mass %, preferably 0.005 to 2 mass % and further more preferably 0.01 to 0.5 mass % based on the whole amount of the developer.

As the development method, use can be made of, for example, a method in which the substrate is dipped in a tank filled with a developer for a given period of time (dip method), a method in which a developer is puddled on the surface of the substrate by its surface tension and allowed to stand still for a given period of time to thereby effect development (puddle method), a method in which a developer is sprayed onto the surface of the substrate (spray method), or a method in which a developer is continuously discharged onto the substrate being rotated at a given speed while scanning a developer discharge nozzle at a given speed (dynamic dispense method).

With respect to the above various development methods, when the operation of discharging a developer toward a resist film through a development nozzle of a development apparatus is included, the discharge pressure of discharged developer (flow rate per area of discharged developer) is preferably 2 mL/sec/mm$^2$ or below, more preferably 1.5 mL/sec/mm$^2$ or below and further more preferably 1 mL/sec/mm$^2$ or below. There is no particular lower limit of the flow rate. However, from the viewpoint of through-put, it is preferred for the flow rate to be 0.2 mL/sec/mm$^2$ or higher.

Pattern defects attributed to any resist residue after development can be markedly reduced by regulating the discharge pressure of discharged developer so as to fall within the above range.

The detail of the mechanism thereof is not apparent. However, it is presumed that regulating the discharge pressure so as to fall within the above range would lower the pressure of the developer on the resist film, thereby inhibiting inadvertent shaving or crumbling of the resist film and/or resist pattern.

The discharge pressure of developer (mL/sec/mm$^2$) refers to a value at the outlet of the development nozzle of the development apparatus.

For the regulation of the discharge pressure of developer, there can be employed, for example, a method in which the discharge pressure is regulated using a pump or the like, or a method in which the discharge pressure is changed through pressure regulation by supply from a pressure tank.

The development operation may be followed by the operation of discontinuing the development by replacement with a different solvent.

It is preferred for the method of forming a pattern according to the present invention to include a rinse operation (operation of rinsing the film with a rinse liquid containing an organic solvent) to be conducted after the development operation.

The rinse liquid for use in the rinse operation is not particularly limited as long as it does not dissolve the pattern after development, and solutions containing common organic solvents can be used.

As the rinse liquid, there can be mentioned, for example, one containing at least one organic solvent selected from among a hydrocarbon solvent, a ketone solvent, an ester solvent, an alcohol solvent, an amide solvent and an ether solvent. It is preferred for the rinse liquid to be one containing at least one organic solvent selected from among a ketone solvent, an ester solvent, an alcohol solvent and an amide solvent. A rinse liquid containing an alcohol solvent or an ester solvent is more preferred.

The rinse liquid further more preferably contains a monohydric alcohol, most preferably a monohydric alcohol having 5 or more carbon atoms.

The monohydric alcohol may be in the form of a linear chain, a branched chain or a ring. Particular examples of the monohydric alcohols include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. Particular examples of the monohydric alcohols each having 5 or more carbon atoms include 1-hexanol, 2-hexanol, 4-methyl-2-pentanol, 1-pentanol and 3-methyl-1-butanol.

Two or more of these components may be mixed together before use. Also, they may be mixed with other organic solvents before use.

The water content of the rinse liquid is preferably below 10 mass %, more preferably below 5 mass % and further more preferably below 3 mass %. Namely, the amount of organic solvent used in the rinse liquid is preferably in the range of 90 to 100 mass %, more preferably 95 to 100 mass % and most preferably 97 to 100 mass % based on the whole amount of the rinse liquid. Favorable development performance can be attained by controlling the water content of the rinse liquid at below 10 mass %.

The vapor pressure of the rinse liquid at 20° C. is preferably in the range of 0.05 to 5 kPa, more preferably 0.1 to 5 kPa and further more preferably 0.12 to 3 kPa. When the vapor pressure of the rinse liquid is in the range of 0.05 to 5 kPa, not only can the temperature uniformity within the plane of the wafer be enhanced but also the swell attributed to the penetration of the rinse liquid can be suppressed to thereby improve the dimensional uniformity within the plane of the wafer.

An appropriate amount of surfactant may be added to the rinse liquid.

In the rinse operation, the wafer having undergone the development is rinsed using the above rinse liquid. The method of rinse treatment is not particularly limited. For example, use can be made of any of a method in which the rinse liquid is continuously applied onto the substrate being rotated at a given speed (spin application method), a method in which the substrate is dipped in a tank filled with the rinse liquid for a given period of time (dip method) and a method in which the rinse liquid is sprayed onto the surface of the substrate (spray method). Preferably, the rinse treatment is carried out according to the spin application method, and thereafter the substrate is rotated at a rotating speed of 2000 to 4000 rpm to thereby remove the rinse liquid from the top of the substrate.

The method of forming a pattern according to the present invention may include the operation of developing with an alkali developer (positive pattern forming operation) in addition to the operation of developing with a developer containing an organic solvent. The order of the operation of developing with an alkali developer and operation of developing with a developer containing an organic solvent is not particularly limited. However, it is preferred to carry out the development with an alkali developer before the development with a developer containing an organic solvent. The operation of baking is preferably conducted before each of the development operations.

The type of the alkali developer is not particularly limited. However, an aqueous solution of tetramethylammonium hydroxide is generally used. An appropriate amount of alcohol and/or surfactant may be added to the alkali developer.

The alkali concentration of the alkali developer is generally in the range of 0.1 to 20 mass %. The pH value of the alkali developer is generally in the range of 10.0 to 15.0. It is especially preferred to use a 2.38 mass % aqueous tetramethylammonium hydroxide solution as the alkali developer.

When a rinse treatment is conducted after the development using an alkali developer, typically, pure water is used as the rinse liquid. An appropriate amount of surfactant may be added to the rinse liquid.

EXAMPLE

<Acid-Decomposable Resin>

The above resins (A-1) to (A-55) were synthesized in the following manner. Further, the following resin (CA-1) was prepared. With respect to the resin (CA-1), the weight average molecular weight was 10,500, the molecular weight dispersity 1.77, and the component ratio 40:10:40:10 (molar ratio).

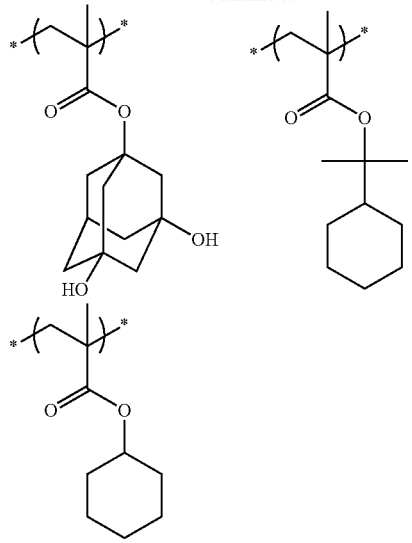

-continued

Synthetic Example 1: Resin (A-1)

In a nitrogen stream, 200 g of cyclohexanone was placed in a three-necked flask, and heated at 80° C. Thus, a solvent 1 was obtained. Separately, the following monomer-1 (29.7 g) and monomer-2 (71.4 g) were dissolved in cyclohexanone (372 g), thereby obtaining a monomer solution. Further, a polymerization initiator V601 (produced by Wako Pure Chemical Industries, Ltd.) was added in an amount of 6.6 mol % based on the total amount of monomers to the solution and dissolved therein. The thus obtained solution was dropped into the solvent 1 over a period of six hours. After the completion of the dropping, reaction was continued at 80° C. for two hours. The reaction liquid was allowed to cool, and dropped into a liquid mixture of 7736 g of heptane and 859 g of ethyl acetate. The thus precipitated powder was collected by filtration and dried. Thus, 73 g of resin (A-1) was obtained. With respect to the thus obtained resin (A-1), the weight average molecular weight was 9800, the molecular weight dispersity (Mw/Mn) 1.76 and the component ratio determined by $^{13}$C-NMR 40:60.

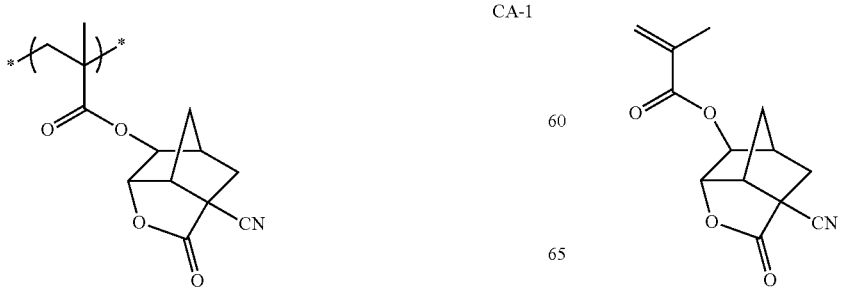

CA-1 monomer-1

-continued monomer-2

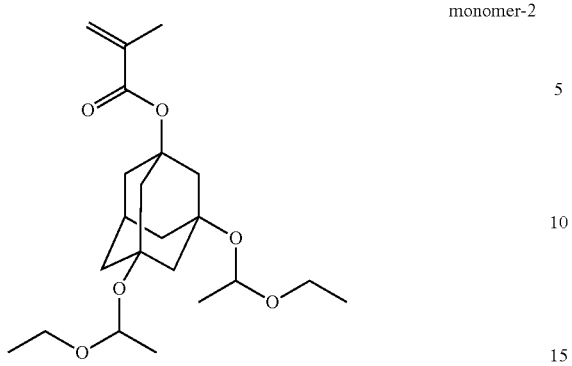

Synthetic Example 2: Resins (A-2) to (A-55)

The resins (A-2) to (A-55) were synthesized in the same manner as in Synthetic Example 1. With respect to each of these resins, the weight average molecular weight, the molecular weight dispersity (Mw/Mn), and the component ratio were as given in Table 1 above.

<Hydrophobic Resin>

Synthetic Example 3: Hydrophobic Resin (1b)

The hydrophobic resin (1b) shown below was synthesized in the following manner. Namely, the monomers corresponding to the individual repeating units of the hydrophobic resin (1b) were charged in a proportion of 40/60 (molar ratio) and dissolved in propylene glycol monomethyl ether acetate (PGMEA). Thus, 450 g of a solution of 15 mass % solid content was obtained. A polymerization initiator V60 produced by Wako Pure Chemical Industries, Ltd. was added in an amount of 1 mol % to the solution. In a nitrogen stream, the resultant mixture was dropped into 50 g of PGMEA heated at 100° C. over a period of six hours. After the completion of the dropping, the reaction liquid was agitated for two hours. After the completion of the reaction, the reaction liquid was allowed to cool to room temperature and precipitated in 5 liters of methanol. The thus precipitated white powder was collected by filtration, thereby recovering desired resin (1b).

The polymer component ratio determined by NMR was 40:60. Further, the standard-polystyrene-equivalent weight average molecular weight and dispersity of the resin determined by GPC were 8000 and 1.55, respectively.

1b

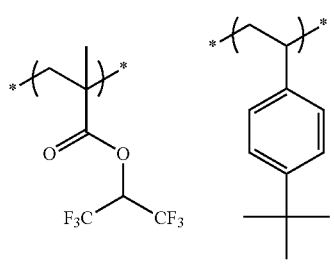

Molar Ratio 40/60
Mw 8000
Mw/Mn 1.55

-continued

2b

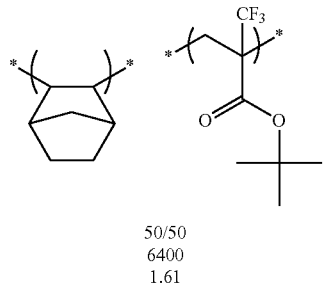

50/50
6400
1.61

3b

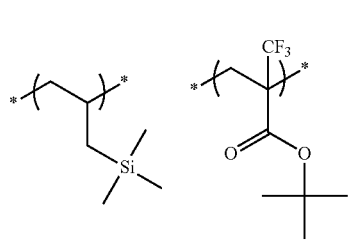

50/50
4500
1.49

4b

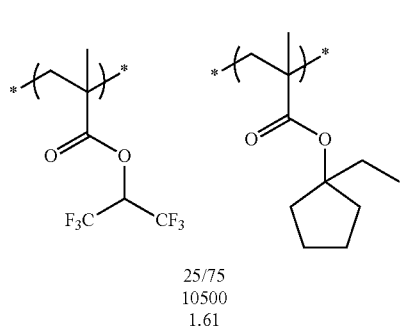

25/75
10500
1.61

5b

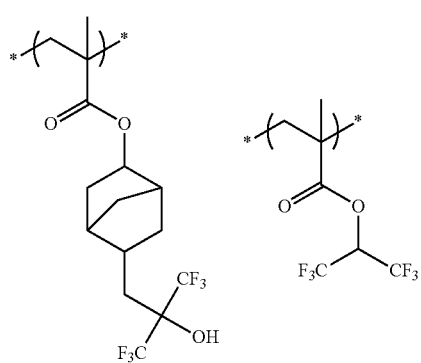

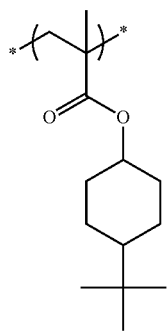

20/20/60
12000
1.70

Synthetic Example 4: Hydrophobic Resins (2b) to (5b)

The hydrophobic resins (2b) to (5b) shown above were synthesized in the same manner as in Synthetic Example 3. With respect to each of these resins, the component ratio, weight average molecular weigh and molecular weight dispersity (Mw/Mn) were as indicated above.

<Acid Generator>

The following compounds (PAG-1) to (PAG-12) were provided as the acid generators.

PAG-1

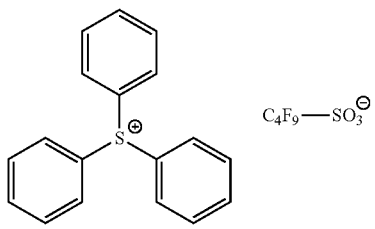

PAG-2

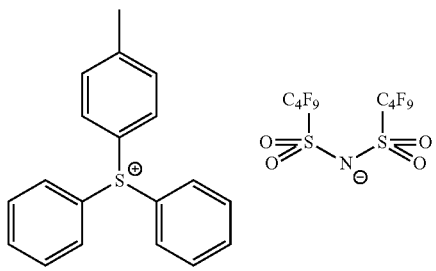

PAG-3

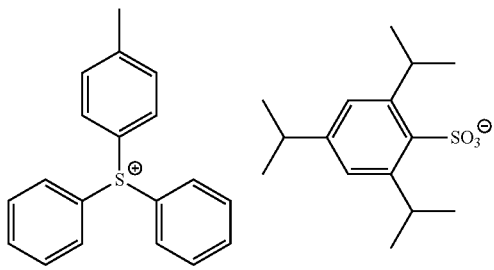

PAG-4

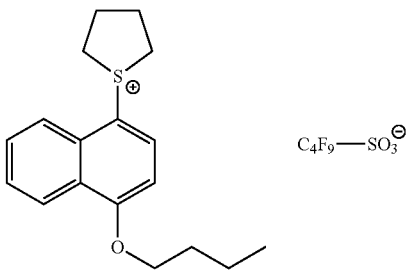

PAG-5

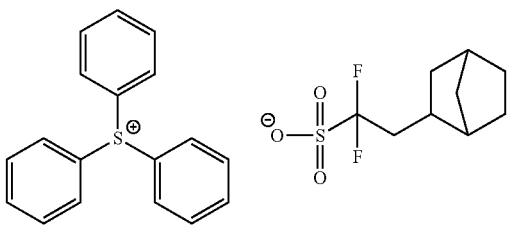

PAG-6

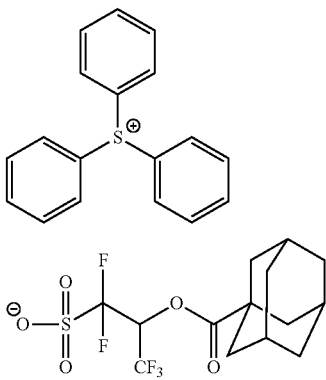

PAG-7

PAG-8

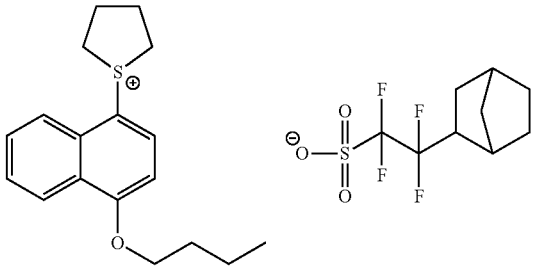

-continued
PAG-9
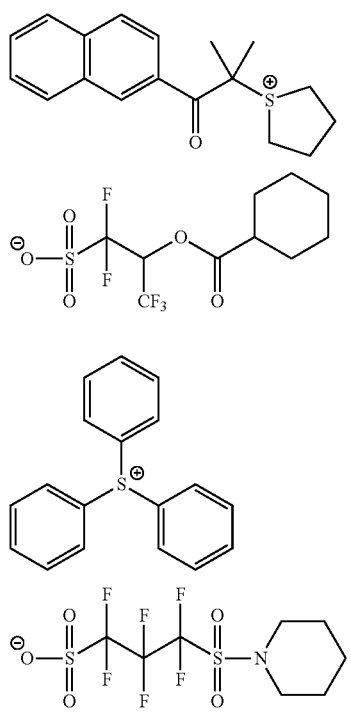
PAG-10
PAG-11
PAG-12
<Basic Compound>
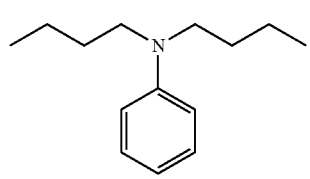
N-1
-continued
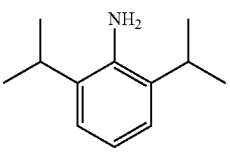
N-2
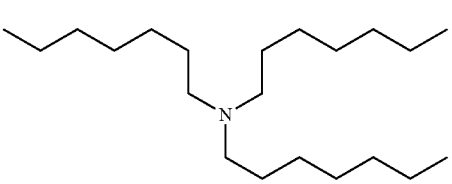
N-3
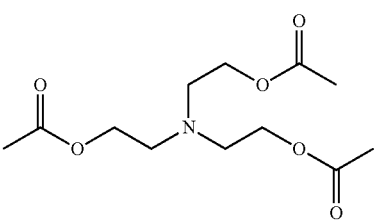
N-4
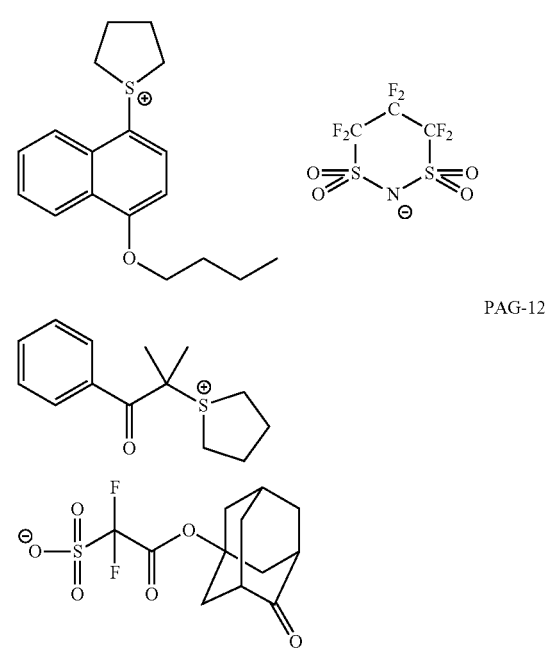
N-5
N-6
N-7
N-8
The following compounds (N-1) to (N-8) were provided as the basic compounds.
<Additive>
The following compounds (AD-1) to (AD-5) were provided as the additives.

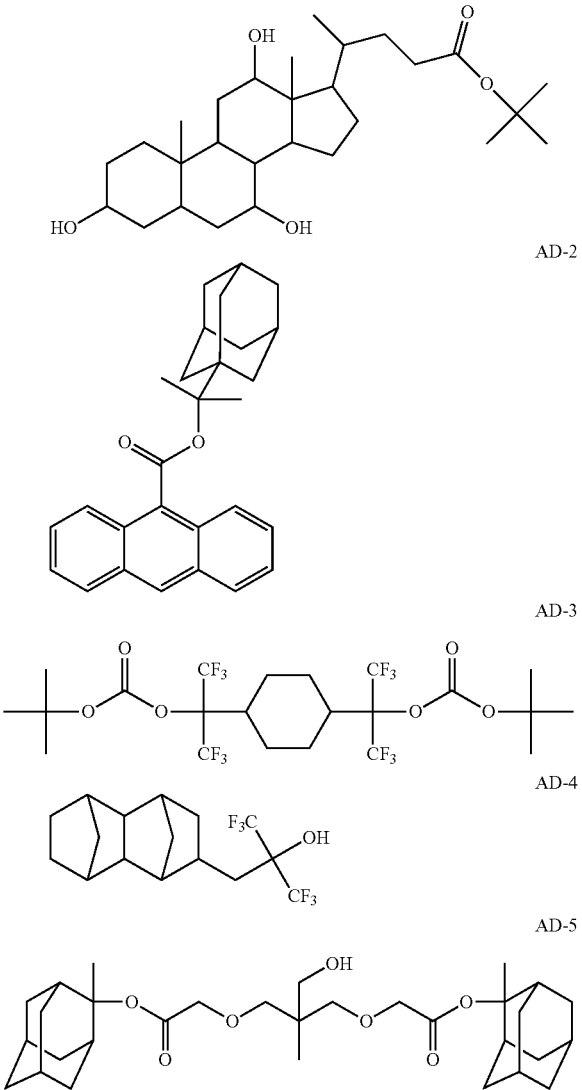

<Surfactant>

The following surfactants were provided.

W-1: Megafac F176 (produced by Dainippon Ink & Chemicals, Inc., fluorinated),

W-2: Megafac R08 (produced by Dainippon Ink & Chemicals, Inc., fluorinated and siliconized), W-3: polysiloxane polymer KP-341 (produced by Shin-Etsu Chemical Co., Ltd., siliconized), W-4: Troy Sol S-366 (produced by Troy Chemical Co., Ltd.), W-5: KH-20 (produced by Asahi Kasei Corporation), and W-6: PolyFox PF-6320 (produced by OMNOVA SOLUTIONS, INC., fluorinated).

<Solvent>

The following solvents were provided.

(Group a)

SL-1: propylene glycol monomethyl ether acetate,

SL-2: propylene glycol monomethyl ether propionate, and

SL-3: 2-heptanone.

(Group b)

SL-4: ethyl lactate,

SL-5: propylene glycol monomethyl ether, and

SL-6: cyclohexanone.

(Group c)

SL-7: γ-butyrolactone, and

SL-8: propylene carbonate.

<Preparation of Resist Composition>

Resist compositions were prepared by dissolving individual components indicated in Table 3 below in solvents indicated in the table and passing the solutions through a polyethylene filter of 0.03 μm pore size. Separately, an organic antireflection film ARC29SR (produced by Nissan Chemical Industries, Ltd.) was applied onto a silicon wafer and baked at 205° C. for 60 seconds, thereby forming a 86 nm-thick antireflection film. Each of the prepared resist compositions was applied thereonto and baked (PB) at 100° C. for 60 seconds, thereby forming a 100 nm-thick resist film.

Each of the resultant wafers was patternwise exposed through an exposure mask (line/space=1/1) by means of an ArF excimer laser liquid-immersion scanner (manufactured by ASML, XT1700i, NA 1.20, C-Quad, outer sigma 0.981, inner sigma 0.895, XY deflection). Ultrapure water was used as the immersion liquid. Thereafter, the exposed wafer was baked at 85° C. for 60 seconds (PEB). The baked wafer was developed by puddling a developer (butyl acetate) for 30 seconds and rinsed by puddling a rinse liquid (4-methyl-2-pentanol) for 30 seconds. The rinsed wafer was rotated at a rotating speed of 4000 rpm for 30 seconds and baked at 90° C. for 60 seconds and baked at 90° C. for 60 seconds. Thus, a 75 nm (1:1) line-and-space resist pattern was obtained.

<Method of Evaluation>

[Sensitivity (Eopt)]

Each of the obtained patterns was observed by means of a scanning electron microscope (SEM model S-9380II manufactured by Hitachi, Ltd.). The sensitivity (Eopt) was defined as the exposure energy in which a 75 nm (1:1) line-and-space resist pattern was resolved.

The smaller this sensitivity value, the higher the sensitivity.

[Resolving Power (Limiting Resolving Power)]

At the resolution of a pattern of line:space=1:1 at the above sensitivity, the minimum of resolvable line width was observed by means of the above scanning electron microscope. The smaller this minimum value, the higher the resolving power.

[Line Width Roughness (LWR)]

Each of the 75 nm (1:1) line-and-space resist patterns was observed by means of a critical dimension scanning electron microscope (SEM model S-9380II, manufactured by Hitachi, Ltd.). The distance between actual edge and a reference line on which edges were to be present was measured at 50 points of equal intervals within 2 μm in the longitudinal direction of the pattern. The standard deviation of measured distances was determined, and 3σ (nm) was computed therefrom. This 3σ was denoted as LWR. The smaller the value thereof, the higher the performance exhibited.

[Exposure Latitude (EL)]

The optimum exposure amount was defined as the exposure amount that formed a 75 nm (1:1) line-and-space resist pattern. The exposure amount width in which when the exposure amount was varied, the pattern size allowed ±10% of the size was measured. The exposure latitude is the quotient of the value of the exposure amount width divided by the optimum exposure amount, the quotient expressed by a percentage. The greater the value of the exposure latitude, the less the change of performance by exposure amount changes and the better the exposure latitude (EL).

[PEB Temperature Dependency]

The optimum exposure amount was defined as the exposure amount that reproduced a 75 nm line-and-space 1/1 upon postbaking at 85° C. for 60 seconds. After the exposure conducted in the optimum exposure amount, postbake was carried out at two temperatures, above postbake temp. +2° C. and above postbake temp. −2° C., namely, 87° C. and 83° C. The thus obtained line-and-spaces were measured, thereby determining the line widths $L_1$, $L_2$ thereof. The PEB temperature dependency was defined as the change of line width per PEB temperature change ° C., and calculated by the following formula. The smaller the calculated value, the favorably less the performance change per temperature change.

PEB temperature dependency (nm/° C.)=$|L_1-L_2|/4$

[Focus Latitude (Depth of Focus DOF)]

The exposure amount was fixed at the above Eopt, and the relationship between focus shift and line width was investigated. The focus maximum value and minimum value that could cause the line width to fall within the range of ±10% of the target 75 nm (namely, the range of from 67.5 nm to 82.5 nm) were determined. The difference between the maximum value and the minimum value was calculated and denoted as "focus latitude (depth of focus DOF)."

The evaluation results are given in Table 3 below.

TABLE 3

| Examples | Acid-decomposable resin No. | parts by mass | Hydrophobic resin No. | parts by mass | Acid generator 1 No. | parts by mass | Acid generator 2 No. | parts by mass | Basic compound 1 No. | parts by mass | Basic compound 2 No. | parts by mass |
|---|---|---|---|---|---|---|---|---|---|---|---|---|
| 1 | A-1 | 90.3 | 1b | 0.8 | PAG-1 | 2.0 | PAG-7 | 6.0 | N-2 | 0.60 | N-4 | 0.30 |
| 2 | A-2 | 89.0 | 2b | 2.5 | PAG-3 | 4.0 | PAG-8 | 4.0 | N-8 | 0.50 | | |
| 3 | A-3 | 87.0 | 3b | 2.0 | PAG-1 | 5.0 | PAG-10 | 5.0 | N-3 | 0.50 | N-8 | 0.50 |
| 4 | A-4 | 89.0 | 4b | 3.0 | PAG-1 | 5.0 | PAG-4 | 2.0 | N-5 | 0.50 | N-6 | 0.50 |
| 5 | A-5 | 85.2 | 5b | 5.0 | PAG-6 | 6.0 | PAG-9 | 3.0 | N-1 | 0.50 | N-4 | 0.30 |
| 6 | A-6 | 92.4 | 1b | 0.6 | PAG-3 | 6.0 | | | N-8 | 1.00 | | |
| 7 | A-7 | 85.2 | 2b | 4.0 | PAG-4 | 7.0 | PAG-10 | 3.0 | N-5 | 0.80 | | |
| 8 | A-8 | 87.5 | 3b | 3.0 | PAG-4 | 5.5 | PAG-12 | 3.0 | N-6 | 0.60 | N-3 | 0.40 |
| 9 | A-9 | 91.5 | 4b | 1.5 | PAG-1 | 2.0 | PAG-2 | 4.0 | N-1 | 0.50 | N-2 | 0.50 |
| 10 | A-10 | 84.2 | 5b | 3.0 | PAG-11 | 12.0 | | | N-4 | 0.80 | | |
| 11 | A-11 | 89.8 | 1b | 1.2 | PAG-2 | 4.0 | PAG-8 | 4.0 | N-7 | 1.00 | | |
| 12 | A-12 | 82.2 | 2b | 6.5 | PAG-4 | 6.0 | PAG-11 | 4.0 | N-8 | 0.30 | N-2 | 1.00 |
| 13 | A-13 | 82.2 | 2b | 6.5 | PAG-1 | 6.0 | PAG-10 | 4.0 | N-8 | 0.30 | N-2 | 1.00 |
| 14 | A-14 | 82.2 | 2b | 6.5 | PAG-8 | 6.0 | PAG-11 | 4.0 | N-8 | 0.30 | N-2 | 1.00 |
| 15 | A-15 | 87.8 | 1b | 1.0 | PAG-5 | 8.0 | PAG-4 | 1.0 | N-8 | 1.20 | | |
| 16 | A-16 | 86.2 | 2b | 0.8 | PAG-10 | 6.0 | PAG-7 | 5.0 | N-7 | 1.00 | | |
| 17 | A-17 | 86.8 | 3b | 1.5 | PAG-6 | 6.0 | PAG-9 | 4.0 | N-6 | 0.60 | N-5 | 0.60 |
| 18 | A-18 | 88.0 | 5b | 2.0 | PAG-7 | 6.0 | PAG-11 | 2.0 | N-4 | 0.80 | N-3 | 0.20 |
| 19 | A-19 | 85.6 | 4b | 1.0 | PAG-10 | 6.0 | PAG-12 | 6.0 | N-7 | 0.80 | N-6 | 0.60 |
| 20 | A-20 | 89.4 | 2b | 1.2 | PAG-12 | 6.0 | PAG-3 | 1.5 | N-6 | 0.80 | N-4 | 0.10 |
| Comp. 1 | CA-1 | 88.0 | 1b | 1.0 | PAG-1 | 3.0 | PAG-7 | 7.0 | N-1 | 1.00 | | |

| Examples | Additive No. | parts by mass | Surfactant No. | parts by mass | Solvent 1 | parts by mass | Solvent 2 | parts by mass | Solvent 3 | parts by mass |
|---|---|---|---|---|---|---|---|---|---|---|
| 1 | AD-1 | 1.0 | | | SL-1 | 1573 | SL-6 | 800 | SL-8 | 27 |
| 2 | | | W-6 | 0.50 | SL-1 | 1819 | SL-5 | 531 | SL-7 | 50 |
| 3 | | | W-3 | 0.50 | SL-1 | 400 | SL-6 | 2000 | | |
| 4 | AD-3 | 0.5 | | | SL-1 | 1769 | SL-4 | 531 | SL-7 | 100 |
| 5 | | | | | SL-1 | 1849 | SL-3 | 531 | SL-7 | 20 |
| 6 | AD-5 | 1.0 | | | SL-6 | 2380 | SL-8 | 20 | | |
| 7 | | | W-1 | 0.50 | SL-1 | 2365 | SL-7 | 35 | | |
| 8 | | | | | SL-2 | 1938 | SL-6 | 442 | SL-7 | 20 |
| 9 | AD-4 | 0.5 | W-2 | 0.50 | SL-2 | 1869 | SL-4 | 531 | | |
| 10 | | | W-6 | 1.00 | SL-2 | 1869 | SL-6 | 531 | | |
| 11 | | | | | SL-3 | 1869 | SL-6 | 531 | | |
| 12 | AD-2 | 0.5 | W-4 | 1.00 | SL-3 | 2265 | SL-7 | 135 | | |
| 13 | | | W-4 | 1.00 | SL-3 | 2265 | SL-7 | 135 | | |
| 14 | | | W-4 | 1.00 | SL-3 | 2265 | SL-7 | 135 | | |
| 15 | | | W-1 | 1.00 | SL-3 | 1750 | SL-6 | 600 | SL-7 | 50 |
| 16 | | | W-4 | 1.00 | SL-3 | 1800 | SL-6 | 500 | SL-8 | 100 |
| 17 | | | W-3 | 0.50 | SL-3 | 1400 | SL-6 | 1000 | | |
| 18 | | | W-2 | 1.00 | SL-3 | 2100 | SL-5 | 200 | SL-7 | 100 |
| 19 | | | | | SL-3 | 2150 | SL-3 | 200 | SL-8 | 50 |
| 20 | | | W-5 | 1.00 | SL-3 | 1900 | SL-6 | 400 | SL-4 | 100 |
| Comp. 1 | | | W-1 | 0.50 | SL-1 | 2150 | SL-6 | 250 | | |

TABLE 3-continued

| | | Performances | | | | |
|---|---|---|---|---|---|---|
| Examples | Eopt (mJ/cm$^2$) | Limiting resolving power (nm) | LWR (nm) | EL (%) | PEB temperature dependency (nm/° C.) | DOF (μm) |
|---|---|---|---|---|---|---|
| 1 | 29.1 | 30 | 5.0 | 20.1 | 1.0 | 0.40 |
| 2 | 28.8 | 29 | 5.2 | 19.1 | 1.2 | 0.40 |
| 3 | 27.8 | 28.5 | 4.5 | 20.3 | 0.8 | 0.40 |
| 4 | 28.7 | 29.5 | 5.3 | 19.8 | 0.5 | 0.40 |
| 5 | 28.7 | 29.5 | 5.2 | 19.3 | 0.5 | 0.40 |
| 6 | 29.1 | 30.5 | 4.9 | 20.5 | 0.7 | 0.40 |
| 7 | 35.2 | 30.5 | 4.6 | 22.7 | 1.2 | 0.35 |
| 8 | 27.5 | 28.5 | 4.9 | 20.3 | 0.8 | 0.40 |
| 9 | 26.6 | 29.5 | 4.9 | 18.8 | 2.1 | 0.50 |
| 10 | 27.1 | 30 | 5.0 | 20.5 | 1.9 | 0.50 |
| 11 | 34.7 | 33.5 | 4.8 | 23.9 | 1.1 | 0.40 |
| 12 | 24.9 | 34 | 5.2 | 20.7 | 1.1 | 0.40 |
| 13 | 38.9 | 33.5 | 5.5 | 17.8 | 2.5 | 0.35 |
| 14 | 35.6 | 37.5 | 5.8 | 20.7 | 1.1 | 0.30 |
| 15 | 28.6 | 34.5 | 5.1 | 18.8 | 0.9 | 0.40 |
| 16 | 29.1 | 30.1 | 5.3 | 19.8 | 2.0 | 0.50 |
| 17 | 28.5 | 33.4 | 5.3 | 24.5 | 1.9 | 0.50 |
| 18 | 36.7 | 28.5 | 5.2 | 25.1 | 2.6 | 0.50 |
| 19 | 29.3 | 33.5 | 5.1 | 20.7 | 1.6 | 0.50 |
| 20 | 26.6 | 33.6 | 5.2 | 20.1 | 1.3 | 0.40 |
| Comp. 1 | 43.5 | 42.5 | 5.8 | 14.5 | 3.3 | 0.30 |

As apparent from the results of Table 3, the compositions of the working examples excelled in the sensitivity, limiting resolving power, LWR, EL, PEB temperature dependency and DOF.

Also, the results of Table 3 have elucidated the following.

(1) Comparison of Examples 1 to 10, 16 and 18 with other Examples has proved that the sensitivity can be enhanced when the acid-decomposable resin further contains a repeating unit containing a cyano group.

(2) Comparison of Examples 7, 11, 17 and 18 with other Examples has proved that the EL can be enhanced when the acid-decomposable resin further contains a repeating unit containing an alcoholic hydroxyl group.

(3) Comparison of Examples 9, 10 and 16 to 19 with other Examples has proved that the DOF can be enhanced when the acid-decomposable resin further contains a repeating unit containing a group that is decomposed when acted on by an acid to thereby produce a carboxyl group. Also, an enhancement of the PEB temperature dependency thereby has been recognized.

(4) Comparison of Examples 13 and 18 with other Examples has proved that the sensitivity and the PEB temperature dependency can be enhanced when the acid-decomposable resin contains a repeating unit containing any of the groups of general formula (II-1) above in which at least one of $R_3$s represents a monovalent organic group.

(5) Comparison of Example 14 with other Examples has proved that the limiting resolving power and the roughness performance can be enhanced when the acid-decomposable resin contains a repeating unit containing two or more groups that are decomposed to thereby produce an alcoholic hydroxyl group when acted on by an acid.

<Evaluation Made Using Other Developers>

Patterns were formed in the same manner as described above except that in place of butyl acetate, EEP, MAK, amyl acetate and a mixed solvent of butyl acetate and MAK (mass ratio 1:1) were each used as the developer. The obtained patterns were evaluated in the same manner as described above. As a result, it has been ascertained that excellent sensitivity, limiting resolving power, LWR, EL, PEB temperature dependency and DOF can be attained even when use is made of developers other than butyl acetate.

The invention claimed is:

1. A method of forming a pattern, comprising:

(A) forming a film from a resist composition comprising a resin containing a repeating unit containing a group that is decomposed when acted on by an acid to thereby produce an alcoholic hydroxyl group in the side chain of the resin, a compound (b) that generates an acid when exposed to actinic rays or radiation, and solvent, which resin when acted on by an acid decreases its solubility in a developer containing an organic solvent, (B) exposing the film to light, and (C) developing the exposed film using a developer containing an organic solvent, wherein the pattern formed is a negative pattern, wherein the repeating unit is represented by at least one selected from the group consisting of general formulae (I-1) to (I-10) below, wherein the group that is decomposed when acted on by an acid to thereby produce an alcoholic hydroxyl group is represented by at least one selected from the group consisting of general formulae (II-3) to (II-9) below, wherein the organic solvent contained in the developer is an ester solvent, and wherein the amount of the ester solvent as the organic solvent used in the developer is in the range of 80 to 100 mass % based on a whole amount of the developer,

(I-1)

-continued

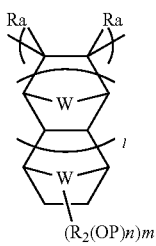
(I-2)

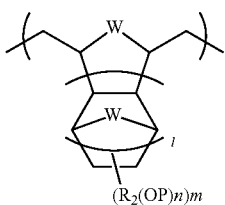
(I-3)

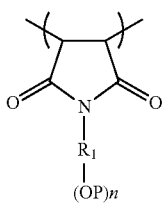
(I-4)

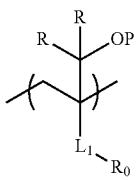
(I-5)

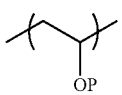
(I-6)

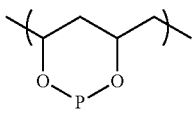
(I-7)

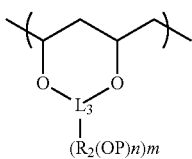
(I-8)

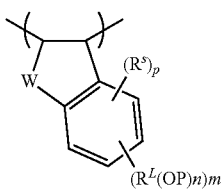
(I-9)

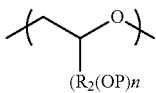
(I-10)

in the general formulae (I-1) to (I-10),

Ra, or each of Ra's independently, represents a hydrogen atom, an alkyl group or any of groups of the formula —CH$_2$—O—Ra2 in which Ra2 represents a hydrogen atom, an alkyl group or an acyl group, $R_1$ represents a (n+1)-valent organic group, $R_2$, when m≥2 each of $R_2$s independently, represents a single bond or a (n+1)-valent organic group, OP, or each of OPs independently, represents the group that is decomposed when acted on by an acid to thereby produce an alcoholic hydroxyl group, provided that when n≥2 and/or m≥2, two or more OPs may be bonded to each other to thereby form a ring, W represents a methylene group, an oxygen atom or a sulfur atom, each of n and m is an integer of 1 or greater, l is an integer of 0 or greater, $L_1$ represents a connecting group of the formula —COO—, —OCO—, —CONH—, —O—, —Ar—, —SO$_3$— or —SO$_2$NH—, the Ar representing a bivalent aromatic ring group, each of R's independently represents a hydrogen atom or an alkyl group, $R_0$ represents a hydrogen atom or an organic group, $L_3$ represents a (m+2)-valent connecting group, $R^L$, when m≥2 each of $R^L$s independently, represents a (n+1)-valent connecting group, $R^S$, when p≥2 each of $R^S$s independently, represents a substituent, provided that when p≥2, two or more $R^{Ss}$ may be bonded to each other to thereby form a ring, and p is an integer of 0 to 3,

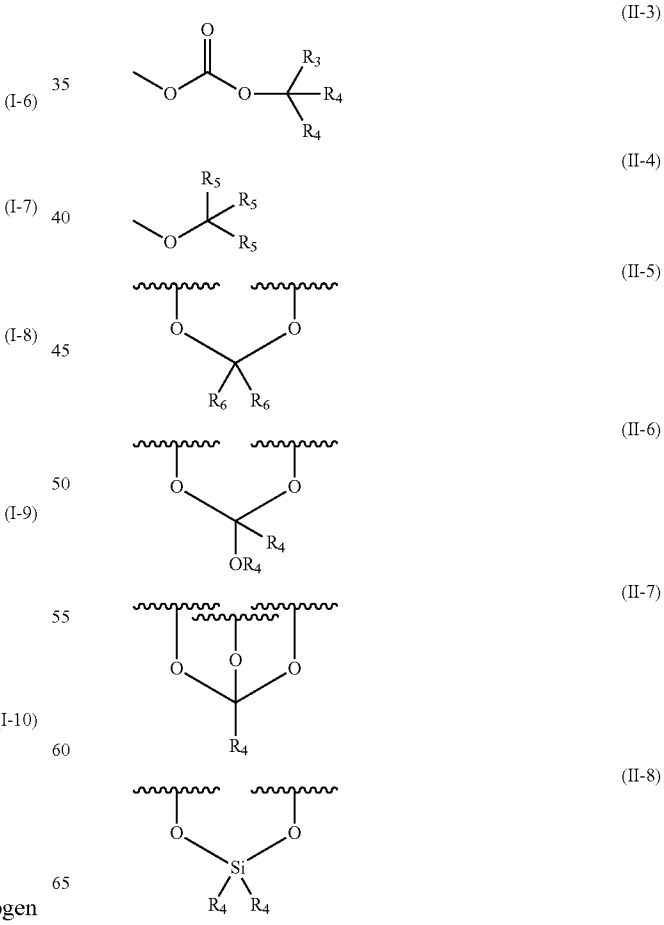

-continued

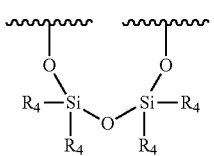

(II-9)

in the general formulae (II-3) to (II-9), $R_3$, represents a hydrogen atom or a monovalent organic group, $R_4$, or each of $R_4$s independently, represents a monovalent organic group, provided that at least two $R_4$s may be bonded to each other to thereby form a ring and that $R_3$ and $R_4$ may be bonded to each other to thereby form a ring, each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group, and each of $R_6$s independently represents a hydrogen atom or a monovalent organic group, provided that $R_6$s may be bonded to each other to thereby form a ring; and wherein the solvent contained in the resist composition is different from the organic solvent contained in the developer.

2. The method of forming a pattern according to claim 1, wherein the repeating unit is any of those represented by general formula (III) below:

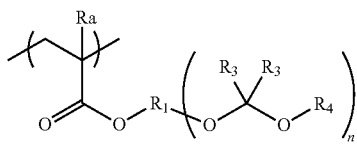

(III)

in which $R_1$ represents a (n+1)-valent organic group,

Ra represents a hydrogen atom, an alkyl group or any of groups of the formula —$CH_2$—O—Ra2 in which Ra2 represents a hydrogen atom, an alkyl group or an acyl group, each of $R_3$s independently represents a hydrogen atom or a monovalent organic group, provided that $R_3$s may be bonded to each other to thereby form a ring, $R_4$, when n≥2 each of $R_4$s independently, represents a monovalent organic group, provided that $R_4$s may be bonded to each other to thereby form a ring and that $R_3$ and $R_4$ may be bonded to each other to thereby form a ring, and n is an integer of 1 or greater.

3. The method of forming a pattern according to claim 2, wherein $R_1$ represents a nonaromatic hydrocarbon group.

4. The method of forming a pattern according to claim 3, wherein $R_1$ represents an alicyclic hydrocarbon group.

5. The method of forming a pattern according to claim 1, wherein the resin further contains a repeating unit containing an alcoholic hydroxyl group.

6. The method of forming a pattern according to claim 1, wherein the resin further contains a repeating unit containing a cyano group.

7. The method of forming a pattern according to claim 1, wherein the resin further contains a repeating unit containing a group that is decomposed when acted on by an acid to thereby produce a carboxyl group.

8. The method of forming a pattern according to claim 1, the resin comprising a repeating unit containing a partial structure represented by the formula (D-1) below:

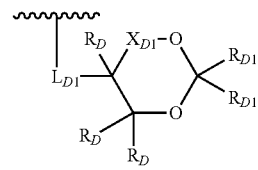

(D-1)

in the formula, $L_{D1}$ represents a single bond or a bivalent connecting group, each of $R_D$s independently represents a hydrogen atom, an alkyl group or a cycloalkyl group provided that at least two of three $R_D$s may be bonded to each other to thereby form a ring, $X_{D1}$ represents a single bond or a connecting group having 1 or more carbon atoms, provided that $L_{D1}$, $R_D$ and $X_{D1}$ may be bonded to each other to thereby form a ring, and provided that at least one of $L_{D1}$, $R_D$ and $X_{D1}$ may be bonded to a carbon atom as a constituent of the principal chain of a polymer to thereby form a ring, and each of $R_{D1}$s independently represents a hydrogen atom, an alkyl group or a cycloalkyl group, two $R_{D1}$s may be bonded to each other to thereby form a ring.

9. The method of forming a pattern according to claim 1, wherein the group that is decomposed when acted on by an acid to thereby produce an alcoholic hydroxyl group is represented by at least one selected from the group consisting of general formulae (II-3) to (II-4) above.

10. The method of forming a pattern according to claim 1, wherein the resin further contains a repeating unit containing a lactone structure.

11. The method of forming a pattern according to claim 1, wherein the resist composition further comprises a hydrophobic resin (e).

12. The method of forming a pattern according to claim 11, wherein the hydrophobic resin (e) contains at least one of a fluorine atom and a silicon atom.

13. The method of forming a pattern according to claim 11, wherein the content of the hydrophobic resin (e) based on the total solids of the resist composition is in the range of 0.01 to 10 mass %.

14. The method of forming a pattern according to claim 1, wherein the compound (b) is a compound that generates the acid represented by general formula (I-A) below:

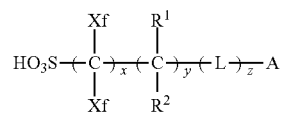

(I-A)

in which, each of Xfs independently represents a fluorine atom or an alkyl group having at least one hydrogen atom thereof substituted with one or more fluorine atoms, each of $R^1$ and $R^2$ independently represents a hydrogen atom, a fluorine atom, an alkyl group or an alkyl group having at least one hydrogen atom thereof substituted with one or more fluorine atoms, provided that when y≥2, the multiple $R^1$s, and also the multiple $R^2$s, may be identical to or different from each other, L represents a single bond or a bivalent connecting group, provided that when z≥2, the multiple Ls may be identical to or different from each other, A represents a group having a cyclic structure, x is an integer of 1 to 20, y is an integer of 0 to 10, and z is an integer of 0 to 10.

15. The method of forming a pattern according to claim 1, wherein the organic solvent contained in the developer contains further any of, ketone, alcohol, amide, ether and hydrocarbon solvents.

16. The method of forming a pattern according to claim 1, wherein the developer contains, as the organic solvent, acetic acid alkyl esters.

17. The method of forming a pattern according to claim 1, wherein the solvent contained in the resist composition comprises at least one solvent selected from the group consisting of an alkylene glycol monoalkyl ether carboxylate, an alkylene glycol monoalkyl ether, an alkyl lactate, an alkyl alkoxypropionate, a cyclolactone, an optionally cyclized monoketone compound, an alkylene carbonate, an alkyl alkoxyacetate and an alkyl pyruvate.

18. The method of forming a pattern according to claim 17, wherein the solvent contained in the resist composition consists of a solvent selected from the group consisting of an alkylene glycol monoalkyl ether carboxylate, an alkylene glycol monoalkyl ether, an alkyl lactate, an alkyl alkoxypropionate, a cyclolactone, an optionally cyclized monoketone compound, an alkylene carbonate, an alkyl alkoxyacetate and an alkyl pyruvate.

19. The method of forming a pattern according to claim 1, wherein the developer comprises butyl acetate.

20. The method of forming a pattern according to claim 19, wherein the developer consists of butyl acetate.

* * * * *